(12) United States Patent
Lee

(10) Patent No.: US 9,659,636 B2
(45) Date of Patent: May 23, 2017

(54) NAND MEMORY ARRAY WITH BL-HIERARCHICAL STRUCTURE FOR CONCURRENT ALL-BL, ALL-THRESHOLD-STATE PROGRAM, AND ALTERNATIVE-WL PROGRAM, ODD/EVEN READ AND VERIFY OPERATIONS

(71) Applicant: Peter Wung Lee, Saratoga, CA (US)

(72) Inventor: Peter Wung Lee, Saratoga, CA (US)

(73) Assignee: Peter Wung Lee, Saratoga, CA (US)

( * ) Notice: Subject to any disclaimer, the term of this patent is extended or adjusted under 35 U.S.C. 154(b) by 104 days.

(21) Appl. No.: 14/806,629

(22) Filed: Jul. 22, 2015

(65) Prior Publication Data

US 2016/0027504 A1    Jan. 28, 2016

Related U.S. Application Data

(60) Provisional application No. 62/027,694, filed on Jul. 22, 2014.

(51) Int. Cl.
*G11C 16/04* (2006.01)
*G11C 11/56* (2006.01)
(Continued)

(52) U.S. Cl.
CPC ............ *G11C 11/5635* (2013.01); *G11C 7/14* (2013.01); *G11C 7/18* (2013.01); *G11C 11/56* (2013.01);
(Continued)

(58) Field of Classification Search
CPC . G11C 11/5635; G11C 11/5642; G11C 16/24; G11C 16/26; G11C 16/3459;
(Continued)

(56) References Cited

U.S. PATENT DOCUMENTS 5,734,609 A   3/1998 Choi
5,867,429 A   2/1999 Chen
(Continued)

*Primary Examiner* — Gene Auduong
(74) *Attorney, Agent, or Firm* — Raywell Group, LLC

(57) ABSTRACT

A YUKAI NAND array comprising multiple strings associated with hierarchical global/local bit lines (GBL/LBL) and each string being associated with one LBL and having adjacent LBL as a dedicated local source line (LSL) without a common source line to connect all strings. Each of the LBLs is interleavingly associated with either an Odd or Even string selected via one pair of dummy cells inserted in each string and is used as one on-chip PCACHE register with full BL-shielding without wasting extra silicon area to allow batch-based multiple concurrent MLC All-BL, All-Vtn-Program and Alternative-WL program, Odd/Even read and verify operations with options of providing individual and common $V_{SL}$-based Vt-compensation and $V_{LBL}$ compensations to mitigate high WL-WL and BL-BL coupling effects. Bias conditions in each string are provided to correctly sense highly-negative erase-verify voltage, multiple negative program-verify voltages and without $V_{DS}$ punch-through, breakdown and body-effect in both boundary and non-boundary WLs cells.

134 Claims, 55 Drawing Sheets

(51) Int. Cl.
   *G11C 16/08* (2006.01)
   *G11C 16/14* (2006.01)
   *G11C 16/24* (2006.01)
   *G11C 16/26* (2006.01)
   *G11C 16/34* (2006.01)
   *G11C 7/14* (2006.01)
   *G11C 7/18* (2006.01)
   *G11C 29/50* (2006.01)

(52) U.S. Cl.
   CPC ...... *G11C 11/5642* (2013.01); *G11C 16/0483* (2013.01); *G11C 16/08* (2013.01); *G11C 16/14* (2013.01); *G11C 16/24* (2013.01); *G11C 16/26* (2013.01); *G11C 16/3445* (2013.01); *G11C 16/3459* (2013.01); *G11C 29/50* (2013.01); *G11C 2029/5002* (2013.01)

(58) Field of Classification Search
   CPC . G11C 16/0483; G11C 16/3445; G11C 16/08; G11C 16/14; G11C 11/16
   USPC ............ 365/185.02, 185.03, 185.11, 185.12, 365/185.17
   See application file for complete search history.

(56) References Cited

U.S. PATENT DOCUMENTS

| | | | |
|---|---|---|---|
| 6,522,580 B2 | 2/2003 | Chen | |
| 6,542,407 B1 | 4/2003 | Chen | |
| 6,657,891 B1 | 12/2003 | Shibata | |
| 6,781,877 B2 | 8/2004 | Cernea | |
| 6,807,095 B2 | 10/2004 | Chen | |
| 6,816,409 B2 | 11/2004 | Tanaka | |
| 6,847,553 B2 | 1/2005 | Chen | |
| 6,870,768 B2 | 3/2005 | Cemea | |
| 6,888,758 B1 | 5/2005 | Hemink | |
| 6,917,542 B2 | 7/2005 | Chen | |
| 7,023,735 B2 | 4/2006 | Ban | |
| 7,046,548 B2 | 5/2006 | Cernea | |
| 7,061,798 B2 | 6/2006 | Chen | |
| 7,102,924 B2 | 9/2006 | Chen | |
| 7,187,585 B2 | 3/2007 | Li | |
| 7,196,928 B2 | 3/2007 | Chen | |
| 7,196,946 B2 | 3/2007 | Chen | |
| 7,224,613 B2 | 5/2007 | Chen | |
| 7,289,344 B2 | 10/2007 | Chen | |
| 7,301,808 B2 | 11/2007 | Li | |
| 7,301,813 B2 | 11/2007 | Chen | |
| 7,301,839 B2 | 11/2007 | Li | |
| 7,315,477 B2 | 1/2008 | Chen | |
| 7,321,510 B2 | 1/2008 | Li | |
| 7,372,730 B2 | 5/2008 | Chen | |
| 7,397,698 B2 | 7/2008 | Fong | |
| 7,443,729 B2 | 10/2008 | Li | |
| 7,499,329 B2 | 3/2009 | Nazarian | |
| 7,499,338 B2 | 3/2009 | Ito | |
| 7,506,113 B2 | 3/2009 | Li | |
| 7,522,454 B2 | 4/2009 | Li | |
| 7,652,929 B2 | 1/2010 | Li | |
| 7,706,188 B2 | 4/2010 | Kim | |
| 7,839,690 B2 | 11/2010 | Lee | |
| 7,876,611 B2 | 1/2011 | Dutta | |
| 8,036,041 B2 | 10/2011 | Li | |
| 8,130,556 B2 | 3/2012 | Lutze | |
| 8,148,763 B2 | 4/2012 | Kim | |
| 8,169,826 B2 | 5/2012 | Hishida | |
| 8,189,391 B2 | 5/2012 | Itagaki | |
| 8,194,453 B2 | 6/2012 | Maejima | |
| 8,203,882 B2 | 6/2012 | Hishida | |
| 8,218,348 B2 | 7/2012 | Roohparvar | |
| 8,274,823 B2 | 9/2012 | Roohparvar | |
| 8,284,606 B2 | 10/2012 | Li | |
| 8,284,613 B2 | 10/2012 | Yamada | |
| 8,334,551 B2 | 12/2012 | Itagaki | |
| 8,335,111 B2 | 12/2012 | Fukuzumi | |
| 8,400,826 B2 | 3/2013 | Roohparvar | |
| 8,400,839 B2 | 3/2013 | Li | |
| 8,437,192 B2 | 5/2013 | Lung | |
| 8,446,777 B2 | 5/2013 | Ueno | |
| 8,461,000 B2 | 6/2013 | Alsmeier et al. | |
| 8,462,559 B2 | 6/2013 | Yamada | |
| 8,477,533 B2 | 7/2013 | Kang | |
| 8,488,382 B1 | 7/2013 | Li | |
| 8,503,230 B2 | 8/2013 | Yoo | |
| 8,503,245 B2 | 8/2013 | Yamada | |
| 8,526,236 B2 | 9/2013 | Jones | |
| 8,559,222 B1 | 10/2013 | Iwai et al. | |
| 8,559,236 B2 | 10/2013 | Nakai | |
| 8,570,810 B2 | 10/2013 | Fong | |
| 8,599,617 B2 | 12/2013 | Shiino | |
| 8,605,503 B2 | 12/2013 | Futatsuyama | |
| 8,605,511 B2 | 12/2013 | Tanaka | |
| 8,619,468 B2 | 12/2013 | Shibata | |
| 8,625,356 B2 | 1/2014 | Shibata | |
| 8,625,357 B2 | 1/2014 | Cho | |
| 8,625,359 B2 | 1/2014 | Jeon | |
| 8,630,115 B2 | 1/2014 | Pascucci | |
| 8,630,116 B2 | 1/2014 | Maejima | |
| 8,634,251 B2 | 1/2014 | Chung | |
| 8,637,915 B2 | 1/2014 | Ichige | |
| 8,638,608 B2 | 1/2014 | Lai | |
| 8,638,609 B2 | 1/2014 | Lin | |
| 8,644,081 B2 | 2/2014 | Chang | |
| 8,654,585 B2 | 2/2014 | Oh | |
| 8,654,588 B2 | 2/2014 | Aritome | |
| 8,659,951 B2 | 2/2014 | Nawata | |
| 8,661,294 B2 | 2/2014 | Lee | |
| 8,665,649 B2 | 3/2014 | Park | |
| 8,670,272 B2 | 3/2014 | Radke | |
| 8,675,410 B2 | 3/2014 | Pyeon | |
| 8,675,416 B2 | 3/2014 | Lee | |
| 8,681,543 B2 | 3/2014 | Jang | |
| 8,681,545 B2 | 3/2014 | Kim et al. | |
| 8,681,563 B1 | 3/2014 | Lee | |
| 8,687,430 B2 | 4/2014 | Sarin et al. | |
| 8,687,431 B2 | 4/2014 | Sarin | |
| 8,694,720 B2 | 4/2014 | Lee | |
| 8,694,766 B2 | 4/2014 | Toelkes | |
| 8,700,879 B2 | 4/2014 | Porzio | |
| 8,705,277 B2 | 4/2014 | Moschiano et al. | |
| 8,705,290 B2 | 4/2014 | Damle | |
| 8,705,293 B2 | 4/2014 | She | |
| 8,711,621 B2 | 4/2014 | Kim | |
| 8,711,624 B2 | 4/2014 | Choi | |
| 8,717,819 B2 | 5/2014 | Aritome | |
| 8,730,733 B2 | 5/2014 | Youn | |
| 8,737,140 B2 | 5/2014 | Kim | |
| 8,755,224 B2 | 6/2014 | Yun | |
| 8,773,910 B2 | 7/2014 | Jones | |
| 8,773,911 B2 | 7/2014 | Park | |
| 8,893,247 B1 | 11/2014 | Faaborg | |
| 9,183,940 B2 * | 11/2015 | Lee | G11C 16/0483 |
| 9,230,677 B2 * | 1/2016 | Lee | G11C 11/56 |
| 9,263,137 B2 * | 2/2016 | Lee | G11C 16/10 |
| 9,293,205 B2 * | 3/2016 | Lee | G11C 16/0483 |
| 2015/0179269 A1 * | 6/2015 | Lee | G11C 16/14 365/185.03 |

* cited by examiner

| Boundary WL | Time | | t0 | t1 | t2 | t3 | t4 | t5 | t6 | t7 | t8 | t9 | t10 | t11 |
|---|---|---|---|---|---|---|---|---|---|---|---|---|---|---|
| | | MLC ABL, AnP, Alt-WL Program Scheme | | | | | | | | | | | | |
| Yes | DMYWL | | DP | 1S | | | | | | | | | | |
| 1st(Yes) | WLn-1 | | DS | 1P | 1S | 2S | | | | | | | | |
| No | WLn | | | 1S | 1P | 2P | 1S | 2S | | | | | | |
| No | WLn+1 | | | | 1S | 2S | 1P | 2P | 1S | 2S | | | | |
| No | WLn+2 | | | | | | 1S | 2P | 1P | 2S | 0S | 1S | 2S | |
| 2nd(Yes) | WLn+3 | | | | | | | 2S | 1S | 2S | 0P | 1P | 2P | 2S |
| 1st(Yes) | WLn+4 | | | | | | | | | 2S | | 1S | 2S | 2S |
| | 2-bit PB | | DMYWL | WLn-1 | WLn | WLn+1 | WLn+1 | WLn | WLn+2 | WLn+1 | WLn+4 | WLn+3 | WLn+2 | WLn+3 |

ABL, AnP, Alt-WL Program Scheme

| Boundary WL | Time | t8 | t9 | t11 | t1' | t2' | t3' | t4' | t5' | t6' | t7' |
|---|---|---|---|---|---|---|---|---|---|---|---|
| No | WLn+2 | 0S | 1S | 2S | | | | | | | |
| 2nd(Yes) | WLn+3 | 0P | 1P | 2P | 1S | | 2S | | | | |
| 1st(Yes) | WLn+4 | 0S | 1S | 2S | 1P | 1S | 2P | 1S | 2S | | |
| No | WLn+5 | | | | 1S | 1P | 2S | 1S | 2P | 1S | 2S |
| No | WLn+6 | | | | | 1S | | 1P | 2S | 1P | 2P |
| No | WLn+7 | | | | | | | 1S | 2S | 1S | 2S |
| | 2-bit PB | WLn+4 | WLn+3 | WLn+3 | WLn+4 | WLn+5 | WLn+4 | WLn+6 | WLn+5 | WLn+7 | WLn+6 |

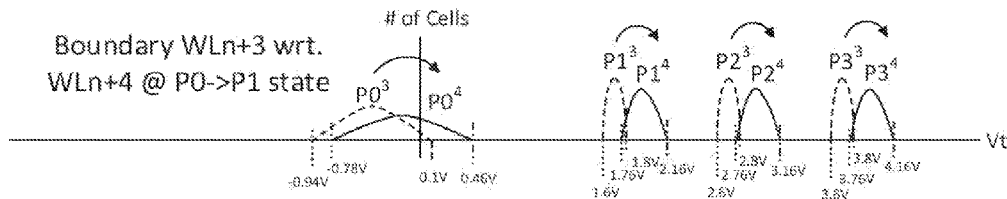

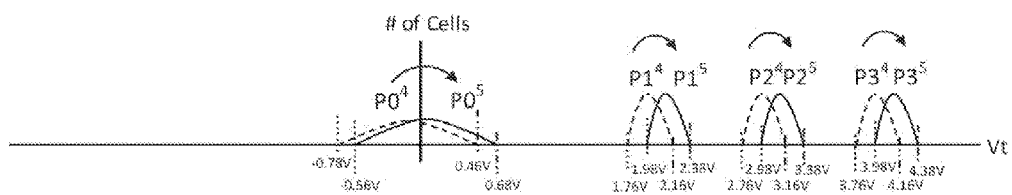

| Time | State | Vtmin/Vtmax of WLn+3 wrt. WLn+4 @ P0 -> P1 |
|---|---|---|
| t1' | 1P: $P0^3$->$P0^4$ (WLn+4) | Vtmin(new)=Vtmin(old)+0.16V |
| t3' | 2P: $P0^5$->$P1^6$ (WLn+4) | |
| t1' | 1P: $P0^3$->$P0^4$ (WLn+4) | Vtmax(new)=Vtmax(old)+0.36V |
| t3' | 2P: $P0^5$->$P1^6$ (WLn+4) | |
| Note | | |
| 1. No shifted Vtmin due to no 1P program operation on WLn+4 for P0 | | |
| 2. Vtmin is shifted by WLn+4's (Vtp$1^6$min-Vtp$0^5$max) x10%=(1.6-0)x10%=0.16V | | |
| 3. No shifted Vtmax due to no 1P program operation on WLn+4 for P0 | | |
| 4. Vtmax is shifted by WLn+4's (Vtp$1^6$max-Vtp$0^5$min) x10%=(1.8+1.81)x10%=0.36V | | |

Fig. 6I

WLn wrt. WLn+1 @ P0³->P1⁴/P2³->P2⁴~P3⁴ state by 2ⁿᵈ-pass Program Operation

WLn Read Operation by Applying Individual
$V_{SL}$ =0.15V/0V/0.1V/0V wrt. WLn+1 @ P0~P3 state

| 1st-pass Program: 1P ||
|---|---|
| State | $V_{LBL}$ |
| P0 | 2V/Vinh |
| P2 | 0V/Vinh |

Fig. 7A

| 2nd-pass Program: 2P ||
|---|---|
| State | $V_{LBL}$ |
| P0 | Vinh |
| P1 | 2V/Vinh |
| P2 | 1V/Vinh |
| P3 | 0V/Vinh |

Fig. 7B

| ABL 1st/2nd-pass MLC Program @ Vdd=2.4V |||||||||
|---|---|---|---|---|---|---|---|---|
| Program | State | $V_{LBL}$ | T0 || T1 || T2 || After C.S. |
| | | | GBL | LBL | GBL | LBL | GBL | LBL | |
| 1P | P0 | 2V | 0 | 7->0 | 0 | 7->0 | Vdd | 6 | 2V |
| | P2 | 0V | 0 | 7->0 | 0 | 7->0 | 0 | 6->0 | 0V |
| 2P | P1 | 2V | 0 | 7->0 | 0 | 7->0 | Vdd | 6 | 2V |
| | P2 | 1V | 1 | 7->1 | 1 | 7->1 | 1 | 6->1 | 1V |
| | P3 | 0V | 0 | 7->0 | 0 | 7->0 | 0 | 6->0 | 0V |
| All Inh. States | | Vinh | Vdd | 7 | Vdd | 7 | Vdd | 6 | 6.67V |

Fig. 7C

| ABL 1st/2nd-pass MLC Program @ Vdd=1.6V ||||||||||
|---|---|---|---|---|---|---|---|---|---|
| Program | State | $V_{LBL}$ | T0 || T1 || T2 || After C.S. |
| | | | GBL | LBL | GBL | LBL | GBL | LBL | |
| 1P | P0 | 2V | 0 | 7->0 | 0 | 3->0 | Vdd | 6 | 2V |
| | P2 | 0V | 0 | 7->0 | 0 | 3->0 | 0 | 6->0 | 0V |
| 2P | P1 | 2V | 0 | 7->0 | 0 | 3->0 | Vdd | 6 | 2V |
| | P2 | 1V | 0 | 7->0 | Vdd | 3 | 0 | 6->0 | 1V |
| | P3 | 0V | 0 | 7->0 | 0 | 3->0 | 0 | 6->0 | 0V |
| All Inh. States || Vinh | Vdd | 7 | Vdd | 3 | Vdd | 6 | 5.33V |

Fig. 7D

| VFY Voltage \ State | 1P || 2P ||
|---|---|---|---|---|
| | WL | SL | WL | SL |
| P0 | 0V | 1V | Neglect ||
| P1 | Neglect || 1.6V | 0V |
| P2 | 1V | 0V | 2.6V | 0V |
| P3 | Neglect || 3.6V | 0V |

Fig. 7E

| Read Operation of WLn-1~WLn+2 wrt. Programmed Adj. WL |||
|---|---|---|
| Voltage \ State | WL | SL |
| P0 out of P1~P3 | 1.4V | 0V |
| P0~P1 out of P2~P3 | 2.4V | 0V |
| P3 out P0~P2 | 3.4V | 0V |

Fig. 7F

| Read Operation of Boundary WLn+3 wrt. WLn+4 @ P0 State | | |
|---|---|---|
| State \ Voltage | WL | SL |
| P0 out of P1~P3 | 1.2V | 0V |
| P0~P1 out of P2~P3 | 2.2V | 0V |
| P3 out P0~P2 | 3.2V | 0V |

Fig. 7G

| Read Operation of Boundary WLn+3 wrt. WLn+4 @ P0~P3 state | | WLn+4 | | | |
|---|---|---|---|---|---|
| State \ Voltage | WLn+3 | P0 SL | P1 SL | P2 SL | P3 SL |
| P0 out of P1~P3 | 1.7V | 0.36V | 0.22V | 0.1V | 0V |
| P0~P1 out of P2~P3 | 2.7V | 0.36V | 0.22V | 0.1V | 0V |
| P3 out P0~P2 | 3.7V | 0.36V | 0.22V | 0.1V | 0V |

Fig. 7H

| Read Operation of Non-Boundary WLn wrt. WLn+1 @ P0~P3 state | | WLn+1 | | | |
|---|---|---|---|---|---|
| State \ Voltage | WLn | P0 SL | P1 SL | P2 SL | P3 SL |
| P0 out of P1~P3 | 1.4V | 0.15V | 0V | 0.1V | 0V |
| P0~P1 out of P2~P3 | 2.4V | 0.15V | 0V | 0.1V | 0V |
| P3 out P0~P2 | 3.4V | 0.15V | 0V | 0.1V | 0V |

Fig. 7I

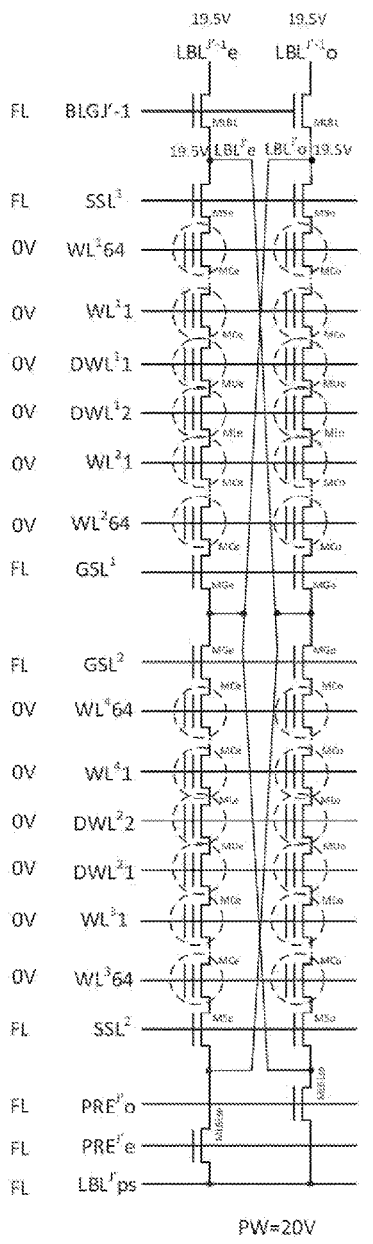
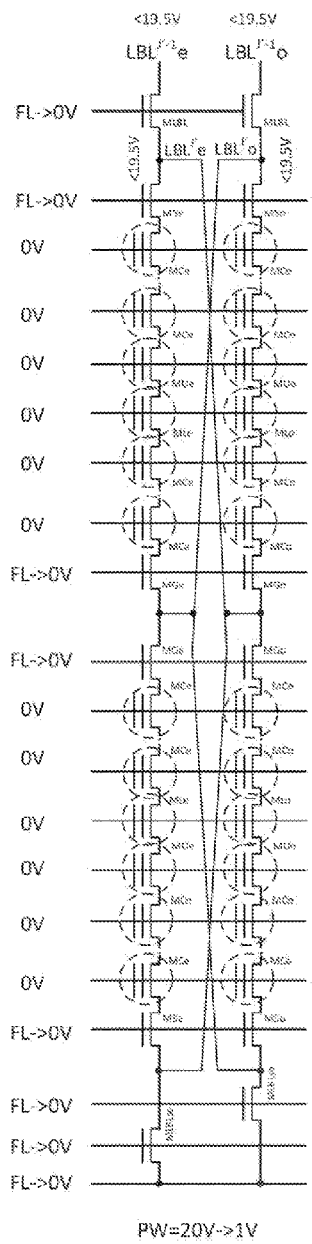
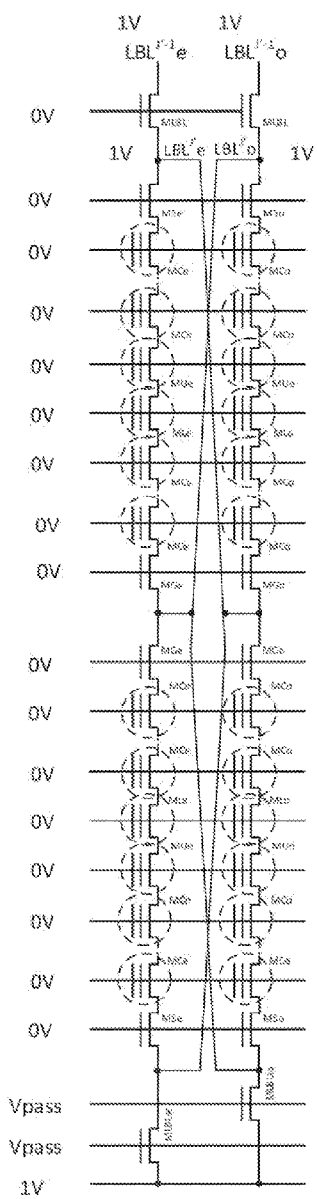
Fig. 9A — Multiple Blocks Erase (Fresh Regular & Dummy Cells) in same LG
Fig. 9B — PW/DNW/WL Discharge post Multiple Blocks Erase
Fig. 9C — Concurrent C_LBL Discharge post Multiple Blocks Erase

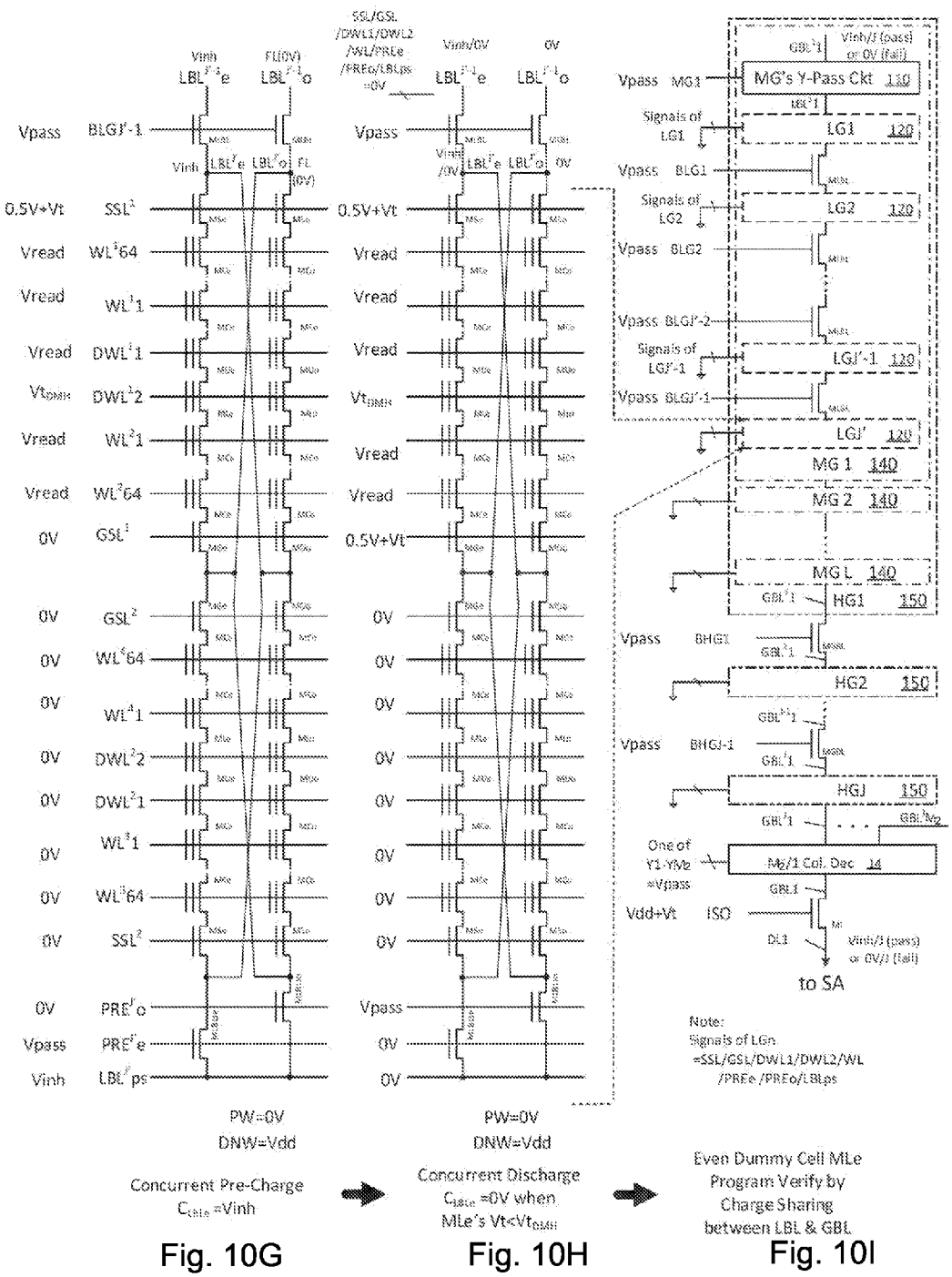
Fig. 10G — Concurrent Pre-Charge $C_{LBLe}$ =Vinh
Fig. 10H — Concurrent Discharge $C_{LBLe}$ =0V when MLe's Vt<$Vt_{DMIN}$
Fig. 10I — Even Dummy Cell MLe Program Verify by Charge Sharing between LBL & GBL

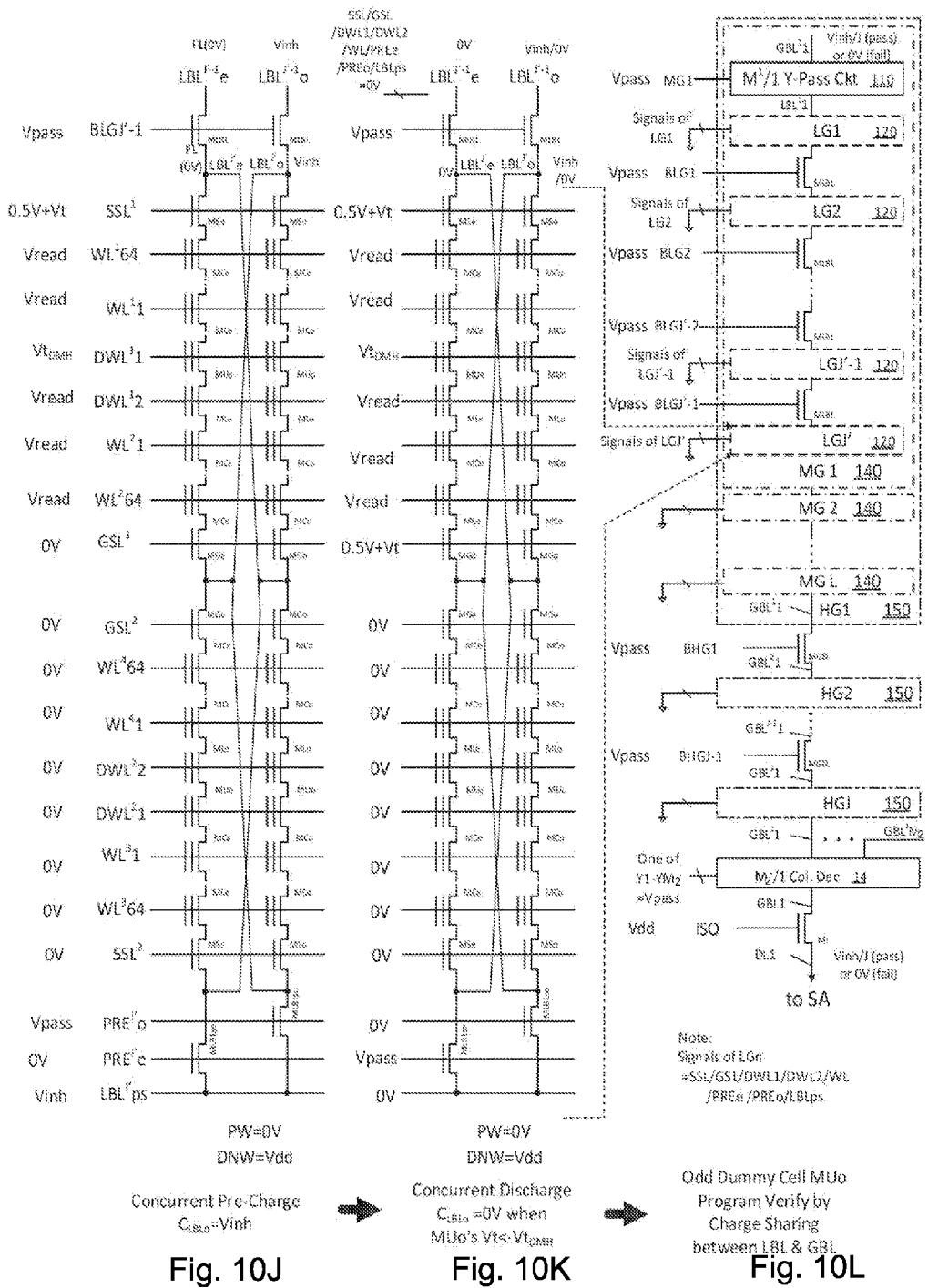

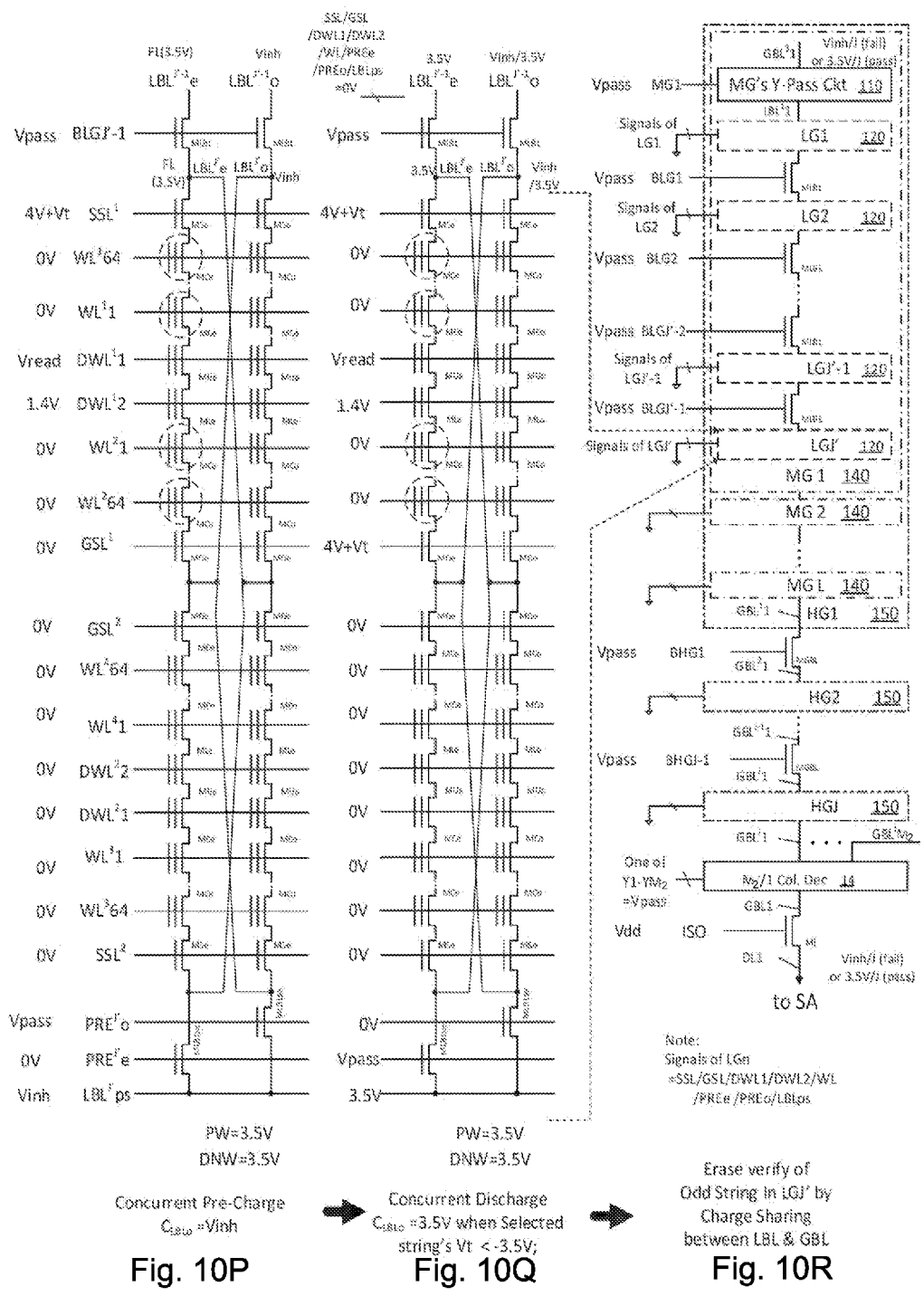

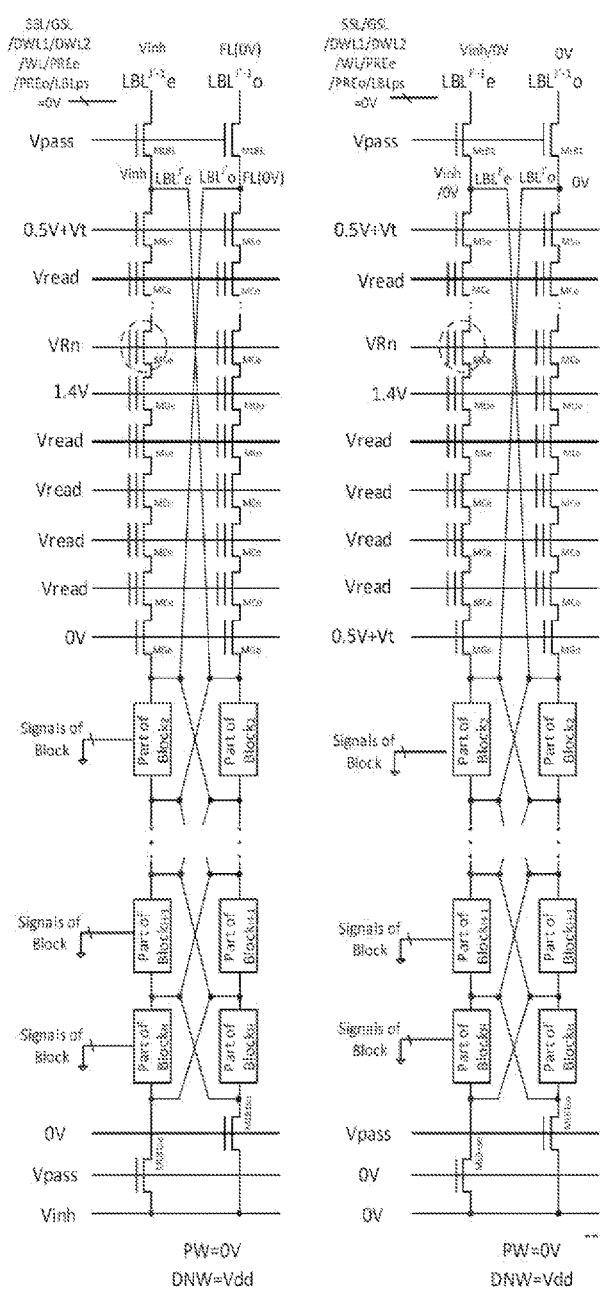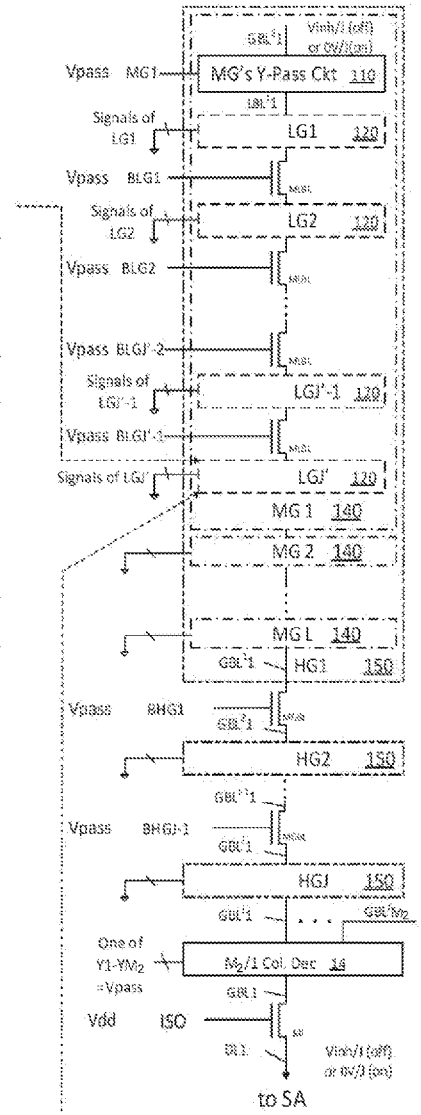
Fig. 12A — Concurrent Pre-charge $C_{LBLe}$ =Vinh
Fig. 12B — Concurrent Discharge $C_{LBLe}$ =0V when Selected Even Cell's Vt < VRn
Fig. 12C — Even Cell MCe Read by Charge Sharing between LBL & GBL MLC ABL, AnP, Alt-WL Program Scheme

| Boundary WL | Time | t0 | t1 | t2 | t3 | t4 | t5 | t6 | t7 | t8 | t9 | t10 |
|---|---|---|---|---|---|---|---|---|---|---|---|---|
| Yes | DMYWL | DP | 1S | | | | | | | | | |
| 1st (Yes) | WLn-1 | DS | 1P | 1S | 2S | | | | | | | |
| No | WLn | | 1S | 1P | 2P | 1S | 2S | | | | | |
| No | WLn+1 | | | 1S | 2S | 1P | 2P | 1S | 2S | | | |
| No | WLn+2 | | | | | 1S | 2S | 1P | 2P | 1S | 2S | |
| 2nd(Yes) | WLn+3 | | | | | | | 1S | 2S | 1P | 2P | 2S |
| 1st(Yes) | WLn+4 | | | | | | | | | 1S | 2S | 2P |
| | 2-bit PB | DMYWL | WLn-1 | WLn | WLn-1 | WLn+1 | WLn | WLn+2 | WLn+1 | WLn+3 | WLn+2 | WLn+3 |

Fig. 13A

| | MLC ABL, AnP, Alt-WL Program Scheme | | | | | | | | | | |
|---|---|---|---|---|---|---|---|---|---|---|---|
| Boundary WL | Time | t8 | t9 | t10 | t1' | t2' | t3' | t4' | t5' | t6' | t7' |
| No | WLn+2 | 1S | 2P | 2S | | | | | | | |
| 2nd(Yes) | WLn+3 | 1P | 2S | 2P | 1S | 1S | | | | | |
| 1st (Yes) | WLn+4 | 1S | | 2S | 1P | 1P | 2S | 1S | | | |
| No | WLn+5 | | | | 1S | 1S | 2P | 1P | 2S | | |
| No | WLn+6 | | | | | | 2S | 1S | 2P | 1S | 2S |
| No | WLn+7 | | | | | | | | 2S | 1P | 2P |
| | 2-bit PB | WLn+3 | WLn+2 | WLn+3 | WLn+4 | WLn+5 | WLn+4 | WLn+6 | WLn+5 | WLn+7 | WLn+6 |

Fig. 13B

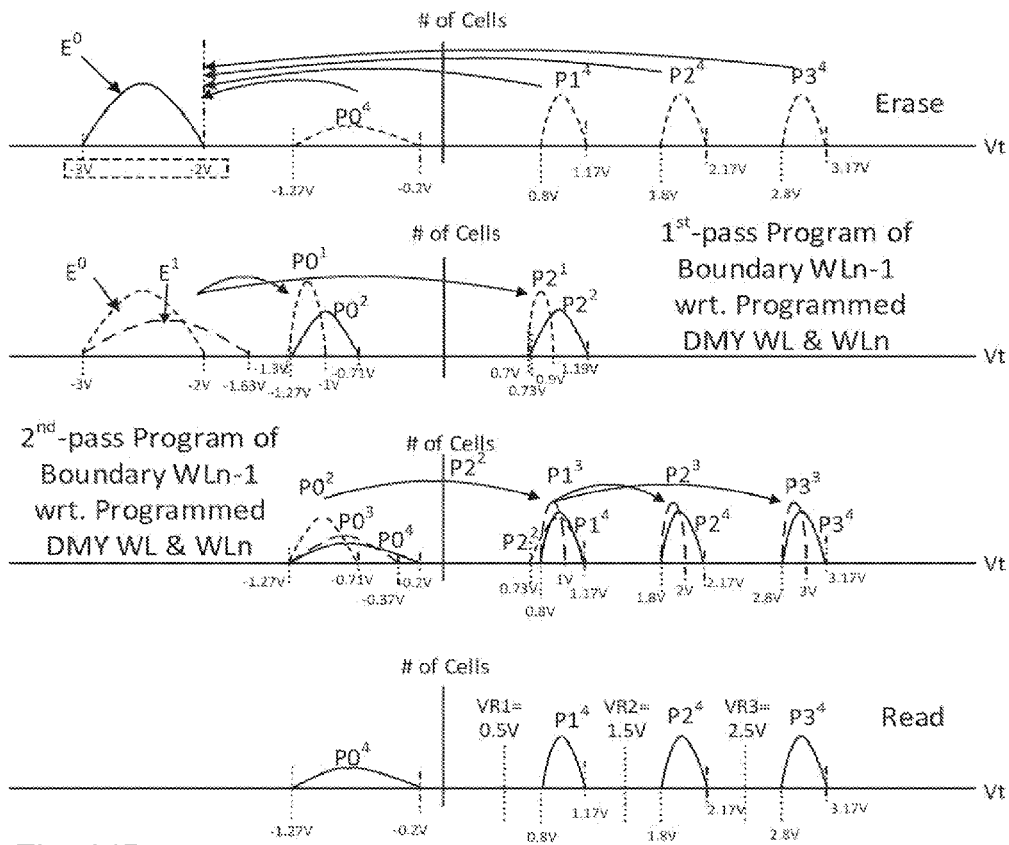

Fig. 14B

| Time | State | Vtmax of E for WLn-1 wrt. Dummy WL's Vt=Vte/$V_{DM}$ & Programmed Adjacent WLn |
|---|---|---|
| | Initial | Vte$^0$max= -2V; Vte$^0$min= -3V |
| t0 | DS: E$^0$->P2$^1$ (DMWL) | Vte$^1$max =(-2)+ (2+3)x7.5%= -0.83V |
| t1 | 1P: E$^1$->P2$^1$ (WLn-1) | Vtp0$^1$max =(-1.3)+ (0.3)= -1V |
| t2 | 1S: E$^1$->P2$^1$ (WLn) | Vtp0$^2$max =(-1)+ (2.97+0.9)x7.5%= -0.71V |
| t3 | 2P: Pn$^2$->Pn$^3$ (WLn-1) | Vtp0$^3$max =(-0.71)+(3-0.73)x7.5%x2=-0.37V |
| t5 | 2S: Pn$^3$->Pn$^4$ (WLn) | Vtp0$^4$max =(-0.37)+ (3-0.73)x7.5%=-0.2V |
| | Note | |
| 1. Vtp0$^1$max is set to -1V due to WLn-1's (Vtp2$^1$max-Vte$^1$min) x7.5%x2=(3+0.9)x15%= 0.59V; (-1.63)+(0.59)= -1.04V<-1V | | |
| 2. Vtp0$^2$min & Vtp2$^2$min are shifted by 0.03V due to WLn's (Vtp0$^1$min-Vte$^1$max) x7.5%= (1.71-1.3)x7.5%=0.03V | | |
| 3. No shift on Vtpn$^4$min due to no program on WLn's Vtp0 | | |

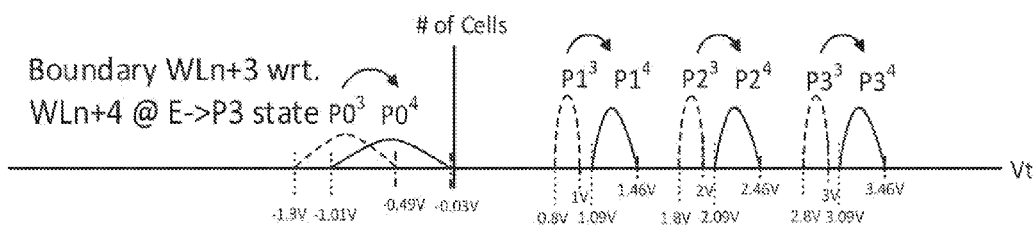

Individual $V_{SL}=0V$

| Time | State | Vtmin/Vtmax(New) of WLn+3 wrt. WLn+4 @ E -> P3 |
|---|---|---|
| t1' | 1P: $E^2$->$P2^1$ (WLn+4) | Vtmin(new)=Vtmin(old)+0.168V+0.121V<br>=Vtmin(old)+0.29V |
| t3' | 2P: $P2^2$->$P3^3$ (WLn+4) | |
| t1' | 1P: $E^2$->$P2^1$ (WLn+4) | Vtmax(new)=Vtmax(old)+0.29V+0.17V<br>=Vtmax(old)+0.46V |
| t3' | 2P: $P2^2$->$P3^3$ (WLn+4) | |

| Note |
|---|
| 1. Vtmin is shifted by WLn+4's ($Vtp2^1min-Vte^2max$)<br>x7.5%=(0.7+1.54)x7.5%=0.168V |
| 2. Vtmin is shifted by WLn+4's ($Vtp3^3min-Vtp2^2max$)<br>x7.5%=(2.8-1.19)x7.5%=0.121V |
| 3. Vtmax is shifted by WLn+4's ($Vtp2^1max-Vte^2min$)<br>x7.5%=(0.9+2.97)x7.5%=0.29V |
| 4. Vtmax is shifted by WLn+4's ($Vtp3^3max-Vtp2^2min$)<br>x7.5%=(3-0.73)x7.5%=0.17V |

Fig. 14F

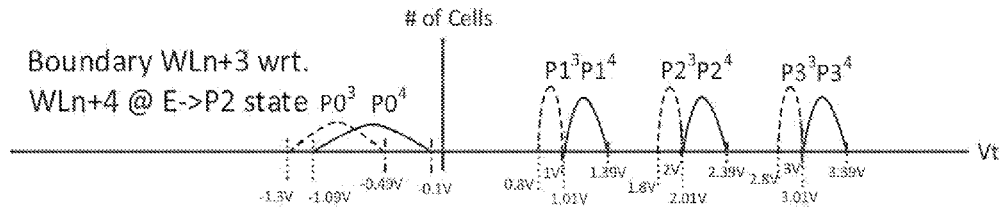

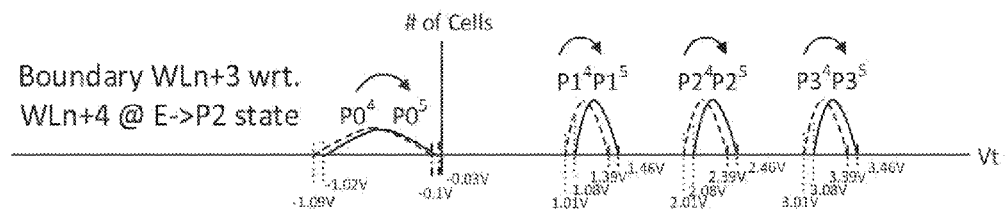

Compensate Boundary WLn+3 by Applying Individual $V_{SL}=0.07V$

| Time | State | Vtmin/Vtmax of WLn+3 wrt. WLn+4 @ E -> P2 |
|---|---|---|
| t1' | 1P: $E^2$->$P2^1$ (WLn+4) | Vtmin(new)=Vtmin(old)+0.168V+0.046V =Vtmin(old)+0.21V |
| t3' | 2P: $P2^2$->$P2^3$ (WLn+4) | |
| t1' | 1P: $E^2$->$P2^1$ (WLn+4) | Vtmax(new)=Vtmax(old)+0.29V+0.095V =Vtmax(old)+0.39V |
| t3' | 2P: $P2^2$->$P2^3$ (WLn+4) | |

| Note |
|---|
| 1. Vtmin is shifted by WLn+4's ($Vtp2^1min-Vte^2max$) x7.5%=(0.7+1.54)x7.5%=0.168V |
| 2. Vtmin is shifted by WLn+4's ($Vtp2^3min-Vtp2^2max$) x7.5%=(1.8-1.19)x7.5%=0.046V |
| 3. Vtmax is shifted by WLn+4's ($Vtp2^1max-Vte^2min$) x7.5%=(0.9+2.97)x7.5%=0.29V |
| 4. Vtmax is shifted by WLn+4's ($Vtp3^3max-Vtp2^2min$) x7.5%=(2-0.73)x7.5%=0.095V |

Fig. 14G

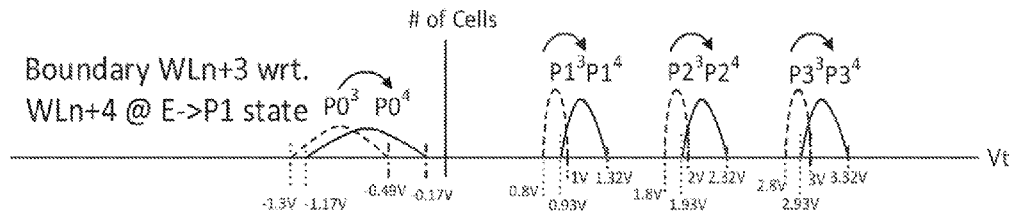

Compensate Boundary WLn+3 by Applying Individual $V_{SL}$=0.14V

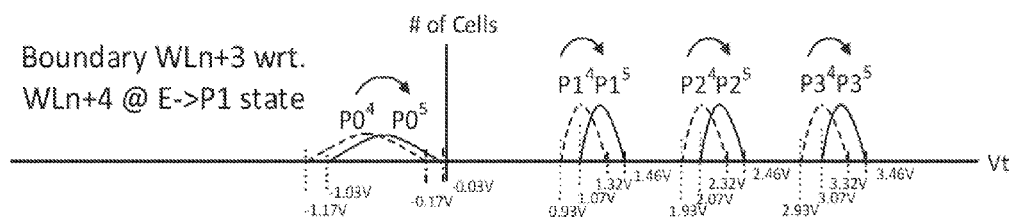

| Time | State | Vtmin/Vtmax of WLn+3 wrt. WLn+4 @ E -> P1 |
|---|---|---|
| t1' | 1P: $E^2$->$P2^1$ (WLn+4) | Vtmin(new)=Vtmin(old)+0.018V+0.11V |
| t3' | 2P: $P0^2$->$P1^3$ (WLn+4) | =Vtmin(old)+0.13V |
| t1' | 1P: $E^2$->$P2^1$ (WLn+4) | Vtmax(new)=Vtmax(old)+0.148V+0.17V |
| t3' | 2P: $P0^2$->$P1^3$ (WLn+4) | =Vtmax(old)+0.32V |
| Note | | |
| 1. Vtmin is shifted by WLn+4's ($Vtp0^1min$-$Vte^2max$) x7.5%=(1.54-1.3)x7.5%=0.018V | | |
| 2. Vtmin is shifted by WLn+4's ($Vtp1^3min$-$Vtp0^2max$) x7.5%=(0.8+0.67)x7.5%=0.11V | | |
| 3. Vtmax is shifted by WLn+4's ($Vtp0^1max$-$Vte^2min$) x7.5%=(2.97-1)x7.5%=.148V | | |
| 4. Vtmax is shifted by WLn+4's ($Vtp1^3max$-$Vtp0^2min$) x7.5%=(1+1.27)x7.5%=0.17V | | |

Fig. 14H

Boundary WLn+3 Read Operation by Applying Individual $V_{SL}$ =0.25V/ 0.14V/0.07V/0V & Raising up 0.3V on WLn+3 wrt. WLn+4 @ P0~P3 state

| VFY Voltage State | 1P | | 2P | |
|---|---|---|---|---|
| | WL | SL | WL | SL |
| P0 | 0V | 1.3V | Neglect | |
| P1 | Neglect | | 0.8V | 0V |
| P2 | 0.7 | 0V | 1.8V | 0V |
| P3 | Neglect | | 2.8V | 0V |

| Read Operation of WLn-1~WLn+2 wrt. Programmed Adj. WL | | |
|---|---|---|
| Voltage State | WL | SL |
| P0 out of P1~P3 | 0.5V | 0V |
| P0~P1 out of P2~P3 | 1.5V | 0V |
| P3 out P0~P2 | 2.5V | 0V |

| MLC Read Operation of Boundary WLn+3 wrt. WLn+4 @ E-State | | |
|---|---|---|
| Voltage / State | WL | SL |
| P0 out of P1~P3 | 0.5V | 0V |
| P0~P1 out of P2~P3 | 1.5V | 0V |
| P3 out P0~P2 | 2.5V | 0V |

Fig. 15C

| MLC Read Operation of Boundary WLn+3 wrt. WLn+4 @ P0~P3 state | | | | | |
|---|---|---|---|---|---|
| Voltage / State | WLn+3 | WLn+4 | | | |
| | | P0 | P1 | P2 | P3 |
| | | SL | SL | SL | SL |
| P0 out of P1~P3 | 0.8V | 0.25V | 0.14V | 0.07V | 0V |
| P0~P1 out of P2~P3 | 1.8V | 0.25V | 0.14V | 0.07V | 0V |
| P3 out P0~P2 | 2.8V | 0.25V | 0.14V | 0.07V | 0V |

Fig. 15D

NAND MEMORY ARRAY WITH BL-HIERARCHICAL STRUCTURE FOR CONCURRENT ALL-BL, ALL-THRESHOLD-STATE PROGRAM, AND ALTERNATIVE-WL PROGRAM, ODD/EVEN READ AND VERIFY OPERATIONS

1. CROSS-REFERENCES TO RELATED APPLICATIONS

This application claims priority to U.S. Provisional Application No. 62/027,694, filed Jul. 22, 2014, commonly assigned and incorporated by reference herein for all purposes.

This application is related to U.S. patent application Ser. No. 14/583,178, Ser. No. 14/487,078, Ser. No. 14/341,739, Ser. No. 14/316,936, and Ser. No. 14/283,209, incorporated by reference herein for all purposes.

This application is related to following U.S. Pat. Nos. 5,867,429; 6,542,407; 6,522,580; 6,781,877; 6,807,095; 6,847,553; 6,870,768; 6,888,758; 6,917,542; 7,046,548; 7,061,798; 7,102,924; 7,187,585; 7,196,928; 7,196,946; 7,196,928; 7,224,613; 7,289,344; 7,289,348; 7,301,808; 7,301,813; 7,301,839; 7,315,477; 7,321,510; 7,372,730; 7,397,698; 7,443,729; 7,499,329; 7,506,113; 7,522,454; 7,652,929; 7,876,611; 7,876,611; 8,036,041; 8,130,556; 8,274,823; 8,284,606; 8,284,613; 8,400,839; 8,570,810; 8,638,608; 8,705,293; 6,917,542; 7,839,690; 7,499,338; 6,657,891; 5,734,609; 8,503,230; 8,625,357; 8,654,585; 8,681,545; 8,665,649; 8,477,533; 7,023,735; 6,816,409; 8,661,294; 8,681,543; 8,675,416; 8,681,543; 8,694,720; 8,711,624; 8,755,224; 8,893,247; 8,625,359; 8,634,251; 8,654,588; 8,681,563; 8,730,733; 8,737,140; 8,773,911; 8,218,348; 7,499,329; 8,526,236; 8,400,826; 8,687,430; 8,687,431; 8,670,272; 8,630,115; 8,462,559; 8,705,277; 8,705,290; 8,700,879; 8,717,819; 8,773,910; 8,638,609; 8,644,081; 8,694,766; 8,711,621; 7,706,188; 8,675,410; and 8,711,621; incorporated by reference herein for all purposes.

2. BACKGROUND OF THE INVENTION

The present invention generally is directed to Non-volatile (NVM) NAND memory architecture design. In particular, this invention provides several novel $V_{SL}$-based NVM NAND concurrent design methods, aiming particularly to greatly improve read and write speed, power consumption and the data reliability of an extremely high-density NAND without changing the existing NAND cell and process technology.

Electrically erasable and programmable NAND, NOR, EEPROM and the likes are among the most popular NVMs. Particularly, NAND is extensively used with a big volume in cellular phones, digital cameras, personal digital assistants, mobile computing devices, tablet, SSD and desktop computers and other emerging wearable devices.

Typically, the mainstream 2D nLC NAND flash memories utilize a 2-poly NMOS memory cell with a floating gate that is provided above and insulated from a channel region in a triple-P-well within a deep-N-well on top of common P-substrate across the cell array region. The floating gate is made of a poly-silicon material (so-called poly1) and is positioned on top and between N-active source and drain regions. A control gate is made of another poly-silicon material (poly2) and provided over and insulated from the poly1 floating gate. The threshold voltage (Vtn) of each nLC flash cell is controlled by the amount of charges that are retained on the poly1 floating gate layer. In other words, a nLC cell's Vtn check means the minimum control gate voltage, e.g., $V_{WL}$ (Vg) voltage, that must be biased with respect to its source node voltage, Vs, to turn on the cell to allow the current conduction of $I_{DS}$ flowing between its drain (with voltage level at Vd) and source (with voltage level at Vs) to meet a condition of Vtn check equation of Vgs=Vg−Vs>Vtn or Vgs−Vtn>0. On the contrary, when the condition becomes Vgs−Vtn<0, then the selected flash cell would not conduct current. In other words, the cell is verified not in the current Vtn state, and it should be in Vtn+1 state, e.g., one or more high charge states with a larger Vtn.

Throughout this specification, a nLC NAND flash cell used to store two ranges of charges is referred as 1-bit, 2-state (Vtn, where n=1) SLC cell; to store four ranges of charges are referred as a 2-bit, 4-state (Vtn, where n=2) MLC cell; to store eight ranges are referred as a 3-bit, 8-state (Vtn, where n=3) TLC cell; and to further store the sixteen ranges of charges are referred as a 4-bit but 16-state (Vtn, where n=4) XLC cell. When a floating-gate of each NAND cell is used to store more than 16 ranges of charges such as 256 states (Vtn, where n=8) is referred as the 8-bit analog cell.

As a result, in a NAND nLC read or any verification operation, by determining which Vtn of a NAND cell conducts current at a given Vgs on WLn under a circumstance of no Yupin coupling interference between adjacent wordlines (WLs) and bit lines (BLs), then each Vtn of nLC (MLC or TLC) states of each accessed cell can be fully distinguished and determined. Note, the verification includes program-verify and erase-verify operations.

Unfortunately, a typical NAND array is usually formed in a very compact memory matrix to squeeze die size smaller. In All-bitline (ABL) or non-ABL NAND read and verification operations, a plurality of NAND cells with one cell per each string of one physically WLn are selected simultaneously. This means only one cell is read out from one long and compact NAND string that comprises a plurality of NAND cells being laid out in a highly tight 1-lambda (1λ) BL width and 1-lambda (1λ) spacing in X-direction and very tight 1λ WL width and 1λ spacing in Y-direction.

When NAND technology scaling comes to below 30 nm, or even down to 10 nm-class range, the floating-gate Vt interfering coupling effect becomes very severe between adjacent BLs and WLs. These are the well-known Yupin BL-BL or WL-WL cell coupling effects. The Yupin coupling effect will result in the nLC data reliability issue of unintentional errorus reading, which is undesired but in fact not avoidable.

For example, the typical NAND technology node of 30 nm, the degree of total Yupin coupling effect is less than 30% averagely between two adjacent WLs and two adjacent BLs. When it comes to 20 μm node, the degree of total Yupin coupling effect is increased to about 35% averagely. By extrapolation, the degree of total Yupin coupling effect will be further increased to a value more than 40% averagely if the isolation techniques do not get improved.

Typical NAND cell suffered Yupin coupling effect is referred as a "Victim cell or BLn cell in WLn", while the cells that generate Yupin coupling effects are referred as "Aggressor cell or two BLn−1 or BLn+1 cells in WLn or three BLn−1, BLn and BLn+1 cells in WLn−1 and WLn+1." Usually, one Victim cell is surrounded by eight Aggressor cells in 2D NAND array but twenty-six Aggressor cells in 3D NAND array.

Ultimately, in 2D NAND, each nLC Victim cell will be surrounded by eight Aggressor cells with $2^n$ possible Vtn values. In other words, the total combinations of Yupin coupling effect are 8×2". But if the Yupin coupling effects of four diagonal Aggressor cells are not significant and the WLn−1 cell's coupling effect being taken care during WLn program because WLn−1 is being programmed before WLn, then the combinations of major significant Yupin coupling effect can be reduced to 3×2" by three Aggressor cells such as two cells of BLn−1 and BLn+1 in WLn and one cell of BLn in WLn+1.

In summary, for both NAND read and verify operations, a cell's Vtn compensation to offset Yupin coupling effect to fix error-correcting code (ECC) errors is required.

Although in past years, there are plenty of Vtn compensation techniques being disclosed in prior art, all of them are more like the "Collective Vt-compensation" or "Pseudo Individual Vt-compensation (PIC)" solutions that rely on cell's $V_{WL}$-based or $V_{BL}$-based Vt-offset scheme. None of them are really based "Real Individual Vt-compensation (RIC)", which is referred as the $V_{SL}$-based Vt-offset compensation scheme by the present invention.

For example, in a conventional mainstream NAND memory block circuit of 2D array architecture, each NAND block typically is made of a plurality of NAND strings with their individual drain nodes being connected to a plurality of bit lines (BLs) which can be divided into Even BL group (BLe) and Odd BL group (BLo) with their source nodes being connected to one common source line (CSL). The gates of a plurality of NAND cells (plus some dummy cells) in each string are respectively connected to different WLs. Each NAND string includes one top big select NMOS transistor gated to a DSL line and one bottom big select NMOS transistor gated to a SSL line. Additionally, dummy cells and regular NAND cells are formed in series with these two select transistors. The dummy cells are formed at both ends of each string nearing the top and bottom big select transistors for the purpose to avoid gate-induced-drain-leakage (GIDL) effect that results in higher Vt of regular cells of top and bottom WLs.

In such NAND block structure, the tight 1λ-width and 1λ-spacing of all BLe and BLo are laid as metal lines at M1 level in parallel in Y-direction and are perpendicular to all CSLs laid as different metal lines at M0 level (M0 being lower than M1) in X-direction. There is no individual SL line formed for each individual BL for each NAND string.

A method of program and read nLC cells in this conventional NAND array is referred as ABL program and read, in which all nLC NAND cells in all strings in each selected physical WLn are programmed and read at same time as an advantage but at expense of 2-fold PB size. One bit of PB is connected to one corresponding bit of nLC cell formed in each physical WLn.

Another method of program and read based on above conventional NAND array is Odd/Even-BL or SBL (Shielded BL) read and program-verify. In this method, only one half of interleaving nLC cells of ½ of all BLs at each physical WLn of either Odd-BL group or Even-BL group are selectively programmed and read at same time with a benefit of just one-half PB size of the ABL method mentioned earlier. One bit of PB is connected to two bits of nLC cells of two BLs through one Odd/Even column decoder. However, this is not a perfect BL-shielding method as the BL-BL coupling effect still happens, causing penalties of 2-fold latency of read and program-verify operation, 2-fold Vpass and Vread WL gate disturbance to degrade P/E endurance cycle data reliability of NAND products, and 2-fold power consumption of read, program and verify due to 2 times of half-page size access operations. On the other hand, although the ABL method has superior nLC performance and reliability over the Odd/Even-BL approach but it has a penalty of 2× area size in PB.

In another example, U.S. Pat. No. 5,734,609 disclosed one non-mainstream paired 2D NAND string in which BL node of Even/Odd string is connected in a zigzag way to each corresponding SL node of next adjacent Odd/Even string. Two different metal lines are used for two adjacent BLs in parallel in Y-direction and are fully symmetrical in terms of layout and electric operations. There is no common horizontal SL metal line running in X-direction in each NAND block. Each NAND string is formed to have its individual BL and uses each physically adjacent BL as its individual SL. However, this still is not a perfect SBL scheme to guarantee BL-coupling free operation. Each NAND-string size is larger than the mainstream NAND-string of last example because one extra big 1-poly Depletion-type select transistor is added to the left string and another big Depletion-type NMOS select transistor is added to the right string respectively. These paired Depletion-type NMOS transistors form a pair of Odd and Even select transistors, which are laid out with a bigger channel length and size as the regular Enhancement-type transistor.

In yet another example, U.S. Pat. No. 8,695,943 disclosed a non-mainstream NAND scheme in which BL and SL lines are also laid out in parallel in Y-direction but not connected in a zigzag way between the drain and source nodes of two physically adjacent strings and no horizontal SLs are required. Again, each NAND-string size is formed larger than the one made of the mainstream NAND-string scheme by adding one extra big 2-poly floating-gate device in an even string and a similar big 2-poly floating-gate device in an odd string. Each of these added 2-poly floating-gate devices is laid out with the same big channel length as 1-poly enhancement-type select transistor. The read and verify operations of this NAND string is pretty much same as the last example but with disadvantages of requiring additional erase, program and verification on these large select transistors. Both interleaving BL and SL lines are formed with only one metal layer. As a result, the BL-BL coupling cannot be avoided and the quality and yield of the preferred ABL nLC program would be highly jeopardized.

In yet still another example, U.S. Pat. No. 7,499,329 disclosed another non-mainstream NAND array in which both BL and SL are also laid out in parallel in Y-direction and connected in a zigzag way between the drain and source nodes of two physically adjacent paired strings and each BL line is shared by one paired Odd and Even strings by the proper logic selection of SELECT lines. Both BL and SL lines are formed interleavingly with only one tight-pitch metal layer. Again, the disadvantage of this array is that two extra large 1-poly Enhancement-type select transistors have to be added to each paired strings. As a result, there is no perfect SBL effect and the BL-BL coupling cannot be avoided and the quality and yield of the preferred ABL nLC program would be highly jeopardized.

In summary, there is a strong need to improve NAND array architecture without using extra large string-select transistors or any sort and having a plurality of separate BL and SL lines in parallel without any common SL in the selected NAND block by using adjacent BL as an individual SL biased with an individual $V_{SL}$ to allow the preferred $V_{SL}$-based Vt-compensation to be implemented. Further, it is desired to have a Fine program and an alternating-WL program applied together with the $V_{SL}$-offset mixed scheme have to be used to make a final narrow-Vt program states for more reliable read and verification. As the results, the improvement should allow batch-based multiple All-BL (ABL) and All-Vtn-Program (AnP) program, read, and verify operations to be performed in a same NAND plane for dramatic reduction of latency and power consumption and number of row-decoders and PB needed so that less errorus reading can be achieved without need of sophisticate ECC schemes and algorithms for less Read latency and power consumption.

3. BRIEF SUMMARY OF THE INVENTION

The present invention provides several novel $V_{SL}$-based non-volatile NAND concurrent design methods, aiming particularly to greatly improve read and write speed, power consumption and the data reliability of an extremely high-density NAND without changing the existing NAND cell and process technology.

The fundamental platform to support the preferred $V_{SL}$-based concurrent design methods is based on a new YUKAI scheme of NAND memory array comprising a plurality of BLs of at least two hierarchical levels and each BL being associated with one physically adjacent BL as a dedicated SL for corresponding string of transistors so that a preferred $V_{SL}$-based Vt-compensation can be implemented without any common local source lines (SLs) for superior and faster concurrent NAND operation.

There are many benefits of the YUKAI scheme of NAND memory array, regardless of advanced or less advanced nodes, regardless of 2D or 3D NAND manufacturing technology. But it would be more beneficial to those 10 nm-class nLC NAND designs that suffer more well-known Yupin WL-WL and BL-BL NAND cell Vt coupling effects. Here, the nLC becomes SLC when n=1, becomes MLC when n=2, becomes TLC when n=3 and lastly becomes XLC when n=4. Here the conventional definition is adopted, "n" of the present invention means n logic bits stored in one physical NAND cell. The higher value of n means the higher compression of logic data into one tiny physical NAND cell, thus lower bit cost and smaller NAND array size.

As will be explained in details subsequently and to be appreciated by those skilled in the ordinary art, the concurrent-operation circuit under the YUKAI scheme can be applied not only to NAND flash cells but also to those NVMs cells with substantial performance improvement in whole or part of specs whenever NVM cell technologies meet one criteria of using the identical extremely low-current FN-tunneling mechanism or the likes to perform both erase and program operations.

To the best of our knowledge, today's existing popular NVM designs that meet this YUKAI criteria include NAND, 2T Flotox-based EEPROM, NAND-based NOR, and NAND-based Flash designs, regardless of 2D or 3D manufacturing technologies, regardless of 1-poly charge-trapping SONOS or 2-poly floating gates flash cell structure, and regardless of PMOS or NMOS NAND cell and flash technology types. When a slow-read NAND using the YUKAI scheme, then the potential improvements include more than 10-fold latency reduction in the nLC Read, Program and Erase operations as well as substantial reduction of error bits so that the less sophisticated and expensive ECC algorithm and NAND flash controller can be used with a high successful yield.

But when a fast-read NOR or EEPROM designs using the YUKAI scheme, then the potential improvements include more than 10-fold latency reduction in the nLC program and erase operations as well as the 10-fold number reduction of erroneous bits so that the less sophisticated and expensive ECC algorithm and NAND flash controller can be used for cost reduction in system applications.

The Vt-shifts in the apparent charge stored on a NAND floating gate can occur because of coupling of an electric field based on the charge stored in adjacent floating gates of nLC cells such as SLC, MLC, TLC and XLC. This floating gate to floating gate coupling phenomena was first disclosed by Yupin Fong in U.S. Pat. No. 5,867,429, which is incorporated herein by reference in its entirety. The adjacent surrounding floating gates to a target floating gate of BLn in WLn may include two neighboring floating gates that are on the same bit line, BLn, but in WLn−1 and WLn+1, and another two neighboring floating gates of BLn−1 and BLn+1 cells, on the same word line, WLn. The Vt-shifts and widening induced by four diagonal nLC cells located in two different BLn−1 and BLn+1 and two different WLn−1 and WLn+1 are being treated as relatively minor, thus the Yupin coupling effects are eliminated or neglected from the present invention to simply the description of the inventive concepts of the present invention. Definitely, any significant Yupin coupling effects generated by these 4 diagonal nLC cells in 2D NAND flash can also apply the same techniques disclosed by the present invention herein.

The following descriptions will disclose how and what more benefits to build a preferred YUKAI NAND chip starting from building the basic YUKAI paired NAND strings, then expendably to build the preferred BL-hierarchical YUKAI NAND array with the plurality of segmented arrays with locally segmented power lines and pseudo CACHE registers, then the dramatic area-saving NAND peripheral circuits such as WL row-decoder, BL column-decoder, page buffer, etc.

In an embodiment, the preferred $V_{SL}$-based Vt-offset scheme of the present invention can truly comply with individual Vtn check criteria as defined to see if Vgs−Vtn>0 for every individual Victim cell, where Vgs=Vg−Vs (Vs=$V_{SL}$). Every individual source node voltage of each selected Victim cell is assigned with each corresponding individual $V_{SL}$ determined by three Vt-offsets of four Vtn states for WLn's program cells but would be four or more Vt-offsets for lockout WLn's erase cells.

A key reason of failing to perform $V_{SL}$-based Vt-offset scheme in prior art is that there is no way to assign an individual $V_{SL}$ voltage to each individual Victim cell in conventional mainstream NAND array architecture with all N-bit cells sharing one common SL and one common WLn. As such, all $V_{SL}$ of all N-bit cells are connected to one identical voltage, because physically all $V_{SL}$ nodes of all N-bit Victim cells are not separated. In addition, since all gates of N-bit NAND cells are also tied together to selected WLn, thus Vg is also identical for all N-bit cells in single WLn. Thus, Vgs=Vg−Vs are kept identical for all N-bit NAND cells in single WLn in the conventional NAND array architecture, regardless of 2D or 3D technology. When WLn's nLC data fails within the fixing capability of ECC of Flash controller, then WLn voltage is readjusted from n hard-decision values to n soft-decision values. This is called as the WL-based compensation scheme. In some prior art, the BLn−1's and BLn+1's data are read out from WLn to compensate BLn cell's Vtn in WLn. This is referred as a $V_{BL}$-based compensation. As a summary, all current NAND's Vt-compensation techniques dealing with Yupin coupling effects are either $V_{WL}$ or $V_{BL}$ based indirect offset techniques. In some other prior art, the Vt-compensation techniques use adjustable WLn−1 and WLn+1 Vread voltages to indirectly compensate the ΔVtn. Again, these techniques requires more readings on WLn−1 and WLn+1 and not effective to reduce the erroneous bits. In still some other prior art, compensation techniques are used for differentiating the highest coupling state (High Vtpn) from low coupling state (low Vtpn) to generate the detectable BL coupling effect for determining the degree of cell Vt-compensation induced only by large Vtn. Again, these techniques also have limitation to offer the truly individual Vtn compensation.

In summary, there is a strong need to develop a new NAND array architecture to allow direct individual $V_{SL}$ compensation so that less-erroneous reading can be achieved and non-sophisticate ECC scheme and algorithm can be used for less read-latency and lower power consumption. The new NAND array architecture has to provide a non-common SL but common WL to allow individual Vs assignment so that the Vtn-check criteria Vgs=Vg−Vs>0 can be applied directly on each individual selected cell. In other words, the new NAND array architecture needs to have a plurality of separate BL and SL lines and nodes in parallel without any common SL in the selected NAND block using the adjacent BL as an individual SL with an individual $V_{SL}$.

In order to fully and individually fix Yupin coupling effects, an objective of the present invention is to not completely rely on $V_{SL}$-compensation technique only because the total Yupin coupling effect for 10 nm-class NAND design could exceed 40%, which is too high exceeding Vdd to use $V_{BL}$-based Vt-offset scheme alone without creating any side-effects such as body-effect and punch-through of the accessed NAND cell in sensing design.

For example, total=$£\Sigma_{n=1}^{8}$ ΔVtn, where £ is a coupling ratio and each ΔVtn is the floating-gate and channel induced Vtn increase by each of 8 surrounding Aggressor cells in 2D NAND. For WLn's program cells, the Yupin coupling effect can be reduced to ΔVt total=$£\Sigma_{n=1}^{3}$ ΔVtn but for WLn's lockout erase cells, the Yupin coupling effect is more severe than the program cells with ΔVt total=$£\Sigma_{n=1}^{4}$ ΔVtn. Some extra minor Vtn shifts have to be added to ΔVt total if the nLC program is divided into x-pass sub-program, where x≥2 and the alternate-WL (Alt-WL) program scheme is used.

Assuming each £=10%, then ΔVt total=0.1 $\Sigma_{n=1}^{4}$ ΔVtn. For a lockout erase cell, the largest Vtemax increase will be dominated between the maximum Vt of the highest program state and most negative Vtemin state. Typically, Vtemin=−3V and Vtpnmax=3V, for a MLC cell. As such, then ΔVtn=(Vtpnmax−Vtemin)×0.1×4=[3V−(−3V)]×0.1×4=2.4V for erase locked out cells. But roughly, ΔVtn=(Vtpnmax−Vtemin)×0.1×3=[3V−(−3V)]×0.1×3=1.8V is for each nLC program cells. The Vt-shift values of either 2.4V or 1.8V is still too high to apply for using $V_{SL}$-based offset scheme. The goal of maximum $V_{SL}$ value is less than 0.4V for proper sensing circuit design without causing punch-through and body-effect to the flash cells.

Therefore, a Fine program and an alternating-WL program and the $V_{SL}$-offset mixed scheme have to be used to make a final narrow-Vt program states for more reliable read and verification.

There are many optimal techniques to control the above goal of Vs≤0.4V of this preferred YUKAI $V_{SL}$-based Vt-offset scheme by combining $V_{WL}$-based and ABL-based offset scheme to reduce the required larger $V_{SL}$ from above 0.4V to below 0.4V. More details will be explained thereafter of this description.

Other embodiments of the present application include many on-chip pseudo CACHE registers made of a plurality of N short local bit lines (LBLs) or capacitors without taking extra silicon areas to allow Batch-based multiple ABL and All-Vtn-Program (AnP) program, read, and verify operations to be performed in same NAND plane for dramatic power and latency reduction, number of row-decoders and page buffers (PBs) are also greatly reduced. More details would be explained in subsequent pages of the present invention.

For example four MLC program states would be programmed simultaneously from one initial negative erase state by this preferred YUKAI array and scheme of the present invention. The lowest program state is used to narrow down the Vt-width of the conventional erase state. In this YUKAI nLC array, every final nLC state is preferred to be a narrow program state, regardless of positive or negative Vtn. For a SLC cell, there are 2 program states, and 4 program states for a MLC cell, 8 program states for a TLC cell, and 16 program states for a XLC cell of the present invention.

Although particular embodiments of YUKAI NAND cell strings, hierarchical-BL cell arrays, decoders, flows, methodology, and associated $V_{SL}$-based Vt-compensation techniques are described herein below, other derivatives, modifications, and changes from the present invention will be apparent to those of ordinary skill in the art and should be covered by this invention.

In the following summarized embodiments of the present invention, the reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments to capture the foundations of the following claimed objectives. Other embodiments may be utilized and structural, logical, and electrical changes may be made without departing from the scope of the present disclosure. The following detailed objectives, embodiments and descriptions, therefore, not to be taken in a limitation sense.

A plurality of embodiments of present inventions is organized in a manner as summarized below.

A first embodiment of the present invention is related to a YUKAI NAND array circuit comprising a paired NAND string in which each BL associated with one string uses another BL of one adjacent string as a dedicated SL without any common SL line in each NAND block. The NAND cells and string-select transistor in the circuits are completely the same as conventional transistors without any cell process and layout changes.

In other words, in the YUKAI NAND array, each separate BL for one string also works as a separate SL for next physically adjacent string as a paired NAND string so that no more common SL is used. Besides, each NAND string does not need an extra large string-select transistor in conventional NAND circuit. Instead, a pair of dummy NAND cells is used to enable selection of Odd-numbered string and Even-numbered string by using complementary programmed Vts so that each string can be made small.

As opposed to the conventional similar zigzag NAND arrays, a pair of small dummy cells is programmed with complementary Vts to work as a pair of Odd and Even string-select transistors. As a result, an extra big string-select transistor added in each conventional NAND string can be removed so that the size of zigzag NAND string can be reduced without any area overhead.

In a specific embodiment, each string of the YUKAI NAND array of the present invention is a n-cell string comprising following features:

a) A fully symmetrical structure from each string drain node to each string source node in terms of cell and select transistor layout and electrical operation;
b) Two dummy cells with same sizes of top and bottom select transistors coupled in series with the regular cells but used as programmable Odd/Even-BL-select transistors;
c) The two dummy cells being programmed with two complementary Vts (Vte and Vtp) so that the desired Odd/Even-BL-select function can be implemented with a paired small NAND cell as the regular one;
d) Dummy cell placements includes the following options:
   i) At least one of the two dummy cells is preferably placed in the middle to divide each YUKAI K-cell string to a top K/2-cell sub-string and a bottom K/2-cell sub-string.
   ii) The two dummy cells are inserted together in the middle of the string.
   iii) A first dummy cell is placed in the middle, and a second dummy cell is placed at one end of each string.
   iv) Three dummy cells are used with two of them being placed at both ends of each string used as the Odd/Even-BL select transistors and the third one being placed in the middle of each string with $E^0$ state cells only.
e) The drain connections of Odd/Even NAND strings cross-connected to the source connections of Even/Odd strings. In other words, one metal line is connected in a zigzag way to separate drain and source nodes of two physically adjacent strings. Each BL uses the adjacent BL line as a dedicated SL.
f) No requirement of any common SL in X-direction (perpendicular to BL in Y-direction).

In a specific embodiment, each YUKAI NAND paired string includes K cells connected in series with two string-select transistors and two dummy small cells working as Odd/Even string-select transistors, where K=8, 16, 32, 64, 128, 256 or any integer number. In this specification, K=128 is used for convenience.

Several 2D YUKAI NAND strings are disclosed in FIGS. 1A-1C with a common scheme by using one pair of small dummy cells for Odd/Even-BL select function. Of course, these are merely examples, more variations or derivatives of the YUKAI NAND strings can be realized by those of ordinary skill in art and are still covered by the present invention.

In a second embodiment, the present invention provides a YUKAI NAND array formed with a plurality of HGs, MGs, and LGs capacitors by using m-level hierarchical broken GBL and broken LBL metal line structures and their associated decoders PB or real CACHE (RCACHE) registers and preferred sets of biased conditions with a plurality of pseudo CACHE registers (PCACHE) for key NAND array operations as listed above, where m>2 is an integer.

In a specific embodiment, a preferred m value is m=2, depending on the design applications. A larger m value results in a higher BL-hierarchical cell array with a disadvantage of using more costly BL metal layers but compensated by one advantage of providing more flexible and higher array utilization by many added new concurrent operations in same and different NAND planes. The definition of the m-level BL hierarchical structure of YUKAI NAND array is summarized below:

a) The 1-level BL-hierarchical NAND structure includes all vertical BLs in same M1 layer and a common horizontal SL in M0 layer below the M1 layer.
b) The 2-level BL-hierarchical NAND structure includes two interleaving sets of Odd/Even local-BLs (LBLs) alternatively being used as local-SLs (LSLs) at M1-level (and crossed to M2-level), aligned in Y-direction (i.e., column direction) with a tight pitch for a full BL-shielding over coupling effect, plus additional Global-BLs (GBLs) at a second and higher M3-level with a loose pitch.

In a third embodiment, the present invention discloses a first option of the 2-level hierarchical BL structure of a YUKAI NAND array with J M3-level broken-GBL lines and two interleaving M2/M1-level broken-LBL lines per each long column for performing preferred batch-based low-power and fast NAND operations, J being an integer. Each piecewise GBL line at M3 level represents one $C_{Column}$ capacitor being divided into J shorter M3 broken-GBL line capacitors, $C_{HG}$, by using J−1 broken-GBL-divided device, MGBL, as defined below. Similarly, each broken-GBL line capacitor $C_{HG}$, corresponding to a HG NAND cell group, is further connected to L shorter line capacitors $C_{MG}$s corresponding to L MG NAND cell groups. Each $C_{MG}$ is made by the piecewise LBL line at M1/M2-level, which is further divided by J'−1 broken-LBL-divided device MLBL to form J' even shorter line capacitors $C_{LG}$s corresponding to J' LG NAND cell groups and each LG group comprises H NAND cell blocks and each block comprises of a plurality of NAND cell strings without using a common horizontal SLs.

In summary, the metal line length ratio between HG, MG, and LG groups are defined as $C_{Column}=J\times C_{HG}=J\times(L\times C_{MG})=J\times[L\times C_{LG})]=J\times L\times J'\times C_{LG}$, where $C_{Column}$ stands for whole length or capacitance of each long column across J HG groups. The definition of the broken group structure of the YUKAI NAND array is summarized below:

a) The preferred J values: J=8, 16 or any integer number below, depending on the desired memory array design specs and application.
b) The preferred L values: L=4, 8 or any integer number below 8, depending on the memory array desired design specs. It is preferred to set J×L≤32 for appropriate charge-sharing (CS) operation between each $C_{MG}$ and each $C_{Column}=J\times C_{HG}$. The rule of thumb is to use a bigger $C_{MG}$ for CS during read, erase-verify, and program-verify to get a less-diluted optimal analog sensing from cell for sense amplifier (SA).
c) The preferred J' values: J'=4, 8 or any integer number below 8, depending on the memory array desired design specs. The thumb of rule is to use a smaller $C_{LG}$ for program operation to save precharge program current because program operation involves no CS step.
d) Two preferred MGBL and MLBL devices for dividing/connecting broken-GBLs and broken-LBLs: I) 1-poly NMOS device like the string-select transistors MS and MG but with preferred device spec of BVDS such as BVDS≥7V. II) 2-poly NMOS device like NAND cell but channel length>1λ to sustain larger Vds=7V than a regular NAND cell with 1λ, channel length. In certain embodiments, 1-poly MGBL and MLBL devices are used for design simplicity.
e) The NAND memory is divided into J HG groups. The length of each broken-GBL line capacitor at M3-level is referred as one $C_{HG}$, can be flexibly made equal or unequal, depending on specs. All broken $C_{HG}$ capacitors are preferably made of one identical metal line at M3-level only with a relaxed 4λ-pitch that is equal to line width plus line spacing. There are many combinations of width and spacing as long as to make 4λ pitch.

f) Each $C_{HG}=L\times C_{MG}$, where $C_{MG}$ is a lower-level interleaving J' broken-LBLs with Odd-LBL at M2-level and Even-LBL at M1-level with a tight 2λ-pitch in YUKAI array. Each M2 line with 2λ-pitch is equal to M2 line width (1λ) plus M2 line spacing (1λ) and similarly each M1 2λ-pitch is equal to M1 line width (1λ) plus M1 line spacing (1λ). Although only single M1 of 2λ-pitch can be used for all LBLs but one preferred option is to use the interleaving 2λ-pitch M1 and 2λ-pitch M2 as explained above for a full LBL shielding protection for a N-bit ABL program with a N/2-bit or N/4-bit PB of N-bit per one physical WL NAND array.

g) Each $C_{MG}=J'\times C_{LG}$, where $C_{LG}$ is a lower-level interleaving M2/M1 LBL line capacitor with a tight 2λ-pitch in YUKAI array. Each M2 2λ-pitch is equal to M2 line width (1λ) plus M2 line spacing (1λ) and similarly each M1 2λ-pitch is equal to M1 line width (1λ) plus M1 line spacing (1λ).

In a specific embodiment, the size or length of each local LG and MG broken metal lines can be flexibly made equal or unequal, depending on specs but equal broken length is preferred for design simplicity. All $C_{LG}$ broken metal lines are preferably made by two interleaving 2λ-pitch M1 and 2λ-pitch M2 layers with same 1λ-width and 1λ-spacing for a full LBL shielding protection for performing ABL program but Odd/Even-BL verify and read operations.

In a fourth embodiment, the present invention provides a second option of the 2-level hierarchical BL structure of a YUKAI NAND array with each column capacitor $C_{Column}$ (associated with a GBL at M3-level) being divided to J broken HG groups respectively associated with J $C_{HG}$ capacitors (associated with a broken-GBL) and each $C_{HG}$ being divided to L broken $C_{MG}$ but each $C_{MG}$ (associated with a LBL) without any broken $C_{LG}$ (i.e. without broken LBLs), without. In this case, the length of $C_{MG}=C_{LG}$. For NAND program, program-verify, and read operations the same length and magnitude of $C_{MG}$ capacitor are used. With $C_{LG}$ being eliminated the capacitor value for both MLC program operation and read operation is united with a same precharge current.

In a fifth embodiment, the present invention provides a third option of the 2-level hierarchical BL structure of a YUKAI NAND array with each column capacitor $C_{Column}$ being made by one long M3-level GBL but kept with J HG group without any broken GBLs, each HG group being divided to L MGs (associated with LBLs) without LGs (without broken-LBLs).

In a sixth embodiment, the present invention discloses several 4λ-pitch options of top-level M3 GBLs layout in the YUKAI NAND array wherein the 4λ-pitch of M3-level GBL is a sum of a line width and a line spacing if N/2-bit page buffer (PB) is used for N-bit per one physical WL, including following variations:

I. 4λ M3-pitch=1λ M3-width+3λ M3-spacing,
  II. 4λ M3-pitch=1.3λ M3-width+2.7λ M3-spacing,
  III. 4λ M3-pitch=1.5λ M3-width+2.5λ M3-spacing,
  IV. 4λ M3-pitch=2λ M3-width+2λ M3-spacing.

Other M3 metal line layout options are possible but are omitted herein for description simplicity.

In a seventh embodiment, the present invention discloses a $M_2/1$ connection between broken-GBL metal lines of the YUKAI NAND array to PB's isolation device without using any extra metal lines. The $M_2/1$ connection means $M_2$ broken-GBL lines are connected to only one 20V isolation (ISO) device via a median HV (BVDS>7V) $M_2/1$-column decoder combined with MS and MG string-select transistors of smaller size like 7V formed within a same triple-P-well and deep-N-well of the array, rather than any big 20V device formed outside the array deep-N-well. As a result, the number of total 20V ISO NMOS devices is reduced by $M_2$ fold.

In an eighth embodiment, the present invention discloses an output of each $M_2/1$ line being directly connected to one corresponding PB without using any extra metal lines. As a result, the number of PB used can be reduced by $M_2$ fold in the YUKAI NAND array of the present invention comparing to the conventional array.

In a ninth embodiment, the present invention discloses the adjustable capacitor size for 1-bit PCACHE register in accordance with different NAND operations. For example, when one big piecewise $C_{MG}$ is used for storing 1-bit cell's sensed analog data from the array for read or erase-verify and program-verify or 1-bit MLC data from I/O for program, then this is referred as a big PCACHE bit. In this case, all corresponding J' small $C_{LG}$ capacitors have to be connected together to form one big $C_{MG}$ capacitor. But when one small $C_{LG}$ is used for storing 1-bit $V_{LBL}$ analog program voltage or Vinh program-inhibit voltage of the MLC data, then this is referred as a small PCACHE bit. In this case, all corresponding J' $C_{LG}$ capacitors are isolated.

In summary, each capacitor size of 1-bit PCACHE is flexibly defined in accordance with the desired magnitude of capacitance of specific operations. The N-bit PCACHE register is defined as N-bit of 1-page PCACHE register.

In a tenth embodiment, the present invention discloses the required pages of $C_{MG}$ versus nLC program for temporary storage in NAND operations associated with the YUKAI NAND array:

a) For a SLC program, at least two pages of large $C_{MG}$ of PCACHE registers are required with a first $C_{MG}$ page being used to store one logic-page data loaded from I/O and a second $C_{MG}$ page being used to store one logic page of an iterative MLC program-verify data read from one physical WL's cells.

b) For a MLC program, at least four pages of $C_{MG}$ are required with first two $C_{MG}$ pages being used to store two MLC logic-page data (MSB page and LSB page) loaded from I/O and rest two $C_{MG}$ pages being used to store two logic pages of a MLC iterative program-verify data read from one physical WL's cells.

In an eleventh embodiment, the present invention discloses a preferred method of using one small $C_{LG}$ page containing selected WLn of a selected block to store one final optimized MLC program page's voltage data that include four $V_{LBL}$ program voltages and one Vinh inhibit voltage being generated by a preferred 3-capacitor (3-cap) charge-sharing (CS) method involving three small $C_{LG}$ capacitors for reducing precharge current.

In a twelfth embodiment, the present invention discloses a method for connecting any two or more broken-LBL $C_{LG}$ capacitors to form a bigger $C_{LM}$ capacitor by turning on one or more LG-divided devices MLBL with their gates tied to respective control signals BLGs. When total J' adjacent $C_{LG}$ capacitors in same MG group are connected, then it forms a biggest $C_{LM}$, i.e., $C_{MG}=J'\times C_{LG}$.

In a thirteenth embodiment, the present invention discloses a method for using one short parasitic broken-LBL line as a 1-bit small $C_{LG}$ for 1-bit small PCACHE. A whole row of N 1-bit $C_{LG}$ would make one page of the N-bit PCACHE register with a least capacitance located within the YUKAI NAND array without taking extra die area to act as the temporary storage page buffer.

In a fourteenth embodiment, the present invention discloses the determination of each $C_{LG}$ size is a tradeoff of array size increase, $C_{LG}$ precharge-current consumption and the degree of flexibility of desired batch-based MLC concurrent operations allowed in same NAND plane. Particularly, one option of each $C_{LG}$ size is preferably comprised of H NAND blocks for limiting the array size increase less than 3%, where H=8. If array efficiency is ~70%, then NAND die size increase is controlled below 2% for adding this powerful batch-based concurrent ABL and AnP program as well all verify and read functions.

In a fifteenth embodiment, the present invention discloses a preferred method of using each defined $C_{LG}$ as a minimum concurrent operation unit with following setup:
 a) Each $C_{LG}$ comprises H blocks where H is an integer typically equal to 8.
 b) Besides H blocks, each $C_{LG}$ is associated with one LBL precharger circuit with one shared LBLps line for Vinh power-supply and discharge.
 c) Between any two adjacent small $C_{LG}$ capacitors, a LG-divided device MLBL can be turned on for a 3-cap CS operation or off for independent Vinh precharge with less power consumption.
 d) The 3-cap means three adjacent $C_{LG}$ capacitors are selected for performing the CS operation to obtain four optimal $V_{LBL}$ voltages and a Vinh voltage for concurrent ABL and AnP MLC program.

In a sixteenth embodiment, the present invention provides a method associated with the 3-cap CS technique to allow each broken-LBL capacitors $C_{LG}$ to be independently precharged with a predetermined voltage in accordance with a pre-calculated value so that the four optimal $V_{LBL}$ voltages and a Vinh voltage can be obtained in three connected $C_{LG}$ capacitors by a simple CS operation. The final values of four optimal $V_{LBL}$ voltages and one Vinh voltage are only kept in one selected $C_{LG}$ page that contains single selected WLn within the selected block.

In a seventeenth embodiment, the present invention provides further details of the method associated with the 3-cap CS technique to form each selected n $V_{LBL}$ voltages for ABL and AnP nLC program in each selected WLn. The four $V_{LBL}$ values can be set to be larger than Vss and even larger than Vdd but below a HV Vinh, e.g. Vss≤$V_{LBLn}$<Vinh, where Vinh ~7V is substantially the source-drain breakdown voltage (BVDS) of a NMOS 1-poly device as a string-select transistor MS or MG.

The guidelines of the above preferred $V_{LBLn}$ are being set up without using any $V_{GBLn}$ higher than Vdd to save power consumption for a MLC program and program-verify setup condition with $V_{LBLn}$>Vdd under a condition of $V_{GBLn}$≤Vdd to allow the use of a LV PB. With charge-sharing, the final $V_{LBLn}$=1/j$\Sigma_j$Vjn and j physical rows or pages of varied $C_{LG}$. For 3-cap CS operation, j=3 and Vss≤Vjn≤Vinh and Vinh maximum is ~7V.

In an eighteenth embodiment, the present invention provides a method of using n×M dispersed $C_{LG}$ pages in n×M dispersed PCACHE registers to temporarily store n×M pages of MLC data to allow a batch-based concurrent ABL, AnP, and Alt-WL nLC program on M dispersedly selected WLn, where n=1 for SLC, n=2 for MLC, n=3 for TCL, and n=4 for XLC. In a specific embodiment, n×M dispersed $C_{LG}$ pages are preferably selected randomly from one or more $C_{MG}$ within one or more $C_{HG}$.

In a nineteenth embodiment, the present invention provides a method of precharging n×M pages of $C_{LG}$ capacitors with Vinh and other desired voltages from selected LBLps lines at the same time or individually precharged at different cycle times to cut the precharge time. After MLC program, all $C_{LG}$ capacitors can be discharged at the same time by coupling LBLps lines to Vss or other values that are required for desired $V_{SL}$ common or individual values. Note, common $V_{SL}$ means no individual $V_{SL}$-based Vt-compensation is used. For a common $V_{SL}$ is used mainly when the individual $V_{SL}$-based Vt-compensation is not needed but the same Vt-shift for all N-bit cells in the selected M WLn is required, particularly when a negative cell Vt is under erase-verify or program-verify.

In a twentieth embodiment, the present invention discloses five preferred charge-sharing (CS) techniques to be flexibly performed between different capacitors or PCACHE registers as defined below:
 a) A first CS technique is performed between two or more up to J adjacent $C_{MG}$ capacitors in J MGs within each $C_{HG}$ associated with a $C_{Column}$ in Y-direction. This can be easily implemented by turning on desired number of HG-divided devices MGBL. This is one of fast-RC CS techniques because it is not via any NAND string that has few mega-ohms resistance. Here for each MGBL device, R is small if its gate is coupled to Vread as MG and MS bias condition. Note: each $C_{HG}$ is each piecewise unit of broken-GBL capacitor $C_{GBL}$.
 b) A second CS technique is performed between two or more up to J adjacent $C_{LG}$ capacitors in J LGs within each $C_{MG}$ in Y-direction. This can be easily implemented by turning on desired number of LG-divided devices MLBL. This is also one of a fast-RC CS technique because it is not performed via any NAND string that has few mega-ohms resistance. Here for each MLBL device, R is also small if its gate is coupled to Vread as MG and MS bias condition. Note: each $C_{LG}$ is each piecewise unit of broken-LBL capacitor $C_{LBL}$.
 c) A third CS technique is performed between each $C_{HG}$ and its corresponding $C_{LG}$ in Y-direction. This can be easily implemented by turning on corresponding MG Y-pass circuit and the desired number of LG-divided devices MLBL to connect the each broken-GBL $C_{HG}$ capacitor and a plurality of corresponding broken-LBL $C_{LG}$ capacitors in Y-direction. The number of broken-LBL $C_{LG}$ capacitors to be connected is subject to desired CS signal strength. This is also a fast-RC CS technique because it is not performed via any NAND string that has few mega-ohms resistance.
 d) A fourth CS technique is performed between each paired Even and Odd $C_{LG}$ capacitors (i.e., $C_{LBLe}$ and $C_{LBLo}$) of adjacent Even and Odd broken-LBLs in X-direction. This type of CS process is very slow as compared to above three CS methods because it is performed by turning-on two adjacent paired Even-Odd NAND strings that have few mega-ohms resistance.
 e) A fifth CS technique is performed between each paired Odd $C_{Column}$ and Even $C_{Column}$. This is also one of fast CS operation.

In a twenty-first embodiment, the present invention discloses a variety of types of data can be respectively stored in each bit of corresponding $C_{LG}$ and $C_{MG}$ types of PCACHE register shown below:
 1) Local ABL (N-bit) and AnP nLC program page data concurrently stored in one page N-bit $C_{LG}$ PCACHE registers with Vinh/Vss and $V_{LBL}$/Vss voltage conversion for superior program-inhibit:
  a) SLC (n=1): Only one page of program data to be stored in one page N-bit $C_{LG}$ PCACHE registers.

b) MLC (n=2): Two pages of program data to be stored in two pages N-bit $C_{LG}$ PCACHE registers.
c) TLC (n=3): Three pages of program data to be stored in three pages N-bit $C_{LG}$ PCACHE registers.
d) XLC (n=4): Four pages of program data to be stored in four pages N-bit $C_{LG}$ PCACHE registers.

2) Local ABL (N-bit) nLC program-verify Vinh-precharged data concurrently stored in N-bit $C_{MG}$ PCACHE registers.
3) Local ½-ABL (N/2-bit, Odd/Even-BL) iterative nLC program-verify data concurrently stored in N-bit $C_{MG}$ PCACHE registers with preferred Vinh/Vdd and $V_{LBL}$/Vss voltage conversion for a superior CS operation.
4) Local ½-ABL (N/2-bit, Odd/Even-BL) iterative concurrent nLC erase-verify data concurrently stored in each N-bit $C_{MG}$ PCACHE register with preferred Vinh/Vdd and $V_{LBL}$/Vss voltage conversion for a superior CS operation.
5) Local ½-ABL (N/2-bit, Odd/Even-BL) nLC read data concurrently stored in each N-bit $C_{MG}$ PCACHE register, with the preferred Vinh/Vdd and $V_{LBL}$/Vss voltage conversion for superior CS operation. Note: $C_{MG}=J'\times C_{LG}$.

In a twenty-second embodiment, the present invention discloses a method of concurrent erase operation that can be flexibly performed on the following options:
a) Randomly selected X number of full blocks, where X≥1.
b) Randomly selected Y number of pages or WLs per partial block, where Y≥1.
c) Randomly selected a mix of X number of full blocks with Y number of pages in partial blocks.

In a twenty-third embodiment, the present invention discloses an alternative method of concurrent erase operation among regular NAND cells and dummy cells in the same strings and blocks but with different erase-verify bias conditions because each dummy cell is preferably performed with a SLC-program, while the regular cell is preferably performed with a true MLC-program. Thus the two kinds of cells are associated with two different target program Vts, thus two different erase-verify voltages would be better to optimize each NAND block cells.

In a twenty-fourth embodiment, the present invention discloses a method of 3-step concurrent iterative erase-verify on both regular and dummy cells in the selected blocks. The three steps include a $C_{MG}$ precharge step, a $C_{MG}$ discharge and retaining step, and a charge-sharing step for SA's evaluation to determine pass or failure of the erase operation.

In a twenty-fifth embodiment, the present invention discloses a method for programming one pair of regular-like dummy cells in each Even string into 2-complementary SLC Vts states without overheads to each string size. Conversely, another one pair of dummy cells in each Odd string is preferably programmed into a reversed 2-complementary SLC Vts states. With these two pairs of dummy cells being programmed with 2 SLC Vts, then the Odd/Even LBL-select function can be formed to replace the extra big conventional Odd/Even string-select transistors. As a result, each paired Odd/Even string can be logically differentiated by one pair of dummy WLs such as $DWL^1 1$ and $DWL^1 2$ to keep each string length unchanged. More details are explained below.

The dummy cells are preferably divided into Odd and Even ones for respective Odd and Even NAND strings. The erase-Vt is referred as Vte, while the program-Vt is referred as Vtp. Two complementary Vt assignments are shown below:

a) One positive Vtp and one negative Vte: For example, Vte<0V and 2V≤Vtp≤3V. The minimum Vt gape of Vtp−Vte≥2V is preferred.
b) Both positive Vte and Vtp: For example, Vte≤1V and 3V≤Vtp≤4V. The Vt gape still keeps Vtp−Vte=2V.

In a twenty-sixth embodiment, the present invention discloses a batch-based program for dummy cells preferably performed before concurrent program for regular cells in the same strings and blocks but erase on the same time, particularly in first few iterative erase cycles to save erase time. Because both dummy cells and regular cells in multiple selected blocks are formed in the same triple-P-well (TPW) and deep-N-well (DNW), a $V_{TPW}$=20V of erase voltage is exerted on both dummy and regular cells on the same time for floating-gate based memory transistors in both 2D and 3D array structures. Thus, it is the advantage to perform erase on both kinds of cells simultaneously for saving erase time and power but with different erase-verify voltage of Vte⁰max.

In a twenty-seventh embodiment, the present invention discloses a $C_{LG}$-based iterative SLC-like program and program-verify method for dummy cell in respective Odd and Even strings before concurrent program of regular cells in the same strings and blocks.

The method includes following steps:
a) A first step, program N/2-bit of Even-BL $C_{LG}$=0V and N/2-bit of Odd-BL $C_{LG}$=Vinh if Even dummy cells in Even string of a first dummy WL are selected for a SLC-like program. After the program, an Even dummy cell program-verify is performed.
b) A second step, program N/2-bit of Odd $C_{LG}$=0V and N/2-bit of Even $C_{LG}$=Vinh if Odd dummy cells in Odd string of a second dummy WL are selected for a SLC-like program. After the program, an Odd dummy cell program-verify is performed.
c) Odd dummy cell can be programmed before Even dummy cells. But it is preferred the first Odd/Even dummy cells being programmed successfully before moving to program the second Even/Odd dummy cells.
d) Repeat above program steps to more Even/Odd dummy cells having the same dummy WL in different blocks simultaneously due to the same $V_{LBL}$ of 0V or Vinh to save dummy cell program time. But the two Even/Odd dummy cells in different dummy WLs in the same block cannot be performed. It has to be done on block-by-block basis.

In a twenty-eighth embodiment, the present invention discloses a method of determining four program-states with Vtpn for a MLC cell based on following factors:
a) The degree of each Yupin floating-gate coupling effect between adjacent BL-BL and WL-WL determined by the NAND string coupling measurement results from the real NAND strings in NAND array.
b) The final required Vtpn-width and gap after coupling disturbances and storage types such as SLC, MLC, TLC, and XLC.
c) For higher coupling effect, more negative erase-Vt is required to meet a second program P1 state cell's Vt near 0V.

In a twenty-ninth embodiment, the present invention discloses a first batch-based ABL, AnP, and Alt-WL concurrent MLC program scheme for a non-boundary WL. The program scheme comprises at least a two-pass program including a 1st-pass (1P) of SLC-like 2-state interim program with two $V_{LBL}$s and one Vinh and a 2nd-pass (2P) of 4-state final MLC program with three $V_{LBL}$s and one Vinh if a third Fine program (FP) is not required for a reliable MLC read for those defined as the non-boundary WL cells by the present invention. As oppose to prior art, the desired $V_{LBL}$ values are assigned in accordance with Vt-differences between four final Vtpn and one required Vinh. Both $V_{LBL}$ and Vinh can be larger than Vdd for superior program and program-inhibit. The non-boundary WLn operation means that two adjacent WLs, WLn−1 and WLn+1, follow a same Alt-WL program scheme and sequence with MLC page data on the same time but in an preferred alternating-WL manner.

In a thirtieth embodiment, the present invention discloses a second batch-based ABL, AnP, and Alt-WL concurrent MLC program scheme for a boundary WL (such as WLn+3 or WLn+4). In this case, the boundary WLn+3 program operation depends on two different data status of adjacent WLn+4. When MLC page data of the WLn+4 cell is not ready, then a zero-pass (0P) program (like SLC-program) is performed on the WLn+4 cell before the WLn+3 cell is fully programmed with a final MLC page data by a 2nd-pass (2P) program. When MLC page data of the WLn+4 cell becomes ready (after the 0P program has been programmed previously), then the regular 1st-pass (1P) and 2P programs following previously-defined Alt-WL MLC program sequence are resumed on WLn+3, WLn+4, and the next WLn+5, and beyond.

In a thirty-first embodiment, the present invention discloses a method of performing Odd/Even-BL read operation based on the access WLn status. If the access WLn is a regular non-boundary WL, then a less Yupin coupling effect read can be performed without a $V_{SL}$-based individual Vt-compensation. Conversely, if the access WLn is a boundary WL like WLn+3, then a severe Yupin coupling effect happens. Thus a $V_{SL}$-based individual Vt-compensation is preferably performed for a more reliable MLC read. If Yupin coupling effect happens more severe, then the wordline voltage adjustment on the WLn along with individual $V_{SL}$-based Vt-compensation can be both used for a more reliable MLC read.

In a thirty-second embodiment, the present invention discloses program-inhibit voltages of Vinh supplied directly from those selected local LBLps power and discharge lines with less capacitance onto those selected LBL lines or $C_{LG}$, replacing a conventional way from the plurality of long GBL lines of $C_{HG}$ with a heavier parasitic capacitance. As a result, a superior program-inhibit and program with less power consumption can be achieved over prior art that uses error-prone Vpgm-coupling program-inhibit schemes such as SB, LSB, EASB and many others. The conventional program-inhibit voltage generations rely on one common Vpgm boosting-scheme from gate to floating channel of a cell with lower initial voltage of ~1V of Vdd-Vt when $V_{BL}$=Vdd. The boosting of cell's channel is subject to one uncertain channel capacitance determined by the N+/PWL boron concentration as well as one uncertain BL-BL coupling effect determined by MLC data and voltages placed in two adjacent BLs.

In certain embodiments of the present invention, the desired Vinh is not coupled from boosting WLn but is supplied in DC directly from the selected LBLps power lines to guarantee the initial non-boosted Vinh>>Vdd−Vt. When WLn is boosted to beyond Vinh up to ~10V, the channel voltage of the select cells would be increased and clamped at BVDS of string-select transistors MG or MS. As a result of using LBLps power lines to provide desired Vinh, all the uncertainty of BL concentration and BL-BL coupling effect are removed.

In a thirty-third embodiment, the present invention discloses a method to generate a first set and a second set of $V_{LBL}$ and Vinh voltages respectively for a coarse 1P program and a 2P program through a charge-sharing among three selected $C_{LG}$ capacitors and a Vinh/$V_{LBL}$ conversion as summarized below:

a) A low voltage (LV) page buffer (PB) generates four preferred program voltages $V_{LBL}$<Vdd-Vt for MLC program and one Vdd for program-inhibit in accordance with two target voltages for 1P interim SLC program and four target voltages for 2P's final MLC program data.

b) Multiple selected local LBLps decoders generate the preferred Vinh voltages to precharge multiple selected adjacent $C_{LG}$-based PCACHE capacitors.

c) Lastly, CS is performed to obtain the desired $V_{LBL}$ voltages and one Vinh voltage in three connected $C_{LG}$ capacitors to select one $C_{LG}$ for next ABL & AnP MLC program by disconnecting and discharging two other $C_{LG}$ capacitors from the selected $C_{LG}$.

In a thirty-fourth embodiment, the present invention provides a batch-based ABL, AnP, and Alt-WL M WLn concurrent iterative program scheme by simultaneously applying M sets of $V_{LBL}$ and Vinh voltages on M selected pages of $C_{LG}$ in arbitrarily selected dispersed blocks on one-page-per-block basis along with M sets of Vpgm, Vpass, SSL and GSL voltages, where M is a flexible integer. Since FN-tunneling operation consumes very little current in pA range per cell, thus the maximum value of M is >1 and only limited by the number of subsequent program-verify that can be practically performed.

In a thirty-fifth embodiment, the present invention provides a batch-based Odd/Even-BL M WLn concurrent MLC program-verify scheme, M being an integer >1, by simultaneously applying M sets of same program-verify voltage VR, Vread, $V_{DWL}$, $V_{LBL}$, and $V_{SL}$ voltage on M selected blocks and M selected PCACHEs in the YUKAI NAND array. The MLC program-verify schemes are divided into two categories shown below:

a) Using one common $V_{SL}$ for all selected MLC cells' source nodes in all M selected WLn.

b) Using four or less different $V_{SL}$ for all selected MLC cells' source nodes in accordance with different 1P SLC-like program and 2P MLC program target Vtpn in all M selected WLn.

In a thirty-sixth embodiment, the present invention discloses a method of $V_{LBL}$ generation for WLn cells of MLC type by taking into the consideration of M distinct $V_{LBL}$ compensations by reading M adjacent WLn+1's 4-Vtpn values without the individual $V_{SL}$-compensation for more accurate $V_{LBL}$ setting to avoid 4-state MLC over-programming without any early lockout due to Yupin BL-BL coupling effect.

In a thirty-seventh embodiment, the present invention discloses a batch-based ½-WLn Odd/Even-BL or Even/Odd-BL concurrent read operation by using a $V_{SL}$-based Vt-offset technique for reducing Yupin coupling effects. In certain embodiments, there are two options of complementary $V_{SL}$-based Vtn-offset methods between the preferred concurrent read and the concurrent program-verify operations summarized in Table 1.

TABLE 1

| Number of $V_{SL}$ values for Vtn-offset from adjacent WLs and BLs | Concurrent MLC each Vtn read | Concurrent MLC each Vtn program-verify |
|---|---|---|
| Option 1 | 1 | 4 |
| Option 2 | 4 | 1 |

Note:
Option 1 using one common $V_{SL}$ is more favorable than Option 2 for a fast read.

In a thirty-eighth embodiment, the present invention discloses a method of program-verify for the most negative Vtp0 states.
 a) Only Vtp0 state of 1P program is verified with $V_{SL}=V_{TPW}=V_{DNW}$ being set for source node of a selected string. Conversely, the drain node of the selected string is biased to obtain 0.5V higher than the $V_{SL}$ to avoid cell and cell-string punch-through and body-effect when deep negative erase-verify and program-verify voltages are required even under the lowest Vddmin=1.6V.
 b) The negative erase verify-voltage can extend below −2V and program-verify is below −0.5V to −2V.

In a thirty-ninth embodiment, the present invention discloses a method of concurrent 4-state MLC program by assigning maximum Vts of two 1P interim program states P0 and P2 far less than the highest Vts of two final program states P2 and P3 with a safe Vt margin to ensure no earlier lockout of BL-BL coupling effect during the whole course of 1P SLC-like interim program and final 2P MLC program for superior MLC read.

In a fortieth embodiment, the present invention further discloses a Y-pass circuit between a PB of R' kilobytes and the GBLs of NAND array with R kilobytes, where $R'=(\frac{1}{2}^k)R$ and k is an integer ≥0. Larger k will result in a smaller PB size for more overhead saving in silicon area. Some examples are summarized below:
 a) k=0, PB bits=one physical WL bits, thus Y-pass=0. No need of Y-pass transistors.
 b) k=1, PB bits=½ of one physical WL bits, thus Y-pass circuit=Odd/Even decoder.
 c) k=2, PB bits=¼ of one physical WL bits, thus Y-pass circuit=¼ Y-pass selection.
 d) k=3, PB bits=⅛ of one physical WL bits, thus Y-pass circuit=⅛ Y-pass selection.

In a forty-first embodiment, the present invention further discloses a PB circuit with a size of R kilobytes comprising a multiplier circuit to amplify each digital or analog data voltage stored in each corresponding $C_{LBL}$ in the selected YUKAI NAND segment, a DRAM-like sense amplifier circuit using charge-sharing technique to sense MLC data in accordance with Vtn, an analog circuit to generate $V_{LBLn}$<Vdd-Vt for ABL simultaneous program, a D/A converter circuit, an A/D converter circuit, and a real CACHE register circuit to store 2-bit MLC bit data.

4. BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 5A is a table showing preferred ABL, AnP, and Alt-WL program scheme and sequences of dummy program, 1st-pass SLC-like program, and 2nd-pass MLC program operations according to an embodiment of the present invention.

FIG. 5B is a table showing preferred ABL, AnP, and Alt-WL program scheme and sequences of 1st-pass SLC-like program and 2nd-pass MLC program operations according to another embodiment of the present invention.

FIG. 6I is a diagram showing a 4-state MLC Vt shifting and widening for cells with boundary WLn+3 in program operation when next adjacent cells with WLn+4 are programmed into P1 state from initial P0 state according to an embodiment of the present invention.

FIG. 7A is a diagram showing a set of $V_{LBL}$ program voltages and program-inhibit voltage of Vinh assigned for a 2-state SLC-like 1st-pass program of a MLC program operation according to an embodiment of the present invention.

FIG. 7B is a diagram showing a set of $V_{LBL}$ program voltages and program-inhibit voltage of Vinh assigned for a 2nd-pass MLC program operation according to an embodiment of the present invention.

FIG. 7C is a table showing generation of 4 desired $V_{LBL}$ voltages per each pass (1P or 2P) of ABL and AnP program without compensations from adjacent WL cell Vt coupling effect according to an embodiment of the present invention.

FIG. 7D is a table showing formation of 4 desired $V_{LBL}$ voltages per each pass (1P or 2P) of ABL and AnP program using charge-sharing without compensations from adjacent WL cell Vt coupling effect according to an embodiment of the present invention.

FIG. 7E is a table showing two preferred sets of program-verify voltages on WL and individual $V_{SL}$ Vt-offset voltages for respective 1st-pass SLC-like program and 2nd-pass MLC program cells according to an embodiment of the present invention.

FIG. 7F is a table showing three sets of VRn and $V_{SL}$ voltages for a preferred MLC read in non-boundary WLs (WLn−1∼WLn+2) of the present invention under the condition of adjacent WL cells being programmed with 1st-pass and 2nd-pass program operations according to an embodiment of the present invention.

FIG. 7G is a table showing three preferred VRn voltages on WLn+3 along with $V_{SL}$=0V without Vt-offset for boundary WLn+3 MLC read operation when WLn+4 cells are only in P0 program state according to an embodiment of the present invention.

FIG. 7H is a table showing three VRn voltages on boundary WLn+3 with three sets of four individual $V_{SL}$-compensations in accordance with four different MLC program states stored in adjacent WLn+4 cells according to an embodiment of the present invention.

FIG. 7I is a table showing three VRn voltages on non-boundary WLn with three sets of four individual $V_{SL}$-compensations in accordance with four different MLC program states stored in adjacent WLn+1 cells according to an embodiment of the present invention.

Figures 9D, 9E, 9F:
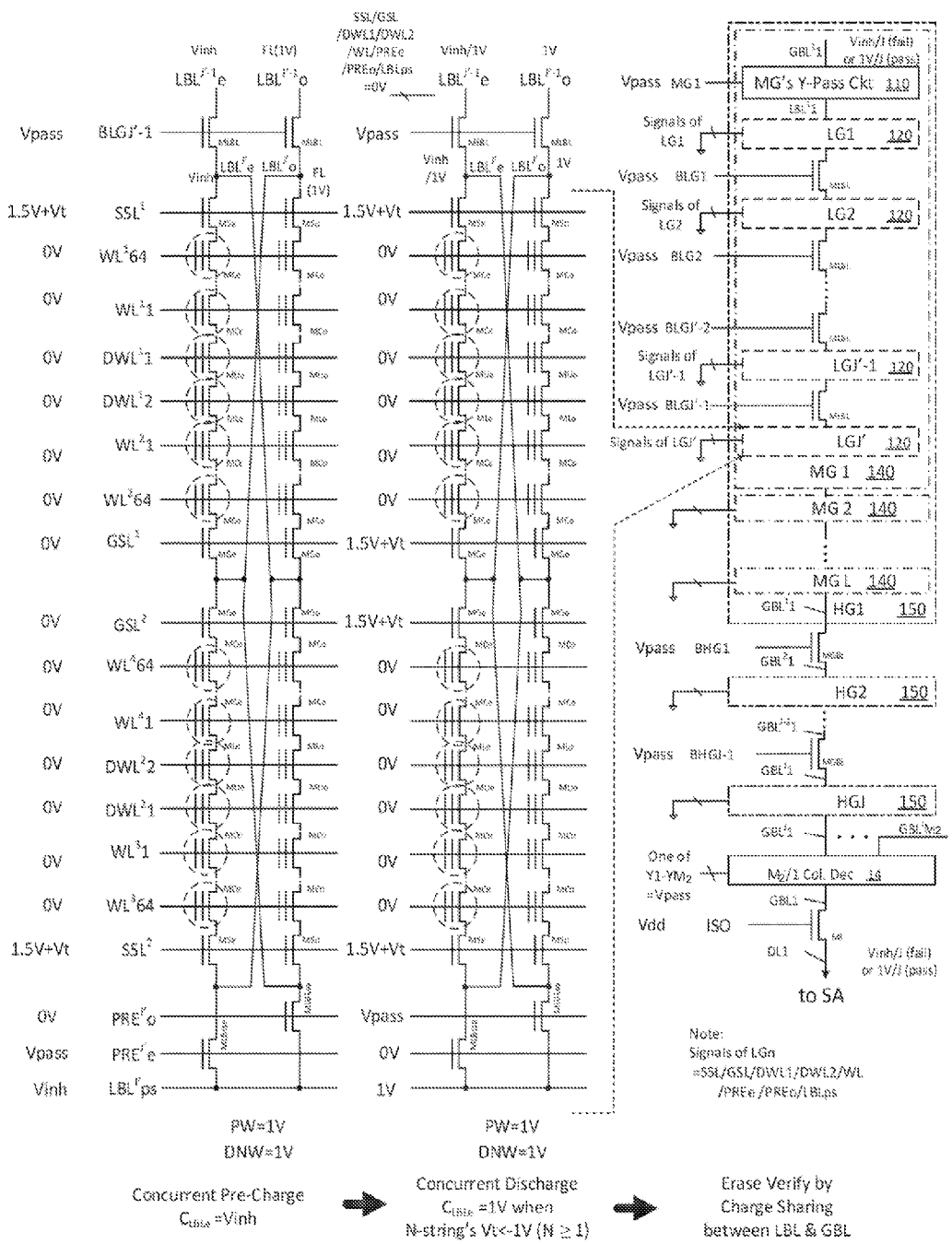
FIG. 9A is a diagram showing a preferred set of bias conditions for a multiple-block erase operation according to an embodiment of the present invention.
FIG. 9B and FIG. 9C are diagrams respectively showing preferred sets of bias conditions for performing two consecutive steps of a high voltage concurrent discharge operation after the multiple-block erase operation according to an embodiment of the present invention.

FIGS. 9D, 9E, and 9F are diagrams respectively showing preferred sets of bias conditions for performing consecutive three steps of erase-verify operation on either Even string cells or Odd string cells according to another embodiment of the present invention.

Figure 10A:
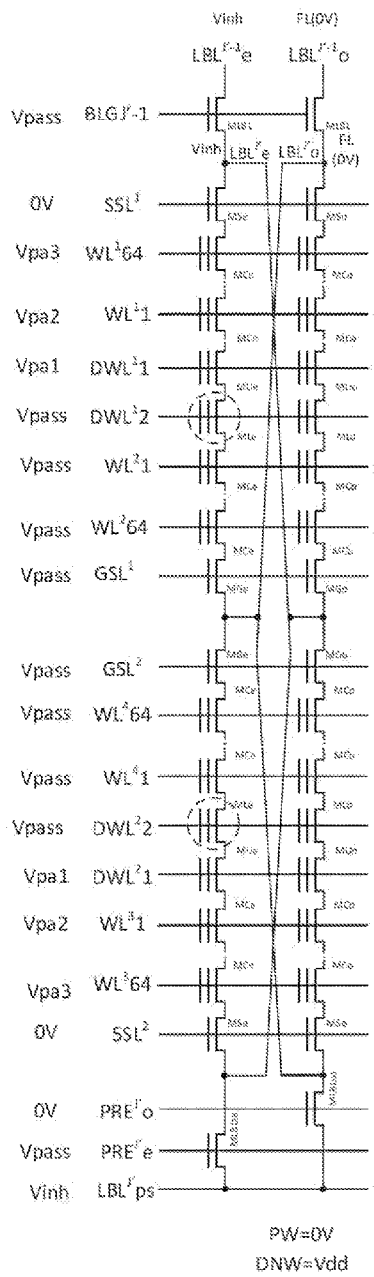
Figure 10B:
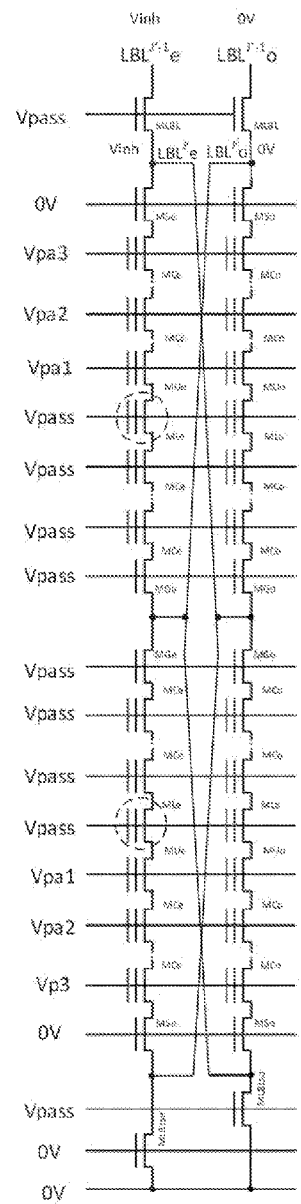
Figure 10C:
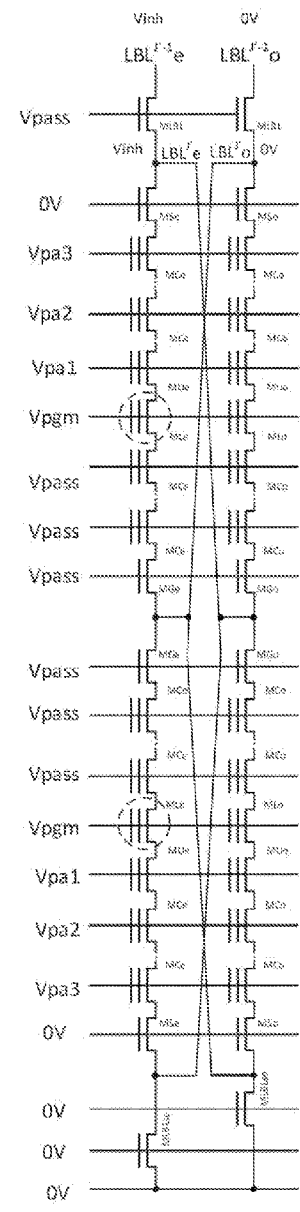

FIGS. 10A, 10B, and 10C are diagrams showing preferred sets of the bias conditions respectively for three steps of Even dummy-cell program operation according to an embodiment of the present invention.

Figure 10D:
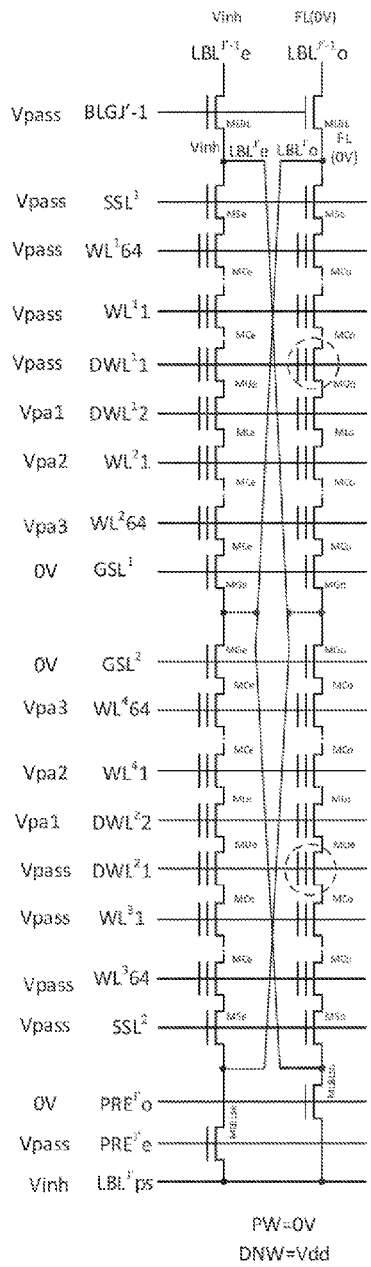
Figure 10E:
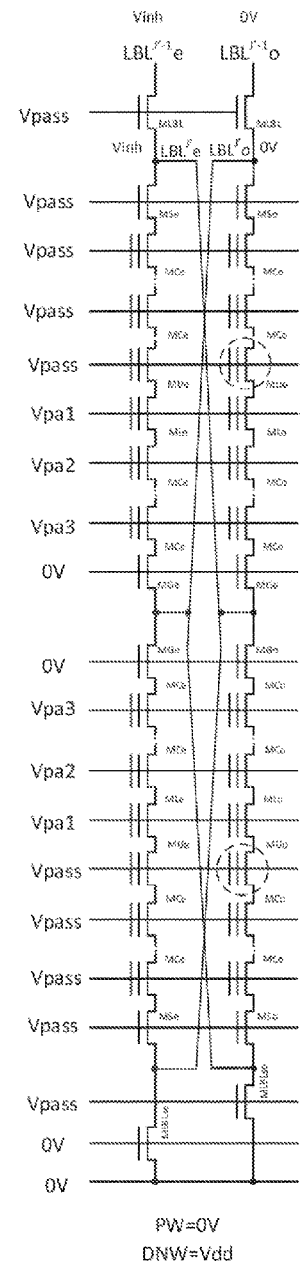
Figure 10F:
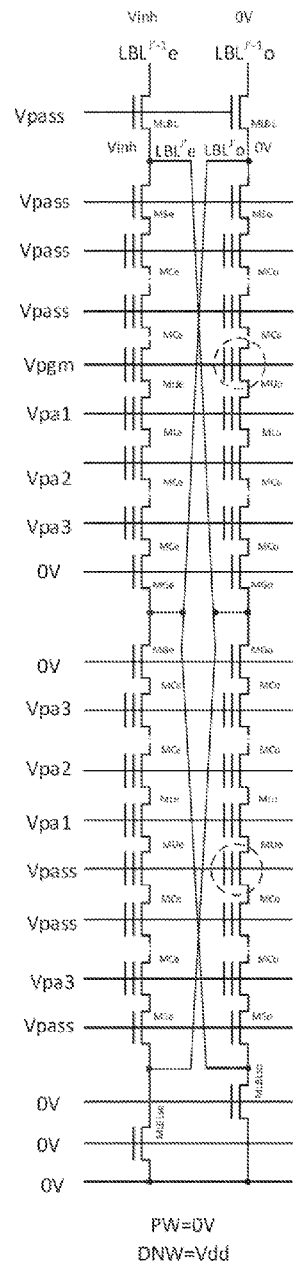

FIGS. 10D, 10E, and 10F are diagrams showing preferred bias conditions respectively for three steps of Odd dummy-cell program operation according to an embodiment of the present invention.

FIGS. 10G, 10H, and 10I are diagrams showing respective steps to perform concurrent precharge, concurrent discharge and concurrent program-verify for Even dummy cells according to an embodiment of the present invention.

FIGS. 10J, 10K, and 10L are diagrams showing respective steps to perform concurrent precharge, concurrent discharge and concurrent program-verify for Odd dummy cells according to an embodiment of the present invention.

Figures 10M, 10N, 10O:
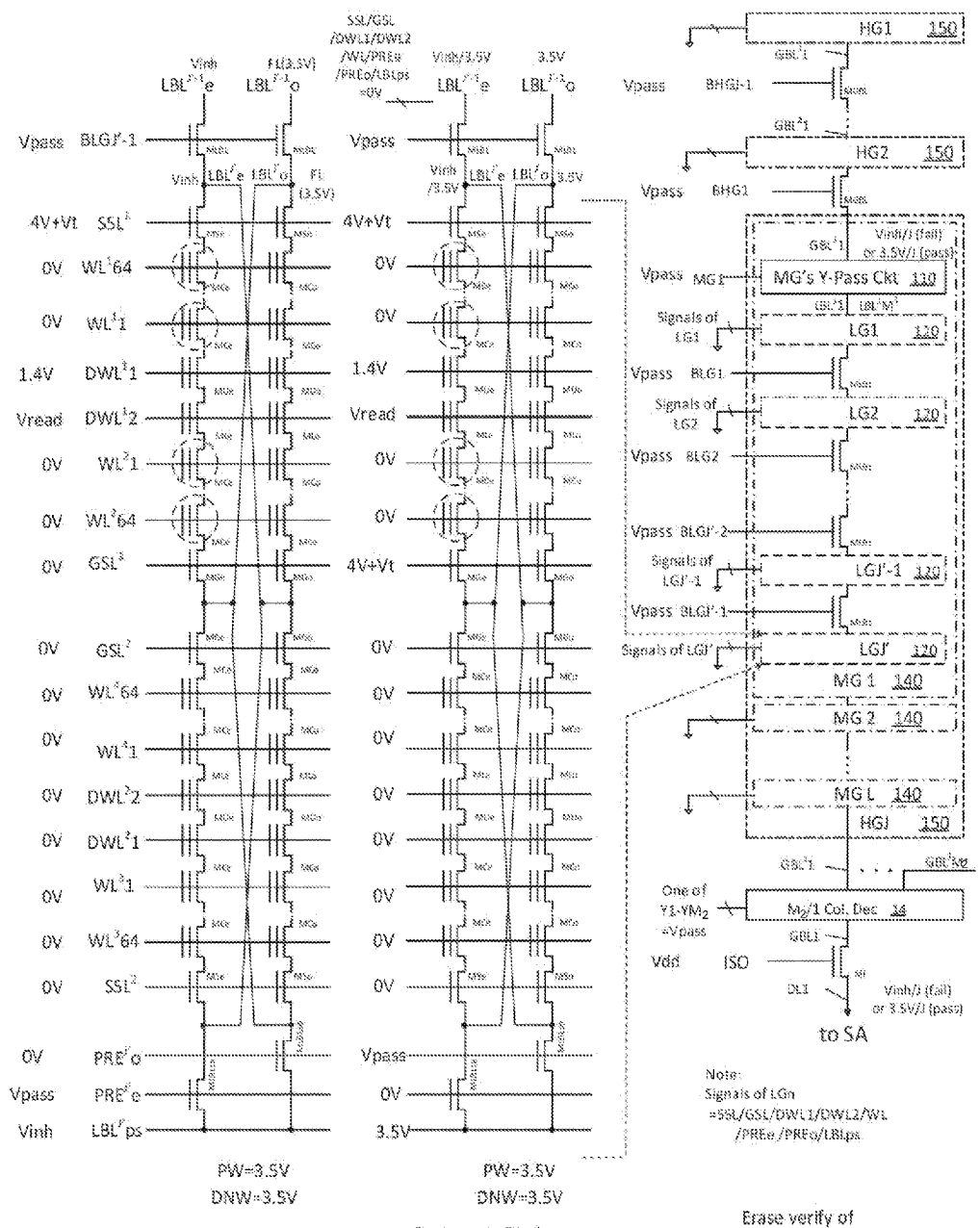

FIGS. 10M, 10N, and 10O are diagrams showing respective steps to further perform concurrent precharge, concurrent discharge and concurrent erase-verify for selected regular cells in Even strings in selected blocks after successful program operation for Odd and Even dummy cells according to an embodiment of the present invention.

FIGS. 10P, 10Q, and 10R are diagrams showing respective steps to further perform concurrent precharge, concurrent discharge and concurrent erase-verify for selected regular cells in Odd strings in selected blocks after successful program operation for Odd and Even dummy cells according to an embodiment of the present invention.

Figures 11A, 11B, 11C:
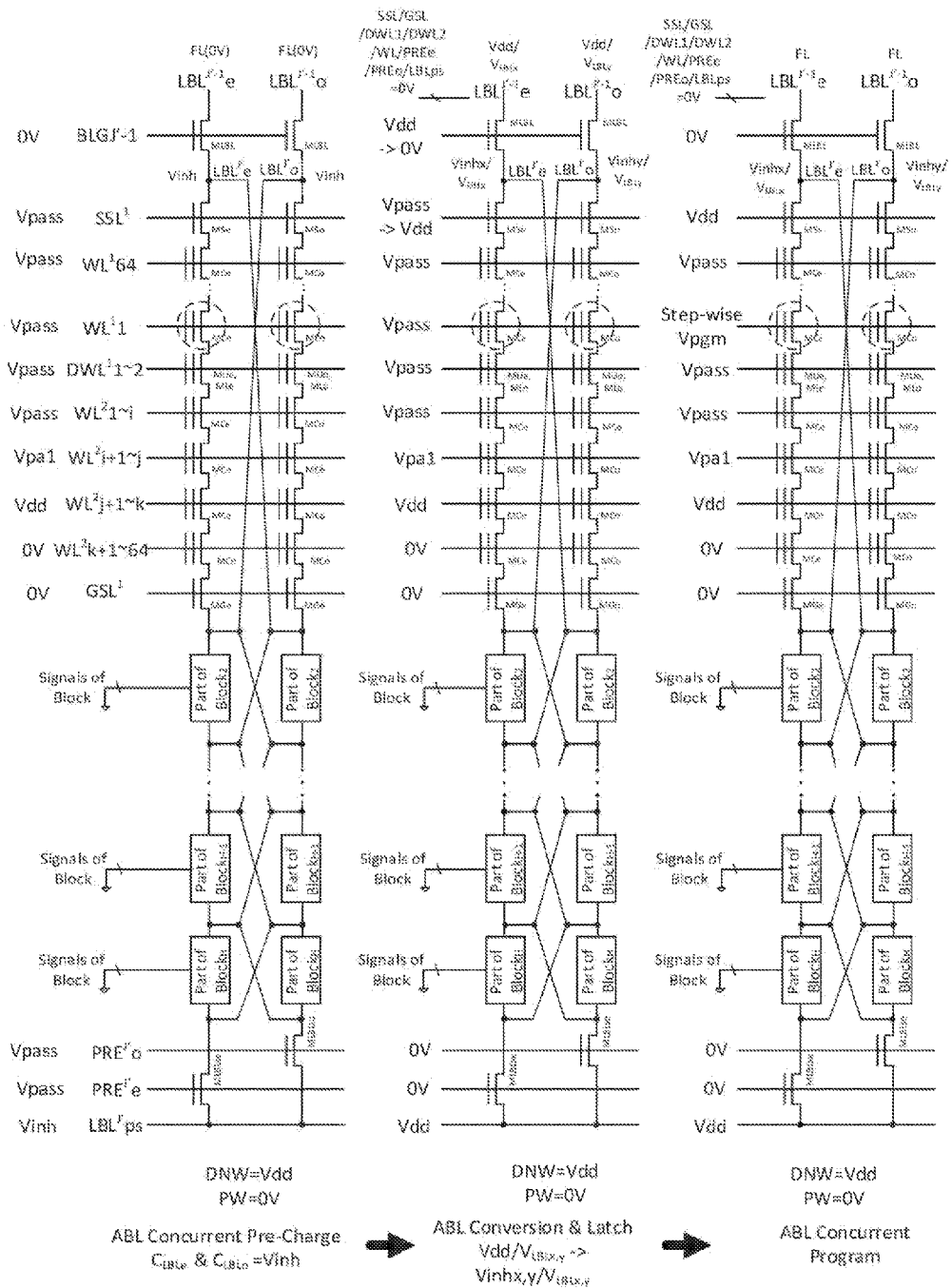

FIGS. 11A, 11B, and 11C are diagrams showing respective sets of bias conditions for performing ABL and AnP coarse and fine MLC program operations according to an embodiment of the present invention.

Figure 11D:
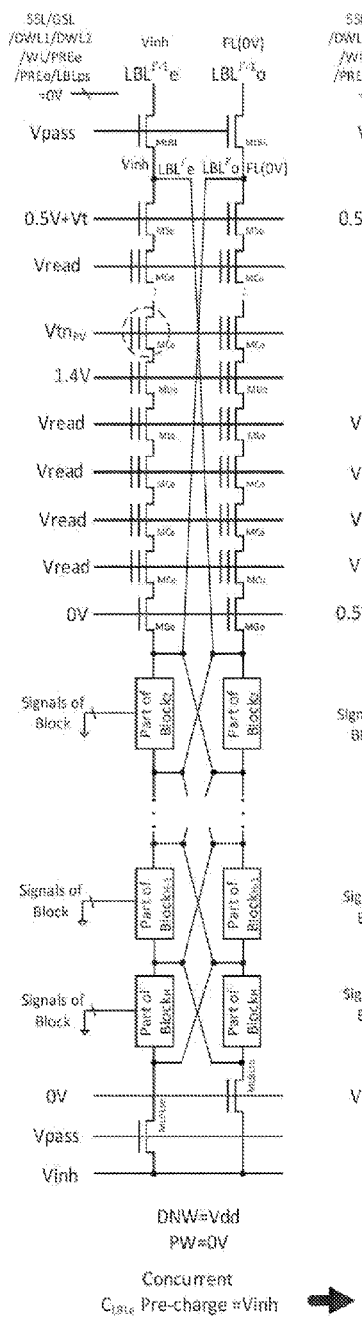
Figure 11E:
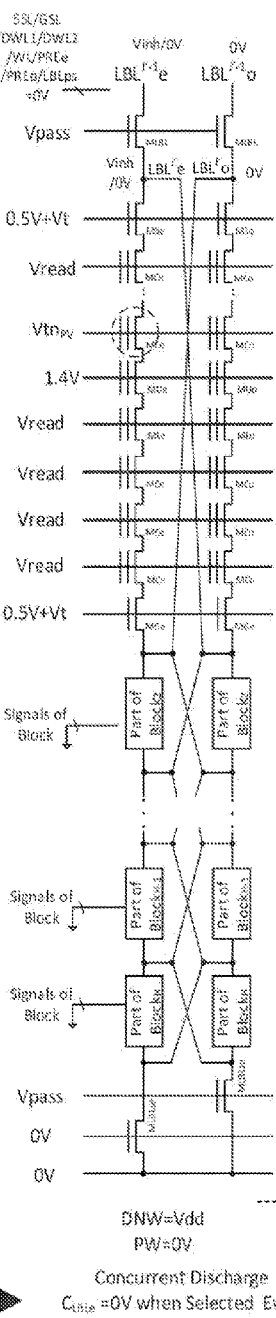
Figure 11F:
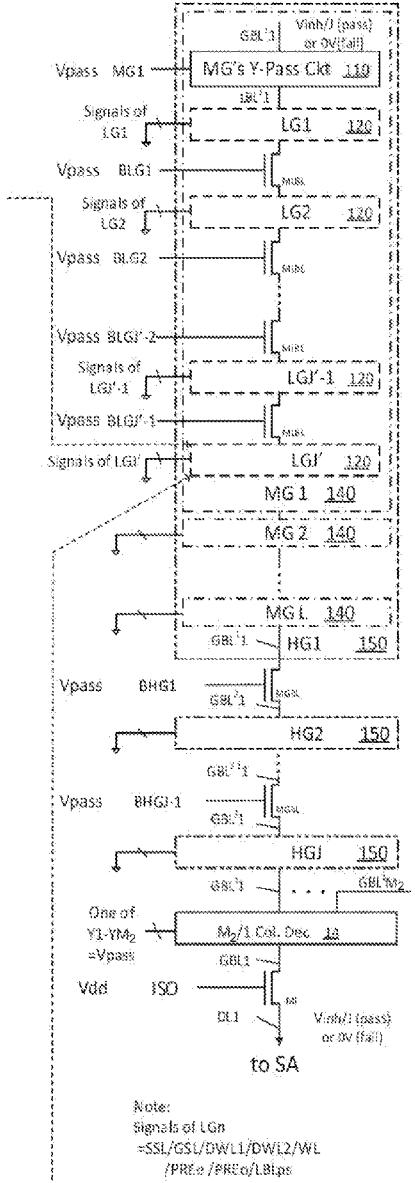

FIGS. 11D, 11E, and 11F are diagrams showing respective sets of bias conditions for performing Even/Odd-BL and AnP MLC concurrent program-verify operations according to an embodiment of the present invention.

FIGS. 12A, 12B, and 12C are diagrams showing respective sets of bias conditions for performing Even-BL MLC concurrent read operation from regular non-boundary cells according to an embodiment of the present invention.

Figures 12D, 12E, 12F:
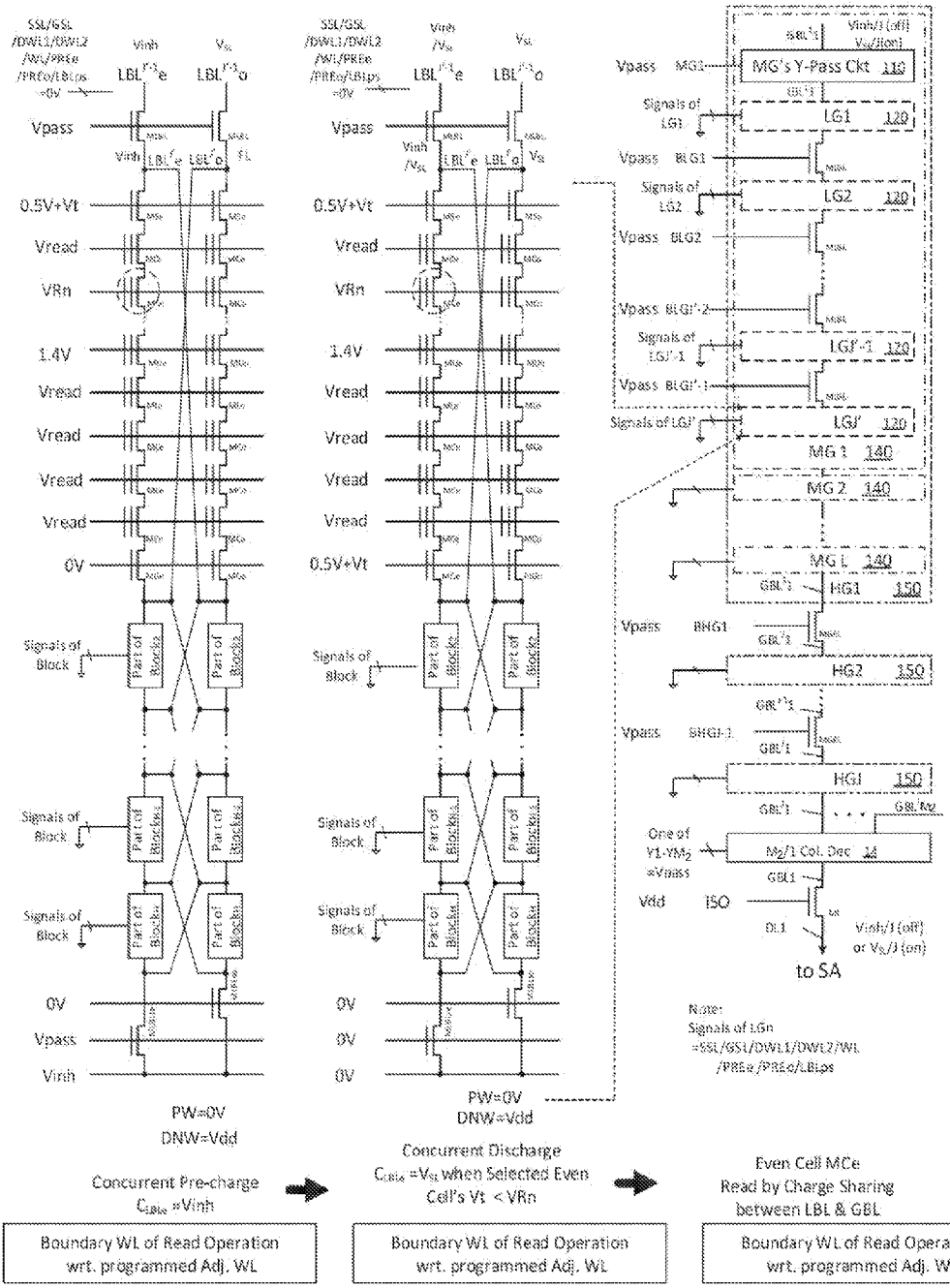

FIGS. 12D, 12E, and 12F are diagrams showing respective sets of bias conditions for performing same Even-LBL concurrent read operation from the boundary WL's cells according to an embodiment of the present invention.

FIGS. 13A and 13B are tables showing preferred ABL, AnP, and Alt-WL program schemes and sequences according to an embodiment of the present invention.

Figure 14A:
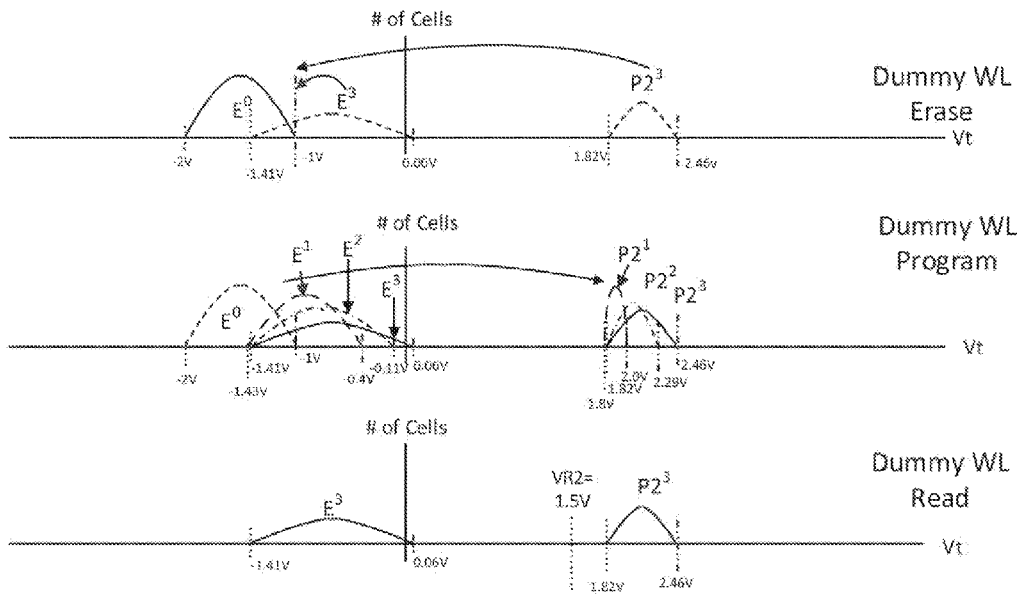

FIG. 14A is a diagram with graphs and table showing preferred SLC-like Vt distributions, populations, Vt verify and widen voltages for erase, SLC-like program, and read operations on dummy cells according to an embodiment of the present invention.

FIG. 14B is a diagram with graphs and table showing preferred MLC Vt distributions, populations, shifting, verify and widened voltages for MLC operations on boundary WLn−1 cells according to an embodiment of the present invention.

Figure 14C:
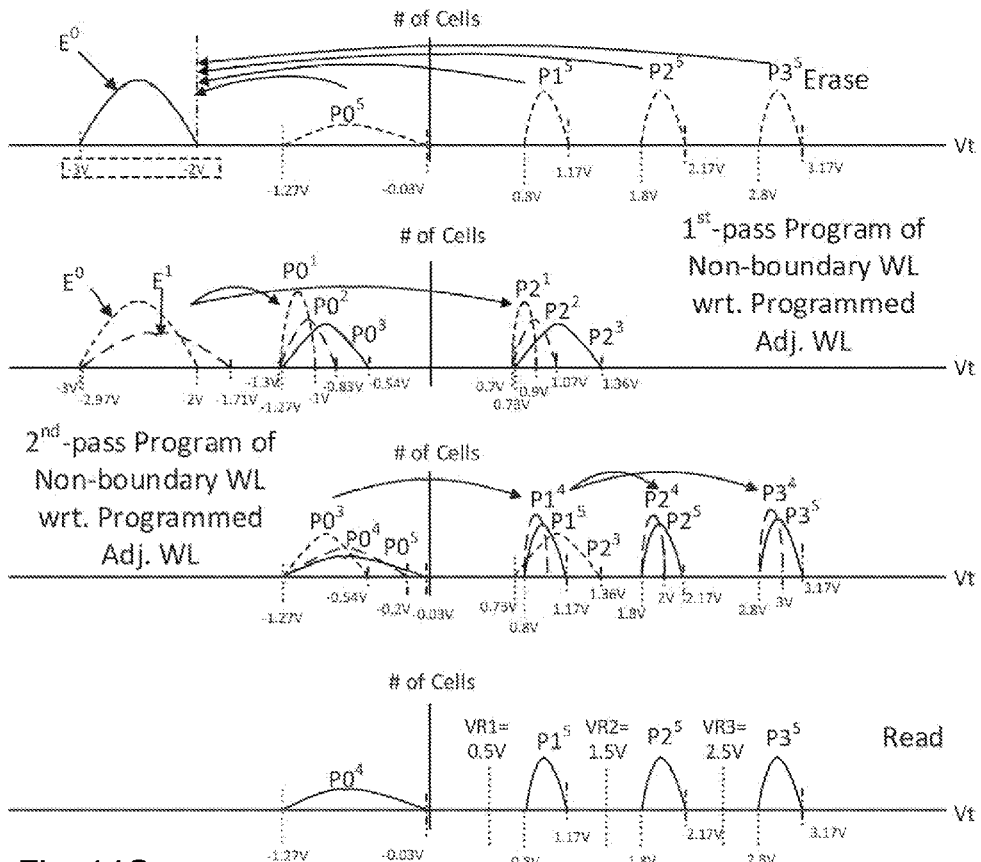

FIG. 14C is a diagram with graphs and table showing preferred MLC Vt distributions, populations, shifting, verify and widened voltages for respective MLC program operations of one non-boundary WLn cells and adjacent WLn+1 cells according to an embodiment of the present invention.

Figure 14D:
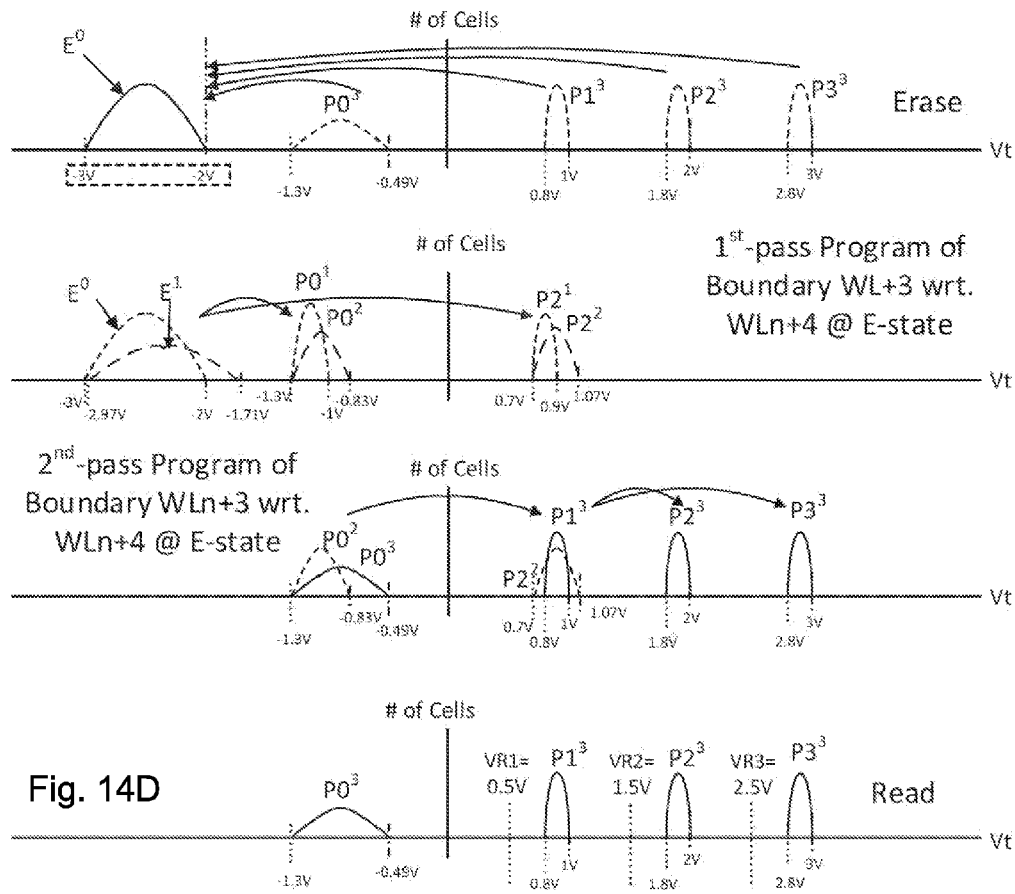

FIG. 14D is a diagram with graphs and table showing preferred MLC Vt distributions, populations, shifting, verify and widened voltages for respective MLC program operations of second boundary WLn+3 cells with WLn+4 cells being in P0-state according to an embodiment of the present invention.

Figure 14E:
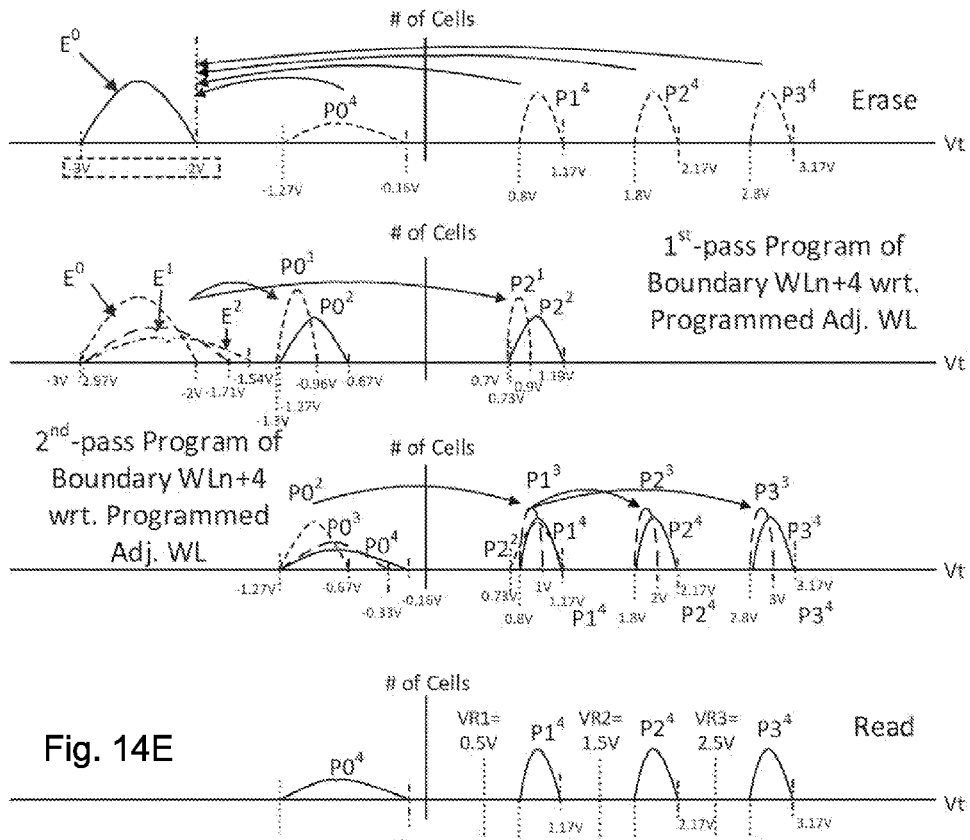

FIG. 14E is a diagram with graphs and table showing preferred MLC Vt distributions, populations, shifting, verify and widened voltages for respective MLC program operations of boundary WLn+4 cells with respect to WLn+5 cells being programmed with MLC data according to an embodiment of the present invention.

FIG. 14F is a diagram showing a 4-state MLC Vt shifting and widening for boundary WLn+3 cells with adjacent WLn+4 cells being programmed into P3 state from the initial P0 state according to an embodiment of the present invention.

FIG. 14G is a diagram showing 4-state MLC Vt shifting and widening for boundary WLn+3 cells with adjacent WLn+4 cells being programmed into P2 state from the initial P0 state according to an embodiment of the present invention.

FIG. 14H is a diagram showing 4-state MLC Vt shifting and widening for boundary WLn+3 cells with adjacent WLn+4 cells are being programmed into P1 state from the initial P0 state according to an embodiment of the present invention.

Figure 14I:
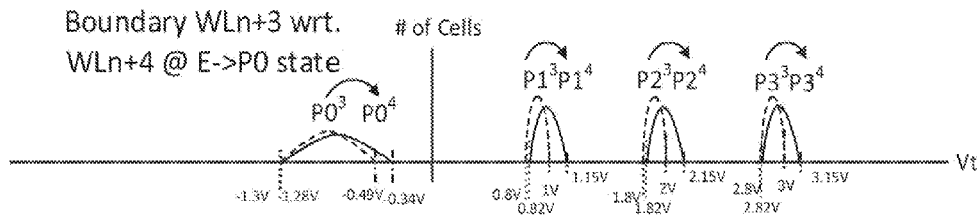
Figure 14I:
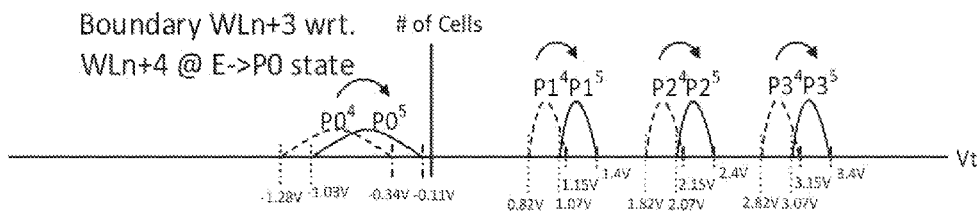

FIG. 14I is a diagram showing 4-state MLC Vt shifting and widening for boundary WLn+3 cells with adjacent WLn+4 cells not being programmed but staying in initial P0 state according to an embodiment of the present invention.

Figure 14J:
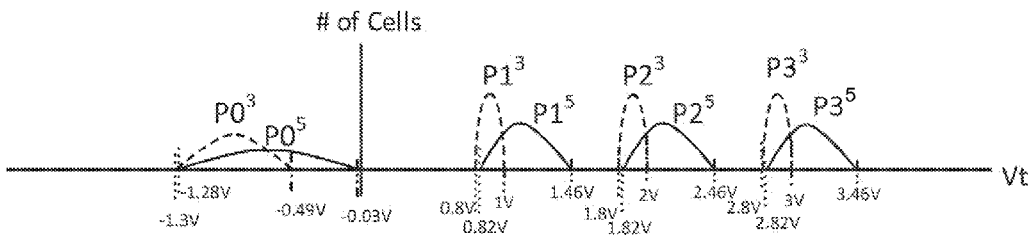

FIG. 14J is a diagram showing 4-state MLC Vt shifting and widening for boundary WLn+3 cells with respect to WLn+4 MLC bit data with $V_{SL}=0V$ according to an embodiment of the present invention.

Figures 14K, 15A, 15B:
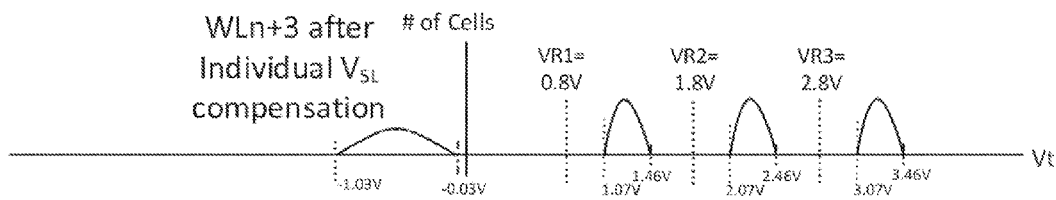

FIG. 14K is a diagram showing 4-state MLC Vt distribution and three preferred VRn for MLC reading of second boundary WLn+3 cells according to an embodiment of the present invention.

FIG. 15A is a table showing preferred sets of program-verify voltages $V_{FY}$ on selected WL with and without individual $V_{SL}$-based Vt-offset voltages for respective 1st-pass SLC-like program and 2nd-Pass MLC program cells according to an embodiment of the present invention.

FIG. 15B is a table showing three sets of $V_{WL}$ and $V_{SL}$ voltages for a preferred MLC read operation in a first boundary and following non-boundary WLs (WLn−1~WLn+2) under the condition of adjacent WLs' cells being fully programmed with 1st-pass and 2nd-pass program operations according to an embodiment of the present invention.

FIG. 15C is a table showing preferred VRn voltages on WLn+3 cells along with $V_{SL}=0V$ without Vt-offset for boundary WLn+3 MLC read operation with WLn+4 cells being only in P0 program state after 0P program according to an embodiment of the present invention.

FIG. 15D is a table showing preferred VRn values on boundary WLn+3 cells with individual $V_{SL}$ compensations in accordance with different MLC program states stored in the adjacent WLn+4 cells according to an embodiment of the present invention.

Figure 16:
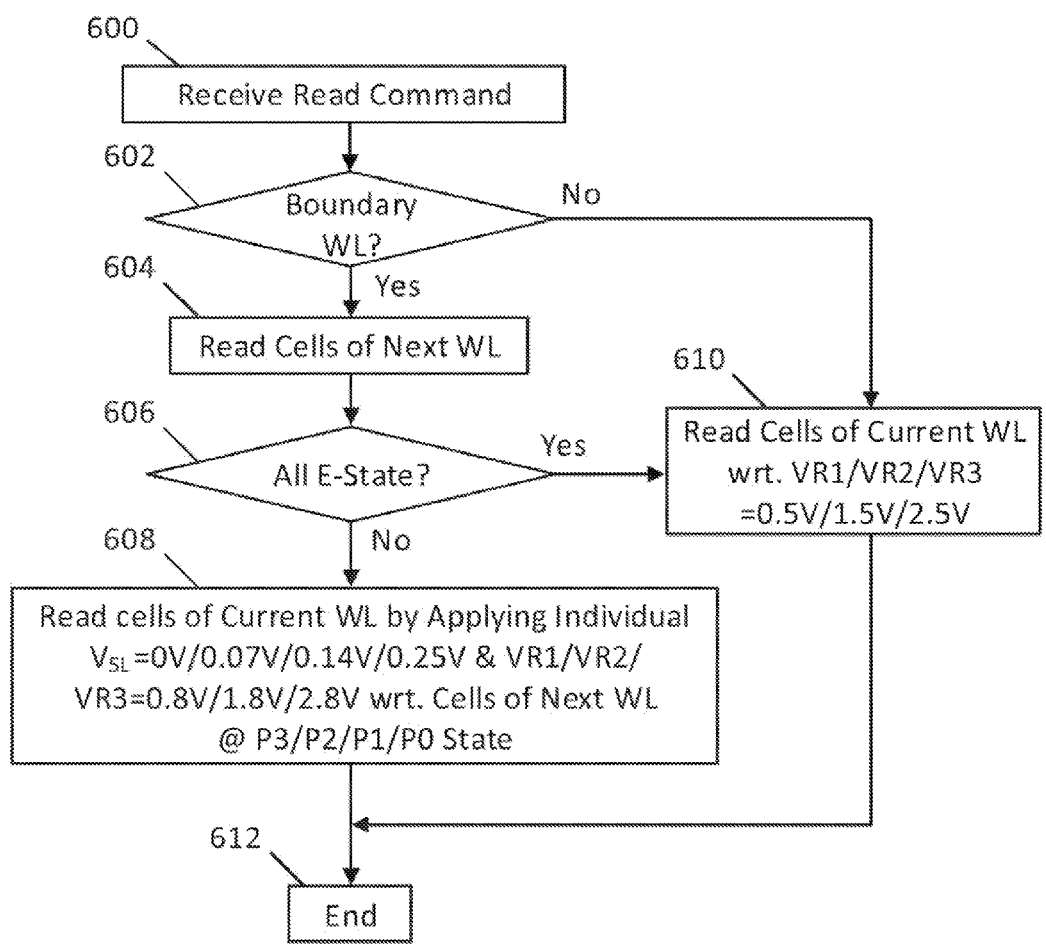

FIG. 16 is a diagram showing preferred general MLC read flow for both boundary and non-boundary WL cells according to an embodiment of the present invention.

Figures 17A, 17B, 17C:
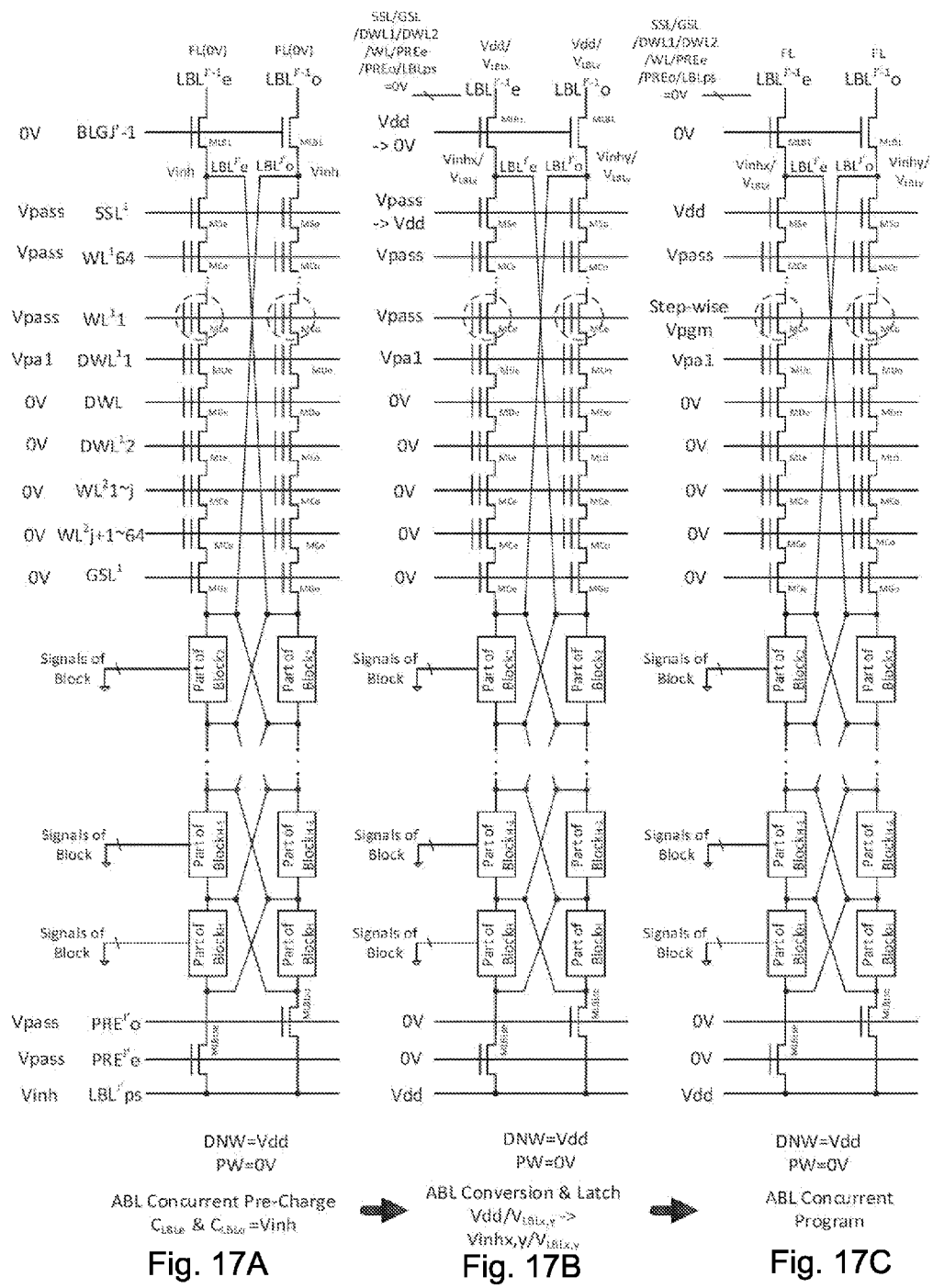

FIGS. 17A, 17B, and 17C are diagrams respectively showing bias conditions for a preferred batch-based concurrent ABL and AnP MLC program and Odd/Even-LBL program-verify operations with one additional dummy cell being inserted right in the middle of NAND string according to an embodiment of the present invention.

5. DETAILED DESCRIPTION OF THE INVENTION

In the following detailed description of the present embodiments, reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the present disclosure. The following detailed description, therefore, not to be taken in a limitation sense.

As will be known in the subsequent detailed explanation, the goal of the present invention aims to dramatically improve all areas of mainstream nLC NAND designs by at least 10-fold, particularly in 10 nm-class NAND design, regardless of 2D or 3D NAND manufacturing technologies.

Although many novel inventive techniques will be disclosed herein, the main theme of the present invention is to provide a batch-based hierarchical NAND flash design without any requirement to change the existing NAND cell and its associated manufacturing process and technology so that a quick adoption, implementation and verification can be achieved.

So far, almost of all NAND key operations are performed in unit of single WL in the selected NAND plane. Although there are many prior art disclosing multiple WLs in multiple independent blocks in multiple independent planes, there are no solutions to allow multiple WLs to be read, programmed and verified within same plane. This is what is referred as batch-based concurrent operations of NAND designs. When more than 10 WLs in different blocks and groups within the same or different planes are selected for a batch-based simultaneous erase, program, verify, and read operation, then more than 10-fold improvements in speed and power performance can be achieved.

In addition to at least 10-fold reduction of the power consumption and operation latency in erase, read, and program, a novel $V_{SL}$-based Vt-offset for both read and all verify operations such as program-verify or erase-verify, is also disclosed and performed in a preferred batch-based concurrent operation. As a result, a dramatic improvement of nLC data integrity and reliability can be also realized by the present invention. In the disclosed invention below, MLC examples are used first to represent nLC. The continuation of this invention in next patent application, the TLC and XLC cases will be further covered herein.

The description of the preferred batch-based MLC NAND operations of whole patent is being organized starting from random page and partial or full block MLC erase, MLC erase-verify, 2nd-pass (2 MLC and program-verify with n $V_{LBL}$ program BL compensations in accordance with the stored MLC data in adjacent WLs. Lastly, the $V_{SL}$-based common and individual Vt-offset scheme during MLC read are also proposed for more accurate and reliable MLC read under different Vdd operating ranges.

Each nLC NAND memory cell can store data in either analog or digital form. When storing one bit of digital data, two threshold voltages of each nLC NAND memory cell is divided into two ranges which represent two distinct memory states. The nLC cell is referred as a SLC cell, which means 1b/1cell. The SLC memory states are assigned with logical data "1" and "0." At least one current breakpoint level between two states is generally established so as to partition the conduction window of each SLC cell into two ranges. When the SLC cell is read by applying predetermined, fixed voltages, on its gate of WLn, its source/drain conduction current is resolved into one of the memory states by comparing it with the breakpoint level, e.g., reference voltage, or reference current. If the current read is higher than that of the breakpoint level, the SLC cell is determined to be "on" and in the logical state of "1." If the current is less than the breakpoint level, the SLC cell is determined to be "off" and in the other logical state of "0." In one example of a SLC NAND memory, one final desired threshold voltage (Vte) is negative after each SLC cell is erased, and defined as logic "1." Conversely, the final threshold voltage (Vtp) is positive after a SLC program operation, and defined as logic "0." When the threshold voltage is negative and a read is attempted by applying 0 volts to the selected SLC cell's control gate, the SLC cell will turn on to indicate logic one is being stored. When the threshold voltage is positive and a read operation is attempted by applying 0 volts to SLC cell's control gate, the SLC cell will not turn on to indicate that logic zero is being stored.

Furthermore, each nLC NAND cell can also store more bits of digital data than a SLC cell by utilizing more than two ranges of threshold voltages (Vtn) to represent distinct memory states. The threshold voltage window can be divided into the number of desired memory states and multiple breakpoint levels used to resolve the individual states. For example, if four states are used, there will be four threshold voltage ranges representing four distinct memory states which are assigned the data values "11," "10," "01," and "00." This 4-state nLC cell is referred as MLC cell, which means 2b/1cell.

In one example of a MLC cell, the final desired threshold voltage after an erase operation is preferably to be negative and defined as "11." Positive threshold voltages are used for the states of "10," "01," and "00." Note, the upper tail of Vte can exceed 0V to become positive when the Yupin coupling effect become very severe, particularly in 10 nm-class NAND designs.

Likewise, each nLC NAND cell can also store multiple bits of digital data than a MLC cell by utilizing more than four ranges of threshold voltages (Vtn) of four nLC program states to represent distinct memory states. For example, if eight states are used, there will be eight threshold voltage ranges representing eight distinct memory states which are assigned the data values "111," "110," "101," "100," "011," "010," "001," and "000." This 8-state nLC cell is referred as TLC cell, which means 3b/1cell with a lowest threshold voltage of "111" after an erase operation and a highest Vt of "000" after a TLC program.

Likewise, each nLC NAND cell can also store multiple bits of digital data than a TLC cell by utilizing more than eight ranges of threshold voltages (Vtn) to represent more distinct memory states. For example, if sixteen states are used, there will be sixteen threshold voltage ranges representing 16 distinct memory states which are assigned the data values "1111," "1110," "1101," "1100," "1011," "1010," "1001," "1000," "0111," "0110," "0101," "0100," "0011," "0010," "0001," and "0000." This 16-state nLC cell is referred as XLC cell, which means 4b/1cell with a lowest threshold voltage of "1111" after an erase operation and a highest Vt of "0000" after a XLC program.

In some conventional approaches, the above nLC data values (e.g., logical states) are assigned to the threshold ranges using a Gray code assignment so that if the threshold voltage of a floating gate erroneously shifts to its neighboring physical state, only one bit will be affected. The specific relationship between the nLC data programmed into each nLC memory cell and the threshold voltage ranges of the nLC cell depends upon the nLC data encoding scheme adopted for the nLC memory cells.

Typically, nLC NAND cell's Vtn are defined and measured from cell's gate voltage, $V_{WL}$, with respect to cell's common source node voltage $V_{SL}$. Normally, a $V_{SL}$ voltage at the common SL node for all selected nLC cells in the selected WLn is held at Vss during nLC n Vtn read and program-verify operations. The width of the negative erase Vte can be as wide as up to 2V and as low as −3V but the remaining n−1 Vtn of program states are kept pretty narrow-width, ranging from 0.2V to 0.5V, as storage type varying from XLC to SLC with Yupin coupling induced Vt-widen effect.

Figure 1A:
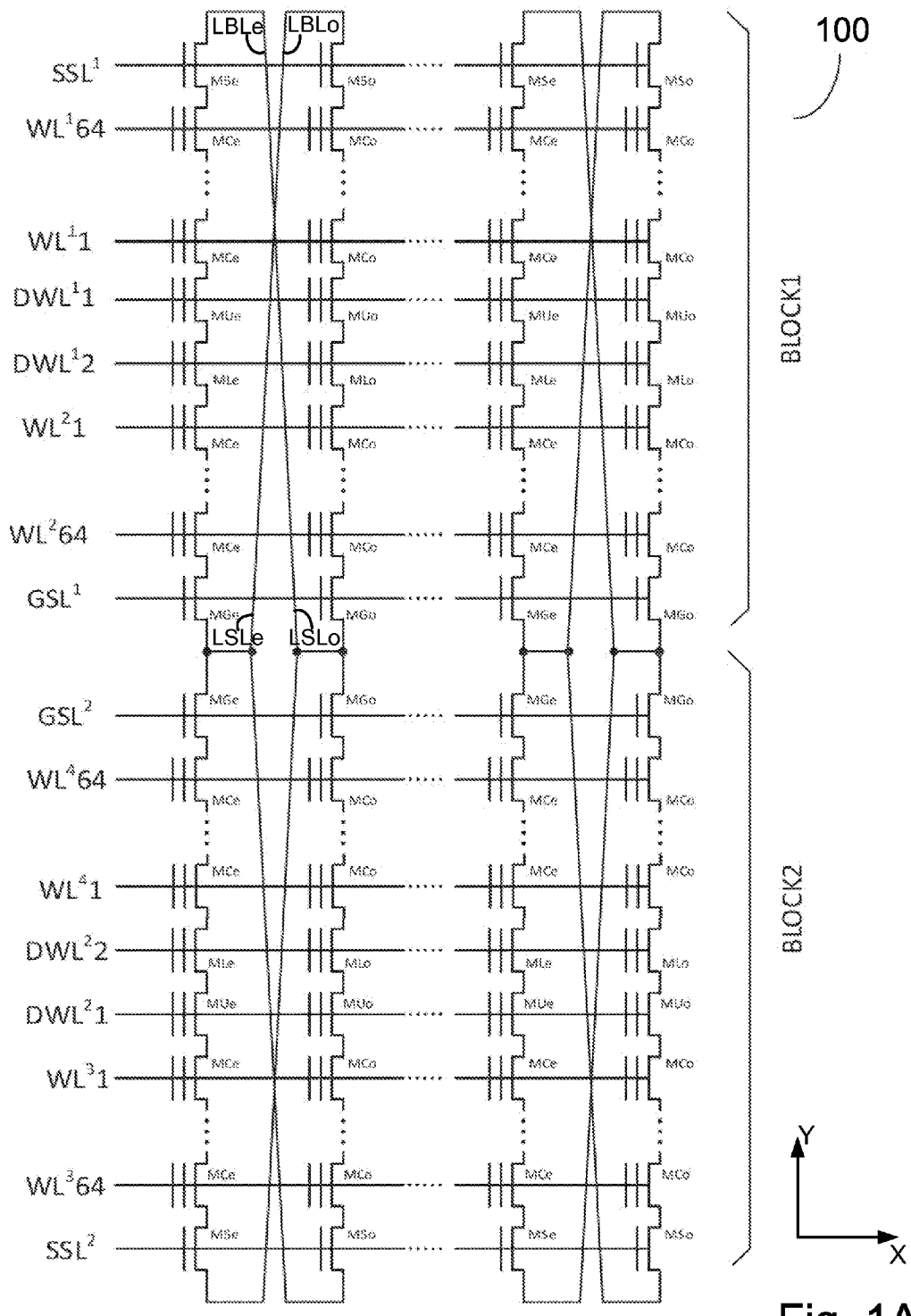
FIG. 1A is a diagram illustrating a YUKAI NAND array with a plurality of paired zigzag NAND strings having short string lengths according to an embodiment of the present invention.
Figure 1B:
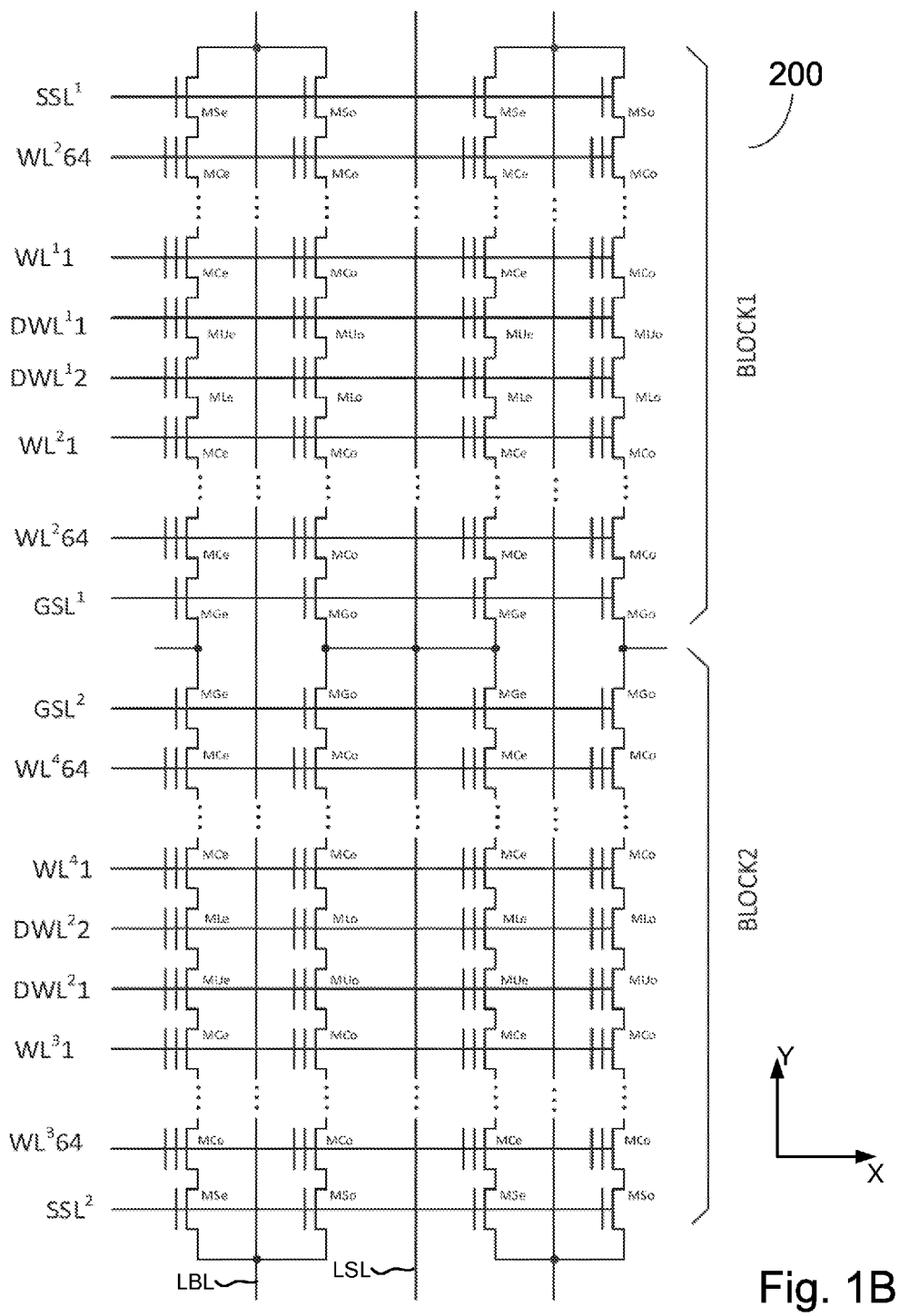
FIG. 1B is a diagram illustrating a YUKAI NAND array with a plurality of paired NAND strings without any common SL according to another embodiment of the present invention.
Figure 1C:
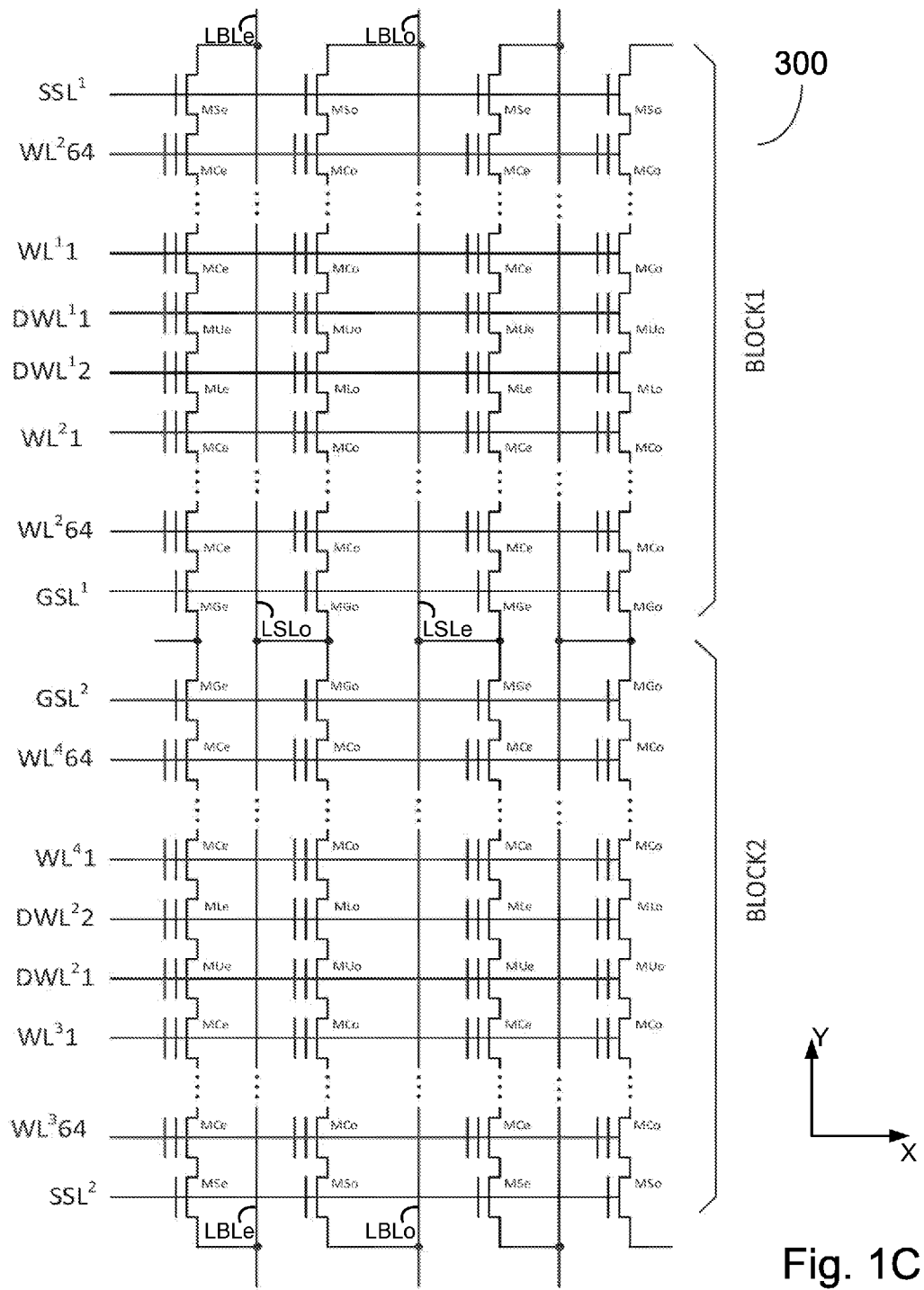
FIG. 1C is a diagram illustrating a YUKAI NAND array with a plurality of paired zigzag NAND strings with small programmable NAND dummy cells according to yet another embodiment of the present invention.

In an embodiment, in a preferred YUKAI NAND scheme of the present invention, to be shown in FIG. 1A, FIG. 1B, and FIG. 1C, each BL in Y-direction uses a physically adjacent Y-direction BL as its dedicated SL. In other words, no more common horizontal SLs are used as in conventional NAND strings. All separate BLs can also be used as all SLs. As a result, when YUKAI scheme is used in this kind of separate BL and SL array, we referred them as YUKAI NAND array. All multiple Vtn measurements of the Victim MLC cell in read and program-verify operations can be done with respect to a common $V_{SL}$ value or n individual $V_{SL}$ values, depending on the stored data of eight surrounding Aggressor 2D NAND cells in a 2D NAND array or 26 adjacent 3D NAND cells in a 3D NAND array.

Note, although the following examples are focusing on MLC erase, program, read and verify of NAND arrays made of NAND strings of FIG. 1A, FIG. 1B, and FIG. 1C, most of the disclosed inventive concepts can be also applied to improve any NAND arrays and cell structures, regardless of 2D or 3D NAND, PMOS-cell or NMOS-cell NAND, 2-poly floating-gate cell or 1-poly charge-trapping cell NAND.

In all conventional NAND arrays, BL lines in general are all long, unbroken or undivided non-hierarchical GBL lines and cannot be implemented with the preferred batch-based concurrent NAND operations in same NAND plane by the present invention. Only the broken, divided and hierarchical LBL and GBL scheme used in the YUKAI NAND array of the present invention makes the batch-based concurrent NAND operations with more than 10-fold reduction in power saving, latency, and reliability improvement possible in a same or different NAND planes.

Several novel structures of the YUKAI NAND array will be fully disclosed below in which each LBL using one physically adjacent LBL as the dedicated LSL but keeping the same smaller string size as the conventional NAND array with additional advantages of using more accurate $V_{SL}$-based individual Vt-offset technique to overcome Yupin floating-gate coupling effect between LBL-LBL and WL-WL and the perfect SBL is attained for the preferred batch-based concurrent ABL, AnP and Alt-WL nLC program scheme.

In addition, in a typical NAND program-speed measurement reported by M-Y Lee et al. (NVSM Workshop, 2001), a generic relationship is demonstrated between a program Vt increment versus program time under certain cell gate voltages. In that measurement, four individual NAND program Vt increments are plotted against the program time under four different cell gate voltages of 18V, 17V, 16V, and 15V with four cell channels being held at one identical voltage of 0V and $V_{TPW}$=0V and $V_{DNW}$=Vdd. The four NAND Vts are increased from a same initial negative erase $V_{TPW}$=−3.0V. Within a same program time, the higher gate program voltage, the higher NAND cell program Vt-increase. With a long-enough program time and a longer than ~20 μs program pulse, the four final Vt-differences are well maintained and controlled in a same degree by the four different gate voltages with a same channel voltage of 0V. With 1V difference among the four different gate voltages, the four final cell Vt values are approximately following the 1V gate voltage difference after elapse of several iteratively accumulated program time period that is longer than ~100 μs.

For NAND Vt values in a negative range, then the Vt-increment is larger. But when NAND Vt becomes a positive value, the degree of cell Vt-increment gradually becomes smaller due to more electrons accumulated in floating gate would generate the repulse force to slow down the electron injection into the floating gate from the cell channel.

After 100 μs accumulated program time, cell Vt-difference of 1V is approximately realized in accordance with 1V difference among four gate voltages. In other words, with one identical initial negative Vte, four final equally-spaced Vt program states can be obtained at almost a same time without earlier lockout state under four assigned program gate voltages of Vpgm with three equal gate differences.

Equivalently, with same gate voltage of Vpgm of 18V, but four different channel voltages of 0V, 1V, 2V, and 3V for MLC program, then four similar final program Vts with 1V difference between any two adjacent Vt states can be achieved on the same time.

In an embodiment of the present invention, MLC program Vt-differences tracking four different program voltages with one identical channel voltage or conversely one identical program voltage with four different channel voltages has a same MLC Vt outcome under a same accumulated program time. Thus, all four states of a MLC concurrent program can be completed at the same time with four well-controllable Vt-differences without resulting in any earlier lockout state for superior MLC program reliability. Furthermore, n-state nLC concurrent program scheme will generate the least Yupin BL-BL coupling effect as will be further explained in several embodiments of the present invention.

Alternatively in U.S. Pat. No. 8,605,511 one of step-rise ISSP program pulse of a MLC Coarse and Fine program is disclosed with each program voltage increment of 0.2V. During the Fine program, the normal BL program voltage is increased from 0V to 0.4V to decrease cell's ΔVt from 0.2V to 0.05V per increment due to the equivalently weaker FN-tunneling electric field to avoid undesired over-shoot of the MLC program. In reality, however, the MLC Fine and Course programs do not perfectly follow the fundamental physics rules by setting four channel voltages in accordance with four desired final MLC Vts. As a consequence, all MLC program states cannot be completed at the same time. In other words, an earlier program state lockout can happen thus the residual of Yupin BL-BL coupling effect cannot be avoided because $V_{LBLn}$ program voltages are not assigned in accordance with four true MLC Vtpn differences. Thus superior techniques of Coarse and Fine MLC programs with their MLC Vtpn assignments following four final Vt differences will be proposed through the specification and particularly below.

In the present invention, N-bit means a full physical WL page of 16 KB cells. Thereby, N/2-bit means 8 KB which is ½ of one full physical page or ½ WL size storing 8 KB regular NAND cells. 16 KB and N-bit or 8 KB and N/2-bit are alternately used as examples in the specification and should be treated as the same. As explained later, each LBL line or LBL capacitor $C_{LBL}$ is also referred as one local segment metal1 line (at M1-level level) or one local metal2 line (at M2-level), or local segment parasitic $C_{LBL}$ capacitor, or one local pseudo CACHE register. Each segment is comprised of L NAND blocks, which are connected in column direction by 8 KB M1-level LBL lines and another 8 KB M2-level LBL lines with 1λ, width and 1λ, spacing with special layout technique to attain a full BL shielding effect to allow the preferred ABL program and program-inhibit operations.

FIG. 1A is a diagram illustrating a YUKAI NAND array with a plurality of paired zigzag NAND strings having short string lengths according to an embodiment of the present invention. As shown, the NAND array 100 is a YUKAI NAND array including a plurality of NAND blocks, each being formed with a plurality of paired NAND strings including cross-coupled Odd LBL line and Even LBL line in Y-direction. And in particular, each string in one paired Even-Odd strings is associated with an individual LBL line and uses its physically adjacent LBL line as an individual local source line (LSL) without any common SL in X-direction.

As an example, only two NAND blocks are shown in FIG. 1A to illustrate one key feature of the YUKAI NAND array according to an embodiment of the present invention. Each block contains 128 pages of regular NAND cells with gates connected to corresponding wordlines (WLs) in X-direction. In addition to those WLs, there is no extra large paired select transistor (such as 1-poly Depletion-type, 1-poly Enhancement-type, or 2-poly floating-gate type NMOS transistor) in each string. Instead, one pair of small 2-poly dummy NAND cells, MUe and MUo, or MLe and MLo, having same size as a regular NAND cell, MCe or MCo, is used to replace big string-select transistors used in many conventional NAND strings. The conventional mainstream NAND string has incorporated one dummy cell on top and one dummy cell on bottom of each string for the purpose to reduce the GIDL effect between the WLs in both ends nearing the top and bottom select transistors, two dummy cells with complementary Vts are used by the present invention for Odd and Even string selection. The physical placements of these two dummy cells in each YUKAI NAND string can be anywhere but are preferably placed in the middle of each string so that an ABL, AnP, and Alt-WL program scheme and sequence can be started from two middle points heading two opposite directions with least Vpass voltage disturbance. The YUKAI NAND string structure thus has the same compact string size of a mainstream NAND string while provides much more advantages in power saving and latency reduction that will be fully disclosed in subsequent sections of the specification.

In an embodiment, the pair of dummy cells is used as the Odd and Even string-select transistors by programming with the complementary Vts to allow the right logic selection of Odd and Even strings. The pair of small dummy cells (MUe and MUo, and MLe and MLo) in two respective dummy WLs (DWL$^1$ and DWL$^2$) for performing Odd and Even string selection is used to replace large channel-length HV select transistors in prior art, because Odd/Even string-select function is only performed during read and all verify operations which are not under the HV program conditions. Therefore, the channels of selected strings are at low voltage scenario, thus HV select transistor for Odd/Even select function is not required in read and all verify operations.

In other words, the only reason to have a large string-select transistor in the conventional NAND strings is to prevent the coupling leakage of ~7V from string channel to GBL. This coupling leakage of ~7V is boosted and generated when the selected WLn voltage is ramped to 20V during the page-program operation. But as seen in FIG. 1A, a boosted 7V coupling leakage in each string is protected because each string still keeps one top and bottom big select transistors such as MSe and MGe for each corresponding Even string and MSo and MGo for each adjacent Odd string.

Referring to FIG. 1A, the YUKAI NAND array operations are associated with preferred rows, columns, broken GBL and broken LBL decoders, and local LBL precharge circuits. In a specific embodiment, each string has an individual LBL and uses its adjacent LBL as a LSL so that the most accurate $V_{SL}$-based Vt-offset inventive concept can be easily implemented. Practically, this combines all the advantages of new $V_{BL}$-based and conventional $V_{WL}$-based Vt-offset techniques to overcome Yupin BL-BL and WL-WL coupling effects in 10 nm-class NAND memory design. In addition, a $V_{SL}$-based Vt-offset technique is applied to fix each degraded nLC Victim cell Vtn by using an individual SL-node Vt-compensation voltage, which is more direct and accurate than using a non-individual collective and inaccurate compensation techniques by either $V_{BL}$-based and $V_{WL}$-based Vt-offset techniques. Note, the cross-coupled paired strings require 1λ-width and 1λ-spacing M1/M2-level metal lines in non-contact areas for the interleaving BLs, which are configured to achieve fully BL shielding effect for superior ABL program.

FIG. 1B is a diagram illustrating a YUKAI NAND array with a plurality of paired NAND strings without any common SL according to another embodiment of the present invention. As shown, a preferred NAND array 200 is made of a plurality of blocks that are further comprised of a plurality of paired Odd and Even NAND strings. Again, as an example, only two blocks are included in FIG. 1B to simply illustrate one of key feature of the YUKAI NAND array according to another embodiment of the present invention. Each paired NAND string includes one Odd and one Even LBL lines. Each string has an individual LBL in Y-direction and uses its adjacent LBL as an individual LSL without a separate common LSL in X-direction. Again, the NAND string contains no extra large paired select transistor (e.g., 1-poly Depletion-type transistor, 1-poly Enhancement-type transistor or 2-poly floating-gate type transistor). Instead, small paired 2-poly dummy NAND cells, MUe and MUo, or MLe and MLo, with a same size of the regular NAND cell, is used to replace conventionally used big select transistors. Other than in some conventional NAND strings using one dummy cell on top and one dummy cell on bottom of each string for the purpose to reduce the GIDL effect between the WLs in both ends nearing the top and bottom select transistors, these small paired dummy cells in the NAND strings of FIG. 1B are used as the Odd and Even string-select transistors without increasing the string size. The placements of two dummy WLs can be anywhere in each string but are preferably placed in the middle of NAND string or at least one in the middle and one in either top end or bottom end of string.

Referring to FIG. 1B, another feature of this YUKAI NAND string scheme is that a single metal1 line at M1-level can be used for all LBL lines because the zigzag LBL connection in FIG. 1A has been removed by straight (Y-direction) LBL lines. As a result, one metal line layer is saved. Note, although this non-cross-coupled paired strings require 1λ-width and 1λ-spacing of single metal line at M1-level for the interleaving Odd and Even BLs, the present invention preferably uses two metal line at respective M1-level and alternate M2-level with 1λ-width and 1λ-spacing to achieve a full LBL shielding effect (see FIG. 2 below) for superior ABL, AnP, and Alt-WL program.

FIG. 1C is a diagram illustrating a YUKAI NAND array with a plurality of paired zigzag NAND strings with small programmable NAND dummy cells according to yet another embodiment of the present invention. As shown, the NAND array 300 is made of a plurality of blocks with each block containing a plurality of paired Odd and Even NAND strings. Each paired NAND string includes one Odd and one Even LBL lines. In particular, each string has its own individual LBL and uses its adjacent LBL as an individual LSL along the Y-direction and no X-direction common SL is used in plurality of NAND strings within the plurality of blocks.

Again, one of features of this NAND string is that no extra large paired select transistor (1-poly Depletion-type, 1-poly Enhancement-type or 2-poly floating-gate type) is added to each NAND string. Instead, one small paired 2-poly dummy NAND cells with the same size of the regular NAND cell is used to replace above big select transistors. As some conventional NAND string has incorporated one dummy cell on top and one dummy cell on bottom of each string for the purpose to reduce the GIDL effect between the WLs in both ends nearing the top and bottom select transistors, these paired small dummy cells can also be used as the Odd and Even select transistors without increasing the string size. Thus the NAND strings in FIG. 1C can retain compact string length and at the same time be used for applying truly individual $V_{SL}$-based Vt-offset techniques for superior MLC program and read operation.

Note, although this NAND strings are non-cross-coupled paired strings requiring 1λ-width and 1λ-spacing of two-level metal lines, one at M1-level and alternate one at M2-level, for the interleaving Odd and Even BLs, it is preferred to uses the two-level metal lines with 1λ-width and 1λ-spacing to achieve fully BL shielding effect (see FIG. 2 below) for superior ABL program operation. The detail descriptions of the ABL, AnP, and Alt-WL MLC program, read, and verify operation based the above NAND string embodiments shown in FIGS. 1A, 1B, and 1C will be found throughout the specification and particularly below.

Figure 2:
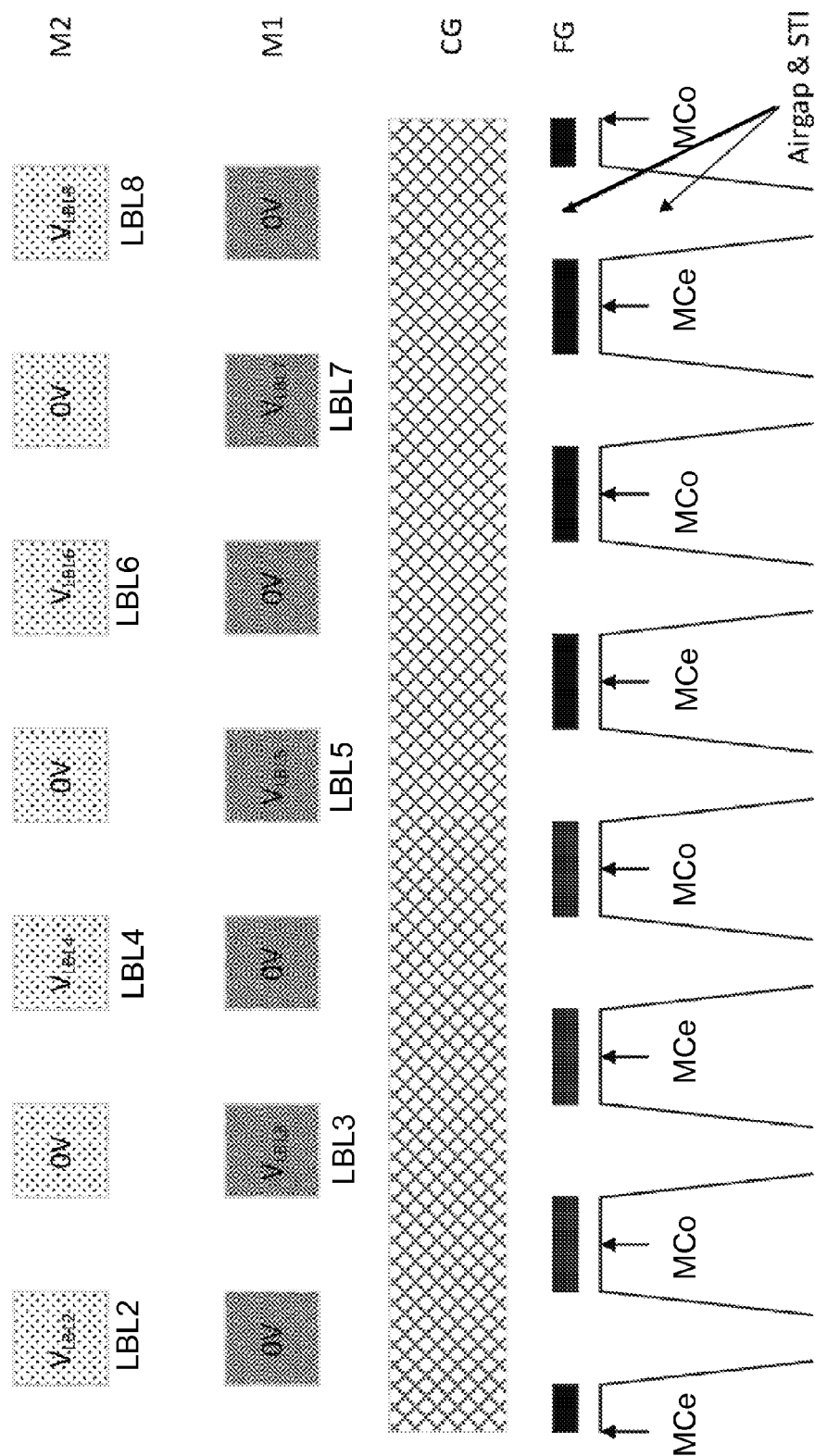
FIG. 2 is a diagram illustrating cross-sectional view and topological view of two levels, M1 and M2, of local bit line metal lines used in the YUKAI NAND strings according to embodiments of the present invention.

FIG. 2 is a diagram illustrating cross-sectional view and topological view of two local bit line metal lines, arranged alternatively in two levels, M1 and M2, used in YUKAI NAND strings according to embodiments of the present invention. As shown, two metal lines of alternate M1 and M2 levels adopted by the BL-hierarchical NAND array structure are both made with 1λ width and 1λ spacing. One Odd LBL line (e.g., LBL3) at M1-level is connected to a first drain node of an Odd string for a first 1-bit of MLC data but the physically adjacent Even metal line at M1-level is not connected to a second drain node but is grounded (to 0V) in layout as the first-level shielding LBL structure. While the actual Even LBL line (e.g., LBL4) is laid at M2-level above M1-level and configured to connect to the second drain node of the Even string. Using two sets of metal lines arranged respectively at two M1 and M2 levels for interleaving Odd/Even strings as shielding topological LBL and LSL lines is one of important feature for performing concurrent ABL, AnP, and Alt-WL MLC, TLC, and XLC program operations (including 1P, 2P, or more than 2P and FP) based on NAND strings shown in FIG. 1A, FIG. 1B and FIG. 1C.

Referring to FIG. 2 again, two 1-λ, metal-width and 1-λ, metal-spacing LBLs at M1-level and alternate M2-level are interleavingly used to shield any two adjacent LBLs at the same level from coupling. As shown in FIG. 1A and FIG. 1C, two tight M1 and M2 levels metal lines are required for two adjacent Odd and Even LBLs to be connected in a zigzag way. But in FIG. 1B, optionally only one tight M1 level metal line is required to construct the NAND string. In this way, one level of metal lines can be saved for each broken-LBL line. But since ABL nLC program operation is pivotal for achieving a high nLC data reliability and yield to reduce the Yupin coupling effect, two levels of tight M1 and M2 lines are preferably used for all three embodiments of the YUKAI NAND arrays 100, 200, and 300. Thus, for all n $V_{LBL}$ voltages assigned to n-state concurrent nLC program (AnP), a full shielding of all LBLs n $V_{LBL}$ voltages is required to guarantee a successful operation of the ABL program with least ECC errors.

Additionally, FIG. 2 shows that an shielding of a M1-level Odd LBL data line is provided by connecting alternate Even metal lines of 1λ-width and 1λ-spacing at M1-level to ground and having corresponding Odd LBL data lines of 1λ-width and 1λ-spacing at M1-level coupled to $V_{LBL}$ voltages (e.g., four individual $V_{LBL0}$ to $V_{LBL3}$ voltages in MLC operation, or eight individual $V_{LBL0}$ to $V_{LBL7}$ voltages in TLC operation, or 16 individual $V_{LBL0}$ to $V_{LBL15}$ voltages in XLC operation). At the same time, alternate Odd metal lines of 1λ-width and 1λ-spacing at M2-level is grounded while adjacent Even LBL data line of 1λ-width and 1λ-spacing at M2-level coupled to $V_{LBL}$ voltages. As a result, any one tight 1λ-width and 1λ-spacing Odd/Even M1/M2-level LBL data line is fully shielded by two tight 1λ-width and 1λ-spacing adjacent Even/Odd M1/M2-level metal lines in ground. Both the M1-level and M2-level metal lines for shielding are grounded by connecting to grounding lines laid out at M0 level (not visible in FIG. 2) in parallel to WLs in X-direction crossing all strings of the whole YUKAI NAND array.

Figure 3:
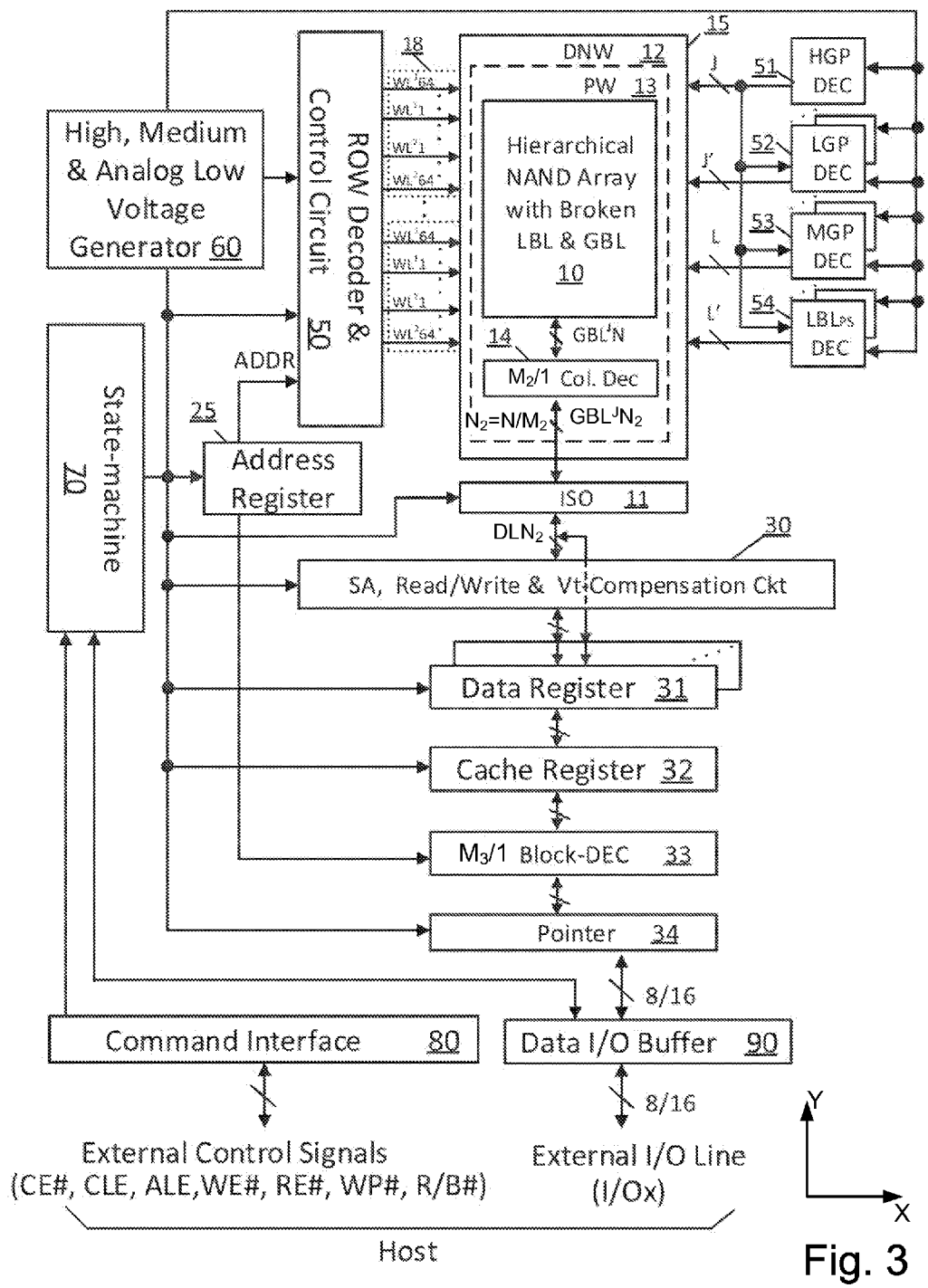
FIG. 3 is a block diagram of a preferred YUKAI-based MLC NAND memory chip according to an embodiment of the present invention.

FIG. 3 is a block diagram of the preferred MLC NAND memory chip based on YUKAI array according to an embodiment of the present invention. As shown, the YUKAI NAND array 15 is, in a specific implementation, comprised of a nLC NAND cell array 10 with a plurality of paired strings as shown in FIG. 1A. The NAND cell array 10 is configured to have the plurality of paired strings associated with two-level BL-hierarchical broken LBLs and GBLs. The GBLs linked to a column decoder 14 in a triple-P-well (TPW) 13 within a common deep-N-well (DNW) 12 of the YUKAI NAND array 15. A 20V ISO array device 11 including a plurality of 20V HV NMOS devices is disposed between the hierarchical YUKAI NAND array 15 and a page buffer (PB) 30. It is located outside the DNW 12 so that NAND array's high voltage 20V erase operation would not damage those low voltage (LV) peripheral circuits such as the PB 30, the LV data register 31, the LV CACHE registers 32, $M_3/1$ block decoder 33, and the LV pointer device 34, via a $N_2$ broken $GBL^J$ $N_2$ lines placed between the NAND cell array 10 and $M_2/1$ column decoder 14. There are $N_2$ inputs of the ISO array device 11 of $GBL^J$ lines and with same number of outputs of $DLN_2$ connecting to $N_2$ bits of PB 30.

The YUKAI NAND array 15 is configured to have each column of GBL divided into J top broken-GBL M3-level metal lines respectively associated with J capacitors $C_{HG}$. Each M3-level broken-GBL $C_{HG}$ is coupled to L M1/M2-level broken-LBL MG groups. Each MG group is formed with one capacitor $C_{MG}$. $C_{MG}$ is a minimum capacitor for a local $C_{LBL}$ of one bit in read and verify operations. Therefore, $C_{MG}=C_{GBL}/J\times L$, as defined and calculated in BL length and value of capacitance where $C_{GBL}=J\times C_{HG}$ is capacitance of unbroken long GBL line, assuming a same unit of parasitic metal capacitance of M1/M2-level metal lines. These J×L short and tight-spacing broken-LBL M1/M2-level metal lines form a plurality of on-chip pseudo-CACHE (PCACHE) Registers with near zero-overhead, leading to J×L×Vdd/Vinh-fold reduction of latency and power consumption in nLC cells read and program-verify operations in the YUKAI NAND array 15. Additionally, each MG group can be further divided to J' smaller $C_{LG}$ capacitor to temporarily store the MLC page data for program operation in the YUKAI NAND array 15.

With the YUKAI NAND array proposed above, several advantages over conventional NAND array can be achieved. In read and verify operation, $C_{MG}$ is precharged to Vinh, thus $V_{MG}$=Vinh≈7V. Therefore, $Q_{MG}$=Vinh×$C_{MG}$=Vinh×$C_{GBL}$/J×L, contrary to prior art of precharging the long $C_{GBL}$ with Vdd. Thus $Q_GBL$=Vdd×$C_{GBL}$. As a result, power ratio=Vdd×J×L/Vinh. In an example, assuming J=8, L=4, Vdd=2.7V, and Vinh=7V, the read and verify precharge power ratio=2.7×8×4/7≈12.3 (assuming same capacitance unit). In another example, assuming Vdd=1.8V, and Vinh=7V, then the power ratio=1.8×8×4/7≈8.2. Therefore, the YUKAI NAND array provides about 10-fold power reduction comparing to conventional NAND array during read and verify operations.

Similarly, a ratio of read or verify precharge time over prior art is also Vdd×J×L/Vinh a same precharge driving capability. In an embodiment, a stronger and higher 20V erase pump with 7V clamping can be used for the precharge Vinh pump supplied to the selected LBLps bus lines without overhead. Thus, the reduction of read and verify precharge and discharge time is ~10 fold.

For program operation on each selected page (corresponding to each WL), since even smaller $C_{LG}$ capacitors are used to temporarily store the MLC page data, thus the program precharge time can be further reduced with program precharge power ratio being Vdd×J'×L×F/Vinh=2.7×8×4×4/7=135.8, assuming that J'=8, L=4, and J=8 for 1,204 physical blocks. That means more than 100-fold power reduction during each iterative ISPP MLC program. Since each (nLC) program operation is divided into a program step and a program-verify step and each program step time is further divided into one LBL precharge time and one FN-tunneling program ISSP time, it is more complicate than read and verify operation to compare the whole course of program latency reduction over prior art. Worse than that, each nLC program operation may have up to n program-verify in one program pass. For example, for an ABL MLC program scheme, one program time plus up to four program-verify times are needed to be counted for one pass program latency. For one or two negative program-verify voltages, more power and latency are required to charge up highly capacitive TPW and DNW (as in erase-verify) than cases for positive, program-verify voltages without charging up TPW and DNW. In a specific embodiment, a method of 3-cap precharge and charge-sharing scheme is proposed to generate n $V_{LBL}$ program voltages on smaller capacitor $C_{LG}$/J'. Then, on average the overall program latency per selected page can be reduced by more than 10-fold as compared with prior art.

Furthermore, if M (M is an integer equal to 2 and greater) pages WLn are selected for performing batch-based concurrent read, verify, and program operations, then additional approximately M-fold reduction in program latency can be achieved on top of about 10-fold reduction per page mentioned above. If M=10, then total latency reduction is about 100-fold.

Another advantage of using the YUKAI NAND array with a truly individual $V_{SL}$-based Vt-offset scheme to replace prior-art $V_{BL}$-based and $V_{WL}$-based Vt-offset techniques is dramatic nLC data reliability improvement. The $V_{SL}$-based Vt-offset scheme means using an individually adjustable NAND cell's source node voltage due to unique feature of this YUKAI array to offset Yupin coupling induced Vt-shift of each individual cell during read and program-verify operations in accordance with the stored nLC data of surrounding aggressor cells in the adjacent LBLs and WLs. For example, when final Vtns of nLC victim cells are locked out earlier than final Vtns of the aggressor cells, all Vtns of victim cells will be widened and shifted by Yupin coupling effect accordingly. Particularly when the aggressor Vtn shift from the most negative Vte to the highest Vtpn of 1P or and similarly for 2P program operation. All these shifting and widening Vtpn will make the Vt-gap between two adjacent program states smaller. Once Vtn value is increased and Vtn width is widen by Yupin coupling effect after programming adjacent WLn+1 or BLn+1 and BLn−1 cells not in same time, then a more effective individual Vtn compensation technique can be achieved by using this preferred $V_{SL}$-based Vt-offset scheme of the present invention.

Additional advantage of the memory chip based YUKAI NAND array over conventional one provides M-fold reduction in row decoder driver's area and layout pitch size by using a so called M-to-1 Row decoder scheme. This can be achieved due to unique batch-based M×WLn lines being selected for performing concurrent read, program and program-verify operations. In other words, M page of nLC cells located at same row-address are simultaneously selected for all key NAND operations. By using M physically independent pages of on-chip capacitors as SCACHE registers in YUKAI NAND array, M pages (WLn) of nLC read data, or nLC program data or program-verify data can be stored in parallel. Since all M independent WLn nLC data of M selected blocks are stored in M corresponding local $C_{LBL}$ capacitors, thus no data contention will happen with a same WLn address. Therefore, M WLn gates can be connected together and M row decoders can be reduced to one with M-fold reduction in layout area.

Note, for each page of WLn, the required pages of PCACHE registers are subject to nLC types and the methods to generate n varied $V_{LBL}$ voltages for preferred ABL-program of the present invention. For example, for a MLC program, there are two PCACHE pages are required to store a 2-bit MLC page data for each selected WLn. Besides, three extra PCACHE capacitors are required for generating four preferred MLC $V_{LBL}$ voltages as a 3-cap charge-sharing technique is used by the present invention. The preferred n $V_{LBL}$ voltages are extended from 0V to some values larger than Vdd such as Vtnmax and Vinh. Specifically, the values of Vtnmax are about 2V for SLC, 3V for MLC, 4V for TLC, and about 5V for XLC with Vinh≥7V. Note, all $V_{LBL}$ voltage values are preferably fixed respective to Vdd variation. In other words, under different Vdd operation, n $V_{LBL}$ values assigned for nLC program would not be changed for the preferred ABL, AnP, and Alt-WL program operation.

Furthermore, a $M_2$-fold improvement over all prior art on PB size and CACHE area reduction can be achieved by using a so-called $M_2$-to-1 scheme for SAs, Data registers and CACHE registers under the proposed YUKAI-based nLC NAND memory chip (FIG. 3). Note, the CACHE area in a PB comprises a real CACHE logic circuit referred as RCACHE that takes an extra silicon area. The PCACHE is referred as a pseudo CACHE and is comprised of $C_{LG}$ or $C_{MG}$ capacitors. The PCACHE takes no extra silicon area and can be used only to temporarily store the nLC data within a predetermined limited time longer than typical DRAM's 60 ms refresh time because either $C_{LG}$ capacitor or $C_{MG}$ capacitor has much less a N+/PW leakage junction on LBL contact areas.

The reason that $M_2$-fold reduction can be achieved in PB bit number is because a group of $M_2$ GBL'/$M_2$ lines are connected to only 1-bit of PB (to be seen in FIG. 4D below). With aid of each PCACHE to temporarily latch and store one full-page nLC data for ABL-program in cell array, a full physical page of RCACHE is not required. It allows just 1/$M_2$ page size of PB to be used for transferring the full physical MLC page data in $M_2$ iterative times. Thus, a big $M_2$-fold reduction in PB size as oppose to a conventional ABL program operation that requires a PB with same bit number of each physical page of WLn.

Although some extra overheads have to be added to the NAND memory chip including a plurality of small HGP decoder 51, LGP decoder 52, MGP decoder 53, and LBLps decoder 54 to allow batch-based concurrent operations, these overheads are much less than the size to add RCACHEs. Note, the preferred batch-based concurrent operations in same or different NAND planes comprising YUKAI NAND array include at least a) read while program and program-verify and b) program while program-verify and read.

Referring to FIG. 3, the YUKAI NAND memory chip includes an ISO circuit 11 having a plurality of 20V HV NMOS devices inserted between the hierarchical NAND array 15 and a page buffer (PB) 30. There are $N_2$ number of $GBL^{J}N_2$ lines as inputs of the ISO circuit 11, and $N_2$ number of $DLN_2$ lines as outputs connecting to same $N_2$ number of bits of the PB 30.

The PB 30 is comprised of a Multiplier circuit, a Sense Amplifier (SA) circuit, and s Read/Write and Vt-compensation circuits. The Multiplier circuit is a first analog-and-digital amplifier of a small signal developed in each of $GBL^{J}N_2$ lines. The amplified signal is transferred to each of corresponding $DLN_2$ outputs after the sensed cell signal is stored at each corresponding $C_{LBL}$ capacitor by performing the predetermined CS with each corresponding $GBL^{J}N$ capacitors. The Read/Write circuit is a second amplifier made of a controlled latch-type SA (like a DRAM SA) configured to distinguish the stored nLC states in read or the iterative program-verify states during each ISSP program step and then determine whether nLC data pass the verification to inhibit further program or fail to continue the ISPP program. The Vt-compensation circuit includes nLC D/A and A/D converts and $V_{LBL}$-generator for a preferred $V_{SL}$-based Vt-offset scheme.

Referring to FIG. 3 again, the NAND memory chip includes Data registers 31 configured to be multiple real CACHE registers or RCACHE. There are at least X number of RCACHEs made of large glue logics rather than $C_{LBL}$ as PCACHE in cell array. Typically, the X number of RCACHEs for storing nLC page data of one WLn is shown in Table 2 below for nLC operations.

TABLE 2

| nLC/WLn | SLC | MLC | TLC | XLC | Analog |
|---------|-----|-----|-----|-----|--------|
| X       | 1   | 2   | 3   | 4   | ≥5     |

The connections of the X Data registers 31 to the ISO circuit 11 include $N_2$ number of output data lines $DLN_2$ in parallel so that faster and more flexible storages of nLC page data can be achieved. Note, $N_2=N/M_2$.

The NAND memory chip further includes a CACHE register 32 configured as a $N_2$-bit RCACHE register like an one-page of $N_2$-bit Data register made of the glue logics rather than $C_{LBL}$ as PCACHE in cell array. Although there are X pages of data registers 31 for each PB 30, only one page of CACHE register 32 is required and shared independently by all X pages of PB 30. In an embodiment, the RCACHE register can be designed to have two functions for both Serial and Parallel read NAND interface.

Also shown in FIG. 3, the NAND memory chip further includes a $M_3/1$ Block-decoder circuit 33 and Pointer circuit 34 to be sequentially coupled to the CACHE register 32. The Pointer circuit 34 is a medium-sized page-buffer circuit with $M_3/1$ Block-decoder circuit 33 being used between the large CACHE register 32 and a small Data I/O Buffer 90 which is coupled to an external I/O Line connected to host. In an embodiment, the number of Data I/O Buffer 90 can be 8 or 16, depending on whether NAND interface is byte or word. The $M_3$ number is defined in Table 3 below to have $M_3$ selections of byte or word out from $N_2$ CACHE bits to Data I/O buffer 90 to be clocked out from the NAND chip to an off-chip Flash controller.

TABLE 3

| # of sequential clocks | Byte-I/O | Word-I/O |
|------------------------|----------|----------|
| $M_3$ value            | $N_2/8$  | $N_2/16$ |

Further shown in FIG. 3, the NAND memory chip includes a Command Interface circuit 80 configured to communicate external control signals from host to a state-machine 70. The state-machine 70 further use the control signals to interact with the Data I/O buffer 90 and to control each of ISO circuit 11, PB 30, X number of data register 31, CACHE register 32, $M_3/1$ Block-decoder circuit 33, and Pointer circuit 34. The state-machine 70 also provides controls of an Address register 25, a voltage generator 60, a Row-decoder control circuit 50, as well as HGP decoder 51, LGP decoder 52, MGP decoder 53, and LBLps decoder 54. The Row-decoder control circuit 50 receives ADDR information from the Address register 25 and corresponding high, medium, and analog low voltages from the voltage generator 60 for setting word line control gate voltages of each NAND block of the YUKAI NAND array 15 to perform preferred NAND read, program, and verify operations. The same NAND array 15 also receives control signals from as-mentioned HGP decoder 51, LGP decoder 52, MGP decoder 53, and LBLps decoder 54 for selecting or dividing the array into smaller groups like HG, LG, or MG and providing precharging/inhibiting voltages to each selected block through a LBLps power line during the preferred NAND read, program, and verify operations. In a specific embodiment, additional commands are added for performing preferred concurrent operations in same or different NAND planes. These new commands are intended for driving concurrent $C_{LBL}$ precharge, n varied-level $V_{LBL}$ generation, n $V_{SL}$-based Vt-offset values to cover Yupin BL-BL or WL-WL coupling effects. More detail descriptions about how to perform the preferred read, program, and verify operations under the proposed YUKAI NAND memory architecture can be found throughout the specification and particularly below.

Figure 4A:
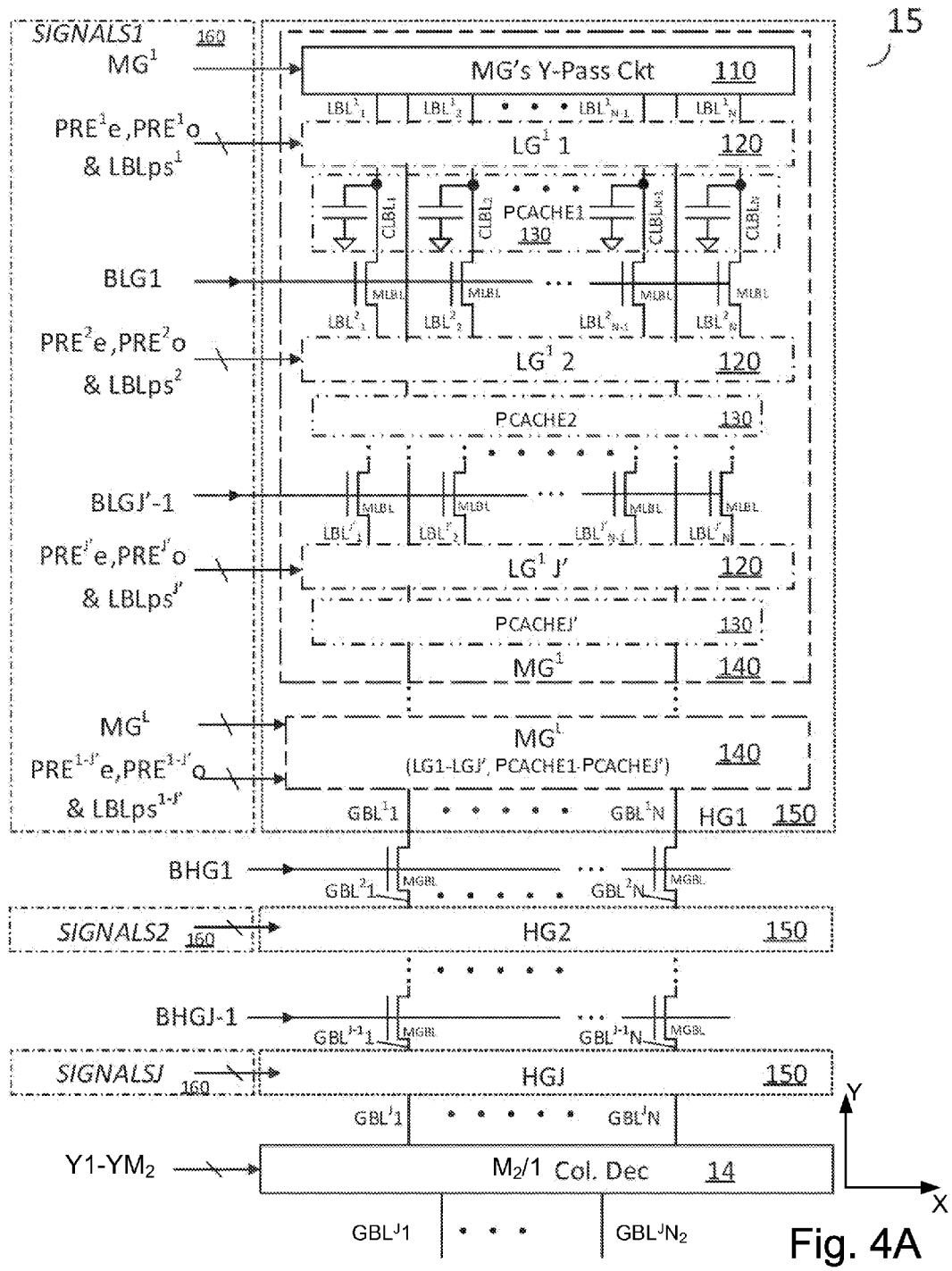
FIG. 4A is a diagram showing the YUKAI NAND array divided into multiple hierarchical BL groups according to an embodiment of the present invention.

FIG. 4A is a diagram showing preferred memory divisions of the YUKAI NAND array divided into three hierarchical BL groups according to an embodiment of the present invention. As shown, the whole NAND array 15 of FIG. 3 is divided into J equal-length or equal-size of broken GBL HG groups 150. The HG groups 150 are formed in triple-P-well 13 within a DNW 12 with a row of HV ISO array devices 11 located outside the DNW 12, as seen in FIG. 3. The last group HGJ is connected to $M_2/1$ Column-decoder 14 via N broken $GBL^{J}N$ lines. In fact, the size of each broken GBL group HGj (j=1, 2, . . . J) can be made identical or different and the number of HG groups is not necessary to be $2^Y$ where Y is a positive integer. From the hierarchical BL structure perspective, all J HG groups are disposed at the top-level of chip layout with total J number of broken GBL (M3-level) lines $GBL^{1 \sim J} N$ divided by (J−1)

broken-GBL NMOS devices MGBL gated by corresponding (J−1) BHG signals. The group HGJ is one located nearest to the PB via a $M_2/1$ Column-decoder 14 but the group HG1 is one located farthest from the PB. Each HG group 150 is coupled by a Signals Row-decoder 160 to provide control signals like $MG^{1\sim L}$ for MG Y-pass devices to couple broken GBLs to LBLs, PREe, PREo and LBLps associated to each LG group for precharging/discharging LBLs, BLG signal for controlling connection/isolation between LGs.

As shown in FIG. 4A, each HG group 150 is further divided into L MG groups 140 connected by N corresponding top-level broken $GBL^J N$ metal lines at M3-level. Each M3-level metal line is associated with a capacitor $C_{MG}$. Each MG group is then divided into J' broken lower-level LG groups 120 associated with shorter metal lines $LBL^{J'}{}_N$ at M1/M2-levels forming smaller capacitors $C_{LG}$. Each LG group comprises a plurality of NAND blocks (not directly shown) correspondingly connected by N lower-level M1/M2-level $LBL^{J'}{}_N$ metal lines which form one row of n-bit pseudo CACHE (PCACHE) registers 130. Each MG group includes a Y-pass circuit 110 configured to couple top-level $GBL^J N$ metal lines at M3-level respectively to the N $LBL^{J'}{}_N$ lines of a first LG group. For the YUKAI NAND array based on paired string structure, $C_{LG}$ can be divided into two groups such as $C_{LGe}$ and $C_{LGo}$, or alternatively referred as $C_{LBLe}$ and $C_{LBLo}$, respectively.

The $M_2/1$ column-decoder 14 is coupled to HG group via total N number of broken $GBL^J N$ lines and further coupled to PB via total $N_2$ number of $GBL^J N_2$ lines, where $N_2=N/M_2$. Since $N_2$ is smaller than N by $M_2$-fold, thus the PB size can be reduced by $M_2$-fold for a smaller chip area. The devices of $M_2/1$ column-decoder 14 are NMOS Y-select transistors gated by $M_2$ number of decoder inputs $Y1\sim YM_2$.

Furthermore, each YUKAI block includes n NAND strings cascaded in WL-direction, i.e., row-direction, or X-direction. Each of the n NAND strings can be any one selected from the group shown previously in FIGS. 1A-1C and more not shown without affecting the implementation of preferred NAND operations of the present invention based on the YUKAI NAND architecture proposed above.

Figure 4B:
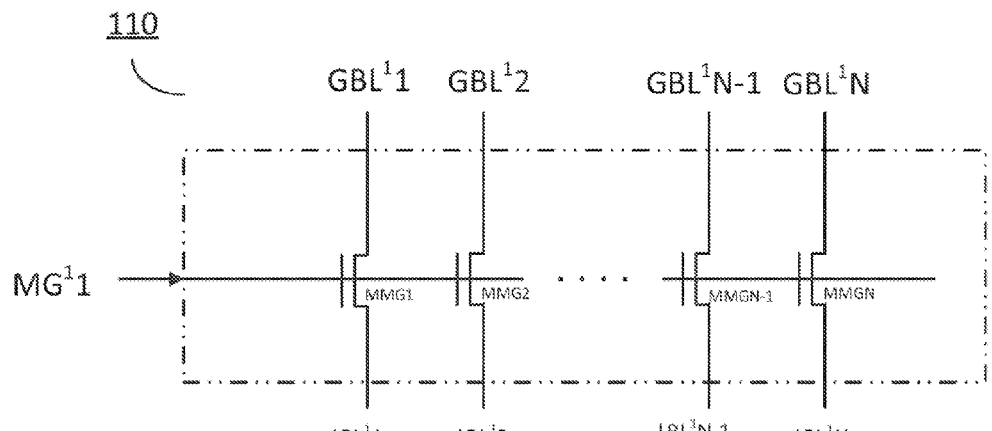
FIG. 4B is a diagram of a number of preferred Y-pass units in the YUKAI NAND array of FIG. 4A according to the embodiment of the present invention.

FIG. 4B is a diagram of a preferred MG Y-pass circuit in the NAND array of FIG. 4A according to the embodiment of the present invention. As shown, the MG Y-pass circuit 110 is configured to couple N number of LBLs with $N_1$ number of GBLs. As an example, FIG. 4B only shows that $N_1=N$, i.e., one top level metal line GBL is coupled to one lower metal line LBL in one-to-one fashion with a same 1λ pitch size. In a general scenario, the top-level metal line pitch size of each GBL can be $M_1$-fold relaxed as compared to each corresponding tight pitch bottom-level LBL line. In other words, each MG Y-pass circuit 110 includes $N_1$ number of NMOS 1-poly pass transistors such as from MMG1 to $MMGN_1$ with $M_1$ number of gates tied to $MG^11$ to $MG^1M_1$ respectively, where $N_1=N/M_1$, forming $N_1$ number of $M_1/1$ ($M_1$-to-1) multiplexer units for coupling $M_1$ number of LBL input lines at bottom-level to one GBL output at top-level. In an example, $M_1=2$ by making a 2-to-1 multiplexer unit for an Odd and Even select device, using only two $MG^11$ and $MG^12$ signals (e.g., MGo and MGe) to respectively select one of paired tight 1λ-width and 1λ-spacing M1/M2-level $LBL^11$ and M2/M1-level $LBL^12$ (e.g., LBLo and LBLe lines) for corresponding one top M3-level $GBL^11$ line.

Figure 4C:
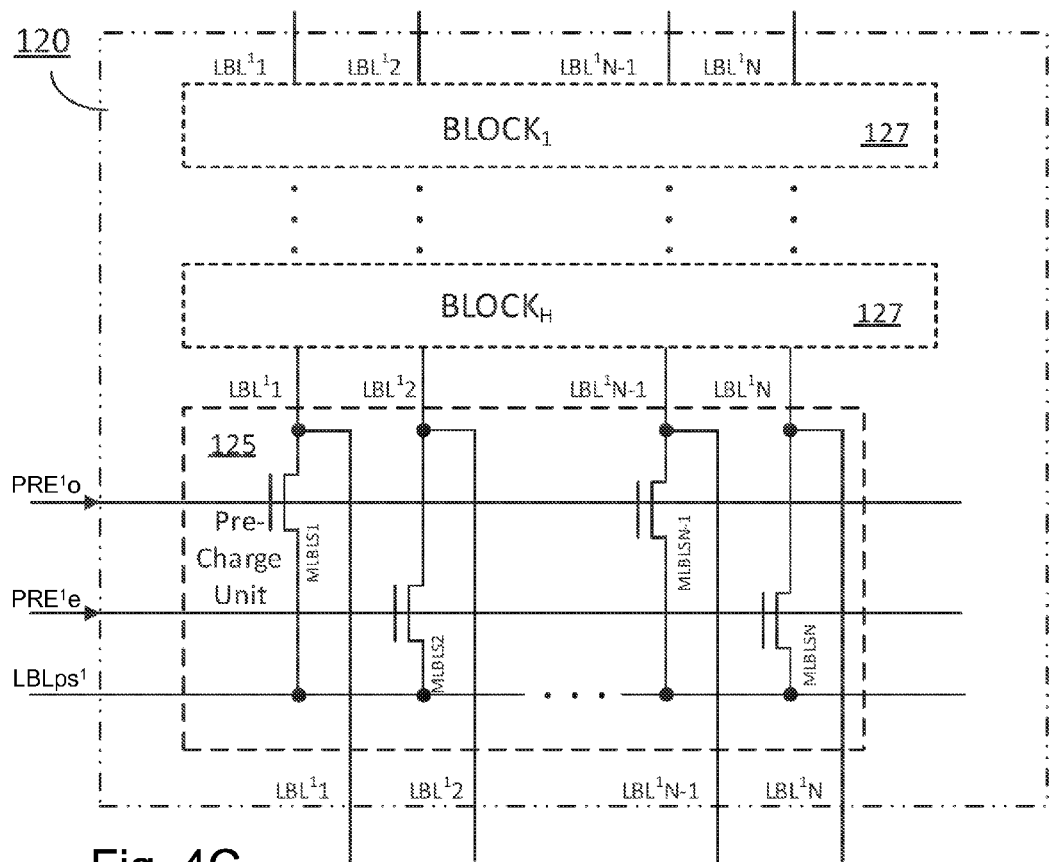
FIG. 4C is a diagram of a LG circuit in the YUKAI NAND array of FIG. 4A according to the embodiment of the present invention.

FIG. 4C is a diagram of a LG circuit in FIG. 4A comprising a preferred number of NAND blocks connected by common LBL lines and one shared LBL-precharger according to the embodiment of the present invention. As shown, a preferred LGJ' circuit 120 is one unit of a MG group 140 seen in FIG. 4A, including H NAND blocks 127, $Block_1$ to $Block_H$, connected by N low-level tight M1/M2-level LBL metal lines (e.g., $LBL^11$ to $LBL^1N$) and one shared LBL-precharger 125 comprised of N Precharger units. Each unit has N separate LBL outputs connected to $LBL^11$ to $LBL^1N$ across H blocks but has only one common power line connected to $LBL^1ps$ for supplying a common medium program-inhibit voltage Vinh with maximum around ~7V for LBL precharge during program-verify and read operations.

The whole $LBL^11$ to $LBL^1N$ lines are interleavingly divided into Even and Odd groups with their respective gates of MLBLS driven by $PRE^1e$ and $PRE^1o$ bias voltages. The function of this LGJ' circuit 12 is to form a preferred NAND LG capacitor $C_{LG}$ that allows an independent and smallest precharging and discharging current on each $C_{LG}$ of each PCACHE bit for performing batch-based concurrent ABL and AnP program operation under the framework of YUKAI NAND memory architecture proposed above.

The voltage value of each selected $LBL^1ps$ power line varies in accordance with targeted functions and operating Vdd voltages. The targeted functions includes: a) varied precharge voltages of Vinh from LBLps lines for generating the desired n $V_{LBL}s$ on the selected $C_{LG}$ for 0P, 1P, 2P and even FP program operation (For example, four MLC's $V_{LBL}s$ are Vinh, 2V, 1V and 0V as seen in FIG. 7B); b) Vinh=7V or 6V to generate above four MLC's $V_{LBL}s$ by using a 3-cap CS technique under Vdd=2.4V (see FIG. 7C); c) Vinh=7V, 6V, and 3V to generate above four MLC's $V_{LBL}s$ by using similar 3-cap CS technique under Vdd=1.6V (see FIG. 7D).

In order to generate the four desired $V_{LBL}$ program and one program-inhibit voltages ranging from 0V to Vtnmax for MLC storage in different program pass (0P, 1P, 2P, and FP), three $C_{LG}$ capacitors is involved and the Vinh values has little flexible values such as 3V to 7V, not always fixed at 7V. The generation of $V_{LBL}$ voltages uses the CS technique between three $C_{LG}$ capacitors when three vertically adjacent MG groups are connected.

The precharge of all $C_{LG}$ capacitors (Odd and Even) is performed by setting $PRE^1e=PRE^1o$ to Vpass and $LBL^1ps$ to Vinh, where Vpass>Vinh+Vt, where Vt is the threshold voltage of MLBLS1 and MLBLS2. As such the Vinh on $LBL^1ps$ can be fully passed to $LBL^11$ to $LBL^1N$ simultaneously without any voltage drop.

Referring to FIG. 4C, it only shows that $C_{LG}$ is precharged with the desired Vinh voltage at one precharging period (such as one of T0, T1, and T2 time periods to be defined in FIG. 7C and FIG. 7D tables). For 3-cap CS, three adjacent $C_{LG}$ capacitors need to be precharged with three different or same precharged voltages and then connected for CS to obtain the desired $V_{LBL}$ voltages (to be defined in FIG. 7C and FIG. 7D) under different Vdd operating voltages.

The connections of three rows of N-bit adjacent $C_{LG}$ capacitors of PCACHE registers are through the bus lines of $LBL^11$ to $LBL^1N$ and two corresponding N-bit $C_{LG}$ bridge (or connect) transistors MLBL gated by corresponding BLGJ'−1 signals as shown in FIG. 4A. Note, when all the residue HVs in N $C_{LG}$ capacitors need to be charged after ABL program, $LBL^1ps$ is reset from Vinh to 0V in most of cases, but in some cases reset to other desired verify or $V_{SL}$ offset-voltages with $PRE^1o$ and $PRE^1e$ biased in conduction state during read (such as 1V for 0-pass negative-Vt program-verify in FIG. 6B WLn−1 1st-pass program) with the purpose to avoid recharge power consumption. Although Odd and Even LBL lines, such as $LBL^11$ and $LBL^12$ to $LBL^1N−1$ and $LBL^1N$ lines, are formed by interleaving M1/M2-level metal lines, this only happens in local $C_{LG}$ area. For those $LBL^1 1$ and $LBL^1 2$ to $LBL^1 N-1$ and $LBL^1 N$ lines used to connect the adjacent $C_{LG}$, they are turned to use M1-level only because this happens only at the boundary area between two adjacent LG groups as shown in the bottom LBL bus signals to allow the $LBL^1$ps being formed by M0-level metal line only without increasing the total metal layer number in NAND array for cost reduction.

Figure 4D:
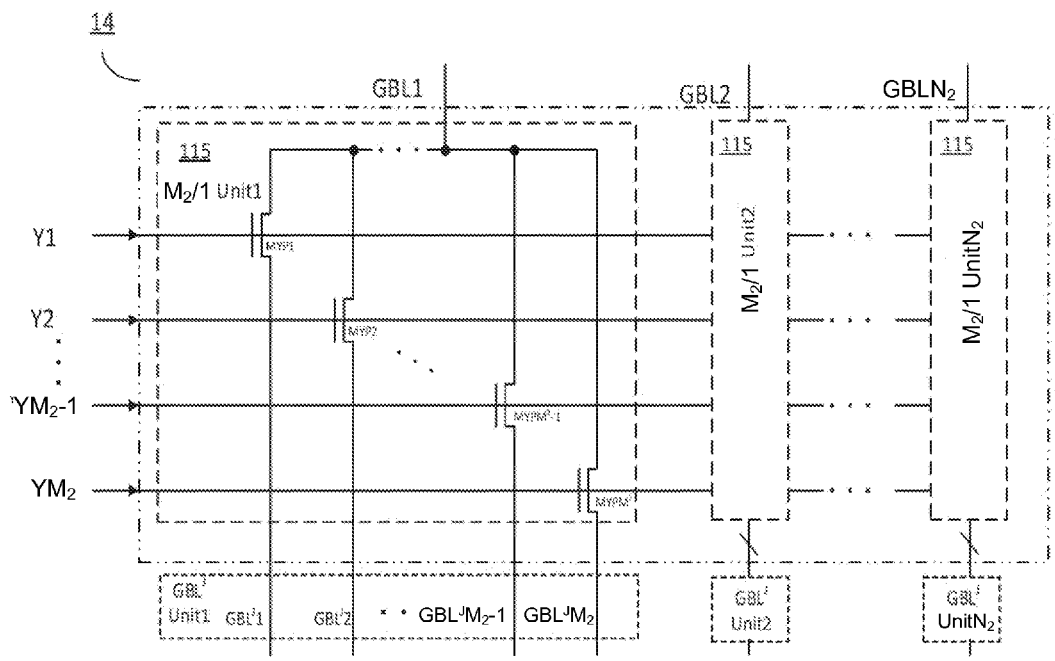
FIG. 4D is a diagram of a column-decoder circuit in the YUKAI NAND array of FIG. 4A according to the embodiment of the present invention.

FIG. 4D is a diagram of a column-decoder circuit in FIG. 4A having multiple GBL separate inputs with only one common output according to the embodiment of the present invention. As shown, a preferred Y-pass column-decoder circuit 14 as seen in FIG. 4A includes $N_2$ NMOS MHV Y-pass units 115. Each unit has $M_2$ LBL separate inputs connected to $M_2$ common gates of Y1, Y2, ... $YM_2$ of corresponding NMOS MHV devices of MYP1, MYP2, ... $MYPM_2$ and $M_2$ inputs of $GBL^J 1$ to $GBL^J M_2$ with only one common GBL output. For example, in the $M_2/1$ ($M_2$-to-1 multiplexer) Unit1, the $M_2$ broken $GBL^J M_2$ inputs are decoded to one final GBL1 output, which will be connected to one corresponding bit of PB 30 via $N_2$-bit ISO circuit 11 as shown in FIG. 3. The total final outputs of the column-decoder circuit 14 are GBL1 to $GBLN_2$.

By implementing this Y-pass column-decoder circuit 14 to the NAND memory chip, a $M_2$-fold saving on PB size can be achieved and a tight chip layout area between PB and GBL is relaxed by $M_2$-fold. In other words, the number of $GBLN_2$ can be designed to be $M_2$-fold smaller than total GBL lines and still allows ABL program, because there are same number of N-bit LBL lines and N-bit capacitors of N-bit PCACHE register are used to temporarily store ABL-page N-bit data. These ABL N-bit MLC page data can be sequentially loaded and locked in from a smaller $N_2$-bit PB to a larger N-bit PCACHE $C_{LG}$ capacitors by $M_2$ cycles, where $N_2=N/M_2$. If $M_2=2$, then ½ PB size is saved. If $M_2=4$, then ¾ PB size is saved.

As a result, an ABL nLC-program scheme under the YUKAI NAND memory architecture of the present invention does not require a PB's bits number to be the same as the number of LBL lines. The column-decoder circuit 14 proposed above has many advantages including: 1) to allow bit number of $M_2/1$-reduction between N-bit local broken GBL lines and $N_2$-bit PB, where $M_2=N/N_2$ and $M_2=2, 4, 8, 16$, etc, for $M_2$-fold PB size reduction; 2) to allow final $N_2$-bit voltages of GBL1 to $GBLN_2$ from $GBL^J 1$ to $GBL^J N$ to be higher than Vdd but below Vinh; 3) to load $N_2$-bit data into N-bit $C_{LG}$ from the smaller $N_2$-bit PB for the ABL nLC program scheme.

Figure 4E:
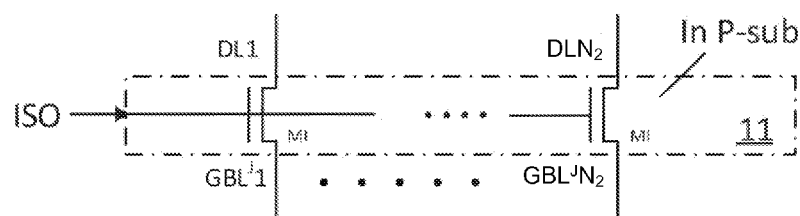
FIG. 4E is a diagram of an isolation circuit between the YUKAI NAND array of FIG. 4A and a page buffer according to an embodiment of the present invention.

FIG. 4E is a diagram of an isolation circuit between the NAND array and page buffer according to an embodiment of the present invention. As shown, in the ISO circuit 11, each final broken GBL line such as $GBL^J 1$ to $GBL^J N_2$ needs to have one corresponding 20V NMOS 1-poly device MI acting as a HV buffer to isolate the 20V HV erase voltage appearing on all nodes of $GBL^J 1$ to $GBL^J N_2$ of the NAND array 15 from damaging $N_2$-bit corresponding LV PB located in the peripheral area. The isolation is achieved by coupling the signal of the common gate voltage $V_{ISO}$ of $N_2$ number of NMOS transistors MI to ground during erase operation, and coupling to a Vpass voltage higher than Vdd+Vt during other concurrent operations such as read, program-verify and erase-verify. The reason to have $V_{ISO}$>Vdd+Vt is to allow the full Vdd and Vss as high/low voltages from each corresponding $GBL^J N_2$ to store each data bit, DL1 to $DLN_2$, of $N_2$-bit LV PB without any voltage drop through the ISO circuit 11 along with several intermediate paths through FIGS. 4A, 4B, 4C, and 4D.

The NMOS HV 20V 1-poly devices MI are formed outside the regular NAND array area. In other words, these ISO devices are preferably formed on the regular P-well as row-decoder devices (not shown), not in the same Triple-P-Well (TPW) and deep-N-well (DNW) as the regular NAND cells within NAND array 15. As a consequence, 20V Verase in the TPW and DNW in NAND array 15 would be blocked by this HV ISO circuit 11 (see FIG. 4E and FIG. 3) by grounding $V_{ISO}$=0V. Table 4 below summaries settings of $V_{ISO}$ voltage for various NAND nLC operations.

TABLE 4

| nLC operation | $V_{ISO}$ | Conditions Y = 1 to $N_2$ |
|---|---|---|
| During PB sensing | Vdd + Vt | If $VGBL^J Y \geq$ Vdd, |
| During PB sensing | Vdd | If $VGBL^J Y <$ Vdd, |
| During erase | 0 V | $VGBL^J Y = 20$ V |
| During read and verify | Vdd + Vt | $V_{DLY}$ = Vdd or Vss |
| During all GBL precharge | 0 V | $V_{DLY}$ = don't-care |
| During 2-CAP CS | 0 V | $V_{DLY}$ = don't-care |
| During Vinh/Vss and Vdd/Vss conversion in $C_{LG}$ and $C_{MG}$ | 0 V | $V_{DLY}$ = don't-care |

In an implementation of the present invention, a 4-state MLC ABL, AnP, and Alt-WL program scheme and associated Vtn distribution, spacing and Vt shifting and widening calculation and flows are provided below. Based on an assumption of 10% per Yupin WL-WL and BL-BL floating-gate coupling effect for both the boundary and non-boundary WLs, concurrent ABL and AnP 1P and 2P (Coarse), and FP (Fine) program and program-verify operations are illustrated in FIGS. 5A, 5B, and 6A-6R of following sections of specification.

In an embodiment, the as-mentioned ABL program stands for All-BL NAND program. Here it specifically stands for All-LBL NAND program in this application. This means all N-bit nLC NAND cells of all LBLs in one physical WL are simultaneously selected for an nLC program operation at a time. Additionally, the as-mentioned AnP program stands for all n-state of nLC program plus one program-inhibit operations are performed concurrently with same starting and ending time. Note, the terminologies of "concurrent" and "simultaneous" are interchangingly used in the present invention.

In other words, this AnP program scheme provides a truly effective method to allow all individual nLC's n varied-level Vtn of memory cell channel threshold states to be programmed simultaneously with self-ΔVtn-controlled scheme with starting and finishing substantially at a same time without earlier program lockout. The ΔVtn means that true n−1 final target Vtn-differences defined by n Vt states of nLC data. For a 4-state MLC cell, there are three equally-spaced ΔVtn ~1V. But at most of time only 2 out of 3 ΔVtn are made equal for higher Vtn between P1 state and P2 state and between P2 state and P3 state. ΔVtn between P0 state and P1 state is usually made larger than other two to take into larger Vt-shift that frequently happen between P0 and P1. For TLC and XLC cells, the ΔVtn will be made smaller than 1V.

In an embodiment, the Yupin BL-BL floating-gate-coupling effect can be substantially reduced because no early lockout program scenario will happen to all nLC program states as the result from the present NAND design with all n-state of nLC program plus one program-inhibit operations being performed concurrently with substantially same starting time and same ending time. In particular, AnP program scheme can have all nLC states programs being ended almost at a same time is achieved by means of a self-timed nLC program control scheme in which ΔVtn-based $V_{LBL}$ voltages are assigned in accordance with exact Vtn difference among n final targeted nLC Vtn values during all 0P, 1P, 2P, and FP programs.

For each nLC cell, it is preferred to have n varied-level $V_{LBL}$ program voltages and one program-inhibit voltage assigned to n corresponding nLC program states such as P0, P1 to Pn. For a MLC ABL program, four or less $V_{LBL}$ program voltages and one unified Vinh program-inhibit voltage are used for different program passes. There are two options of setting MLC $V_{LBL}$ voltages. 1) If the lowest Vtn state P0 with the targeted Vtp0 min<−0.3V for program-verify, then the MLC program preferably uses total four $V_{LBL}$ voltages and one Vinh voltage. But by purposely leaving the lowest state as only one erase-state when applying Vinh without being programmed in any program pass, the negative-Vt verify operation with lengthy and high power-consumption conventionally required to charge up TPW and DNW now can be eliminated. The reason to set Vtp0min<−0.3V means that $V_{SL}$>0.3V verify-compensation has a risk for verification without charging $V_{TPW}$=$V_{DNW}$>0.3V due to concern of tiny cell channel's punch-through. 2) Alternatively, if the lowest Vtn state P0 with the targeted Vtp0 min>−0.3V for program-verify, then the MLC program needs total three $V_{LBL}$ voltages and one Vinh voltage, particularly being used by 2P and FP programs. Alternatively, for a SLC-like 0P and 1P programs on dummy cells or regular cells, only two $V_{LBL}$ voltages and one Vinh voltage are required.

One universal Vinh program-inhibit voltage can be assigned for all n nLC program states when each individual Vtn value meets its own program-verify value predetermined after each iterative program pulse is performed. Typically, the Vinh value is set to be ~7V for the ideal precharge voltage. But as a 3-Cap CS scheme is used to generate desired n final $V_{LBL}$ program voltages and a final program-inhibit Vinh voltage, then each final $V_{LBL}$ voltage can vary between 0V and 7V. There is a tradeoff between the final optimal $V_{LBL}$ voltages and final Vinh voltage. For setting more accurate n $V_{LBL}$ voltages, the final Vinh voltage may end up with a value lower than 7V. In some cases, both ideal final Vinh=7V and n accurate $V_{LBL}$ program voltages as the desired Vtn can also be achieved at a higher Vdd operating voltage.

In a specific embodiment, a 3-cap CS technique is used to generate n final $V_{LBL}$ program voltages and one final Vinh voltage closer to corresponding target values. In general, the n final $V_{LBL}$ program voltages and one final Vinh voltage are preferred to be generated via the least number of $C_{LG}$ capacitors as possible to save latency time and power consumption in MLC program operation. In this MLC program, three adjacent independent and equal $C_{LG}$ capacitors acted as 3-bit PCACHE registers are used per one MLC physical cell.

Firstly, the three $C_{LG}$ capacitors are precharged independently with three predetermined voltages in accordance with four MLC data on one cycle or three different cycles of t0, t1, and t2 can be performed before CS. The precharged voltages on three adjacent $C_{LG}$ capacitors preferably vary from 0V to Vinh, which is defined by the breakdown voltage of ~7V of the string-select transistors MG and MS.

In a specific embodiment, precharging the three capacitors needs three selected LBLps lines to be coupled respectively with three predetermined voltages. These three $C_{LG}$ voltages are referred as Vinh0 for t0, Vinh1 for t1 and Vinh2 for t2 with equal $C_{LG}$ capacitance.

Secondly, a CS step among three adjacent $C_{LG}$ capacitors is performed to generate four or three final $V_{LBL}$ program voltages and a final Vinh voltage for MLC program. Each final $V_{LBL}$ voltage for one program state after the CS step is (Vinh0+Vinh1+Vinh2)/3. Different MLC program state would have different set of Vinh0+Vinh1+Vinh2 values. More details of the CS step are shown in FIG. 7C under Vddmin=2.4V and FIG. 7D under Vddmin=1.6V. Note, less than three $C_{LG}$ capacitors can be used for generating the desired n $V_{LBL}$ voltages and one Vinh voltage with larger off values from the desired predetermined values.

Further, the as-mentioned Alt-WL program scheme is referred as alternating MLC program among three adjacent WLs in the present invention. Several conventional Alt-WL program schemes have been extensively used for MLC and TLC programs for years to mitigate NAND cell's floating-gate coupling effect by performing a sequential and alternating (Alt-WL) MLC program among three adjacent WLs. The idea behind the Alt-WL program scheme is that each physical nLC page program is divided into multiple logic pages that have to be programmed in succession according to their physical page order. For a MLC program, it is divided into MSB and LSB logic pages. As well known in the art, this operative way removes or mitigates the capacitive coupling effect due to the preceding pages. In fact, the preceding pages cannot change the threshold voltages of the cells of the current page because they are not modified any more after their programming and are referred as lockout states in the lockout page. However, such technique does not remove the capacitive coupling effects of the other MLC cells, which are programmed successively in adjacent WLs.

The present invention provides a more reliable Alt-WL program scheme that is differentiated by following major differences compared to conventional Alt-WL program. For 1P MSB-based SLC-like program, this is a 2-state interim P0' state and P2' state program operation. The MSB bit of MLC data is loaded and programmed first to allow 1P SLC-like program to meet certain preferred criteria to be shown below. Note, there are four final MLC program states from P0, P1, P2, and P3 associated with Vt value sequence as Vtp0<Vtp1<Vtp2<Vtp3. A first criterion is that the maximum Vt of the interim program state P2' after 1P operation has to be lower than the minimum Vt of the final P2 state after 2P operation with ~0.5V margin to prevent earlier lockout in 1P operation before 2P operation is performed subsequently. In other words, Vp0max(1P)<Vp2'max (1P)≤Vp2 min (2P)−0.5V<Vp3 min (2P). A second criterion is that the interim state P0' is used to generate two final lower program states P0 and P1, while the interim state P2' is used to generate two final higher program states P2 and P3. The final P2 and P3 state program is not allowed in SLC-like 1P program operation. Thus MSB page data has to be loaded and programmed first. After successful 1P program operation, the MSB-bit data can be removed from RCACHE and PCACHE registers so that next LSB-bit data can be loaded into the same place without taking addition $C_{LG}$ capacitors for temporary storage. Because the MSB page data can be retrieved from WLn for subsequent 2P MLC program, it can be removed temporarily from the corresponding $C_{LG}$ capacitors.

For 2P LSB-based MLC program, this is a final 4-state P0, P1, P2, and P3 program operation. In this preferred MLC program, the interim state P0' is programmed into two final P0 and P1 states, while interim state P2' is programmed into two final P2 and P3 states simultaneously with well-planned three equal Vt-shifts to reduce the Yupin Vt coupling effect on four final program states. The comparison of Alt-WL program between present invention and prior art are summarized in Table 5 below.

TABLE 5

| MLC Alt-WL program comparison | present invention | Prior art |
|---|---|---|
| Number of $V_{LBL}$/Vinh for 1P (SLC) | 2/1 | 1/1 |
| Number of $V_{LBL}$/Vinh for 2P (MLC) | 3/1 with zero 1P lockout | 3/1 with some 1P lockout |
| Values of $V_{LBL}$ | $0\ V \leq V_{LBL} \leq$ Vtpnmax | $0\ V \leq V_{LBL} <$ Vdd − Vt |
| Value of Vinh | Vdd < Vinh ≤ 7 V | Vinh = Vdd |

FIG. 5A is a table showing preferred ABL, AnP, and Alt-WL program scheme and sequences of dummy program (DP), 1st-pass (1P) SLC-like program, and 2nd-pass (2P) MLC program operations according to an embodiment of the present invention. The preferred ABL, AnP, and Alt-WL MLC program sequences are illustrated with SLC-like DP, 0P, and 1P programs, and MLC 2P program and corresponding DS, 1S, and 2S Vt-shifts with respect to multiple time periods t0 to t11. In an example, the ABL, AnP, and Alt-WL MLC program starts from one top dummy wordline DMYWL, a first boundary WLn−1, non-boundary WLs such as WLn, WLn+1, and WLn+2, and a second boundary WLn+3. A pre-program 0P of WLn+4 cell follows the program of WLn+3 cells because the next MLC page data is not ready yet.

In an embodiment, 1s stands for 1P-induced Vt-shift ($\Delta Vt_{1S}$) for a MLC cell being programmed from one initial negative (erased) $E^0$ state to two SLC-like interim program states of P0' and P2' in all selected WLs. Further in the specification, $P0^1$ and $P2^1$ are used to represent respective interim P0' state and P2' state by 1P program operation. 1S is the largest cell Vt-shift because, as shown in an example for MLC cell with the first boundary WLn−1, it is calculated by using 10% of the largest Vt-change from $E^0$ state with the most negative $Vte^0$ min (−4.5V) to $P2^1$ state with the highest Vtp1max (1.2V). The largest value of the MLC Vt-shift is thus 5.7V.

In another embodiment, 2S stands for 2P-induced Vt-shift ($\Delta Vt_{2S}$) for a MLC cell being programmed from the two 1P program states $P0^1$ and $P2^1$ after 1P program operation to four final program states $P0^4$, $P1^4$, $P2^4$, and $P3^3$ by 2P program operation. For example, for the MLC cell with the first boundary WLn−1, this value of $\Delta Vt_{2S}$ is being adjusted to be equal to $\Delta Vt_{1S}$ due to a Vt-shift of 2.8V because from Vtp$2^1$min=1.0V to Vtp$3^3$max=3.8V and Vtp$0^2$ min=−0.8V to Vtp$1^3$max=1.8V being optimized to be same.

In yet another embodiment, the 1P program is 1st-pass ABL, AnP, and Alt-WL SLC-like program operation which can be performed to increase the regular NAND cell Vt from initial erase $E^0$ state before being shifted or widened by its own WL program or by adjacent WLs program. In a specific embodiment, 1P program is performed from virgin $E^0$ state to a preferred negative P0 state with Vtp0 min=−1V and a P2 positive state with Vtp2 min=1V but without suffering Yupin coupling effect. The $E^0$ state is defined as the erase state without being affected by Yupin coupling effect. In the 1P program, as shown in an example for MLC cell with the first boundary WLn−1, the maximum Vt-shift (1S) of 5.7V is measured from $Vte^0$ min=−4.5V to Vtp2max=1.2V, i.e., $\Delta Vt1smax$=5.7V; the minimum Vt-shift is 2.5V which is measured from $Vte^0$max=−3.5V to Vtp$0^1$min=−1V, i.e., $\Delta Vt1smin$=2.5V.

In another specific embodiment, 1P program is performed from virgin non-$E^0$ state such as $E^1$ or $E^2$ states to one similar preferred negative P0 state with Vtp$^0$min=−1V and one P2 positive state with Vtp2 min=1V. The $E^1$ state is defined as the state being affected by two Yupin BL-BL coupling effects in one selected WL. As a result, the $Vte^0$max=−3.5V is being shifted to $Vte^1$max=−3.02V. In 1P program, the maximum Vt-shift (1S) of 5.7V (is measured from $Vte^0$ min=−4.5V to Vtp2max=1.2V. This maximum 1S referred as $\Delta Vt1Smax$=5.7V. The minimum Vt-shift is 2.5V which is measured from $Vte^0$max=−3.5V to Vtp$0^1$min=−1.0V. The minimum 1S referred as $\Delta Vt1Smin$=2.5V.

In still another specific embodiment, the 2P program is 2nd-pass ABL, AnP, and Alt-WL MLC (coarse) program, which is to program part of $P2^2$ state into $P2^3$ and $P3^3$ and to program part of $P0^2$ state into $P1^3$ state. The remaining $P0^2$ cells are inhibited from program.

In yet still another specific embodiment, the DP stands for the preferred dummy cell program with maximum Vt-shift from −4.5V to 2V. The single width and accuracy of Vt of DP program state $P2^3$ is not critical because it is not used to store MLC data but just defined as an Odd/Even select Vt. Thus the gap between dummy program and erase states are preferred to be 2V with a restriction not to create substantial Vt-shift on the boundary WLn−1.

In the following 1S, 2S, and DS calculation, the degree of Yupin floating-gate coupling effect for each cell is assumed to be one identical value of 10% regardless of adjacent BL-BL or adjacent WL-WL coupling. The Yupin coupling effect induced by four diagonal cells in 2D NAND array is neglected herein for a simpler illustration of the present invention. As a result, the maximum of 40% Yupin coupling effect is used as a worst-case scenario Vt-shift and widening on all MLC program cells in either boundary or non-boundary WLs.

Note, WLn−1 is defined as the first boundary WL next to (non-boundary) WLn whose cells are in erase $E^0$ state and next to (dummy) WLn−2 whose cells are in erase (dummy) $D^0$ state. WLn+3 is defined as the second boundary WL with its next adjacent WLn+4 whose cells are in $E^0$ state even after WLn+3's 2P program. Any WLs between WLn−1 and WLn+3 such as WLn, WLn+1 and WLn+2, are defined as the non-boundary WLs. Similar to the first boundary WLn−1, WLn+4 is defined as the next first boundary WL as program is continued to be performed in a sequence starting from WLn+4, then WLn+5 and beyond to WLn+7 (the next second boundary WL).

Although in above example, the numbers of non-boundary WLs in the first and second groups are just three, they should not be limited to the example and can be flexibly increased to an arbitrary number depending on the program needs as long as those cells are erased before program. All boundary WLs need to be marked on the spare cells in the predetermined locations in each boundary WL to differentiate them from the regular non-boundary WLs for a MLC read with different $V_{SL}$-based individual Vt-compensation.

The MLC program sequences starts from 1P, then 2P. At t0, dummy cells in DMYWL are programmed first by dummy program (DP) operation. As a result, DP-induced DS will affect WLn−1 only. But the Yupin coupling affect only happens to N/2-bit LBL cells, e.g., either Odd or Even cells in WLn−1. At t1, 1P program is performed on WLn−1 cells. In the 1P program 1S is induced by WLn−1 on both WLn and DMYWL (WLn−2) cells. At t2, 1P program is performed on next adjacent non-boundary WLn in which 1S is induced by WLn on both WLn−1 and WLn+1 cells but WLn−1's 1P coupling effect on WLn is reduced.

The rest of program sequences are also shown in FIG. 5A at t3 through t7. In general, every non-boundary WL typically suffers four 1S Vt-shifts but one 2S Vt-shift. Two 1S Vt-shifts are due to two BL-BL coupling effects induced by its own WL's 1P program. Other two 1S Vt-shifts are induced by two adjacent WL-WL effects. The 2S Vt-shift is induced by next WLn+1's 2P program. But for boundary WLn−1 cells, they suffer three 1S, one DS, and one 2S effects with DS effect being smaller than 1S.

In summary, as shown in FIG. 5A, the Alt-WL program sequence preferably starts from one dummy WL cells disposed in the middle of a string with a SLC-like program referred as DP before 1P program performed on the boundary WL cell. The dummy WL cells are preferably being programmed for Odd and Even-BL select N/2-bit. After one dummy-WL DP program, then the regular cell 1P program starts from the dummy WL in two independent sequential orders all the way to both ends of one string in two opposite BL directions through two substrings. In other words, there are two program orders from one or two dummy WLs disposed in the middle of each string to two regular cell WLs at both string ends, such configuration helping to reduce wordline program stress.

The WL adjacent to the dummy WL is referred as the first boundary WL, WLn−1, which has less Yupin coupling effect than the non-boundary WL in the program sequence and DP scheme defined above. The program of next non-boundary WLs have to follow up the sequences set in FIG. 5A from t1 through t7. The 2-state 1P MSB-based SLC program is performed first followed by 4-state 2P LSB-based MLC program for achieving the least Yupin coupling effect. The 1P MSB-based SLC program and 2P LSB-based MLC program of next second boundary WL such as WLn+3 preferably starts with WLn+4's 0P first at t8 as MLC page data at WLn+4 is not available. Accordingly, the adjacent WLn+3 and next WLn+2 cells are finishing their 1P and 2P operations with corresponding 1S and 2S respectively at t9, t10, and t11.

FIG. 5B is a table showing preferred ABL, AnP, and Alt-WL program scheme and sequences of 1P SLC-like program and 2P MLC program operations according to another embodiment of the present invention. As shown, the preferred ABL, AnP, and Alt-WL program continues (after 2P WLn+3 at t11) for WLn+4 cells starting at t1' once WLn+4's MLC page data becomes available. The program sequence is set to be like the regular WLn shown in FIG. 5A as WLn moves to WLn+1 and down to WLn+3, etc from WLn+5 to WLn+6 and beyond at t2' through t7'.

There are several program options between WLn+3 and WLn+4. For example, 1P program for WLn+3 cells can be performed before 1P program for WLn+4 cells to reduce the Vt shifting and widening of WLn+4 MLC cells. In certain embodiments, the 2P program for WLn+3 cells is performed to end the whole program steps when WLn+4 MLC data is not ready yet.

Figure 6A:
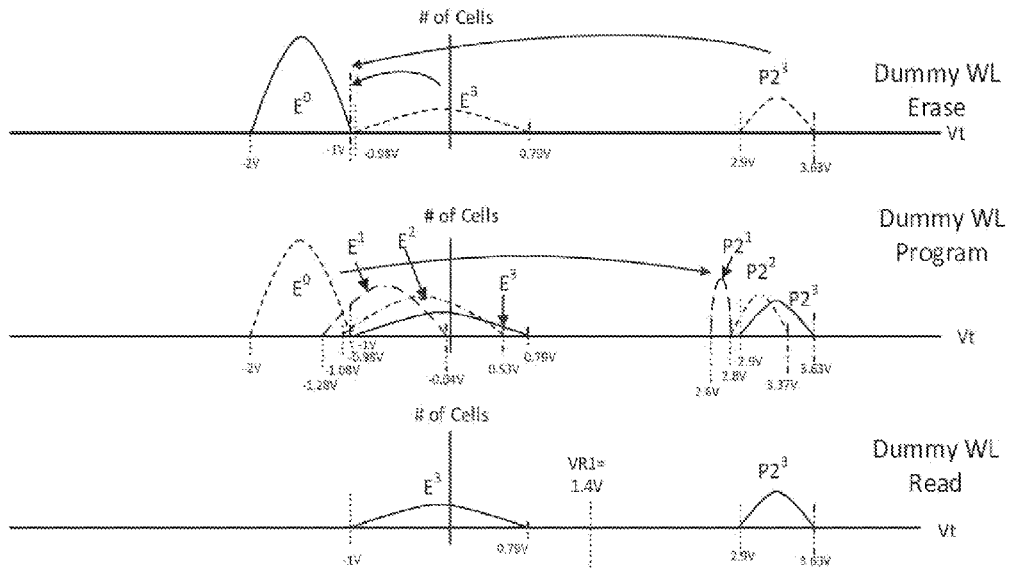
FIG. 6A is a diagram showing preferred SLC-like Vt distributions, populations, Vt verify and widen voltages for erase, SLC-like program and read operations on dummy cells according to an embodiment of the present invention.

FIG. 6A is a diagram showing preferred SLC-like Vt distributions, populations, Vt verify and widen voltages for erase, SLC-like program and read operations on dummy cells according to an embodiment of the present invention. As shown, the preferred SLC-like Vt distributions, populations, Vt verify and widened voltages for performing key operations of erase, SLC-like program, and read of dummy cells in a first DMYWL. Note, only N/2-bit Even/Odd dummy cells per first physical dummy WL are programmed. Thereafter, another N/2-bit Odd/Even dummy cells in the second dummy WL will be complementarily programmed to make one paired dummy cells in two dummy WLs acting as one Odd or Even column-select transistor without using any extra big select transistors for forming a compact NAND string. In an embodiment, although these two dummy WL locations can be flexibly placed in any locations of NAND strings, they are preferably placed in the middle locations to separate two mirrored sub-strings.

As shown in a first graph of FIG. 6A, dummy cell erase operation shifts an initial single positive program state $P2^3$ with widened and shifted Vt-distribution and an erase-state $E^3$ with partial positive and partial negative Vt-distributions to only one final erase $E^0$ state with a desired negative $Vte^1max \le -1.0V$. The Vt-range of the $E^0$ state is assumed to be from −1V to −2V. The details of erase-verify and erase operations of dummy cells with bias conditions will be disclosed in later sections of the specification with respect to FIG. 9A through FIG. 10I.

Further shown in a second graph of FIG. 6A, SLC-like DP operation shifts the dummy cell Vt from an $E^1$ state (initially widened from the $E^0$ state at t0) to one SLC-like narrow program state $P2^1$ by using one program-verify voltage of $Vtp2^1min=2.6V$. $Vte^1min$ is shifted by 0.72V due to DMYWL $(Vtp2^1min-Vte^0max) \times 20\%=(1+2.6) \times 20\%=0.72V$. Therefore, $Vte^1min=(-2.0)+(0.72)=-1.28V$. Further, $E^1$ state is widened to $E^2$ and $E^3$ as the narrow program state $P2^1$ is widened to $P2^2$ and $P2^3$. Accordingly, $Vte^2$ min & $Vtp2^2$ min are shifted by 0.2V due to WLn−1 $(Vtp0^1min-Vte^1max) \times 10\%=(3.02-1) \times 10\%=0.2V$, and $Vte^3$ min & $Vtp2^3$ min are shifted by 0.08V due to WLn−1 $(Vtp2^3min-Vtp2^2max) \times 10\%=(2.6-1.65) \times 10\%=0.1V$. There is no need of narrow-Vt of 0.2V program. Thus the ISSP $\Delta Vpgm>0.2V$ can be used herein to shorten the dummy cell program time.

Note, the maximum DP shift of $Vtp2^1max$ of dummy cell is less than the maximum 1P Vt-shift of regular WL MLC cells, regardless boundary or non-boundary WLs defined in the present invention. For example, $Vtp2^1max$ (dummy cell in DMYWL)=2.8V but $Vtp2^1max$ (regular cell in WLn−1)=3.37V, as calculated and shown in the table of FIG. 6A.

Additionally shown in a third graph of FIG. 6A, the preferred Odd/Even-based dummy cell SLC read operation with one read check voltage, VR1=1.4V, for two widened states of $E^3$ state and $P2^3$ state. Note, if $V_{DMYWL1}=1.4V$ but the complimentary $V_{DMYWL2}$=Vread is to select Odd string, then vice versa, the select $V_{DMYWL1}$=Vread but the complimentary $V_{DMYWL2}$=1.4V is to select Even string, where Vread is about 4~6V.

Figure 6B:
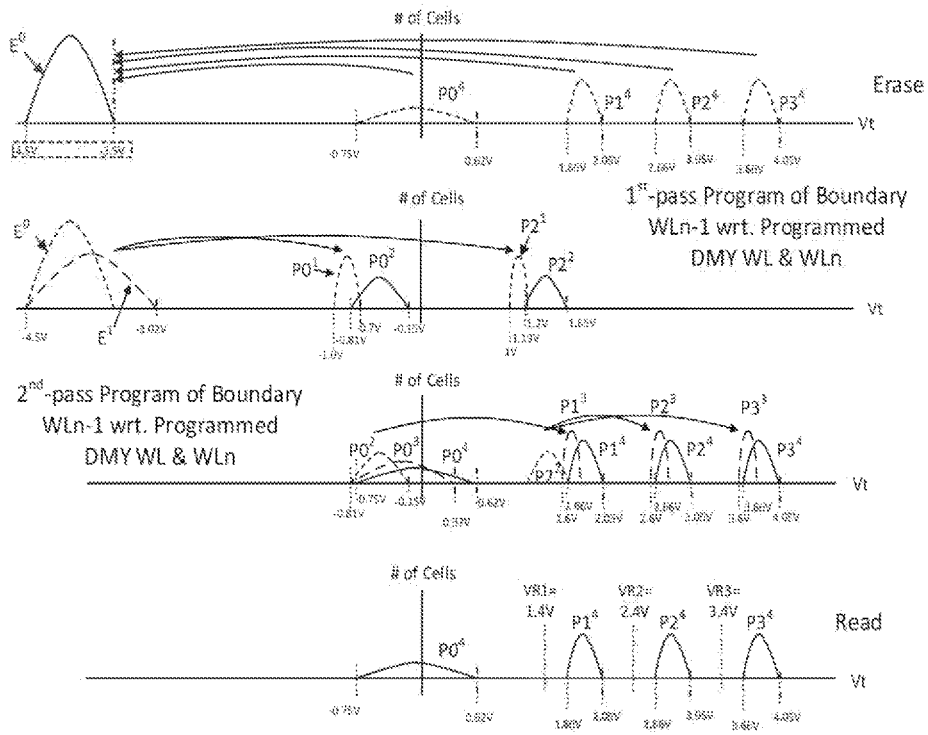
FIG. 6B is a diagram showing preferred MLC Vt distributions, populations, shifting, verify and widened voltages for respective key MLC operations on regular cells with first boundary WLn−1 according to an embodiment of the present invention.

FIG. 6B is a diagram showing preferred MLC Vt distributions, populations, shifting, verify and widened voltages for respective key MLC operations on regular cells with first boundary WLn−1 according to an embodiment of the present invention. As shown, preferred MLC Vt distributions, populations, shifting, verify and widened voltages are illustrated for respective key MLC operations of first boundary WLn−1cells with programmed dummy WL. Each interim 1P and 2P program operation follows the preferred ABL, AnP and Alt-WL scheme and sequences as specified in FIG. 5A. Note, in worst case scenario total 40% Yupin coupling effect is assumed and used below.

In a first graph of FIG. 6B, erase operation of the boundary WLn−1 cells shifts Vts from four initial widened program states $P0^4$, $P1^4$, $P2^4$, and $P3^4$ to one erase $E^0$ state by using $Vte^0max=-3.5V$ as the erase-verify voltage. Note, the Vt-gap of 2.5V is preferably set between $Vte^0max=-3.5V$ and the $1^{st}$ interim $P0^1$ program state with $Vtp0^1min=-1.0V$, that is big because 40% Yupin coupling induced Vt-shift is big. This setting is to control final Vt maximum of $P0^4$, $Vtp0^4max$, as close to 0V as possible to have a better Vt-distribution arrangement for three positive final widened MLC program states of $P1^4$, $P2^4$, and $P3^4$.

In a second graph of FIG. 6B, the preferred ABL-1P operation shifts a WLn−1 cell Vt from one initial widened $E^1$ state to two narrow SLC-like program states of $P0^1$ and $P2^1$ by respectively using two program-verify voltages $Vtp0^1min=-1.0V$ and $Vtp2^1min=1V$ to prevent earlier lockout for subsequent 4-state MLC program. Note, the Vts of both $P0^2$ and $P2^2$ states are widened (respectively from $P0^1$ and $P2^1$ states) and shifted by 1P MSB-based program on the WLn−1 cell with details calculated and shown in FIG. 6B. In addition, after the successful 1P MSB program, the MSB page data is not longer needed to be kept in $C_{LG}$ capacitors associated with both RCACHE and PCACHE registers. For the subsequent 2P LSB program on WLn−1, the MSB data can be retrieved from WLn−1 to save $C_{LG}$ space for next other concurrent operations.

In a third graph of FIG. 6B, the preferred ABL LSB-based 2P operation shifts WLn−1 cells Vts from two initially widened SLC-like interim states $P0^2$ and $P2^2$ to four final narrow MLC states of $P0^3$, $P1^3$, $P2^3$, and $P3^3$ by using four new program-verify voltages such as $Vtp0^3$ min=−0.81V, $Vtp1^3$ min=1.6V, $Vtp2^3$ min=2.6V, and $Vtp3^3$ min=3.6V.

In a fourth graph of FIG. 6B, the preferred Odd/Even-based MLC read operation with three read check voltages such as VR1=1.4V, VR2=2.4V, and VR3=3.4V is performed to distinguish four final widened MLC states of $P0^4$, $P1^4$, $P2^4$, and $P3^4$. Note, only $P0^1$ state needs to do program-verify operation once in 1P program and the subsequent $P0^2$, $P0^3$ and $P0^4$ are the widened P0 program states that do not need to do program-verify again to save the 2P program-verify time. On the contrary, all P1, P2, and P3 states need to do program-verify during both 1P and 2P MLC programs because their Vts are positive without a need to precharge TPW.

In general for regular boundary WLn−1 cell program, one negative $P0^1$ program and verify is needed only once in 1P SLC-program. As an example to be shown in FIG. 7A below, $V_{LBL}$ is either 2V or Vinh for $P0^1$ state and $V_{LBL}$ is either 0V or Vinh for $P2^1$ state for 1P program, where 2V (larger than Vdd if Vdd=1.8V) and 0V are targeted Vts of interim states $P0^1$ and $P2^1$ and Vinh=7V (not Vdd as used by prior art) is set for superior program-inhibit. Additionally, three program-verify operations are performed only for three positive 2P LSB-based MLC-program. Note, the widened $VP2^3$max is optimized to be less than the final $Vp2^4$ min with a margin of 0.6V to avoid earlier lockout substantially without BL-BL Yupin coupling effect in 2P program. Furthermore, the maximum Vt-shifts from $P0^3$ to $P1^4$ and $P2^3$ to $P3^4$ are approximately maintained the same of 2.2V for easier $V_{SL}$-based Vt-compensation used in this preferred MLC read operation.

Figure 6C:
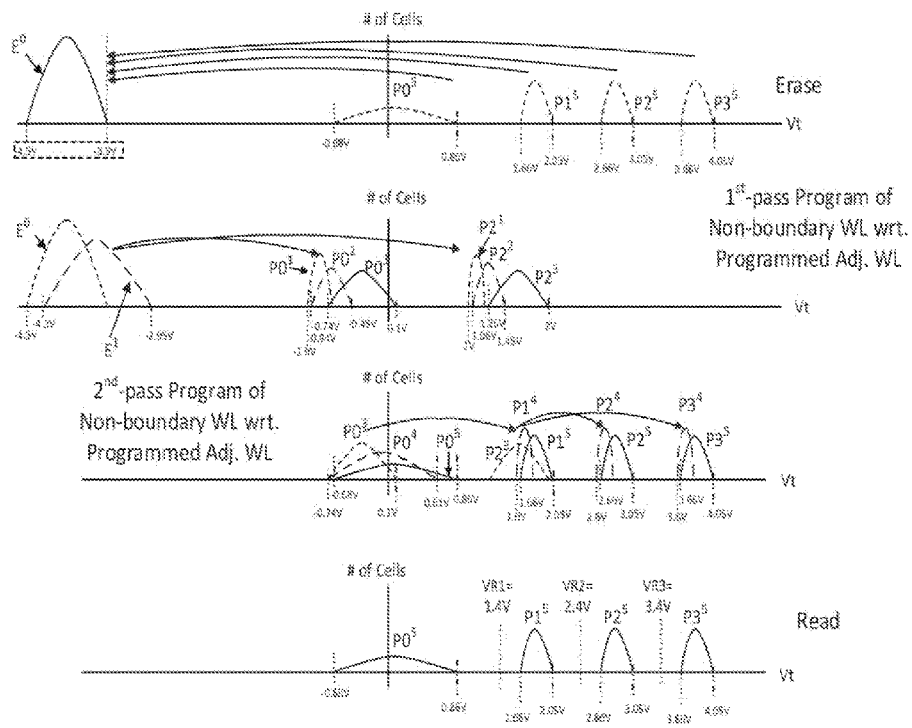
FIG. 6C is a diagram showing preferred MLC Vt distributions, populations, shifting, verify and widened voltages for respective key MLC operations on regular cells with non-boundary WLn according to an embodiment of the present invention.

FIG. 6C is a diagram showing preferred MLC Vt distributions, populations, shifting, verify and widened voltages for respective key MLC operations on regular cells with non-boundary WLn according to an embodiment of the present invention. As shown, preferred MLC Vt distributions, populations, shifting, verify and widened voltages are illustrated for respective key MLC operations of non-boundary WL NAND cells. Non-boundary WLs include WLn, WLn+1 and WLn+2 as an example in the present invention. Again, each interim 1P and 2P program operation follows the preferred ABL, AnP and Alt-WL scheme and sequences as specified in FIG. 5A.

As shown in the first graph of FIG. 6C, the erase operation of the non-boundary WLn cells shifts Vts from initial four widened program states $P0^5$, $P1^5$, $P2^5$, and $P3^5$ to one erase $E^0$ state by using $Vte^0max=-3.5V$ as an erase-verify voltage. The non-boundary WL erase is defined to be same as those boundary WLs such as WLn−1.

As shown in the second graph of FIG. 6C, the preferred ABL 1P MSB-based program operation of a non-boundary WLn cell shifts cell Vt from one initial widened $E^1$ state to two narrow SLC-like interim program states $P0^1$ and $P2^1$ as the boundary WLn−1 by respectively using two program-verify voltages 1) negative $Vtp0^1min=-1.0V$ and 2) positive $Vtp2^1$ min=1.0V to prevent earlier lockout caused by Yupin BL-BL coupling effect for subsequent four-state LSB-based MLC program.

As shown in the third graph of FIG. 6C, the preferred ABL LSB-based 2P operation of non-boundary WLn cells shifts cell Vts from two further widened interim SLC-like states $P0^3$ and $P2^3$ to four final narrow MLC states of $P0^4$, $P1^4$, $P2^4$, and $P3^4$ by respectively using four program-verify voltages of $Vtp0^3$ min=−0.74V, $Vtp1^3$ min=1.6V, $Vtp2^3$ min=2.6V, and $Vtp3^3$ min=3.6V. Note, the negative program-verify voltage $Vtp0^3$ min=−0.74V for $P0^4$ does not need to be applied because it is "don't-care" by the present invention to further distinguish the rest of three positive final MLC states of $P1^4$, $P2^4$, and $P3^4$.

Further as shown in the fourth graph of FIG. 6C, the preferred Odd/Even-based MLC read operation with three read check voltages VR1=1.4V, VR2=2.4V, and VR3=3.4V for the non-boundary WLn cells is performed to distinguish four final widened MLC states of $P0^5$, $P1^5$, $P2^5$, and $P3^5$ without using $V_{SL}$-based Vt-compensation.

Figure 6D:
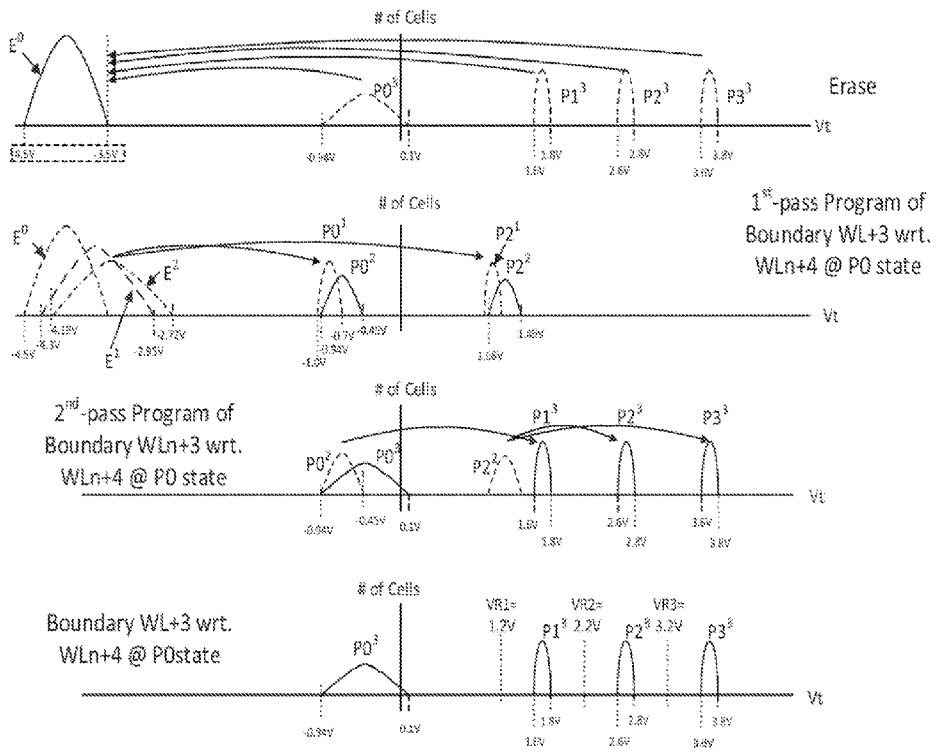
FIG. 6D is a diagram showing preferred MLC Vt distributions, populations, shifting, verify and widened voltages for respective key MLC operations on regular cells with second boundary WLn+3 and with WLn+4 cells being in P0-state according to an embodiment of the present invention.

FIG. 6D is a diagram showing preferred MLC Vt distributions, populations, shifting, verify and widened voltages for respective key MLC operations on regular cells with second boundary WLn+3 and with WLn+4 cells being in P0-state according to an embodiment of the present invention. As shown, a first embodiment of the preferred MLC Vt distributions, populations, shifting, verify and widened voltages are illustrated for respective key MLC operations of second boundary WLn+3 NAND cells with WLn+4 cells being in P0-state because WLn+4 whole MLC page data is not available. Again, each interim 1P and 2P program operation follows the preferred ABL, AnP, and Alt-WL scheme as defined in FIG. 5A.

As shown in the first graph of FIG. 6D, the erase operation on the second boundary WLn+3 cells shifts Vts from initial four narrow program states $P0^3$, $P1^3$, $P2^3$, and $P3^3$ to one erase $E^0$ state by using a same erase-verify voltage $Vte^0max=-3.5V$. This erase operation is set to be same as one mentioned above for the first boundary WLn−1 and non-boundary WLn cells. The latency can be saved through this preferred erase operation because all cells are erased simultaneously with the same $Vte^0max=-3.5V$ regardless of first boundary or second boundary or the non-boundary WLs in a same block.

As shown in the second graph of FIG. 6D, the preferred ABL 1P MSB-based program operation of the second boundary WLn+3 cell shifts Vt from one initial widened $E^1$ state to two narrow SLC-like program states $P0^1$ and $P2^1$ by using two program-verify voltages $Vtp0^1min=-1.0V$ and $Vtp2^1min=1V$ to prevent earlier lockout for subsequent 4-state MLC program.

As shown in the third graph of FIG. 6D, the preferred ABL LSB-based 2P operation shifts Vts from two initial widened interim SLC-like states $P0^2$ and $P2^2$ to four final narrow MLC states of $P0^3$, $P1^3$, $P2^3$, and $P3^3$ for the WLn+3 cells (as the final program states of $P0^4$, $P1^4$, $P2^4$ and $P3^4$ for the WLn−1 cells as mentioned earlier in FIG. 6B) by using four program-verify voltages (same as those for WLn−1 cells) such as $Vtp0^3$ min=−0.94V, $Vtp1^3$ min=1.6V, $Vtp2^3$ min=2.6V, and $Vtp3^3$ min=3.6V. One thing different is that all three positive states of $P1^3$, $P2^3$, and $P3^3$ are not being widened and shifted because next adjacent WLn+4 is at P0 state and not being programmed yet. Thus, three positive final 2P program states $P1^3$, $P2^3$, and $P3^3$ can be sustained for the superior MLC reliability.

As shown in the fourth graph of FIG. 6D, the preferred Odd/Even-based MLC read operation with three read check voltages VR1=1.2V, VR2=2.2V, and VR3=3.2V is performed to distinguish four final narrow un-widened MLC states of $P0^3$, $P1^3$, $P2^3$, and $P3^3$ with a larger read Vt margin as opposite to that of the first boundary WLn−1 and non-boundary WLn cells. In a specific embodiment, this is a first read option of WLn+3 without employing any $V_{SL}$ individual compensation. In other words, $V_{SL}$=0V for WLn+3 MLC read when WLn+4 cells are still held in $E^0$ state cells. The 3 VRn values of WLn+3 (second boundary WL) are set to be 0.2V lower than 3 VRn counterparts used in boundary WLn−1 to WLn+2. In another specific embodiment, the final 2P is preferably performed even WLn+4 MLC data is not ready with a purpose to maintain the better MLC data integrity than above boundary and non-boundary WLs.

Figure 6E:
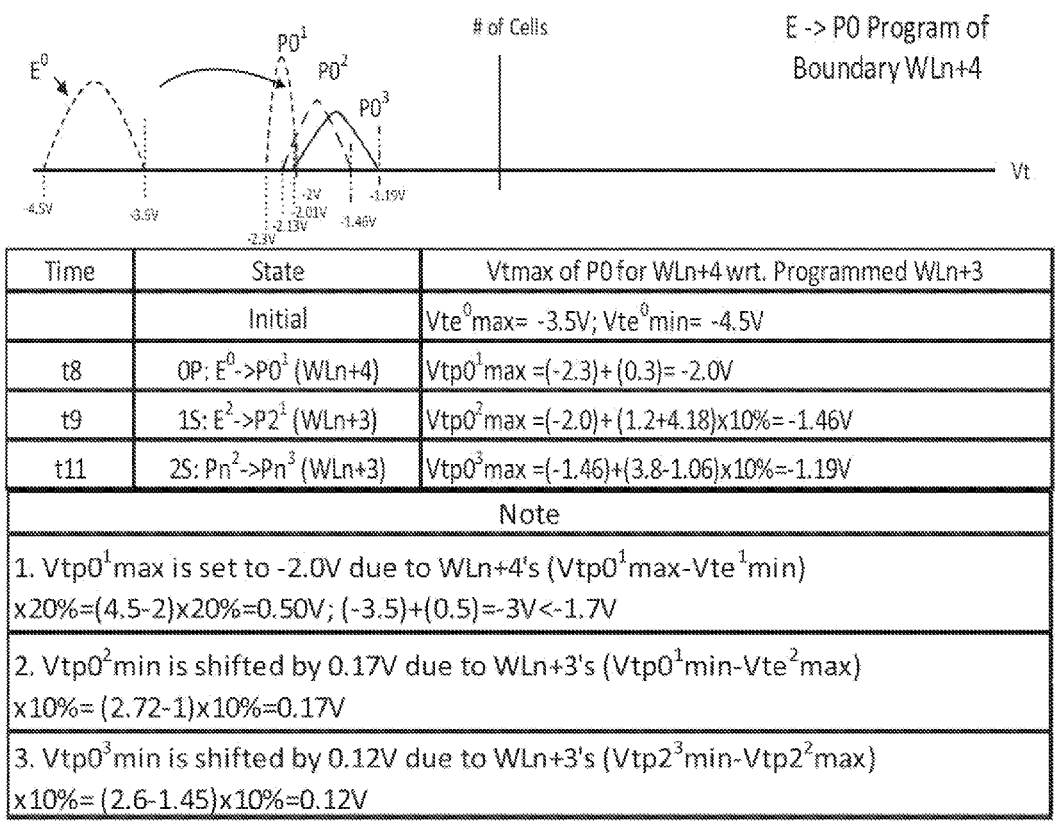
FIG. 6E is a diagram showing 0P program for the boundary WLn+4 nLC cells according to an embodiment of the present invention.

FIG. 6E is a diagram showing 0P program for the boundary WLn+4 nLC cells according to an embodiment of the present invention. As shown in an first example, a 0P program is performed for the boundary WLn+4 MLC cells, which shifts MLC cell Vts from one initial widened $E^0$ state to one narrow interim program state $P0^1$ with a desired negative program-verify voltage $Vtp0^1$min=−2.3V. The 0P operation is kind of pre-1P program with less Vt-shift to reserve Vt room for two subsequent pseudo-1P MSB-based SLC-like and 2P LSB-based MLC program operations. Note, the definition of pseudo-1P MSB-based SLC-like program means that the 0P operation is only halfway done of the previous 1P program because it only programs single P0 state from one initial erase $E^0$ state on the second boundary WLn+4 cells (next to WLn+3) with its MLC page data is not ready. The purpose to do this 0P on WLn+4 is to reduce the overall Yupin WL-WL coupling effect on the previous boundary WLn+3 when it is programmed with complete 1P and 2P programs as mentioned above.

There are several ways to set the desired Vtp0min values for performing 0P program on the boundary WLn+4 cells. But in order to reduce the complexity of on-chip NAND state-machine design, the $Vtp0^1$min=−2.3V is used for WLn+4's 0P 1-state interim program (compared to $Vtp0^1$min=−1.0V used by the regular WL's 1P interim SLC-like program). Both the 0P program scheme and steps for boundary cells and the 1P program scheme and steps for non-boundary cells can be commonly used without extra overhead except that the value of the negative program-verify voltage is different.

After the 0P is performed on WLn+4 before 1P on WLn+3, the narrow P0 state would be widened and shifted by the subsequent WLn+3's 1P-induced 1S and 2P-induced 2S only if WLn+5 cells are still in erase $E^0$ state. The calculations of shifting and widening of $Vtp0^2$max and $Vtp0^3$max are shown in t9 and t11 in FIG. 6E.

In general, the WLn+4 0P program includes following features: 1) Only one negative $P0^1$ program and verify operation is needed under the condition of WLn+5 being in $E^0$ state; 2) The optimal value of $Vtp0^1$min (0P)<$Vtp0^1$min (1P) (Note: setting $Vtp0^1$max (0P) to be lower than $Vtp0^1$max (1P) is to reserve the cell's Vt room for next subsequent pseudo 1P program. From Vt-shift perspective, 0P and pseudo 1P combined is equivalently to a regular 1P program disclosed above for both boundary and non-boundary WLs); 3) No $P2^1$ as an interim program state of the 0P operation as previous 1P operation does; and 4) One $V_{LBL}$ is set to 0V for programming all $E^0$ state cells in WLn+4 and no Vinh is used in initially 0P program but Vinh is used when $Vtp0^1$min>−2.3V after iterative 0P program-verify.

Figure 6F:
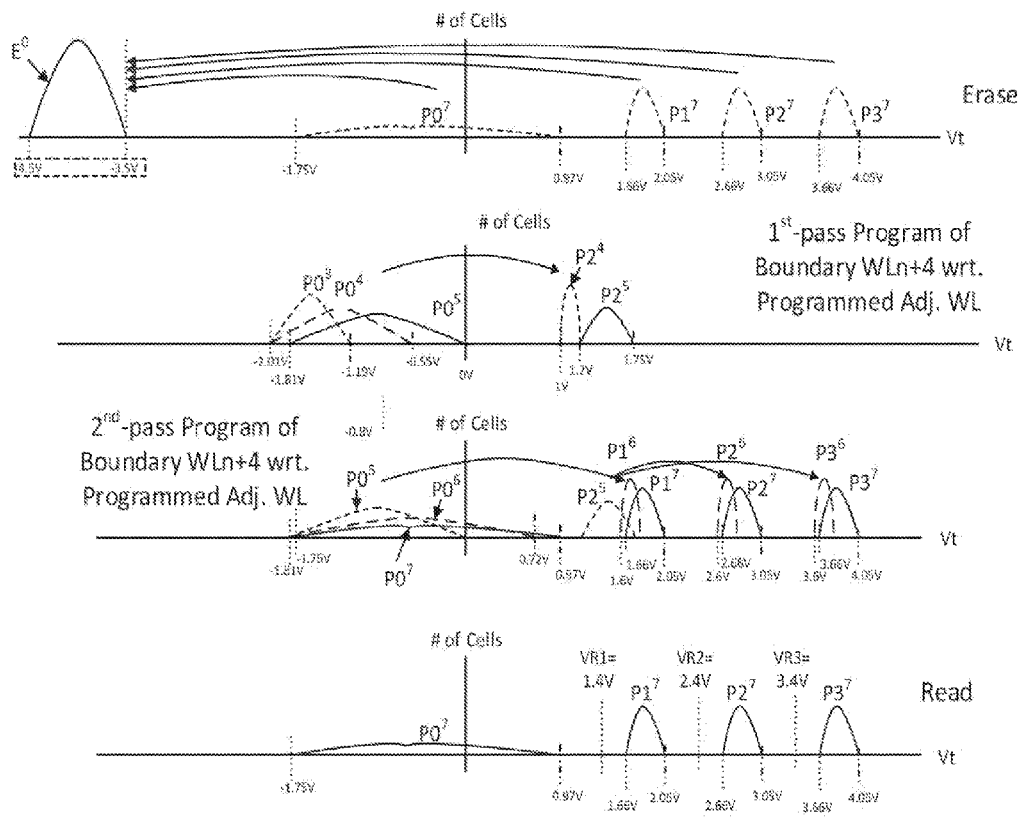
FIG. 6F is a diagram showing preferred MLC Vt distributions, populations, shifting, verify and widened voltages for respective key MLC program operations of second boundary WLn+4 NAND cells with respect to WLn+5 cells being programmed with MLC data according to an embodiment of the present invention.

FIG. 6F is a diagram showing preferred MLC Vt distributions, populations, shifting, verify and widened voltages for respective key MLC program operations of second boundary WLn+4 NAND cells with respect to WLn+5 cells being programmed with MLC data according to an embodiment of the present invention. As shown, four graphs and one table are used to illustrate the preferred MLC Vt distributions, populations, shifting, verify and widened voltages for respective key MLC operations of second boundary WLn+4 NAND cells with WLn+5 cells being programmed with MLC data. Again, each interim 1P and 2P program operation follows the preferred ABL, AnP and Alt-WL scheme and sequence defined in FIG. 5A and FIG. 5B.

As shown in the first graph of FIG. 6F, the erase operation on WLn+4 NAND cells shifts MLC cell Vts from one initial-widened $P0^7$ state and three less-widened $P1^7$, $P2^7$, and $P3^7$ states to one erase $E^0$ state by using an erase-verify voltage $Vte^0$max=−3.5V.

In the second graph of FIG. 6F, the preferred ABL SLC-like 1P operation on WLn+4 NAND cells shifts partial cell Vt from one initial-widened (0P) program state $P0^3$ to one narrow program state $P2^4$ by using only one program-verify voltage $Vtp2^4$ min=1.0V to prevent earlier lockout for subsequent four-state MLC program. The initial program state $P0^3$ is then program-inhibited without requiring further program-verify again to cut down 1P latency time. A interim program state $P0^4$ is widened from the state $P0^3$ by WLn+4's SLC-like 1P program, while another interim program state $P0^5$ is further widened and shifted by adjacent WLn+5's 1P program.

In an embodiment, this 1P program is a so-called pseudo-1P program for the adjacent WLn+4 to complete its full 1P program when its MLC page data is ready. After the 0P program and the pseudo-1P program, the WLn+4 is reset back for next 2P program as the regular WL's 2P program for regular WL cells, correspondingly the program sequences are resumed to move to WLn+5, WLn+6 and beyond, as mentioned before from WLn−1 moving to WLn, then WLn+1, etc.

In the third graph of FIG. 6F, the preferred ABL 2P operation on WLn+4 NAND cells shifts cell Vts from two initially widened interim SLC-like states $P0^5$ and $P2^5$ to four final narrow MLC states of $P0^6$, $P1^6$, $P2^6$, and $P3^6$ by using three new program-verify voltages $Vtp1^6$ min=1.6V, $Vtp2^6$ min=2.6V, and $Vtp3^6$ min=3.6V, while $P0^6$ does not need program-verify to save 2P operation latency.

In the fourth graph of FIG. 6F, the preferred Odd/Even-based MLC read operation with three read check voltages VR1=1.4V, VR2=2.4V, and VR3=3.4V is performed to distinguish four final widened MLC states of $P0^7$, $P1^7$, $P2^7$, and $P3^7$ in WLn+4 cells with WLn+5 cells being fully programmed with MLC data.

In general, the psuedo-1P and 2P programs on WLn+4 includes following features: 1) No negative program and program-verify voltage setting is needed for single $P0^3$ state after both psuedo-1P and 2P programs but three positive program-verify voltages for $P1^7$, $P2^7$, and $P3^7$ are still required as the programs for the regular WLs; 2) Three $V_{LBL}$ voltages are set in accordance with Vt-differences among four program states for $P1^6$, $P2^6$, and $P3^6$ program but Vinh is set for $P0^6$.

In following sections as illustrated by FIGS. 6G-6K, individual MLC cell Vt widening, shifting and coupling effects of the second boundary WLn+3 by its own 1P and 2P programs and adjacent WLn+4's 0P, pseudo-1P, and 2P programs are presented. Then an individual $V_{SL}$-based Vt-compensation technique is disclosed to cope with Yupin coupling effects on WLn+3 in MLC read operation.

Since all previous first boundary WLn−1, non-boundary WLs (WLn, Wn+1, WLn+2) are well designed to have less earlier lockout with relatively less Yupin coupling effects than the secondary WLn+3 by using 1P, 2P and Alt-WL programming scheme, thus $V_{SL}$-based Vt-compensation is not used. Although 0P is programmed on WLn+4 before WLn+3's 1P and 2P program, relatively, WLn+3 has the largest and worst Vt shifting and widening, thus $V_{SL}$-based Vt-compensation is preferably adopted to ensure same MLC data read liability as the above WLs. In fact, this preferred $V_{SL}$-based Vt-compensation for MLC read can be used for MLC read for all WLs, regardless first boundary, non-boundary, and the second boundary WLs, etc. In following examples, WLn+3 is used for demonstrating the $V_{SL}$-based Vt-offset technique of the present invention.

In an embodiment, the $V_{SL}$-based Vt-compensation technique includes four compensation values on each reading MLC cell in BLn of WLn+3 in accordance with the opposite cells residing in corresponding BLn position in WLn+4 because MLC cells in WLn+4 are programmed after cells in WLn+3. The MLC cells in WLn+2 are not the concern because they are programmed before WLn+3 cells according the program sequence shown in FIG. 5A and FIG. 5B.

Figure 6G:
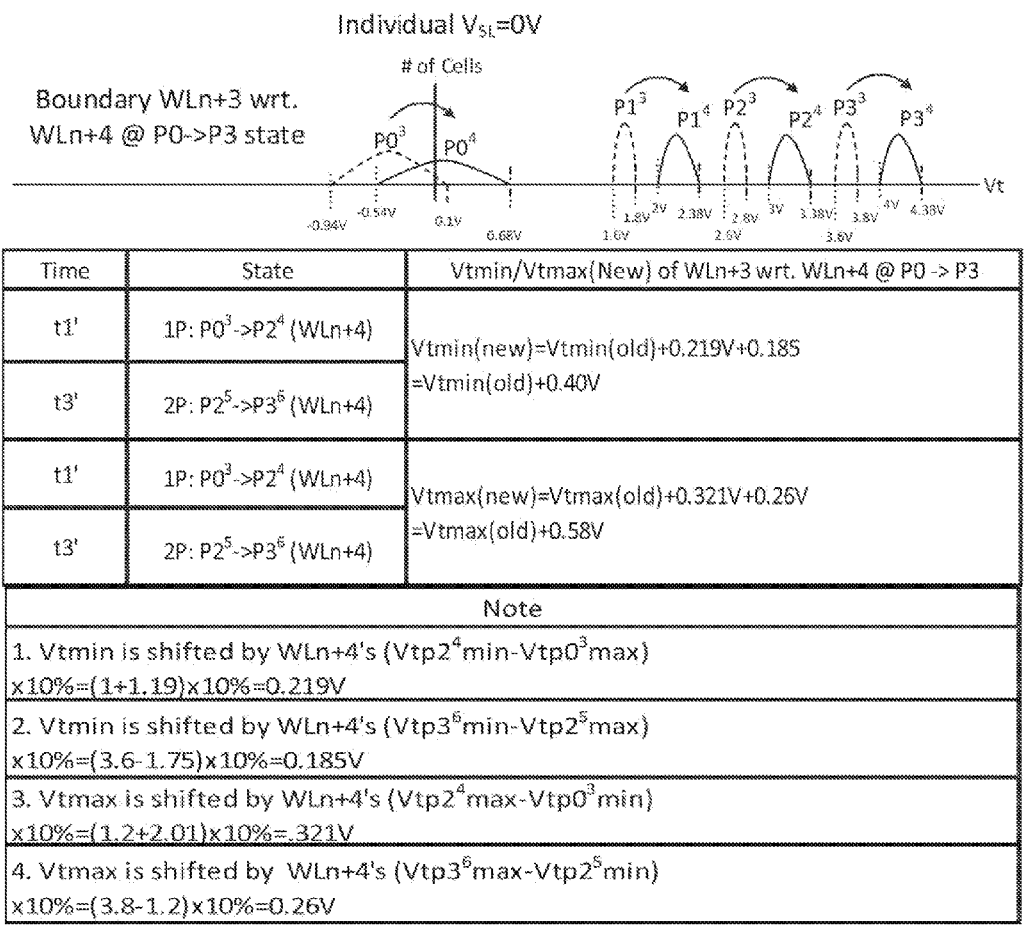
FIG. 6G is a diagram showing a 4-state MLC Vt shifting and widening for cells with boundary WLn+3 in program operation when next adjacent cells with WLn+4 are programmed into P3 state from initial P0 state according to an embodiment of the present invention.

FIG. 6G shows a first case of the four-state MLC Vt shifting and widening for boundary WLn+3 cells when next adjacent WLn+4 cells are programmed into final P3 state from an initial P0 state due to a combination of 0P, psuedo-1P, and 2P programs. Under this scenario, one widened P0$^3$ state and three narrow dotted P1$^3$, P2$^3$ and P3$^3$ states with an initial ΔVt gap of 1.5V between P0$^3$ and P1$^3$ and equal ΔVt gap of 1.0V between P1$^3$ an P2$^3$ and between P2$^3$ and P3$^3$ in WLn+3 are widened and shifted again to four solid states of P0$^4$, P1$^4$, P2$^4$ and P3$^4$ with a dramatic reduced ΔVt gap of 1.42V between P0$^4$ and P1$^4$ and equal ΔVt gap of 0.62V between P1$^4$ an P2$^4$ and between P2$^4$ and P3$^4$ by the opposite cell of P3-state in WLn+4. Thus, a preferred $V_{SL}$-based individual Vt-compensation is required for WLn+3 MLC read if the widened Vt-width of top three program states are not being tightened.

In another embodiment, four $V_{SL}$-based compensations have to be aligned to the highest Vt shifting of P3 state because only the positive values of $V_{SL}$ can be used for Vt-compensation. As a result, $V_{SL}$=0V is preferably used when the opposite MLC cell in WLn+4 is a P3 state cell. The details of Vtmin and Vtmax of four program states during each period of t1' and t3' are summarized in FIG. 6G.

Figure 6H:
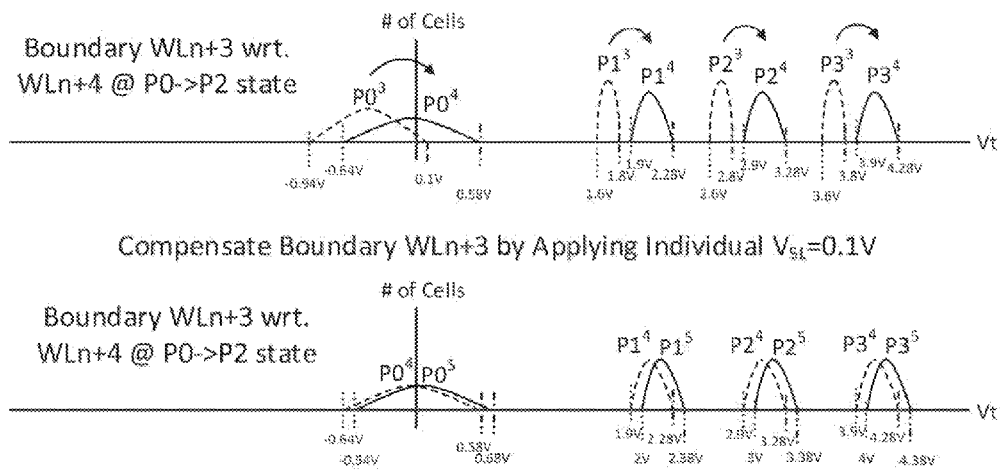
FIG. 6H is a diagram showing a 4-state MLC Vt shifting and widening for cells with boundary WLn+3 in program operation when next adjacent cells with WLn+4 are programmed into P2 state from initial P0 state according to an embodiment of the present invention.

FIG. 6H shows a second case of the four-state MLC Vt shifting and widening for the boundary WLn+3 cells when next adjacent WLn+4 cells are being programmed into P2 state from the initial P0 state due to a combination of 0P, pseudo-1P, and 2P programs. Under this scenario, one widened dotted P0$^3$ state and three narrow dotted P1$^3$, P2$^3$, and P3$^3$ states with an initial ΔVt gap of 1.5V between P0$^3$ and P1$^3$ and equal ΔVt gap of 1.0V between P1$^3$ and P2$^3$ and between P2$^3$ and P3$^3$ in WLn+3 are widened and shifted again to four solid states of P0$^4$, P1$^4$, P2$^4$, and P3$^4$ with a dramatic reduced ΔVt gap of 1.32V between P0$^4$ and P1$^4$ and equal ΔVt gap of 0.62V between P1$^4$ and P2$^4$ and between P2$^4$ and P3$^4$ by the opposite cell of P3-state in WLn+4. Thus, a preferred $V_{SL}$-based individual Vt-compen- sation is required for WLn+3 MLC read if the widened Vt-width of top three program states are not being tightened.

In an example, this P2-state $V_{SL}$-based compensation is also aligned to P3 state cell to use $V_{SL}$=0.1V when the next adjacent MLC cell in WLn+4 is a P2 state cell (see FIG. 6H).

FIG. 6I shows a third case the four-state MLC Vt shifting and widening for the boundary WLn+3 cells when next adjacent WLn+4 cells are being programmed into P1 state from the initial P0 state due to 0P+pseudo-1P+2P program. Under this scenario, one widened P0$^3$ state and three narrow P1$^3$, P2$^3$, and P3$^3$ states with an initial ΔVt gap of 1.5V between P0$^3$ and P1$^3$ and equal ΔVt gap of 1.0V between P1$^3$ and P2$^3$ and between P2$^3$ and P3$^3$ in WLn+3 are widened and shifted again to four solid states of P0$^4$, P1$^4$, P2$^4$, and P3$^4$ with a reduced ΔVt gap of 1.3V between P0$^4$ and P1$^4$ and equal ΔVt gap of 0.6V between P1$^4$ and P2$^4$ and between P2$^4$ and P3$^4$ by the cell of P3-state in WLn+4. Thus, a preferred $V_{SL}$-based individual Vt-compensation is required for WLn+3 MLC read if the widened Vt-width of top three program states are not being tightened.

In a specific embodiment, this P2-state $V_{SL}$-based compensation is also aligned to P3 state cell. As a result, $V_{SL}$=0.22V is preferably used when the MLC cell in WLn+4 is a P1 state cell.

Figure 6J:
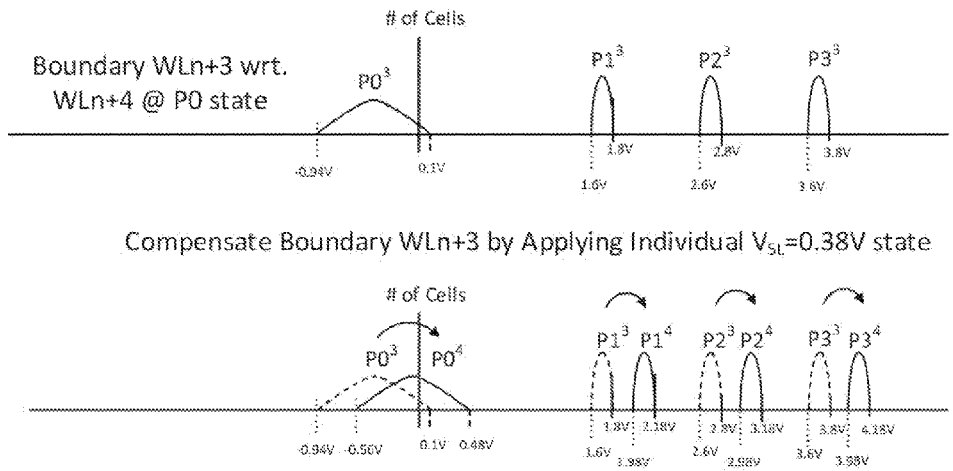
FIG. 6J is a diagram showing a 4-state MLC Vt shifting and widening for cells with boundary WLn+3 in program operation when next adjacent cells with WLn+4 are not programmed but remained in initial P0 state according to an embodiment of the present invention.

FIG. 6J shows a fourth case of the four-state MLC Vt shifting and widening for the boundary WLn+3 cells when next adjacent WLn+4 cells are not being programmed but staying in initial P0 state due to no 0P+1P+2P program. Under this scenario, one widened solid P0$^3$ state and three narrow solid P1$^3$, P2$^3$, and P3$^3$ states with an initial ΔVt gap of 1.5V between P0$^3$ and P1$^3$ and equal ΔVt gap of 0.8V between P1$^3$ and P2$^3$ and between P2$^3$ and P3$^3$ in WLn+3 are not widened and shifted again.

For the present invention, this P0-state $V_{SL}$-based compensation is also aligned to final P3 state cell. As a result, $V_{SL}$=0.38V is preferably used for the WLn+3 cells when the opposing MLC cell in WLn+4 is a P0 state cell.

Figure 6K:
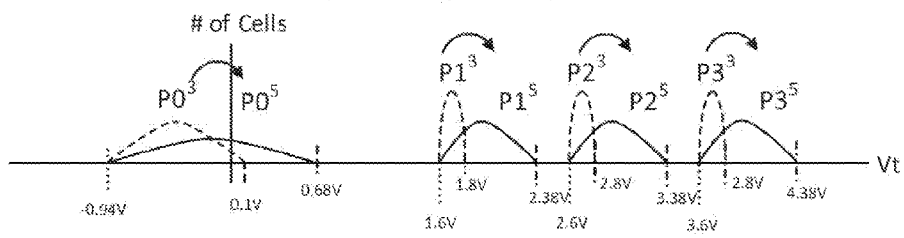
FIG. 6K is a diagram showing a 4-state MLC Vt shifting and widening for cells with boundary WLn+3 in program operation according to an embodiment of the present invention.

FIG. 6K shows the four-state MLC Vt shifting and widening for the boundary WLn+3 cells. As shown, one widened P0$^3$ state and three narrow P1$^3$, P2$^3$, and P3$^3$ states are four states of the boundary WLn+3 cells Vt-distribution before next WLn+4 cells being programmed with 0P, psuedo-1P, and 2P. These four states in WLn+3 cell are widened to four states of P0$^5$, P1$^5$, P2$^5$, and P3$^5$ induced by four possible opposing WLn+4 MLC cells being programmed by combined 0P, psuedo-1P, and 2P operations. As a result, the initial ΔVt gap=0.8V can be reduced to ΔVt gap=0.22V in worst-case. Thus, the present invention provides a $V_{SL}$-based Vt-offset scheme during MLC reading on WLn+3 cells.

Figure 6L:
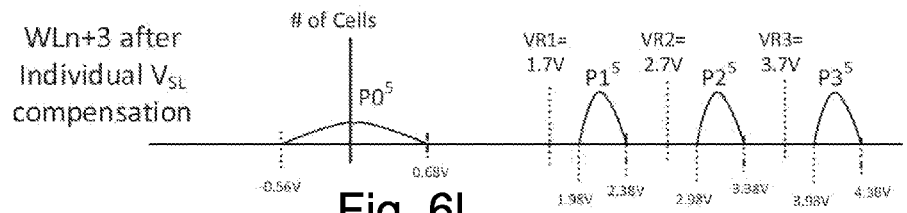
FIG. 6L is a diagram showing a 4-state MLC Vt distribution and 3 preferred VRn for MLC reading of cells with boundary WLn+3 according to an embodiment of the present invention.

FIG. 6L shows the four-state MLC Vt distributions and three preferred VRn for MLC reading of the boundary WLn+3 cells by adopting the preferred a $V_{SL}$-based Vt-offset scheme of the present invention. With $V_{SL}$=0.38V/ 0.22V/0.1V/0V for WLn+3 cells in accordance with respective opposite cells of P0, P1, P2, and P3 in WLn+4, the widened P0$^5$, P1$^5$, P2$^5$, and P3$^5$ of WLn+3 shown in FIG. 6K have been reset back to less widened P0$^5$, P1$^5$, P2$^5$, and P3$^5$ shown in FIG. 6L with a larger ΔVt gap=1.3V between P0$^5$ and P1$^5$ and 0.6V between P1$^5$ and P2$^5$ and between P2$^5$ and P3$^5$.

In addition, WLn+3 cell gate bias voltage is increased by 0.3V because three program states of P1$^5$, P2$^5$, and P3$^5$ have been shifted in the positive direction by about 0.4V. Thus, VR1=1.7V, VR2=2.7V, and VR3=3.7V can be used to differentiate four MLC program states of P0$^5$, P1$^5$, P2$^5$, and P3$^5$. Note, above $V_{SL}$-based MLC Vt-compensation is performed on the second boundary WLn+3. But the similar approach can also be applied to non-boundary WLn cell read in accordance with four opposing MLC cells stored in next adjacent WLn+1 with less compensations are summarized below from FIG. 6M to FIG. 6R. The reason of applying less compensation of WLn than WLn+3 is because WLn follows the Alt-WL program sequences of 1P and 2P among WLn−1, WLn, and WLn+1. Therefore, the Vt-shifting and widening have been reduced more than WLn+3.

Figure 6M:
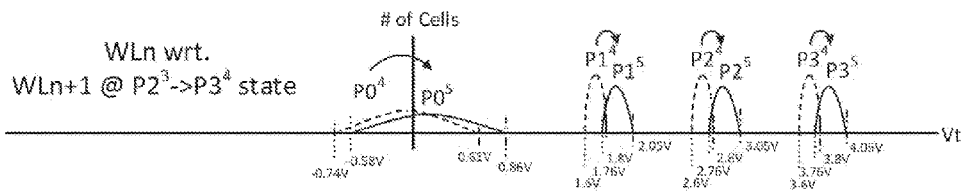
FIG. 6M is a diagram showing a 4-state MLC Vt shifting and widening for cells with non-boundary WLn according to an embodiment of the present invention.

FIG. 6M, in a specific embodiment, shows the four-state MLC Vt shifting and widening for the non-boundary WLn MLC cells. As shown, one widened P0$^4$ state and three narrow P1$^4$, P2$^4$, and P3$^4$ states are four states of the first non-boundary WLn cells Vt-distributions before performing 2P MLC program on WLn+1. These four states in WLn are widened to P0$^5$, P1$^5$, P2$^5$, and P3$^5$, induced by four opposing MLC cells being programmed by 2P program on WLn+1 cells.

In this case, the opposing cell is programmed from interim state P2$^3$ of a 1P program operation to a final state P3$^4$ after a further 2P program operation. All other opposing cells are aligned to this P3$^4$ state cell. Thus $V_{SL}$=0V is set for this case. As a result, the initial ΔVt gap=0.8V is not reduced but shifted by 0.16V from P0$^4$, P1$^4$, P2$^4$, and P3$^4$ states respectively to P0$^5$, P1$^5$, P2$^5$, and P3$^5$ states. Thus, a $V_{SL}$-based Vt-offset scheme with $V_{SL}$=0V is preferably used when reading WLn cells with WLn+1 opposing cells being in P3$^4$ state.

Figure 6N:
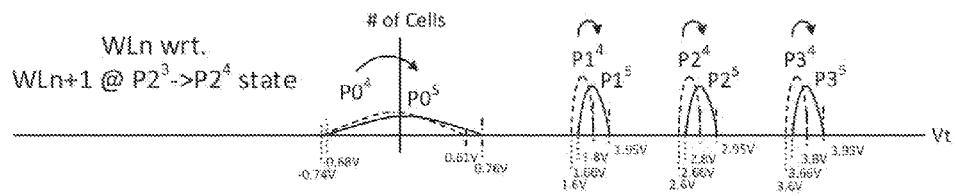
FIG. 6N is a diagram showing a 4-state MLC Vt shifting and widening for cells with non-boundary WLn according to another embodiment of the present invention.
Figure 6N:
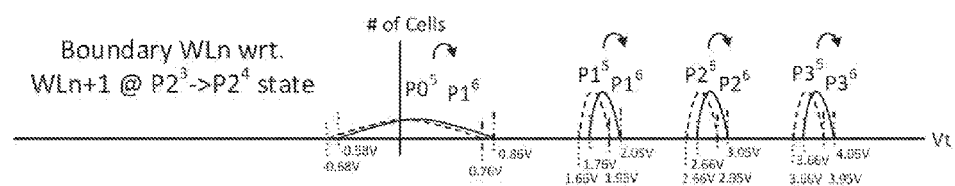

FIG. 6N, in another specific embodiment, shows the 4-state MLC Vt shifting and widening for the non-boundary WLn MLC cells. As shown, one widened P0$^4$ state and three narrow P1$^4$, P2$^4$, and P3$^4$ states are four states of the first non-boundary WLn cells Vt-distribution before performing 2P MLC program on WLn+1 cells. These four states are widened to states of P0$^5$, P1$^5$, P2$^5$, and P3$^5$ in WLn, induced by four possible opposing MLC cells in WLn+1 being programmed by 2P operation. In this case, the opposing cells are programmed from a P2$^3$ state of a 1P program to a P2$^4$ state with a less shift after a further 2P program.

Like WLn+3 boundary cell MLC read, a $V_{SL}$-based Vt-offset scheme of the present invention is preferably used with $V_{SL}$ being set to 0.1V during the MLC reading on WLn cells when opposing cell in WLn+1 is programmed with P2 state and is aligned to P3 state.

Referring to FIG. 6N, the Vt distributions of the four states P0$^5$, P1$^5$, P2$^5$, and P3$^5$ in WLn are shifted up by 0.1V to P0$^6$, P1$^6$, P2$^6$, and P3$^6$ due to the adoption of $V_{SL}$=0.1V. As a result, the VRn values of reading MLC cells in WLn will remain the same to offset the 0.1V Vt lowering due to align P2 cell to P3 cell in WLn+1.

Figure 6O:
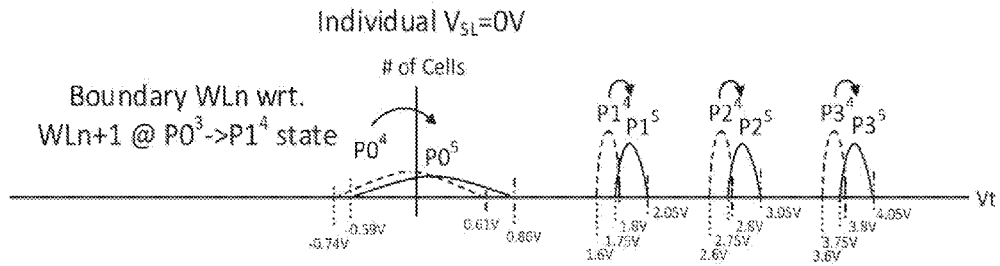
FIG. 6O is a diagram showing a 4-state MLC Vt shifting and widening for cells with non-boundary WLn according to yet another embodiment of the present invention.

FIG. 6O, in yet another specific embodiment, shows the 4-state MLC Vt shifting and widening for the non-boundary WLn MLC cells. As shown, one widened P0$^4$ state and three narrow P1$^4$, P2$^4$, and P3$^4$ states are four states of the first non-boundary WLn cells Vt-distribution before WLn+1 subjects to 2P MLC program. These four states in WLn are widened to P0$^5$, P1$^5$, P2$^5$, and P3$^5$, induced by four possible opposing MLC cells in WLn+1 being programmed by 2P. In this case, the opposing cell is programmed from a P0$^3$ state of a 1P program to a P1$^4$ state after a further 2P program. As a result, the initial ΔVt gap=0.8V is not reduced from 1P to 2P. Thus, a $V_{SL}$-based Vt-offset scheme of the present invention is preferably not used to save time during the MLC reading on WLn cells.

Figure 6P:
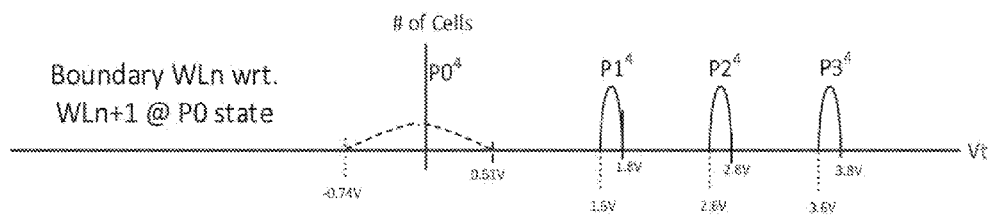
FIG. 6P is a diagram showing a 4-state MLC Vt shifting and widening for cells with non-boundary WLn according to still another embodiment of the present invention.
Figure 6P:
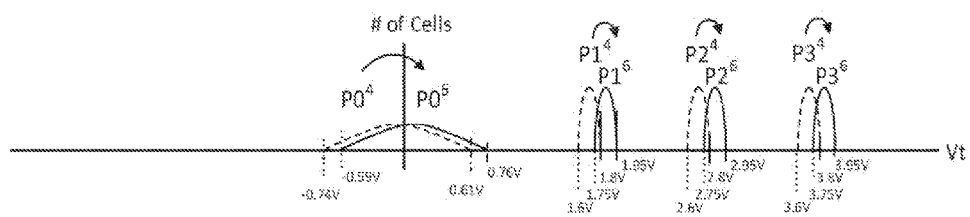

FIG. 6P, in still another specific embodiment, shows the four-state MLC Vt shifting and widening for the non-boundary WLn MLC cells. As shown, one widened P0$^4$ state and three solid narrow P1$^4$, P2$^4$, and P3$^4$ states are four states of the first non-boundary WLn cells Vt-distribution after WLn+1 subjects to 2P MLC program. In this case, the opposing cell is not programmed and stays in P0 state after a further 2P program.

Referring to FIG. 6P, a $V_{SL}$-based Vt-offset scheme of the present invention is preferably used with $V_{SL}$=0.15V during the MLC reading on WLn cells when WLn+1 opposing cell is being programmed with P0 state and is aligned to P3 state. The Vt distributions of P0$^4$, P1$^4$, P2$^4$, and P3$^4$ are respectively shifted up by 0.15V to P0$^6$, P1$^6$, P2$^6$, and P3$^6$ due to the adoption of $V_{SL}$=0.15V. As a result, the VRn values for reading MLC cells in WLn will remain the same to offset the 0.15V Vt lowering due to align P0 state cell to P3 state cell in WLn+1.

Figure 6Q:
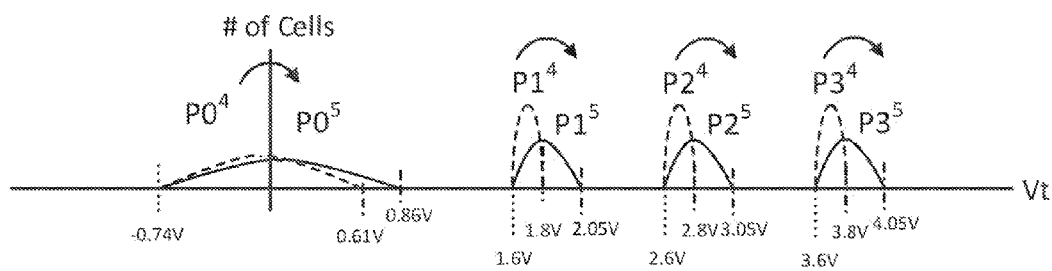
FIG. 6Q is a diagram showing a 4-state MLC Vt shifting and widening for cells with non-boundary WLn with respect to WLn+1 cell being programmed with 2 passes according to an embodiment of the present invention.

FIG. 6Q, in yet still another specific embodiment, shows the four-state MLC Vt shifting and widening for the non-boundary WLn MLC cells with respect to WLn+1 cell being programmed with a 2P operation. As shown, one widened P0$^4$ state and three narrow P1$^4$, P2$^4$, and P3$^4$ states are four states of the first non-boundary WLn cells Vt-distribution prior to opposing WLn+1cell 2P MLC program. Due to WLn+1 cells subjected to 2P MLC program, the four states in WLn MLC cells are widened to Vt distributions of P0$^5$, P1$^5$, P2$^5$, and P3$^5$ states.

The WLn+1 2P MLC program has generated three major Vt-shifts from two initial P0$^3$ and P1$^4$ states induced by WLn 1P program prior to the WLn+1 2P program. Note, the Vtp1max in 1P program is preferably made smaller than the targeted Vtp2 min done by WLn 2P program. One Vt-shift from the initial P0$^3$ state to P1$^4$ state for some P0$^3$ state cells. For those cells staying in P0$^3$ state, then no Vt-shift. Two Vt-shifts from P2$^3$ state to P2$^4$ state and from P2$^3$ state to P3$^4$ state.

Figure 6R:
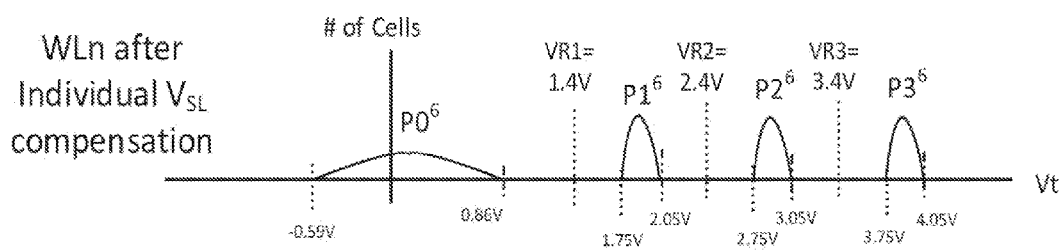
FIG. 6R is a diagram showing a 4-state MLC Vt distributions for cells with non-boundary WLn with respect to WLn+1 cell being programmed with 2 passes and the preferred $V_{SL}$-based Vt-offset scheme being used according to an embodiment of the present invention.

FIG. 6R, in an alternate specific embodiment, shows an equivalent four-state MLC Vt distribution for the non-boundary WLn MLC cells with respect to WLn+1 cell being programmed with a 2P program operation and the preferred $V_{SL}$-based Vt-offset scheme of the present invention is used. In the example, four $V_{SL}$ voltages of 0.15V, 0V, 0.1V, and 0V Vt-compensations are respectively used along with three read-verify voltages VRn of 1.4V, 2.4V, and 3.4V in distinguishing four states of WLn MLC cells in accordance with four different opposing MLC cells of P0, P1, P2 and P3 in WLn+1. Since this WLn has less Vt widening and shifting than WLn+3, thus WLn gate voltage does not need to be increased for proper VRn alignment.

FIG. 7A is a diagram showing a set of $V_{LBL}$ program voltages and program-inhibit voltage of Vinh assigned for a 2-state SLC-like 1st-pass program of a MLC program operation according to an embodiment of the present invention. As shown, a first set of two preferred $V_{LBL}$ program voltages and one program-inhibit voltage Vinh is assigned for a first two-state 1P MSB-based SLC-like program of a MLC cell of the present invention. The two preferred $V_{LBL}$ voltages for 1P operation are assigned based on one Vt-difference of 2V of two targeted SLC-like interim program states P0 and P2. Accordingly, the 1P program can be started and finished substantially at a same time without having earlier lockout state. Once the programmed Vts of interim P0 and P2 states exceed the pre-determined values, then $V_{LBL}$ voltage is re-assigned with an inhibit voltage of Vinh-7V to avoid over-programming.

In particular, the two $V_{LBL}$ voltages for the two interim program states P0 and P2 are set as: a) $V_{LBL0}$ is either 2V or Vinh for P0 program or program-inhibit; b) $V_{LBL1}$ is either 0V or Vinh for P2 program or program-inhibit. Note, 2V is the Vt-difference between targeted P0 and P2 states in 1P program (see FIG. 6B and FIG. 6C). For example, in FIG. 6C, Vtp0$^1$min=−1.0V, while Vtp1$^1$min=1.0V in 1P program for the non-boundary WLn cell. Similarly, Vt-difference=Vtp1$^1$min−Vtp0$^1$min=1.0−(−1.0)=2.0V for the boundary WLn−1 cell. In general, the program-inhibit voltage Vinh is set to be larger than Vdd. $V_{LBL}$ is set to 2V on the LBL line for 1P MSB-based SLC program, which is also larger than Vdd if Vdd=1.8V.

FIG. 7B is a diagram showing a set of $V_{LBL}$ program voltages and program-inhibit voltage of Vinh assigned for a 2nd-pass MLC program operation according to an embodiment of the present invention. As shown, a second set of three preferred $V_{LBL}$ program voltages and one program-inhibit voltage Vinh is assigned for a 2P LSB-based MLC program. The three preferred $V_{LBL}$ program voltages are assigned for MLC 2P operation based on three Vt-differences defined by four final program states of P0, P1, P2, and P3. As such, all three processes from interim P0 to final P1 state and interim P2 to final P2 to final P3 states in 2P MLC program can be started and finished substantially at a same time without having earlier lockout state to reduce Yupin BL-BL coupling effect. Similarly, when the programmed Vts of P0 to P3 exceed the respectively set values, then the $V_{LBL}$ voltage is re-assigned with an inhibit-voltage of Vinh-7V.

In particular, these distinct $V_{LBL}$ voltage values are set to align to P3 state cell with Vt-differences among the four states of P0, P1, P2, and P3. The first value $V_{LBL0}$ is set to Vinh for P0 state as a program-inhibit voltage. No program is performed for P0 state cell to save program and program-verify time. The second value $V_{LBL1}$ is set to 2V for P1 state program or Vinh for program-inhibit. The third value $V_{LBL2}$ is set to 1V for P2 state program or Vinh for program-inhibit. The fourth value $V_{LBL3}$ is set to 0V for P3 state program or Vinh for program-inhibit.

In general, Vinh (~7V) is set to be larger than Vdd for program-inhibit. LBL line voltage $V_{LBL}$ is set to be 2V>Vdd for 1P MSB-based SLC program if Vdd=1.8V. Three $V_{LBL}$ program voltages of 2V, 1V, and 0V are respectively assigned to P1, P2, and P3 states in accordance with targeted Vt-differences among three positive-Vt program states P1, P2, and P3.

FIG. 7C is a table showing generation of four desired $V_{LBL}$ voltages per each pass (1P or 2P) of ABL and AnP program without compensations from adjacent WL cell Vt coupling effect according to an embodiment of the present invention. As shown, two desired $V_{LBL}$ program voltages, 2V and 0V, and one program-inhibit voltage, Vinh-7V, are generated for 1P programmed P0 and P2 states. Furthermore, three desired $V_{LBL}$ program voltages, 2V, 1V, and 0V, and one program-inhibit voltage, Vinh-7V, are generated for 2P programmed P1, P2, and P3 states by using a 3-cap charge-sharing (CS) technique performed on three adjacent $C_{LG}$ capacitors for each BL MLC cell under Vddmin=2.4V when operating at Vdd=2.7V.

In a specific embodiment, both 1P and 2P programs are using different $V_{LBL}$ voltages because they have different targeted Vts. For example, P0 and P2 states are two interim program states with Vts induced by 1P program operation, while P0, P1, P2, and P3 states are the final program states with Vts induced by 2P program operation. The Vt-difference between the program states in 1P and 2P operation are defined differently.

In another specific embodiment, a method of generating multiple MLC $V_{LBL}$ program voltages and one Vinh voltage includes performing a 3-step four-$V_{LBL}$ CS scheme. This scheme is based on a low-power CS operation performed on three small and identical local $C_{LG}$ capacitors made by three broken and equal length LBL metal (M1/M2-level) lines. Before CS being performed, each $C_{LG}$ capacitor is pre-charged with a predetermined voltage that can be larger than Vdd but less than Vinh to avoid junction breakdown. Please note, this precharged voltage is not supplied by a distant page buffer (PB) through multiple long GBLs to reach the selected local LBL. Instead, this precharged voltage is supplied from each selected LBLps line directly to corresponding $C_{LG}$ capacitor to save power consumption.

A first step of the method of generating multiple MLC $V_{LBL}$ program voltages and one Vinh voltage is independently precharging three separate $C_{LBL}$ ($C_{LG}$) capacitors to three initial predetermined (same or different) $V_{LBL}$ voltages in accordance with each corresponding MLC bit data in three different cycles of T0, T1, and T2 before CS is performed. These three separate $C_{LG}$ capacitors are associated with three bits within three separate PCAHCE registers in three adjacent LG groups (FIG. 4A) connected by two bridge NMOS devices MLBL gated by two BLG signals. The LG groups are physically located within one MG group and one HG group. During this precharging step, three $C_{LG}$ capacitors are not connected together and are independently charged to the predetermined voltages by grounding the gates of the bridge devices MLBL, e.g. setting $V_{BLG}$=0V (see FIG. 4A).

A second step of the method includes performing sequential voltage conversions of $V_{LBL}$ to $V_{GBL}$ for 1P and 2P operations in accordance with three cycles of T0, T1, and T2. There are only two $V_{GBL}$ voltages such as Vdd or Vss, depending on MLC digital data stored in page buffer but there are three precharged $V_{LBL}$ voltages stored in three adjacent $C_{LG}$ capacitors for subsequent generation of four $V_{LBL}$ voltages. The voltage conversion means to convert the program-inhibit voltage of Vdd in a $C_{GBL}$ capacitor to Vinh in a $C_{LBL}$ or $C_{LG}$ capacitor and to discharge the corresponding precharged $V_{LBL}$ voltages in accordance with MLC program data in three timelines stored in $C_{LG}$ with four program states in $C_{LG}$ to Vss (when the $V_{GBL}$ is Vss).

Conventionally, Vdd data is treated as program-inhibit data and Vss data as program data. In a specific embodiment, both Vdd and Vss in GBL from the page buffer (PB) are used to generate a Vinh much larger than Vdd as program-inhibit data as well as to generate three $V_{LBL}$ voltages for program data. These $V_{LBL}$ voltages are larger than Vss and may be even larger than Vdd, because MLC Vtn can be larger or less than Vdd but larger than Vss. The Vss voltage in each GBL from each PB is only provided for setting $V_{LBL}$=0V, which is only one of three desired $V_{LBL}$ program voltages of the present invention. Note, the conversion is done by setting gate voltage $V_{MG}$ of a MG-select transistor (MMG) to Vdd to connect the GBL to the selected LBL and by setting corresponding $V_{MG}$ to 0V to disconnect the unselected LBLs from the common GBL as shown in FIG. 4B.

If $V_{GBL}$<Vdd-Vt, then $V_{LBL}$=$V_{GBL}$. It is because the corresponding MG-select transistors MMG are fully turned on by setting $V_{MG}$=Vdd to equalize the voltages present at both drain and source nodes of each MMG device. As a result, any precharged voltage Vinh in local $C_{LBL}$ would be discharged to the same voltage at GBL, i.e., $V_{LBL}$=$V_{GBL}$<Vdd-Vt. If $V_{GBL}$=Vdd, then $V_{LBL}$=Vinh. It is because $V_{MG}$=Vdd on MMG device gate with drain node at Vdd and source node at Vinh. As a result, the MMG device is biased in an off-state, thus the Vinh at the source node connected to the LBL can be retained without leaking to the drain node of Vdd connected to the GBL.

A third step of the method includes $V_{LBL}$ voltage generations by a 3-cap CS operation. This is performed by turning on two adjacent corresponding LG-broken devices, MLBL, to connect three adjacent $C_{LBL}$ capacitors (see FIG. 4A) in each cycle for generating one $V_{LBL}$ voltage for one of four MLC data in three connected segments of LBLs. The calculation below is based on three equal capacitors $C_{LBL1}=C_{LBL2}=C_{LBL3}$. Then the final $V_{LBL}=(\frac{1}{3})[(V_{LBL1}$ in $C_{LBL1}$ done in T0)+$(V_{LBL2}$ in $C_{LBL2}$ done in T1)+$(V_{LBL3}$ in $C_{LBL3}$ done in T2)].

In order to generate total three desired $V_{LBL}$ voltages of 0V, 1V, and 2V, and one Vinh voltage for a MLC cell through 1P program and 2P program (assuming Vdd=2.4V), two different Vinh voltages of 7V and 6V are supplied from the selected local LBLps power lines in three different timelines of T0, T1 and T2. At each timeline only two $V_{GBL}$ voltages are supplied from each bit of the PB. These two $V_{GBL}$ voltages include $V_{GBL}$=Vdd and $V_{GBL}$<Vdd.

In a specific example for generating a desired $V_{LBL}$=2V, at T0 cycle, each PB generates one $V_{GBL}$=0V for P0 state of a MLC data but the corresponding $V_{LBL0}$=Vinh0=7V by precharge from one selected the local power line LBLps to 7V. As explained above, when $V_{GBL}$=Vss, the $V_{LBL}$ will be discharged from 7V to 0V. Thus, $V_{LBL0}$=0V. At T1 cycle, $V_{GBL}$=0V and $V_{LBL}$=Vinh1=7V. Because $V_{GBL}$=0V, thus $V_{LBL}$ cannot be retained the 7V in $C_{LBL1}$, thus, $V_{LBL1}$ is discharged to 0V. At T2 cycle, $V_{GBL}$=Vdd and $V_{LBL2}$=Vinh2=6V by setting LBLps to 6V during precharging step. Because $V_{GBL}$=Vdd, thus $V_{LBL}$=6V can be retained in $C_{LBL2}$. Then the CS step leads to a final value of $V_{LBL}=(\frac{1}{3})[V_{LBL0}+V_{LBL1}+V_{LBL2}]=(\frac{1}{3})[0V+0V+6V]=2V$.

In another specific example for generating a desired $V_{LBL}$=0V for P2 state in 1P, at T0 cycle, each PB generates one $V_{GBL}$=0V for the P2 state in 1P but the corresponding $V_{LBL0}$=Vinh0=7V by precharging corresponding LBL from one selected LBLps to 7V. As explained above, when $V_{GBL}$=0V<Vdd, the $V_{LBL0}$ will be discharged from 7V to 0V. Thus, $V_{LBL0}$=0V. At T1 cycle, $V_{GBL}$=0V and $V_{LBL1}$=Vinh1=7V by setting LBLps to 7V. Because $V_{GBL}$=0V<Vdd, thus $V_{LBL1}$ is again discharged to 0V. At T2 cycle, $V_{GBL}$=0V and $V_{LBL2}$=Vinh2=6V by setting LBLps to 6V. Since $V_{GBL3}$=0V<Vdd, thus, $V_{LBL2}$ is still discharged to 0V. As the results, the 3-cap CS step leads to the final value of $V_{LBL}=(\frac{1}{3})[V_{LBL0}+V_{LBL1}+V_{LBL2}]=(\frac{1}{3})[0V+0V+0V]=0V$.

In yet another specific example for generating a desired $V_{LBL}$=1V for P2, at T0 cycle, each PB generates one $V_{GBL}$=1V for P2 in 2P operation but the corresponding $V_{LBL0}$=Vinh0=7V by precharging the LBL from one selected LBLps to 7V. As explained above, when $V_{GBL}$=1V<Vdd, then the $V_{LBL0}$ will be discharged from 7V to 1V. Thus, $V_{LBL1}$=1V. At T1 cycle, $V_{GBL}$=1V and $V_{LBL1}$=Vinh1=7V by setting LBLps to 7V. Because $V_{GBL}$=1V<Vdd, thus $V_{LBL}$ again cannot be retained in $C_{LBL1}$. As a result, $V_{LBL1}$ will be discharged from 7V to 1V. At T2 cycle, $V_{GBL}$=1V and $V_{LBL2}$=Vinh2=6V by setting LBLps to 6V. Similarly, since $V_{GBL}$=1V<Vdd so that $V_{LBL2}$ will be discharged from 6V to 1V. Finally, the 3-cap CS step leads to the value of $V_{LBL}=(\frac{1}{3})[V_{LBL0}+V_{LBL1}+V_{LBL2}]=(\frac{1}{3})[1V+1V+1V]=1V$.

Other examples include generations of $V_{LBL}$=2V for P1 state and 0V for P3 state in 2P program are similar to respective cases for P0 and P2 states in 1P program.

For the example of generating one program-inhibit voltage, the final Vinh=$(\frac{1}{3})[V_{LBL0}+V_{LBL1}+V_{LBL2}](\frac{1}{3})[7V+7V+6V]$=6.67V, where 7V is precharged as program-inhibit voltages Vinh0 and Vinh1 respectively at two cycles T0 and T1 and 6V is precharged as program-inhibit voltage Vinh2 at T2.

In general, the preferred 3-Cap CS technique described above can generate two $V_{LBL}$ voltages of 2V and 0V and one Vinh (~7V) voltage for two MLC P0 and P2 states by 1P operation and three $V_{LBL}$ voltages of 2V, 1V, and 0V and one Vinh voltage for four MLC P0, P1, P2, and P3 states by 2P operation with a setting of $V_{LBL}$>Vdd and Vinh>>Vdd under an assumption of Vdd=2.4V for performing a superior ABL and AnP MLC program with lower precharge current and faster program-verify operation due to a smaller value of $C_{LBL} \times V_{LBL}$ (present invention) than $C_{GBL} \times$ Vdd (prior art).

FIG. 7D is a table showing formation of 4 desired $V_{LBL}$ voltages per each pass (1P or 2P) of ABL and AnP program using charge-sharing without compensations from adjacent WL cell Vt coupling effect according to an embodiment of the present invention. As shown, a method, similar to that shown in FIG. 7C, is provided to calculate four desired $V_{LBL}$ voltages of 2V, 1V, 0V and Vinh for 1P and 2P of ABL and AnP program without compensations from adjacent WL's Vt coupling effect by using novel CS technique performed on same number of three vertically adjacent $C_{LG}$ capacitors for each BLn MLC cell but under an assumption of Vddmin=1.6V when operating at Vdd=1.8V.

Similarly, three equal capacitors ($C_{LG}$) storing 3 bits at three PCACHE registers are initially precharged with three predetermined values that can be the same or different under three different time periods of T0, T1, and T2. After a precharge cycle, then a similar CS operation is performed as under Vddmin=2.4V. Likewise, two $V_{LBL}$ voltages for 1P operation and three $V_{LBL}$ voltages for 2P operation are assigned under an assumption of Vddmin=1.6V.

Note, due to two different values selected for Vddmin, three precharged $V_{LBL}$ voltages and a program-inhibit Vinh voltage are optimized. With Vddmin=1.6V it is more difficult to obtain four $V_{LBL}$ voltages closer to four desired $V_{LBL}$ values than with Vddmin=2.4V. In the case of Vddmin=1.6V, three Vinh voltages of 7V, 6V, and 3V are required to accurately generate four desired $V_{LBL}$ voltages. But under Vddmin=2.4V, only two Vinh voltages of 6V and 7V are required. Therefore, there is a design tradeoff in order to narrow the gap between the final Vinh and the desired Vinh=7V and between the final $V_{LBL}$ and desired $V_{LBL}$ voltages.

FIG. 7E is a table showing two preferred sets of program-verify voltages on selected WL and individual $V_{SL}$-based Vt-offset voltages for respective 1P SLC-like and 2P MLC program cells according to an embodiment of the present invention. As shown, on selected WL with or without individual $V_{SL}$ Vt-offset voltages for respective SLC-like 1P and MLC 2P program cells two preferred sets of program-verify $V_{FY}$ voltages are provided. For SLC-like 1P program, there are only two sets of $V_{FY}$ voltages: 1) wordline voltage $V_{WL}$=0V and source line $V_{SL}$=1V for interim P0 state; 2) $V_{WL}$=1V and $V_{SL}$=0V for interim P2 state. Program-verify for interim P1 and P3 states is neglected during 1P program because there are no program operations for P1 and P3 states during the 1P program.

For 2P MLC program, there are only three sets of $V_{FY}$ voltages are required for final P1, P2, and P3 program states. The program-verification of the final program state P0 is neglected without affecting the MLC read accuracy to save the verification time because P0 state needs a large negative voltage for verification that would consume too much power to precharge $V_{TPW}$ and $V_{DNW}$ for a proper negative verification. Therefore, no verification is set for final P0 state.

Then, for final P1 state verification, $V_{WL}$ is set to 1.6V and $V_{SL}$ to 0V. For final P2 state verification, $V_{WL}$ is set to 2.6V and $V_{SL}$ to 0V. For final P3 state verification, $V_{WL}$ is set to 3.6V and $V_{SL}$ to 0V. Program-verify for interim state P0 is neglected during 2P program because there is no program on P0 state.

FIG. 7F is a table showing three sets of $V_{WL}$ (VRn) and $V_{SL}$ voltages for a preferred MLC read in WLs (WLn−1 WLn+2) of the present invention under the condition of adjacent WL cells being programmed with 1P and 2P operations according to an embodiment of the present invention. As shown, three sets of read voltages VRn are set for MLC cells with a first boundary and non-boundary WLs (WLn−1~WLn+2) under the condition of adjacent WLs cells being fully programmed with 1P+2P operations. 1) Setting $V_{WL}$=VR1=1.4V and $V_{SL}$=0V to distinguish P0 states out from P1, P2, and P3 states; 2) Setting $V_{WL}$=VR2=2.4V and $V_{SL}$=0V to further distinguish P0 and P1 states out from P2 and P3 states; 3) Then setting $V_{WL}$=VR3=3.4V and $V_{SL}$=0V to further distinguish P3 state out from P1, P2, and P3 states. Note, using $V_{SL}$=0V with TPW=0V and DNW=Vdd for a MLC read is just one of the read option similar to prior art.

FIG. 7G is a table showing three preferred VRn on WLn+3 along with $V_{SL}$=0V without Vt-offset for WLn+3 MLC read operation when WLn+4 cells are only at P0 program state according to an embodiment of the present invention. As shown, three preferred VRn voltages are applied on boundary WLn+3 cells along with source line voltage $V_{SL}$=0V without Vt-offset for MLC read operation when next WLn+4 cells are only in P0 program state after 0P program. In this case, the read operation bias condition is to set $V_{WLn+3}$=VR1=1.2V and $V_{SL}$=0V to distinguish P0 state out from P1, P2, and P3 states. Then, the bias condition is to set $V_{WLn+3}$=VR2=2.2V and $V_{SL}$=0V to further distinguish P0 and P1 states out from P2 and P3 states. Finally, to set $V_{WLn+3}$=VR3=3.2V and $V_{SL}$=0V to further distinguish P3 state out from P1, P2, and P3 states. Note, WLn+4 MLC cells in P0 state mean its MLC page data is not ready (see FIG. 6D).

FIG. 7H is a table showing three VRn voltages on boundary WLn+3 with three sets of four individual $V_{SL}$ compensations in accordance with four different MLC program states stored in the adjacent WLn+4 cells according to an embodiment of the present invention. As shown, three read voltages VRn are applied on boundary WLn+3 with three sets of four individual $V_{SL}$-compensations in accordance with four different MLC program states stored in WLn+4 cells. The first set of read conditions includes setting $V_{WLn+3}$=VR1=1.7V along with four individual $V_{SL}$ Vt-offset voltages to differentiate P0 state out of P1, P2, and P3 states in accordance with four MLC program states stored in WLn+4, e.g., P0: $V_{SL}$=0.36V, P1: $V_{SL}$=0.22V, P2: $V_{SL}$=0.1V, and P3: $V_{SL}$=0V. The second set of read conditions includes setting $V_{WLn+3}$=VR2=2.7V along with four individual $V_{SL}$ Vt-offset voltages to differentiate P0 state and P1 state out of P2 and P3 states in accordance with four MLC program states stored in WLn+4, e.g., P0: $V_{SL}$=0.36V, P1: $V_{SL}$=0.22V, P2: $V_{SL}$=0.1V, and P3: $V_{SL}$=0V. The third set of read conditions includes setting $V_{WLn+3}$=VR3=3.7V along with four individual $V_{SL}$ Vt-offset voltages to differentiate P3 state out of P1, P2, and P3 states in accordance with four MLC program states respectively stored in WLn+4, e.g., P0: $V_{SL}$=0.36V, P1: $V_{SL}$=0.22V, P2: $V_{SL}$=0.1V, and P3: $V_{SL}$=0V.

FIG. 7I is a table showing three VRn voltages on non-boundary WLn with three sets of four individual $V_{SL}$-compensations in accordance with four different MLC program states stored in adjacent WLn+1 cells according to an embodiment of the present invention. as shown, three VRn read voltages are applied on non-boundary WLn with three sets of four individual $V_{SL}$-compensations in accordance with four different MLC program states stored in adjacent WLn+1 cells. The first set of read conditions for this scenario includes setting $V_{WLn}$=VR1=1.4V along with four individual $V_{SL}$-based Vt-offset voltages to differentiate P0 state out of P1, P2, and P3 states in accordance with four MLC program states stored in WLn+1 cells, e.g., P0: $V_{SL}$=0.15V, P1: $V_{SL}$=0V, P2: $V_{SL}$=0.1V, and P3: $V_{SL}$=0V. The second set of read conditions includes setting $V_{WLn}$=VR2=2.4V along with four individual $V_{SL}$ Vt-offset voltages to differentiate P0 and P1 states out of P2 and P3 states in accordance with four MLC program states respectively stored in WLn+1 cells, e.g., P0: $V_{SL}$=0.15V, P1: $V_{SL}$=0V, P2: $V_{SL}$=0.1V, and P3: $V_{SL}$=0V. Additionally, the third set of read conditions includes setting $V_{WLn}$=VR3=3.4V along with four individual $V_{SL}$ Vt-offset voltages to differentiate P3 state out of P1, P2, and P3 states in accordance with four MLC program states stored in WLn+1 cells, e.g., P0: $V_{SL}$=0.15V, P1: $V_{SL}$=0V, P2: $V_{SL}$=0.1V, and P3: $V_{SL}$=0V. Note, although $V_{SL}$=0.15V is used for storing P0 state in WLn+1 cell, but the settings of $V_{TPW}$=0V and $V_{DNW}$=Vdd are used for whole MLC 4-state read operation because only 0.15V is coupled to source node of NAND cells. This small 0.15V would not make punch-through and the body-effect is negligible.

Figure 8A:
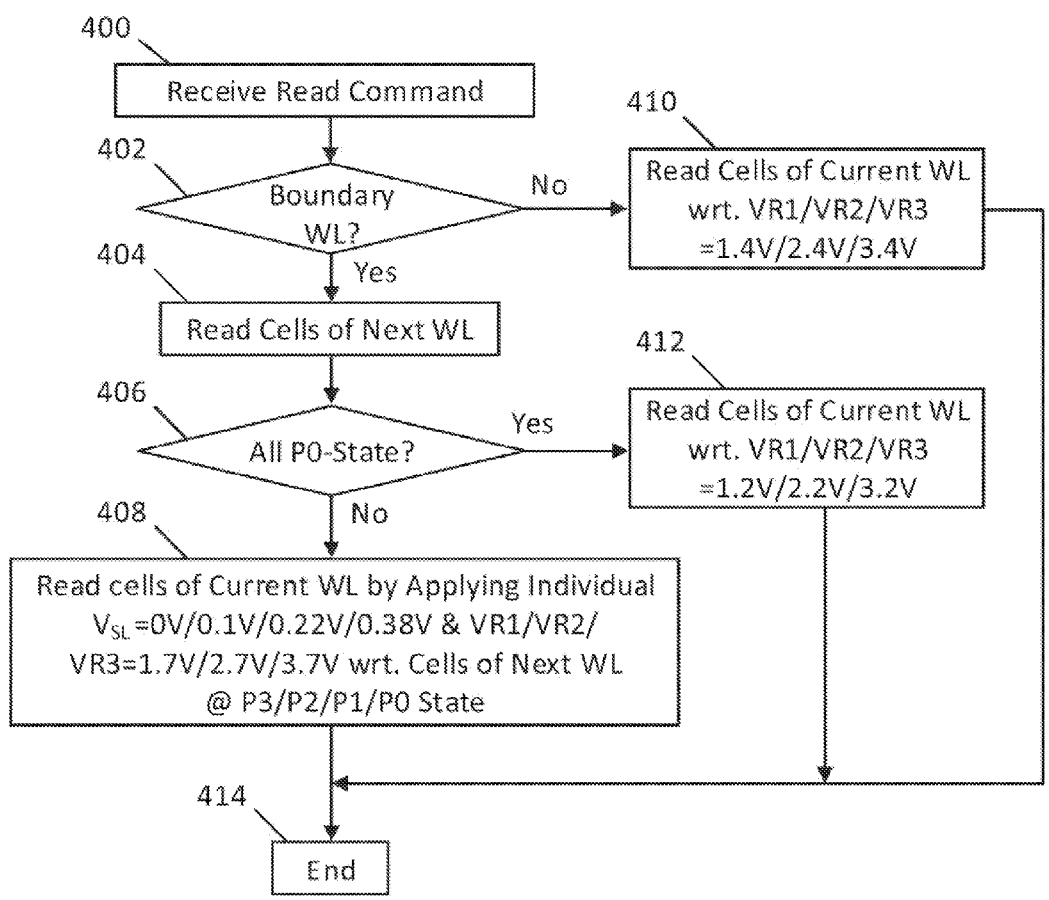
FIG. 8A is a diagram showing a method of performing MLC read operation for both boundary and non-boundary WL cells according to an embodiment of the present invention.

FIG. 8A is a diagram showing a method for performing MLC read operation for both boundary and non-boundary WL cells according to an embodiment of the present invention. As shown, the method starts from a step 400 of receiving a MLC Read Commend that is added with new operations designed to have batch-based concurrent MLC operations. The batch-based concurrent read operation means that multiple WLs are concurrently selected for read but based on the restriction of one WL per one block per one MG group in a same or different HG group of the YUKAI NAND array (see FIG. 4A).

The reason of this restriction is because each WL read is to sense each MLC bit after charge-sharing between one selected $C_{MG}$ and $J \times C_{HG}$ in worst case scenario. Thus the value of $C_{MG}$ cannot be too small as compared to $J \times C_{HG}$ by each SA of each PB. When M WLs are selected for batch-based concurrent read, it means M WLs in M blocks in M different MG groups ($M \times C_{MG}$) in either a same or different HG group in one same NAND plane are selected for concurrent read. Concurrent read means that M pages of $C_{MG}$ PCACHE registers are selected for concurrent local precharge, concurrent local MLC data evaluation (discharging or retaining in accordance with the MLC data), concurrent local $V_{SL}$-based Vt-compensation and concurrent voltages setup on M sets of 127 unselected WLs, one selected WL, SSL, and GSL lines.

Contrary to conventional method of read that only one WL in one block is selected for read in one whole NAND plane, the present invention can have M WLs to be read simultaneously (or concurrently) with only one restriction. One WL per block in one MG group is sensed by each corresponding SA in PB at a time for CS to avoid data contention among M selected WL MLC cells. Because CS time is relatively smaller than $C_{MG}$ precharge time and MLC evaluation time locally, therefore, M WLs are substantially read concurrently in the present invention with M-fold read latency reduction. The read operation flow shown in FIG. 8A is based on one WL select read only for description simplicity.

Referring to FIG. 8A, following step 400 is a step 402 to determine if the selected WLn is a boundary WL or not. In an embodiment, the step 402 is performed based on a status of a "Mark" bits stored in each WLn. For concurrent M WLs selection, then M "Mark" bits have to be read out from M WLn. Specifically, the "Mark" bit is defined as "1" for a non-boundary WL and "0" for a boundary WL. "1" means the cell is in erase-state, while "0" is in program state like a SLC storage. The Mark bits can be formed at the spare area of WLn.

When the Mark bit is "1", it indicates WLn is not a boundary WL, thus the read operation flow moves to step 410, where a $V_{SL}$-based Vt-compensation is not needed. Thus, three stair-rise read voltages VRn of 1.4V, 2.4V, and 3.4V are sequentially applied to each selected WLn to distinguish four distinct MLC states.

When Mark bit is "0", it indicates WLn is indeed a boundary WL, thus the flow moves to step 404, where a $V_{SL}$-based Vt-compensation is needed in accordance with the MLC data stored in next adjacent WLn+1 cells before WLn cells are read.

The flow then moves to a decision step 406 to determine two situations in WLn+1 MLC data. In this step, another Mark bit is read out from WLn+1. If this Mark bit is "1", then the WLn+1 cells store a 4-state MLC data because its MLC page data is available and WLn+2 cells are also being programmed with a full MLC data. Then flow moves to step 408, where WLn MLC read operation employs four $V_{SL}$-compensations voltages, e.g., 0V for P3 state, 0.1V for P2 state, 0.22V for P1 state, and 0.38V for P0 state in accordance with the WLn+1 cell stored MLC data along with three stair-rise VRn of VR1=1.7V, VR2=2.7V, and VR3=3.7V being sequentially applied on WLn for accurate 2-bit MLC read.

Conversely, if the Mark bit is "0", the WLn+1 cells store only P0 data, which means WLn+1 MLC page as well as WLn+2 page are not ready for MLC program. Then the flow moves to step 412 without need $V_{SL}$ Vt-compensation. A direct 4-state MLC read operation is performed on each single selected WLn by sequentially applying three stair-rise VRn of VR1=1.2V, VR2=2.2V, and VR3=3.2V with $V_{SL}$=0V. The method of MLC read operation is ended at step 414.

Figure 8B:
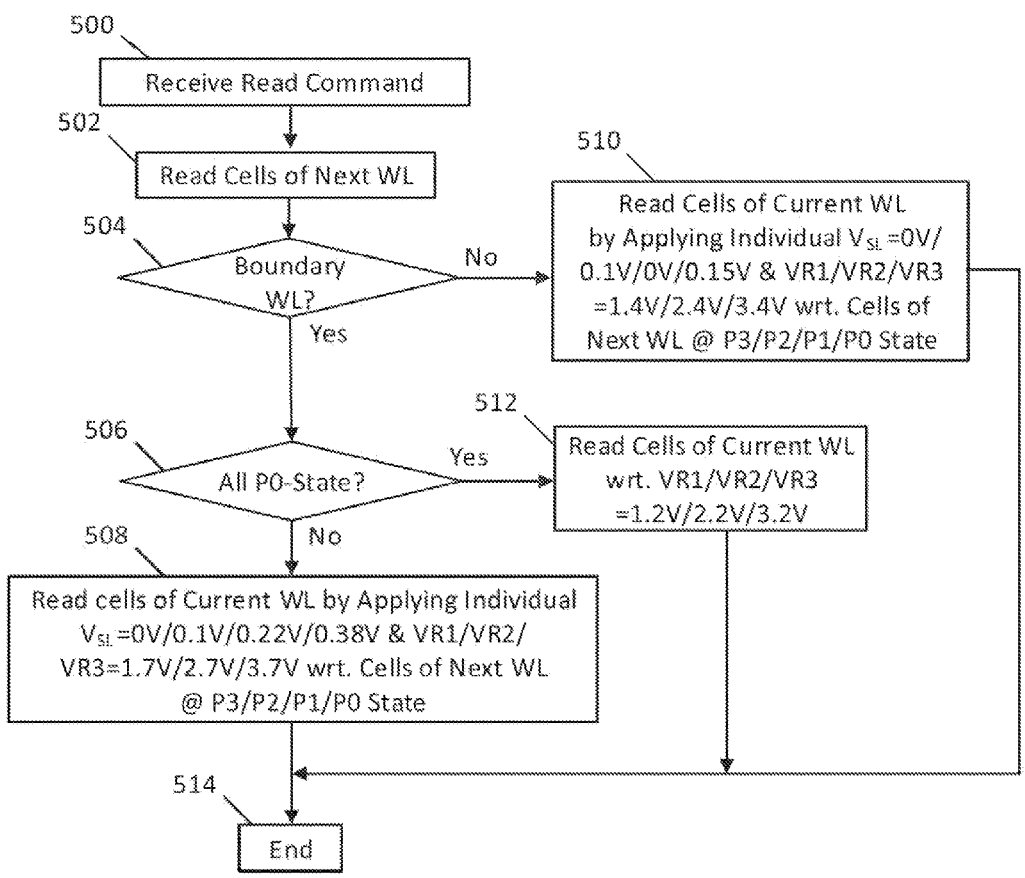
FIG. 8B is a diagram showing a method of performing MLC read operation for both boundary and non-boundary WL cells according to another embodiment of the present invention.

FIG. 8B is a diagram showing a method of performing MLC read operation for both boundary and non-boundary WL cells according to another embodiment of the present invention. As shown, the method starts from step 500 of receiving Read Command for MLC data. Then at step 502 the "Mark" bit status is read out from WLn+1 cells before at step 504 for determining if each selected WLn is a boundary WL or not. Step 502 shows that WLn's status is stored in WLn+1, rather than in WLn. There is advantage of doing this because whether WLn+1 will be programmed with P0 state or not is subject to the availability of WLn+1 MLC page data before performing WLn's 1P operation. The "Mark" bit for WLn cells can be done simultaneously with either WLn+1 at P0 state or MLC 1P program without performing extra program operation to reduce the unnecessary Vpgm on the WL to induce program disturb.

Next, the flow splits to step 506 or step 510 determined by the step 504 on whether the selected WLn is a boundary WL or not. Again, the path decision is based on the status of the "Mark" bits stored in each WLn+1. For concurrent M WLs selection, then M "Mark" bits have to be read out from M WLn+1 cells. The "Mark" bit "1" is defined for a non-boundary WLn and "0" for a boundary WLn. The "Mark" bits can be formed at the spare area of each WLn+1.

When the Mark bit is "1", it indicates WLn is not a boundary WL, thus the flow moves to step 510, where a $V_{SL}$-based Vt-compensation is needed. Thus, three stair-rise voltages VRn of 1.4V, 2.4V, and 3.4V are sequentially applied to each selected WLn along with $V_{SL}$ compensation voltages of 0V, 0.1V, 0V, and 0.15V for respective opposing WLn+1 cells at P3, P2, P1, and P0 states to accurately distinguish four distinct MLC states.

When the "Mark" bit is "0", it indicates WLn is indeed a boundary WL, thus the flow moves to step 506 to further determine WLn+1 second "Mark" bit status on whether WLn+1 stores P0 data. If the second "Mark" bit is read "1", then WLn+1 cells store a 4-state MLC data because its MLC page data is available and adjacent WLn+2 cells are also being programmed with a full MLC data. Then flow moves to step 508.

At step 508, WLn MLC read operation employs four $V_{SL}$-compensation voltages, e.g., 0V for P3 state, 0.1V for P2 state, 0.22V for P1 state, and 0.38V for P0 state in accordance with MLC cell data stored in WLn+1 along with three stair-rise voltages VRn of VR1=1.7V, VR2=2.7V, and VR3=3.7V being sequentially applied on WLn for achieving accurate 2-bit MLC read.

Conversely, if the second "Mark" bit is "0", then WLn+1 cells store only P0 data, which means that MLC page data on WLn+1 as well as WLn+2 are not ready for MLC program. Then the flow moves to step 512, which does not need $V_{SL}$ Vt-compensation. A 4-state MLC read operation is performed directly by applying three stair-rise voltages VRn of VR1=1.2V, VR2=2.2V, and VR3=3.2V sequentially on each single selected WLn with $V_{SL}$=0V. At step 514, the method of MLC read is ended.

In FIG. 9A to FIG. 12F, several preferred concurrent batch-based NAND operations based on one of YUKAI NAND array and its associated peripheral decoders and SA circuits are provided. In an example, the YUKAI NAND array is comprised of a plurality of paired strings within a plurality of blocks as shown in FIG. 1A of the present invention. The concurrent batch-based NAND operations can be also performed in other exemplary YUKAI NAND arrays shown in FIG. 1B and FIG. 1C.

For description simplicity, the one LG group is assumed to contain only two adjacent blocks (a top block configured to be mirrored with respect to a bottom block) in LBL-direction (Y-direction). Two identical sets of bias conditions of two LBLs such as $LBL^{J-1}e$ for even LBL line and $LBL^{J-1}o$ for odd LBL line, 128 WLs, 4 DWLs, 2 SSLs and 2 GSLs of each string are shown. For example, for the top block the top sub-string contains 64 WLs such as $WL^1 1$ to $WL^1 64$ counted from string middle to string top. Conversely, the bottom sub-string contains another 64 WLs such as $WL^2 1$ to $WL^2 64$ counted from string middle to string bottom. Similarly, the same 128 WLs arrangement is shown in the bottom block.

Being differentiated from conventional NAND string, each string of a YUKAI NAND array in the present invention has two first WLs next two dummy WLs located at an interfaced middle area respectively for two mirrored equal-sized sub-strings. As a result, advantages of more flexible and much less WL program disturbance and GIDL effect can be achieved in all kinds of MLC program operation.

In a specific embodiment, the MLC program operation of the top sub-string of the top block is preferably performed sequentially from $WL^1 1$ to $WL^1 64$, which is selected to be erased and programmed concurrently. Conversely, the MLC program operation of the lower sub-string of the same top block is preferably performed sequentially from $WL^2 1$ to WL²64 if 64 WLs of the mirrored bottom block are also selected for erase and program with a MLC data.

In one embodiment of YUKAI NAND array shown in FIG. 4A, which is based on cross-coupled NAND string with Block1 on top and Block2 on bottom of FIG. 1A, the Block1 and Block2 are configured to be mirrored in LBL direction (Y-direction) with individual BL and SL and to include a small dummy cell to replace the extra big Odd/Even string-select transistor in prior art for area saving. Each SL is identical to each BL in this array. The BL and SL can be used interchangeably and each BL is also referred as LBL line here.

In an embodiment, an exemplary block of several exemplary YUKAI NAND arrays shown in the present invention is comprised of N/2 paired 128-cell strings cascaded in WL-direction, e.g., X-direction. The fundamental building circuit of the block is one pair of Even and Odd strings with their respective drain and source nodes connecting to two cross-coupled LBLe and LBLo metal lines at M1/M2 levels. In other words, the drain BL node of adjacent string is used as the individual SL node of a current string so that the individual $V_{SL}$-based Vtn-offset scheme can be flexibly realized in read, program-verify, and erase-verify operations according to certain embodiments of the present invention.

FIG. 9A is a diagram showing a preferred set of bias conditions for a multiple-block-erase operation according to an embodiment of the present invention. As shown, an operation of "Multiple Blocks Erase" is proposed. Here, "Multiple" means at least two adjacent or non-adjacent blocks in Y-direction of a YUKAI NAND array are selected for concurrent HV erase operation. In the following examples, two adjacent blocks are defined as one LG group that uses short M1/M2-level $C_{LG}$ metal capacitors $C_{LBLe}$ and $C_{LBLo}$ and are selected for the demonstrations of MLC erase, program, and read operation. In general one LG group may comprise more than two adjacent blocks. As shown in FIG. 4A, each MG group can contain up to J' LG groups. Note, each $C_{LG}$ capacitor is an optimized unit of PCHACE register configured to temporarily store each MLC bit (MSB or LSB) $V_{LBL}$ data for less power consumption in program operation. By contrast, each $C_{MG}$ capacitor of a larger MG group is a larger PCHACE register configured to temporarily store each MLC bit (MSB or LSB) data for less power consumption in read operation and all verify operation, because charge-sharing is required for concurrent operation that needs more stored charges for sensing diluted MLC data from the PCACHE register by SA in PB.

In a specific embodiment, erase voltage of ~20V or more is required to charge $V_{TPW}=V_{DNW}\geq 20V$ (for 2D floating-gate transistors or bulk of 3D float-gate transistors). Up to M number of LG groups of M×2 blocks in one or more MG groups are selected for simultaneous batch-based erase operation. For setting the erase bias conditions of each 2-block, all selected 256 WLs (WL¹1-WL¹64 to WL⁴1-WL⁴64) of the selected regular NAND cells and 4 DWLs (DWL¹1, DWL¹2, DWL²1 and DWL²2) of dummy cells are coupled to Vss=0V (i.e., $V_{WL}=V_{DWL}=0V$) along with $V_{TPW}=V_{DNW}=20V$ and all selected lines such as SSL¹, GSL¹, SSL², GSL², BLGJ'-1, PREʲ'o, PREʲ'e, and LBLʲ'ps are set in floating states (FL) to be erased and verified against Vte°max. As a result, all N+/TPW diode junctions are precharged to ~19.5V on LBLʲ'⁻¹e, LBLʲ'⁻¹o, LBLʲ'e, and LBLʲ'o nodes. Note, the Vte°max=−3.5V.

In an alternative embodiment, YUKAI NAND array can also be formed with 3D charge-trapping memory transistors in each 3D string structure, in which the multiple-block-erase operation can be performed in similar manner except that GIDL-effect is used to generate hot Hole-Electron pair to erase with slightly different bias conditions described above or more below. But subsequent erase-verify operation, as it is essentially same as read operation, is independent from either 2D or 3D NAND array configurations, so all description on erase-verify operation throughout the specification should be applicable to any 2D or 3D NAND array.

Note, although dummy cells are erased together with the regular NAND cells during first few erase pulses, erase-verify operation for the dummy cells is first to be performed ahead of the regular cells with Vte°max (dummy cell)=−1.0V, which is less negative than the regular NAND cells of Vte°max (regular cell)=−3.5V. In reality, more than two adjacent blocks can be formed as one LG group and two adjacent LG groups is divided or connected by a NMOS transistor MLBL gated by a bias signal BLGJ'-1 as shown in FIG. 4A.

FIG. 9B and FIG. 9C are diagrams respectively showing preferred sets of bias conditions for performing two consecutive steps of a high voltage concurrent discharge operation after the multiple-block erase operation according to an embodiment of the present invention. As shown in FIG. 9B, a preferred set of bias conditions is provided for performing a HV-residual discharge operation in which a HV concurrent discharge occurs after multiple-block erase. Up to M LG groups with M×2 blocks are selected for being simultaneously discharged after iterative 20V concurrent erase operation.

During this discharge operation, all selected TPW and DNW voltages are discharged from ~20V to ~1.0V along with the selected WLs, SSL, GSL, PREʲ'o, PREʲ'e, LBLʲ'ps, and BLGJ'-1 lines being switched from floating state to Vss so that the subsequent erase discharge operation can be performed.

The reason to discharge $V_{TWP}=V_{DNW}$ to 1.0V is to use Vte°max=−1.0V for erase-verify on all regular and dummy NAND cells together to save power and verify time. For performing a negative erase-verify with Vte°max=−1.0V under a condition without applying −1.0V to WLn, then $V_{TPW}=V_{DNW}=1.0V$ with all 256 WLs and 2 dummy WLs are coupled to Vss per block. In other words, the present erase and erase-verify is based on the following preferred scheme: 1) Concurrent erase operation is performed in initial erase pulses on both dummy cells and regular cells within M selected blocks and LGs. This is mainly to save erase time and reduce power consumption because both dummy and regular cells are residing in the same blocks. 2) Erase-verify is performed separately for dummy cells and regular NAND cells but is done for dummy cells first due to its targeted erase-Vt is −1.0V, which is less negative than −3.5V set for the regular cells.

In summary, a first step of discharge operation is to discharge 20V of the selected DNW and TPW to 1V and discharge HV voltages of the poly2-gates of selected WLs, DWLs, PREJ'o, PREJ'e, GSL, SSL, and BLGJ'-1 to Vss for equivalently performing erase-verify voltage of −1V for dummy cells. In a specific embodiment, the erase-verify voltage of −1V for dummy cells has to be performed before the erase-verify of −3.5V for the regular cells because −1.0V is reached before −3.5V.

Note, the bias conditions set in FIG. 9B do not perform erase-verify for dummy cells. They are just a step for preparing for dummy cells' erase-verify by controlling discharging of $V_{TPW}=V_{DNW}$ from 20V to 1V but setting LBLʲ'ps=0V.

FIG. 9C shows a preferred set of bias conditions for performing a second step discharge operation where a HV concurrent discharge occurs after multiple-block erase. This operation is performed by setting PRE$^{J'}$o=PRE$^{J'}$e=Vpass and LBL$^{J'}$ps=1V and BLGJ'-1=0V. The purpose of this second step discharge operation is to discharge all remaining HV charges on all N+/TPW junction nodes from ~19.5V to 1V so that the subsequent erase-verify of −1V can be performed. As a consequence, the HV residue voltage on selected junctions of LBL$^{J'}$e, LBL$^{J'}$o, LBL$^{J'-1}$e, and LBL$^{J'-1}$o and all S/D nodes of regular NAND cells in all selected strings of selected blocks are also discharged to 1V by turning on both MLBLso and MLBLse NMOS devices so that the subsequent batch-based concurrent erase-verify operation of dummy cells and regular NAND cells of −1V can be performed.

FIGS. 9D, 9E, and 9F are diagrams respectively showing preferred sets of bias conditions for performing consecutive three steps of erase-verify operation on either Even-string cells or Odd string cells according to another embodiment of the present invention. As shown in FIG. 9D, a preferred set of the bias conditions is provided for a first step of erase-verify operation on either Even-string regular cells and Even dummy cells or Odd-string regular cells and Odd dummy cells. In this step, a concurrent precharge occurs when LBL$^{J'}$e line is set to Vinh ~7V and LBL$^{J'}$o line is kept floating at initial 1V. In this embodiment, LBL$^{J'}$e is selected for precharging with Vinh from LBL$^{J'}$ps line by setting PRE$^{J'}$e=Vpass and LBL$^{J'}$e is disconnected from common LBL$^{J'}$ps line by setting PRE$^{J'}$o=0V. The conditions of setting BLGJ'-1 to Vpass and $V_{TPW}$=$V_{DNW}$ to 1V are to keep Vs=1V of select transistor MSe with SSL$^1$=1.5V+Vt and Vd=1V of the select transistor MSe with SSL$^2$=1.5V+Vt to avoid cell's punch through in erase string during this erase-verify operation by maintaining the largest Vds≤0.5V across source and drain nodes of all selected cells in the selected strings without the concerns of punch-through and body-effect.

As shown in FIG. 9E, another preferred set of the bias conditions for a second step of erase-verify operation on Even NAND string cells. In this step, a concurrent discharging or retaining operation occurs to keep LBL$^{J'}$e line with the Vinh ~7V in accordance with the status of the erased data. In this embodiment, the voltage of LBL$^{J'}$e line is discharged from Vinh to 1V if all 128 circled cells, MCe, and 2 dummy cells, MUe and MLe, in each of two vertically adjacent blocks pass an erase-verify voltage of −1V or retain the Vinh if at least one cell per string fails to pass the erase-verify of −1V. This discharge or retention operation is performed by setting the following bias conditions: a) set $V_{WL}$=0V for regular cell WLs WL$^1$1 to WL$^1$64 and WL$^2$1 to WL$^2$64 for top and bottom blocks; b) set two dummy WLs DWL$^1$1 and DWL$^1$2 to 0V; c) set SSL$^1$=GSL$^1$=SSL$^2$=GSL$^2$ to 1.5V+Vt to bias the Vd(cell-string) to 1.5V with respect to Vs(cell-string) at 1V so that Vds=0.5V (cell-string) when transistor MLBLso is turned on by applying Vpass=8V-10V to PRE$^{J'}$o; d) set LBL$^{J'}$ps to 1V to supply the Vs (cell-string) with 1V for Vte$^0$max=−1V erase-verify; e) apply Vpass to PRE$^{J'}$o and 0V to PRE$^{J'}$e.

As shown in FIG. 9F, a preferred set of the bias conditions for a third step of erase-verify operation for one or more Even string cells. In this step a concurrent CS occurs between every M$_2$ C$_{MG1}$ (LBL capacitor of one selected MG) and the sum of C$_{HG1}$+C$_{HG2}$+C$_{HG3}$+ . . . +C$_{HGJ}$ (total J parasitic broken GBL$^{J1}$1 capacitors) from HG1 to HGJ along sensing signal path to each M1/M2-level metal line C$_{MG}$=C$_{LG1}$+C$_{LG2}$+ . . . +C$_{LGJ'}$ with each corresponding SA, where each M3-level metal line C$_{HG}$=C$_{MG1}$+C$_{MG2}$+ . . . +C$_{MGL}$ with an initial voltage of 0V. In other words, each long sensing signal path includes a plurality of broken shorter C$_{HG}$ capacitors such as M3-level GBL$^1$1 to GBL$^J$1 lines from GBL$^1$1 in HG1 (150) to GBL$^J$1 in HGJ (150).

Note, only one C$_{LG}$ is selected per one C$_{MG}$ in each C$_{HG}$. When one C$_{LG}$ is selected for erase-verify, program-verify, and read, the rest of (J'−1) C$_{LG}$s within each C$_{MG}$ are connected to form one C$_{MG}$, which is then precharged with Vinh so that J'-fold stronger cell analog voltage with a tradeoff of a higher Vinh precharge current can be generated for the subsequent CS operation. The CS result is sensed and verified by each corresponding SA in each PB through each corresponding transistor MI gated by a common signal ISO. The final sensed MLC cell analog voltage after each CS step is approximately calculated by the following relationships with all C$_{HG}$, C$_{MG}$, and C$_{LG}$ being laid out identical: 1) charges on LBL$^{J'}$e is Vinh/L×J if Vt (dummy cell) and Vt (regular cell)≥−1V, e.g., the CS step dilutes the cell's sensed voltage on LBL$^{J'}$e line by L×J folds because there are total L equal MG groups in one HG group and there are total J equal HG groups; 2) charges on LBL$^{J'}$e is 1V/L×J if Vt (dummy cell) and Vt (regular cell)<−1V.

The CS step for erase-verify operation is performed on one MG-by-MG basis as explained above because each signal path of the accessed specific GBL$^{J'}$1 to each corresponding SA is a shared bus. It does not allow MLC cell bit data of more than one sensed WLs being sensed by one common SA at a time. But when comparing each CS time to each C$_{LBL}$ (i.e., C$_{MG}$) precharge time and discharge time, it is a relatively much shorter time. Thereby, each CS time is negligible in whole erase-verify course.

In an embodiment, the erase verification of a 2-block erase of each MG group only guarantees that one out of four NAND strings in two adjacent pairs in Y-direction within one C$_{LG}$ is successful. Because two SLC-like Vts of a dummy cell are designed to be −1V and positive 2V with a large read margin and a wide Vt range, thus once Vte$^0$max<−1V is verified in at least one NAND string, all the NAND cells (dummy or regular ones) in three remaining strings (in the 2 blocks) should have similar Vte$^0$max<−1V, or at least Vte$^0$max<0V. Therefore, it will be no problem to program arbitrarily selected MUo/MUe and MLo/MLe dummy cells in all dummy WLs (DWL$^1$1, DWL$^1$2, DWL$^2$1, DWL$^2$2) with Odd/Even-BL selection function without need to add any paired extra-big select transistors as in prior art.

The erase-verify operation of dummy cells within same C$_{LG}$ in three remaining strings of the two adjacent blocks need to be finally confirmed after all dummy cells are successfully programmed with one desired complementary Vts.

FIGS. 10A, 10B, and 10C are diagrams showing preferred sets of the bias conditions respectively for three steps of Even dummy cell program operation according to an embodiment of the present invention. As shown in FIG. 10A, a preferred set of the bias conditions for a first step of Even dummy cell Program operation is provided, in which a concurrent precharge occurs by applying Vinh to LBL$^{J'}$e. In this example, LBL$^{J'}$e (one of all J' C$_{LG}$ capacitors) within one C$_{MG}$ capacitor is selected for precharging with Vinh from LBL$^{J'}$ps line by setting PRE$^{J'}$e to Vpass. Conversely, the voltage of LBL$^{J'}$o is set to be floating by disconnecting it from the common LBL$^{J'}$ps bus line by setting PRE$^{J'}$o to 0V.

The dummy cell program is performed in complementary way on one paired cells residing on same dummy WL. For example, when an Even dummy cell MLe on DWL$^1$2 is selected for programming into positive Vtp, then the paired Odd dummy cell MLo is left un-programmed with the initial negative erase Vte. This is what we referred as the Vt-complementary paired dummy cells. Similarly, the Even dummy cell MLe on $DWL^2 2$ is also selected for programming into positive Vtp, then the paired Odd dummy cell MLo is also left un-programmed with the initial negative erase Vte in $E^0$ state (see FIG. 6A).

One significant feature of the dummy cell program is that multiple selected MLe cells in all selected strings within same selected $C_{MG}$ can be simultaneously programmed like a SLC cell with one verification only on single positive target Vtp≥2V, which is referred as $Vtp2^1 max \geq 2V$ as defined in FIG. 6A. The following set of bias conditions is employed for performing this multi-dummy cell simultaneous program.

1) $SSL^1$ and $SSL^2$ are set to 0V to prevent string leakage in both top and bottom blocks.

2) $GSL^1$ and $GSL^2$ are biased to Vpass to pass program-inhibit voltage Vinh to Odd strings and program voltage 0V to the selected Even strings in both top and bottom blocks.

3) First two dummy word lines $DWL^1 1$ and $DWL^2 1$ are biased to a reduced voltage Vpa1<Vpass to gradually reduce the dummy cell MUe's channel voltage below Vinh.

4) Second two dummy word lines $DWL^1 2$ and $DWL^2 2$ are biased to Vpass>Vinh to ensure fully pass of program-inhibit voltage Vinh to the Odd dummy cell MLo channel because Vpass is greater than Vinh and also pass program voltage of 0V to Even dummy cell MLe as Vts of Even dummy cells are $Vte^0 max<-1V$.

5) Top-block lower-substring regular cell word lines $WL^2 1$ through $WL^2 64$ are biased to Vpass>Vinh to ensure fully pass of the Vinh to channels of Odd regular cells MCo on $WL^2 1$ to $WL^2 64$ because Vpass is greater than Vinh and to pass 0V to Even regular cells MCe on $WL^2 1$ to $WL^2 64$ as their Vts are $Vte^0 max<-1V$.

6) Bottom-block upper-substring regular cell word lines $WL^4 1$ through $WL^4 64$ are biased to Vpass to ensure fully pass of the Vinh to channels of these Odd regular cells MCo on $WL^4 1$ through $WL^4 64$ because Vpass is greater than Vinh and to pass 0V to Even regular cells MCe on $WL^4 1$ to $WL^4 64$ as their Vts are $Vte^0 max<-1V$.

7) Top-block upper-substring regular cell word lines $WL^1 1$ to $WL^1 64$ are biased respectively to gradually-reduced voltages from Vpa2 to Vpa3, where Vpass>Vpa1>Vpa2>Vpa3. This setting gradually reduces the channel voltage of 64 unselected MCe cells to a level below Vdd to avoid GIDL effect happening to the end cells of MCe and MCo residing in $WL^1 64$. The exact number of WLs to be respectively assigned with Vpa1, Vpa2, and Vpa3 are highly flexible. It is preferred to approximately divide them into same number of 64/3 with an integer.

8) Similarly to 7), bottom-block lower-substring regular cell word lines $WL^3 1$ to $WL^3 64$ are biased respectively to gradually-reduced voltages from Vpa2 to Vpa3.

Additionally, FIG. 10B shows a preferred set of the bias conditions for a second step of Even dummy cell program operation, in which a concurrent discharge operation is performed for $LBL''o$ voltage dropping to Vss. In this example, $LBL''o$ is selected for being discharges to Vss by turning on transistor MLBLso with its gate $PRE''$ being coupled to Vpass and $LBL''ps$ set to 0V and $PRE''e$ coupled to 0V to prevent the leakage of $LBL''e$, i.e., the $LBL''e$ voltage staying at Vinh. As a result, the channel voltage of selected dummy cell MLe becomes 0V for preparing the subsequent SLC-like program and channel voltage of another dummy cell MLo becomes Vinh for the program-inhibit.

Furthermore, FIG. 10C shows a preferred set of the bias conditions for a third step of Even dummy cell program operation with corresponding gates of $DWL^1 2$ and $DWL^2 2$ being coupled to same Vpgm and their respective channels coupled to $LBL''o$ at 0V. This program operation is generally referred as concurrent program for Even dummy cells. In this example, the bias conditions include following settings in which $LBL''e$ is biased to Vinh but $LBL''o$ is biased to 0V with $GSL^1$ being at Vpass and channels of Odd cells MUo in both top and bottom blocks being set at Vinh for program-inhibit. In an embodiment, setting $SSL^1$ voltage to 0V is to prevent the Vinh voltage at $LBL''e$ line from leaking to Vss as $LBL''o$ line.

The selected Even dummy cells (MLe) in top block with its gate connected to $DWL^1 2$ and MUe in adjacent bottom block with its gate connected to $DWL^2 2$ with same LBL connection can be programmed simultaneously (applying Vpgm to $DWL^1 2$ and $DWL^2 2$) with same target program state Vtp>0 to save time and power consumption. Therefore, the dummy cells SLC-like program and erase operations are much more relaxed and faster than the regular MLC NAND cells.

FIG. 10D, FIG. 10E, and FIG. 10F, comparing to FIG. 10A, FIG. 10B, and FIG. 10C for two Even dummy cells, are designed for showing steps of precharge, discharge, and program operations on two Odd dummy cells, respectively residing on both $DWL^1 1$ and $DWL^2 1$, with corresponding two Even dummy cells left un-programmed in $E^0$ state in two selected Odd strings in two blocks within same MG and $C_{LG}$.

After program, the Vts of two MUo cells connected to $DWL^1 1$ and $DWL^2 1$ in two adjacent Odd strings in two blocks are similarly programmed to Vtp as two MUe cells as described in FIG. 10A, FIG. 10B and FIG. 10C. Thus, the details are omitted herein for description brevity. In summary, two Vts of two complementary dummy cells have two flexible and combination values with some restrictions as set in Table 6 and Table 7 below.

TABLE 6

| Dummy cells | MUe | MUo | MLe | MLo | Remark |
|---|---|---|---|---|---|
| Vt option1 | Vte | Vtp | Vtp | Vte | Okay |
| Vt option2 | Vtp | Vte | Vte | Vtp | Okay |
| Vt option3 | Vte | Vte | Vte | Vte | Not allowed |
| Vt option4 | Vte | Vtp | Vte | Vte | Not allowed |
| Vt option5 | Vte | Vtp | Vtp | Vtp | Not allowed |
| Vt option6 | Vte | Vte | Vte | Vtp | Not allowed |
| Vt option7 | Vte | Vte | Vtp | Vte | Not allowed |
| Vt option8 | Vtp | Vtp | Vtp | Vtp | Not allowed |

As seen in Table 6, only option1 and option2 are allowed for Vt assignments for the paired dummy cells as indicated above. As a result, some of the Vt values of Option1 and Option2 are given in Table 7 below. As seen, the best choice of complementary values is to have Vte negative but have Vtp positive. But because Vte will be widened and shifted into positive values by adjacent WL cells after the regular 1P and 2P programs, the guideline is to keep ΔVt=Vtpmin−Vtemax=2V for a superior read margin in the end of product life.

TABLE 7

| Option1/Option2 | Vtp | Vte | Remark | VR value |
|---|---|---|---|---|
| Complementary value1 | ≈2.5 V | ≤0.5 V | Good | 1.5 V |
| Complementary value2 | ≈2 V | ≤0 V | Good | 1 V |
| Complementary value3 | ≈3 V | ≤1 V | Good | 2 V |
| Complementary value4 | ≈3 V | ≤0 V | Good | 1.5 V |
| Complementary value5 | ≈4 V | ≤2.5 V | Oaky not good | 3.25 V |
| Complementary value6 | ≈4 V | ≤1 V | Okay not good | 2.5 V |
| Complementary value7 | ≈3 V | ≈2 V | Bad | 0.5 V less margin |
| Complementary value8 | ≈1 V | ≤0 V | Bad | 0.5 V less margin |

FIGS. 10G, 10H, and 10I are diagrams showing respective steps to perform concurrent precharge, concurrent discharge and concurrent program-verify for Even dummy cells according to an embodiment of the present invention. In particular, FIG. 10G, FIG. 10H, and FIG. 10I respectively show three consecutive steps to perform a concurrent Even-LBL cell precharge operation, a concurrent discharge operation, and a MG-by-MG program-verify operation by charge-sharing between LBL and GBL (similar to erase-verify with a positive checking voltage for Even dummy cells). The ABL-read SLC-like read operation cannot be performed here in dummy cell.

As shown in FIG. 10G, a concurrent Even-LBL cell precharge operation is executed under the following bias conditions for precharging $LBL^{J'}e$ line capacitor $C_{LG}$ to Vinh voltage:

a) $SSL^1$ is set to 0.5V+Vt to prepare drain node of selected Even dummy cells MUe with source node being at 0V based on setting $DWL^12$ to 0.5V for subsequent Vtp evaluation in top block only.

b) $GSL^1$, $GSL^2$, and $SSL^2$ are all set to 0V to prevent Vinh leakage from top block during the Vinh precharge cycle.

c) $DWL^11$ is biased to Vread and $DWL^1$ 2 is biased to $Vt_{DMH}$ to prepare for subsequent program-verify for the dummy cells on the $DWL^1$ 2 in the top block.

d) $DWL^21$ and $DWL^22$ are kept at 0V to disable dummy cells in bottom block during program-verify operation of dummy cells in the top block.

e) $WL^11$ through $WL^1$ 64 and $WL^21$ through $WL^2$64 are biased to Vread to prepare subsequent program-verify operation on the dummy cells in the top block.

f) $WL^31$ through $WL^3$64 and $WL^41$ through $WL^4$64 are kept to 0V to disable regular cells in the bottom block during program-verify operation of the dummy cells in the top block.

g) $BLGJ'-1$ is biased to Vpass to connect all J' $C_{LG}$ capacitors to form a bigger $C_{MG}$ for a bigger cell signal in charge-sharing operation.

As shown in FIG. 10H, a concurrent discharge operation following the previous concurrent Even-LBL cell precharge operation is performed under changes of bias conditions shown below. Note, a reference value of program-verify voltage Vtp of a dummy cell MLe with high Vt is referred as $Vt_{DMH}$. This $Vt_{DMH}$ is applied to $DWL^1$ 2 as program-verify evaluation of the dummy cell in the bottom block. In a specific embodiment, $Vt_{DMH}$=VR1=1.4V as shown in FIG. 6A. When Vtp<$Vt_{DMH}$, then the dummy cell program fails and needs to be programmed again. When Vtp≥$Vt_{DMH}$, then the dummy cell program succeeds and the further iterative program should be inhibited. The LBLJ'-1 bias voltage of passed dummy cells switches from 0V to Vinh. Additionally, $GSL^1$ is biased to Vread to enable a sensing current flowing through top NAND string if Vtp<$Vt_{DMH}$.

As shown in FIG. 10I, a charge-sharing operation is performed to execute a program-verify based on changes of bias conditions shown below. This step is to evaluate if the selected Even dummy cells are successfully programmed by the corresponding sense amplifier (SA) at page buffer (PB). The details of this step are substantially the same as ones of the charge-sharing in erase-verify operation as explained in terms of FIG. 9F shown above.

FIGS. 10J, 10K, and 10L are diagrams showing respective steps to perform concurrent precharge, concurrent discharge and concurrent program-verify for Odd dummy cells according to an embodiment of the present invention. The three consecutive steps of performing a concurrent precharge, a concurrent discharge, and a MG-by-MG program-verify for Odd dummy cells MUo are just the same as those steps for Even dummy cells MUe described above.

FIGS. 10M, 10N, and 10O are diagrams showing respective steps to further perform concurrent precharge, concurrent discharge and concurrent erase-verify for selected regular cells in Even strings in selected blocks after successful program operation for Odd and Even dummy cells according to an embodiment of the present invention. In particular, FIG. 10M, FIG. 10N, and FIG. 10O respectively show three steps to further perform a concurrent precharge, concurrent discharge, and MG-by-MG program-verify operations for selected regular cells in Even strings, which are similar to steps described earlier for performing erase-verify of those cells but with $Vte^0max$=−3.5V. Both dummy and regular cells has performed and passed the erase-verify operation with $Vte^0max$=−1V, as shown in FIGS. 9A-9F, before dummy cell program operation. The current steps are used to complete erase-verify with $Vte^0max$=−3.5V for all regular cells in all selected strings in all selected LG, MG, and HG groups after the successful completion of selected dummy cells program and program-verify. Since Odd/Even dummy cells have been programmed with success at this step, the Odd/Even-LBL selection would become controllable. The regular NAND cells in either Even or Odd NAND strings can be easily and accurately selected for erase-verify.

As shown in FIG. 10M, a preferred MG-based Vinh precharge operation is performed on Even $LBL^{J'}e$ capacitors $C_{MG}$ with following bias conditions:

a) Dummy word lines $DWL^11$ is biased to 1.4V=VR1 but $DWL^1$ 2 is biased to Vread and $DWL^22$ and $DWL^21$ are biased to 0V, so as to select only one Even string in top block out of the four strings in two blocks for Vinh precharge for subsequent erase-verify on cells in the Even strings of the top block.

The Even string is selected because $DWL^11$ is biased to 1.4V>Vte of the Even dummy cell MUe but $DWL^11$ is biased to 1.4V<Vtp of the Odd dummy cell MLo. The selected string's MUe cell will conduct cell current.

b) $SSL^1$ is biased to 4V+Vt to prepare the drain node voltage of 4V for the selected Even string regular cells MCe with respect to the source node voltage of 3.5V. As a result, a $V_{ps}$ of less than 0.5V is maintained on all selected Even string regular cells MCe to avoid punch-through and body-effect.

c) $GSL^1$, $GSL^2$, and $SSL^2$ are all kept at 0V to only prevent leakage of the precharged Vinh from the Even string in top block. The bottom block is disabled during the top Even string Vinh precharge cycle.

d) $DWL^22$ and $DWL^21$ are kept at 0V to disable the dummy cells in the bottom block from erase-verify of the Even string regular cells.

e) $WL^11$ through $WL^1 64$ and $WL^21$ through $WL^264$ are also kept at 0V to prepare the subsequent erase-verify on Even string regular cells in the top block.

f) $WL^31$ through $WL^364$ and $WL^41$ through $WL^464$ are also kept at 0V to disable regular cells in the bottom block during erase-verify of Even string regular cells in the top block.

g) $PRE^{J'}$ is biased to 0V but $PRE^{J'}e$ is biased to Vpass and $LBLJ'ps$ connects to Vinh.

Note in the current embodiment, to avoid the regular string cells from being punch-through and body-effect, Vs is at 3.5V along with $V_{TPW}=V_{DNW}$ is set to 3.5V.

Additionally as shown in FIG. 10N, a concurrent discharge or evaluation operation on $LBL^{J'-1}e$ capacitors is executed. Furthermore in FIG. 10O, charge-sharing operations similar to those performed for the dummy cells as explained in both FIG. 9E and FIG. 9F are performed here for the Even string regular cells, thus the detailed description for performing this MG-by-MG program-verify for the selected regular cells in Even strings after erase-verify via a charge-sharing (CS) operation is substantially the same as those described based on FIG. 9E and FIG. 9F. The CS operation is performed between one selected $C_{LG}$ in one selected MG group with J $C_{MG}$ capacitors in the worst-case when the selected $C_{LG}$ is the farthest MG away from PB below. In general, if all Even string regular cells in top block have $Vte^0max<-3.5V$, then the corresponding $LBL^{J'}e$ line capacitor should be charged to 3.5V. If all Even string regular cells in top block have $Vte^0max>-3.5V$, then the corresponding $LBL^{J'}e$ is charged to Vinh.

FIGS. 10P, 10Q, and 10R are diagrams showing respective steps to further perform concurrent precharge, concurrent discharge and concurrent erase-verify for selected regular cells in Odd strings in selected blocks after successful program operation for Odd and Even dummy cells according to an embodiment of the present invention. The three steps for performing a concurrent precharge, a concurrent discharge, and a MG-by-MG concurrent erase-verify for the selected regular NAND cells in Odd strings of top block after the dummy cell program and Even string regular cell erase-verify operation are just the same as those steps for Even-string cells in the selected blocks described above in FIGS. 10M, 10N, and 10O.

In certain embodiments, the present invention provides a ABL and AnP based concurrent program, program-verify and Odd/Even read operations on all selected regular cells after successful completion of dummy cell program and regular cell erase-verify operations. With the Even and Odd dummy cells being successfully programmed with two complementary Vts, then the regular NAND cells in Even and Odd strings can be successfully selected for MLC program and program-verify by using the Even and Odd Dummy cells as the Even and Odd string select transistors. As described earlier, the preferred MLC programs for the regular NAND cells include a 1P SLC-like 2-state interim program and a 2P 4-state final MLC program for those regular cells on WLn having adjacent WLn+1 cells not in erase state $E^0$. Each WLn cell program is performed on single physical WL per one selected LG group. In a specific embodiment shown below, only one WLn per one LG group is selected. While the present invention can be applied to a batch-based concurrent MLC program for M number of dispersed WLn, then M WLn in M LG groups on one-page-per-LG basis in more than one MG groups and HG groups can be randomly selected for simultaneous program and verify operations with substantial reduction in latency and power consumption.

FIGS. 11A, 11B, and 11C are diagrams showing respective sets of bias conditions for performing ABL and AnP coarse and fine MLC program operations according to an embodiment of the present invention. Several sets of bias conditions for performing multiple steps of ABL and AnP coarse program operation (0P, 1P or 2P) and fine MLC program operation with preferred four program voltages or three $V_{LBL}$ program voltages and one Vinh program-inhibit voltage for completing 4-state MLC 2P program and with one $V_{LBL}$ program voltage plus one Vinh program-inhibit voltage for completing SLC-like 1P program and their associated sets of voltages of WLs, SSLs, GSLs, DMYWLs, $PRE^{J'}e$, $PRE^{J'}o$, $LBL^{J'}ps$, $BLGJ'-1$ lines and TPW and DNW for operating this YUKAI NAND array.

These desired values of one or more $V_{LBL}$ program voltages plus one Vinh program-inhibit voltage can be optimally generated by using a D/A and A/D converters in each SA in each PB and a 3-cap CS technique among three adjacent $C_{LG}$ capacitors along column direction in each $C_{MG}$ and $C_{HG}$ in a NAND array. Depending on Vdd voltage used in the NAND memory chip, a higher the value of Vdd, the less number of $C_{LG}$ capacitors is required in CS calculation to get the desired $V_{LBL}$ program voltages and Vinh program-inhibit voltage closer to respective target values in accordance with MLC cell interim program Vtpn and final target Vtpn difference to avoid earlier lockout among AnP program and to mitigate Yupin BL-BL coupling effect.

As explained previously, since the some values of the desired $V_{LBL}$ program voltages are larger than Vdd of a typical 1.8V, generating these large $V_{LBL}$ voltages would consume too much power if they are supplied directly from the PB through long GBL lines at M3-level. Thus the local generation of $V_{LBL}$ voltages though the proposed three-capacitor (3-cap) charge-sharing (CS) technique according to certain embodiments of the present invention is a solution for such a problem. In certain embodiments below, the 3-cap CS technique using three $C_{LG}$s for program operation and one $C_{MG}$ for read and verify operations is illustrated.

Referring to FIG. 11A, $LBL^{J'}e$ and $LBL^{J'}o$ precharge operations of the ABL and AnP program are illustrated. As an ABL program, each of all LBL lines has to be precharged with Vinh, regardless of Even or Odd LBL lines, at one $C_{LG}$ capacitor as a 1-bit PCACHE register. Although as seen in the 3-cap CS technique described in earlier sections of this specification, the Vinh voltage can be one selected from various values of 7V, 6V, and even 3V for different 0P, 1P, 2P, and FP program operation, only one Vinh value is shown in the following examples for simplify the description. In general, Vinh value can be varied within $Vdd-Vt \le Vinh \le 7V$ and is referred as HV Vinh in this application, which is preferably supplied from the selected LBLps lines locally. Any $V_{LBL}$ values below Vdd-Vt are referred as LV Vinh in this application, which is preferably generated directly by the global LV PB associated with the NAND array.

In a specific embodiment, FIG. 11A depicts H number of cross-coupled NAND blocks in each LG group. The $LBL^{J'}e$ lines at M1/M2-level and $LBL^{J'}o$ lines at M2/M1-level are used to connect these H blocks in a zigzag manner. Each $LBL^{J'}e$ M1/M2-level line or each $LBL^{J'}o$ M2/M1-level line forms an equal parasitic $C_{LG}$ capacitor and is referred as a 1-bit PCACHE register to store 1-bit MLC data. Note, each $C_{LG}$ capacitor acts as a minimum unit of a $C_{LBL}$ capacitor to temporarily store each MLC program, read, or verify data during all batch-based MLC operations. Referring to FIG.

11A, $WL^11$ is defined as a first selected WL in a first block (of the selected LG group) for performing the ABL MLC program operation with a preferred set of bias conditions summarized below:

a) $SSL^1$ is biased to Vpass in the first block to pass Vinh from the precharged nodes of Even-string capacitor $C_{LG}e$ and Odd-string capacitor $C_{LG}O$ respectively to channels of the selected cells MCe and MCo in the selected WLn (i.e., $WL^11$) via two string-select NMOS transistors MSe and MSo. Note, $WL^11$ is the first page of top 64-WL sub-string of the first block to be programmed according to the Alt-WL program sequence defined in FIG. 5A.

b) $GSL^1$ is kept at 0V to prevent the Vinh leakage from the precharged $C_{LG}e$ and $C_{LG}o$ through respective Even string and Odd string during the Vinh precharge cycle.

c) All remaining $SSL^1$ and $GSL^1$ are kept at 0V to prevent Vinh charges flowing into the remaining H−1 strings in H−1 blocks during the Vinh precharge cycle.

d) Selected $WL^11$ and all WL above it ($WL^12$ through $WL^164$ plus $DWL^11$ and $DWL^12$ all are biased to Vpass in the first selected block to allow fully pass of HV Vinh charges stored in $C_{LG}e$ and $C_{LG}O$ without dropping to all source/drain nodes and channels of 64 Even regular cells MCe and 64 Odd regular cells MCo and 2 dummy cells MUe and MUo in each Even and Odd strings initially for a high DC inhibit voltage for a superior program-inhibit voltage without relying on the unreliable cell gate boosting effect. For all WLs below the selected $WL^11$, i.e., $WL^21$ through $WL^264$, are biased to voltages gradually reduced from Vpass to 0V to reduce unwanted wordline voltage stress on these cells during the program of $WL^11$.

e) $BLGJ'-1$ is set to 0V to isolate the precharged Vinh voltage on the $C_{LG}e$ and $C_{LG}O$ in the first block from being diluted by remaining $C_{LG}e$ and $C_{LG}O$ in other blocks.

f) All gate signals of other non-selected H−1 blocks are set to 0V with $V_{DNW}$ and $V_{TPW}$ being set to 0V to prevent the precharged Vinh charges from flowing into the non-selected H−1 blocks for saving charges.

In another specific embodiment, FIG. 11B depicts a data conversion method for converting a MLC data represented by multi-level $Vdd/V_{LBLxy}$ voltages to alternative multi-level $Vinhxy/V_{LBLxy}$ voltages for generating the desired three $V_{LBL}$ program voltages and Vinh program-inhibit voltage for performing MLC program. Here, $V_{LBLxy}$ is defined as the LV $V_{LBL}$ program voltages supplied directly from PB through J−1 GBL broken lines to $LBL^{J-1}e$ and $LBL^{J-1}o$ and then to $C_{LG}e$ capacitor associated with $LBL^{J}e$ and $C_{LG}O$ capacitor associated with $LBL^{J}o$ with a restriction of no greater than Vdd-Vt to save power consumption. $V_{LBLy}$ is $V_{LBLx}$ in Even LBL line or $V_{LBLy}$ in Odd LBL line. Vinhxy is defined as the HV $V_{LBL}$ program-inhibit voltage. Vinhxy is Vinhx in Even LBL line or Vinhy in Odd LBL line.

Each corresponding MLC bit data represented by either Vdd or Vss stores in each $C_{GBL}$ capacitor supplied from each bit of PB. Each converted data utilizes Vinh voltages precharged temporarily in each local selected $C_{LG}$ capacitor made by a local LBL line such as $LBL^{J}e$ in an Even string or $LBL^{J}o$ in an Odd string. Specifically, $LBL^{J}e$ or $LBL^{J}o$ is given to Vinhxy voltage level when each corresponding $LBL^{J-1}e$ or $LBL^{J-1}o$ is provided to Vdd and the MLC bit data is "1." Alternatively, $LBL^{J}e$ or $LBL^{J}o$ is given to Vss when each corresponding $LBL^{J-1}e$ or $LBL^{J-1}o$ is provided to $V_{LBLxy}$<Vdd-Vt and the MLC bit data is "0".

The data conversion method in terms of the $Vdd/V_{LBLxy}$ to $Vinhxy/V_{LBLxy}$ conversion includes some steps described in more details below. First of all, each MLC digital bit data from the PB is typically only in two LV forms, Vdd or Vss, where Vdd is a single digital level program-inhibit voltage and Vss is a single digital level $V_{LBL}$ program voltage associated with a local LBL line. But for the MLC data, the three $V_{LBL}$ voltages as analog program voltages and a single Vinh as analog program-inhibit voltage are required, where $V_{LBL}$ and Vinh values vary according to the examples of 3-capacitor calculation shown in FIG. 7C under an assumption of Vdd=2.4V and in FIG. 7D under Vdd=1.6V.

Initially, the PB supplies desired $V_{LBL}$ values that include a program-inhibit voltage at Vdd and three $V_{LBL}$ voltages in a range from 0V to Vdd-Vt for four MLC target states with BLGJ'−1 gate line being set to 0V to separate HV nodes of $LBL^{J}e$ and $LBL^{J}o$ from LV nodes of $LBL^{J-1}e$ and $LBL^{J-1}o$. Then, both HV and LV sides can keep respective four to five MLC LV analog voltages $V_{LBL}$ at $LBL^{J-1}e$ and $LBL^{J-1}o$ nodes and one HV Vinh voltage at N/2-bit $LBL^{J}e$ and N/2-bit $LBL^{J}o$ nodes.

Referring to FIG. 11B, the conversion starts to lower $SSL^1$ bias voltage from Vpass to Vdd first along with LBLJ'−1 being switched from Vss to Vdd for conversion and then back to Vss so that the initial Vinh voltage trapped in cell channel of the NAND string will be altered in accordance with the MLC analog $V_{LBL}$ data during the conversion.

When $LBL^{J-1}e$ or $LBL^{J-1}o$ is at Vdd with LBLJ'−1 being set to Vdd, then the LBL-divided transistor MLBL is kept at Off-state so that HV Vinhxy locked in both $LBL^{J}e$ and $LBL^{J}o$ lines would not leak to respective LV nodes of $LBL^{J-1}e$ and $LBL^{J-1}o$. As a result, $LBL^{J}e$ and $LBL^{J}o$ lines are set to Vinh and $LBL^{J-1}e$ and $LBL^{J-1}o$ lines are at Vdd.

When $LBL^{J-1}e$ or $LBL^{J-1}o$ is at Vdd-Vt or smaller with LBLJ'−1 being set to Vdd, then the LBL-divided transistor MLBL is kept at On-state so that HV Vinhxy locked in both $LBL^{J}e$ and $LBL^{J}o$ lines would leak to respective LV nodes of $LBL^{J-1}e$ and $LBL^{J-1}o$. As a result, $LBL^{J}e$ and $LBL^{J-1}e$ are at a same voltage level and $LBL^{J}o$ and $LBL^{J-1}$ are at another same voltage level. Thus, one conversion in terms of 3-cap CS is complete.

Totally, three conversions for three separate but physically adjacent $C_{LG}$ capacitors are independently performed with isolation by setting corresponding BLGJ'−2 and BLGJ'−3 gate voltages of corresponding MLBL transistors to 0V. When the 3-cap CS is performed on the three adjacent $C_{LG}$ capacitors, BLGJ'−1 and BLGJ'−2 gate voltages of corresponding LBL-divided or connected transistors MLBL are set to Vpass to connect the three adjacent $C_{LG}$ capacitors and the BLGJ'−3 gate voltage is set to 0V to isolate these three adjacent $C_{LG}$ capacitors from the remaining $C_{LG}$ capacitors in one $C_{MG}$. During each circle of above conversion, the global $C_{MG}$ and $C_{HG}$ residue voltages are reset to 0V for accurately performing next circle of conversion.

In yet another specific embodiment, FIG. 11C shows a preferred set of bias conditions for one selected NAND block for ABL and AnP 1P SLC-like program operation or 2P MLC program operation. As shown, the selected $WL^11$ is coupled with a step-rise Vpgm pulse with 0.2V ISSP for better program Vt-width control along with 127 unselected and 2 dummy WL voltages, improved reliability of the MLC program and program-inhibit operations can be achieved. Particularly, at least one advantage of the MLC program and program-inhibit operations of the present invention yields no gate-induced drain lowering (GIDL) effect and punch-through effect on the top LBL-select transistors MSe and MSo with a common gate $SSL^1$ being tied to Vdd and Vds being set to 0V because $LBL^{J'}e$ and $LBL^{J'-1}e$, $LBL^{J'}o$ and $LBL^{J'-1}o$ are respectively kept in equal voltage level during $LBL^{J'}e$ and $LBL^{J'}o$ precharge cycle. Furthermore, $V_{DS}$~0-1V during program operation, the channels of $LBL^{J'}e$ and $LBL^{J'}o$ string-select transistor MSe and MSo are coupled to a voltage value higher than initial Vinh when the nearest $WL^1 64$ is ramped by Vpgm, but will be clamped down to the source-drain breakdown voltage (BVDS) of transistors MSe and MSo at about 7V during MLC program cycle.

Another advantage of the MLC program and program-inhibit operations of the present invention is, when $V_{DS}$ of LBL-select transistors MSo and MSe are kept nearly at 0V the undesired GIDL-induced hot hole-electron pairs would not be generated. Thus, Vts of cells on the nearest word line $WL^1 64$ would not be particularly increased more than others in the string as in conventional NAND array. Thus, MLC data quality is guaranteed under the preferred YUKAI NAND scheme of the present invention.

Furthermore, another advantage of the MLC program and program-inhibit operations of the present invention is that no GIDL effect and punch-through effect happens on bottom string-select transistors MSe and MSo with their common gates $SSL^1$ being tied to Vss=0V with $V_{DS}$ at 0V because $LBL^{J'}e$ line and $LBL^{J'-1}e$ line are bias at a same Vinh voltage and $LBL^{J'}o$ and $LBL^{J'-1}o$ lines are kept the same Vinh voltage during MLC program. $LBL^{J'}e$ and $LBL^{J'}o$ are two drain nodes for respective string-select transistor MSe and MSo, while $LBL^{J'-1}e$ and $LBL^{J'-1}o$ are two source nodes for the string-select transistor MSe and MSo. Thus, Vts of cells on $WL^1 64$ would not be particularly increased more than others in the string as prior art.

Moreover, the iterative ABL and AnP MLC program starts in this step with program time of ~20 μs per ISSP step. After the program, a MLC Odd/Even-BL program-verify operation is performed. In an embodiment, during this preferred batch-based concurrent MLC program operations, two $C_{LG}$ capacitors are required to temporarily store 2-bit MLC data loaded sequentially from Byte-based or Word-based I/O pins in 2 bits of PCACHE registers in array without taking the real area in RCACHE registers in PB for area saving. Besides, two additional $C_{LG}$ capacitors are required to store two bits of each MLC program-verify data in 2-bit PCACHE registers.

FIGS. 11D, 11E, and 11F are diagrams showing respective sets of bias conditions for performing Even/Odd-BL and AnP MLC concurrent program-verify operations according to an embodiment of the present invention. The Even/Odd-BL and AnP MLC concurrent program-verify operations, in a specific embodiment, are performed in three basic steps. Although MLC program is performed in ABL per each selected WLn, the MLC program-verify has to be performed on Odd/Even-BL basis. In other words, only one-half number of cells associated with one physical WLn can be program-verified. For whole WLn cells program-verify operation, 2 cycles are needed to verify Even and Odd strings one after the other.

In a first step, as shown in FIG. 11D, a precharge operation is performed by setting $C_{LBLe}$=Vinh and $C_{LBLo}$=$V_{SL}$ in each corresponding PCACHE register. In a second step, as shown in FIG. 11E, a concurrent discharge of $C_{LBLe}$ from Vinh to 0V is performed when Even cells fail to meet the programmed voltages of $Vtn_{pv}$. Finally in a third step, as shown in FIG. 11F, a CS and program-verify operations are performed between each LBL and its corresponding GBL capacitors.

Referring to FIG. 11D, a preferred MG-based Vinh precharge operation on Even $LBL^{J'}e$ line (associated with a $C_{MG}$ capacitor) with a set of bias conditions for performing the first step of the batch-based concurrent MLC program-verify operation. Here, each program-verify voltage is referred as $Vtn_{pv}$. Since each program-verify operation is like an erase-verify operation, a larger $C_{MG}$ (with small $C_{LG}$ connected by LG-divided devices MLBLs) is required for charge-sharing sensing, as shown in descriptions of the set of bias conditions below.

$SSL^1$ is biased to 0.5V+Vt to prepare the drain voltage of 0.5V for the selected Even regular cells MCe with respect to the cell source voltage Vs=0V as explained before. As a result, $V_{DS}$ is maintained to be less than 0.5V on all selected MCe cells in Even LBL to avoid cell punch-through.

$DWL^1 1$ is biased to 1.4V but $DWL^1 2$ is biased to Vread and $DWL^2 2$ and $DWL^2 1$ are kept at 0V to select only one Even string of top block out of total H Even strings in each $C_{MG}$ for a Vinh precharge for subsequent program-verify on cells residing on $WL^1 1$ in the Even strings of the top block. The Even string is selected because the dummy word line $DWL^1 1$ of 1.4V>Vte of MUe cell but <Vtp of MLo cell. Therefore, the MUe cell will conduct cell current to select the Even string by acting as a string-select transistor.

$GSL^1$, $GSL^2$, and $SSL^2$ are set at 0V to prevent the Vinh leakage from the Even string in top block only with the bottom block being disabled during Vinh precharge cycle of the top Even string.

$DWL^2 2$ and $DWL^2 1$ are set to 0V to disable bottom block dummy cells from being affected by erase-verify operation of the top Even regular cells.

$WL^1 2$ to $WL^1 64$ and $WL^2 1$ to $WL^2 64$ all are biased to Vread (~6V) to turn on 127 non-selected regular NAND cells MCe in the selected Even string for preparing the subsequent program-verify on the top Even string regular cells associated with $WL^1 1$.

WLs are all set at 0V to disable regular cells in unselected blocks during program-verify operation of the regular cells in the selected block.

Finally, $PRE^{J'}o$ is biased to 0V but $PRE^{J'}e$ is biased to Vpass and $LBL^{J'}ps$ line is biased to Vinh voltage for precharging Even string. Note, since MLC program-verify starts from Even LBL cells, thus the LBL precharge is performed on Even LBL line $LBL^{J'}e$ first, thus $LBL^{J'}e$ is biased to Vinh and adjacent Odd LBL line $LBL^{J'}o$ is left at floating (FL).

Referring to FIG. 11E, the preferred MG-based Vinh precharge operation on Even $LBL^{J'}e$ line ($C_{MG}$) with another preferred set of bias conditions for a second step of batch-based concurrent MLC program. In the second step, LBL discharging and retaining within each local Even $C_{MG}$ capacitor is performed with following bias conditions changed from the bias conditions shown above (in FIG. 11D).

$GSL^1$ is switched from 0V to 0.5V+Vt to turn on bottom string-select transistors MGe and MGo to allow the sensing current to flow through for each MLC bit data evaluation. Then, $PRE^{J'}o$ is biased to Vpass but $PRE^{J'}e$ is set to 0V and $LBL^{J'}ps$ line is switched to 0V. As a result, if the Vt value of a cell MCe is smaller than program-verify voltage $Vtn_{pv}$, then the cell MCe will conduct current to pull down the corresponding $LBL^{J'}e$ line from Vinh to 0V. Thus, the program-verify operation just indicates that the current MLC program fails, thus the next further ISSP program has to be continued. Conversely, if the Vt value of MCe is greater than $Vtn_{pv}$, then the cell MCe will not conduct current, thus the corresponding $LBL^{J'}e$ line retains Vinh in the $C_{MG}$ capacitor.

The program-verity operation just indicates that the MLC program is passed, thus the next further ISSP program has to be stopped to avoid MLC over-program.

Referring to FIG. 11F, a third step of the preferred MLC program-verify of the present invention is performed following the first step shown in FIG. 11D and the second step shown in FIG. 11E. As how an erase-verify operation is performed, a CS-sensing has to be performed between one selected $C_{MG}$ and a whole $C_{HG}$ or J $C_{HG}$s in worst-case scenario if the selected one is the farthest $C_{MG}$ from the PB of the NAND array. The detail descriptions are similar to those for the erase-verify operation given in earlier sections of the specification.

The program bias conditions described above for all WLs are same for all kinds of 0P, 1P, 2P, and FP of the regular NAND cells under the preferred YUKAI NAND array according to certain embodiments of the present invention. The Vtpn shifting and widening of 0P, 1P, 2P, and FP of MLC program and program-verify operations should refer to FIG. 6A to FIG. 6R and FIG. 7A to FIG. 7I. In general, the Odd string MLC program-verify can be easily performed the same way as the Even string described above by just changing the bias voltage on dummy WLs with the following conditions: $DWL^1 1$ is biased to Vread but $DWL^1 2$ is biased to 1.4V, $DWL^2 2$ and $DWL^2 1$ are set to 0V, to select only one top Odd string out of total H Odd strings in one $C_{MG}$ for a Vinh precharge operation for subsequent program-verify on Odd-string cells residing on $WL^1 1$ in the top block.

FIGS. 12A, 12B, and 12C are diagrams showing respective sets of bias conditions for performing Even-BL MLC concurrent read operation from regular non-boundary cells according to an embodiment of the present invention. The Even-BL MLC read operation is performed in three basic steps. Although nLC program operation is performed in ABL fashion per each selected WLn, the MLC read operation, like MLC program-verify operation, has to be performed on Odd/Even-BL basis. In other words, only one-half of all cells per one WLn can be read in one cycle and the whole WLn cells read operation needs 2 cycles to read respective Even and Odd strings. Since read operation is much like the program-verify operation, the bias condition changes that emphasize the difference from conditions for the program-verify operations are summarized below in each of the three basic steps.

Referring to FIG. 12A, a MG-based Vinh precharge operation is performed on Even $LBL^{J'}e$ line associated with $C_{MG}$ capacitor with a set of bias conditions for a first step of batch-based concurrent MLC read. Here, each read voltage is referred as VRn. For 4-state MLC read, 3 VRn voltages of VR1, VR2, and VR3 are required. Since each read is like erase-verify and program-verify, thus a larger $C_{MG}$ (rather than small $C_{LG}$) is required for CS sensing in this preferred MLC read operation. The bias conditions should be substantially the same as those set for program-verify except that $WL^1 1$ is biased to a VRn voltage for MLC read instead of a program-verify voltage $Vtn_{pv}$ used in MLC program-verify and three VRn values are used to differentiate 4-state MLC cell.

Referring to FIG. 12B, a MG-based Vinh discharge or retaining operation is performed on Even $LBL^{J'}e$ line associated with $C_{MG}$ with a set of bias conditions for a second step of batch-based concurrent MLC read operation. The bias conditions should be substantially the same as those set for the corresponding step of the MLC program-verify operation.

Referring to FIG. 12C, a third step of the preferred MLC read of the present invention is performed. As program-verify and erase-verify, a similar CS-sensing has to be performed between one selected $C_{MG}$ and a whole $C_{HG}$ and J $C_{HG}$s in worst-case scenario if the selected one is the farthest $C_{MG}$ from PB. It is like program-verify, thus the detailed biased are shown in this figure without further explanations.

Note, all above preferred set of bias conditions for Even-LBL cells are from non-boundary WLs such as WLn to WLn+2 as defined in FIG. 5A and FIG. 5B. Under this case, the Vt-shifting and widening is not as big as the boundary WLn+3. Therefore, the above MLC read does not use the individual $V_{SL}$-based Vt-compensation techniques. That means all $V_{SL}=0V$ is used in this preferred MLC read operation.

FIGS. 12D, 12E, and 12F are diagrams showing respective sets of bias conditions for performing same Even-LBL concurrent read operation from the Boundary WL's cells according to an embodiment of the present invention. For example, WLn+3 is a boundary WL as defined in FIG. 5A and FIG. 5B. In this case, WLn+3 cells' adjacent WLn+4 cells may have only $E^0$ state or 4 MLC program states. Since the boundary WLn+3 is programmed with 2P before WLn+4 being programmed with MLC, thus boundary WL MLC cells at WLn+3 suffer the largest Yupin WL-WL coupling effect.

In an embodiment of the present invention, an individual $V_{SL}$-based compensation is used during MLC read operation from the boundary WLn+3 cells. In other words, $V_{SL} \sim 0V$. As disclosed in FIG. 7G, and FIG. 7H, two different sets of $V_{SL}$ voltages are used for Vt-compensation of two cases of WLn+4 data from P0 state only or from P0 state to P3 state.

As shown in FIG. 12E, how to make $V_{SL} \neq 0V$ through setting $LBL^{J'}o$ line at $V_{SL}$ when Even cells are selected for MLC read from the corresponding $LBL^{J'}e$ line $C_{LG}$ and associated $C_{MG}$. The values of $V_{SL}$ are preferably determined by the opposed cells residing on the next adjacent WL, which is WLn+4.

Since $V_{SL}$ value has to be individual with sinking capability to keep $V_{SL}$ a constant during the whole MLC read operation, thus these $V_{SL}$ values have to be directly supplied from each corresponding bits in PB that connects to the designated $V_{SL}$ values generated by a D/A converter (not shown).

Further as disclosed in FIG. 12E, the voltage of each $LBL^{J'-1}o$ line is set to $V_{SL}$, which is directly supplied by each corresponding PB possibly via a long journey through a number of $C_{HG}$s and through one $C_{MG}$ to the selected $C_{LG}$. Each MLC digital bit data will be converted by one D/A converter (not shown) to generate the corresponding desired analog $V_{SL}$ voltages for this individual $V_{SL}$-based Vt-compensation read of the present invention.

Once each individual $LBL^{J'-1}o=V_{SL}$ is set up, then it has to be passed to each corresponding $LBL^{J'}o$ to be set up at $V_{SL}$ as well. This can be done by setting BLGJ'−1 gate signal to Vpass as shown in FIG. 12E. Once Even cells are read out from Even $LBL^{J'}e$ line, the next Odd cells in $LBL^{J'}o$ line can be performed the similar MLC read operation with the preferred individual $V_{SL}$-based Vt-compensation thereafter by setting $LBL^{J'-1}e$ to $V_{SL}$.

FIGS. 13A and 13B are tables showing preferred ABL, AnP, and Alt-WL program schemes and sequences according to an embodiment of the present invention. Note, the definition of terminologies of FIG. 13A table is same as the ones shown in FIG. 5A of the present invention. In FIG. 13A, a ABL, AnP, and Alt-WL program scheme and sequences of DP, 1P SLC-like program, 2P MLC program, and their respectively induced Vt-shifts of DS, 1S, and 2S with respect to time periods t0 to t10 are illustrated, starting from one top dummy WL (DMYWL), the first boundary (WLn−1), non-boundary WLs (WLn, WLn+1 and WLn+2), the second boundary WL (WLn+3), and the next first boundary WL (WLn+4). The operation is performed with two conditions such as 1) WLn+4 MLC MSB and LSB page data are not available during WLn+3 MLC program and 2) WLn+3 cells MLC 1P and 2P programs have to be completed.

Referring to FIG. 13A, 1S stands for a 1P program induced Vt-shift ($\Delta Vt_{1S}$) for a MLC cell being programmed from one initial negative $E^0$ state to two final SLC-like program states $P0^1$ and $P2^1$ by 1st-pass program (1P). This yields the largest cell Vt-shift because it is calculated using 7.5% of the largest Vt change from the most negative $Vte^0$ min=−3.0V of $E^0$ state to a preferred highest interim $Vtp2^1max$=0.9V of $P2^1$ state. The largest value of $\Delta Vt_{1Smax}$=3.9V.

Additionally, 2S stands for a 2P program induced Vt-shift ($\Delta Vt_{2S}$) for a MLC cell being programmed from two preferred interim program states $P0^1$ and $P2^1$ to four final MLC program states of $P0^4$, $P1^4$, $P2^4$, and $P3^4$ by 2nd-pass program (2P). $\Delta Vt_{2Smax}$ is the largest value of $\Delta Vt_{2S}$ and is calculated from $Vtp2^1$ min=0.8V to the final $Vtp3^4max$=3V (to be seen in FIG. 14C), thus yielding $\Delta Vt_{2Smax}$=2.2V.

Furthermore, 1P stands for 1st-pass ABL, AnP, Alt-WL SLC-like program, 2P stands for 2nd-pass ABL, AnP, Alt-WL MLC (coarse) program, and DP stands for the preferred dummy cell program with Vt-shift from $E^0$ state with Vt-width varying between −3V and −2V to a single program state $P2^3$ with Vt-width varying between 1.8V and 2.0V. The single width and accuracy of Vt of the DP program state $P2^3$ are not critical because dummy cell is not used to store MLC data and the state $P2^3$ is just defined as a Odd/Even select Vt. Thus the gap between program state and erase state is preferred to be ~2V with a restriction to not create substantial Vt-shift on the boundary WLn−1 cells.

In a specific embodiment, WLn−1 is defined as the first boundary WL with next WLn (bottom adjacent WL) cells in $E^0$ state and WLn−2 (DMYWL, top adjacent WL) cells in $D^0$-state. WLn+3 is defined as the second boundary WL with next WLn+4 cells in $E^0$ state even after WLn+3 2P program. Any WLs between WLn−1 and WLn+3 such as WLn, WLn+1 and WLn+2, are defined as the non-boundary WLs in the present invention. Similar to WLn−1, WLn+4 is defined as the next first boundary WL as the MLC program is continued to be performed in another sequence starting from the WLn+4 and beyond. Note, the numbers of non-boundary WLs in the first exemplary wordline group and the next second exemplary group can be flexibly increased (rather than be limited to WLn, WLn+1 and WLn+2), depending on the program needs as long as their cells are initially erased before the program. Accordingly, the second boundary WL and next first boundary WL would be shifted their location. In general, all boundary WLs need to be marked on spare cells in the predetermined locations to differentiate them from the regular non-boundary WLs for a MLC read with different $V_{SL}$-based individual compensation.

As shown in FIG. 13B, the ABL, AnP and Alt-WL program scheme and sequences continue from WLn+4 with a new starting period t1' when MLC page data are ready for the WLn+4 through WLn+7 after WLn+3 cells are fully programmed with 1P and 2P at the last period t10. Referring both FIG. 13A and FIG. 13B, the WLn+4 program is based on total 30% Yupin coupling effect with the desired sequence set between t8 to t7'.

As oppose to previous case shown in FIG. 13A, now in FIG. 13B all MLC page data are ready for WLn+4, WLn+5, WLn+6, and WLn+7, thus WLn+3 MLC program is preferably performed in same ABL, AnP, Alt-WL program scheme and sequence as WLn−1 to WLn+2.

As compared to the first boundary wordline WLn−1, MLC program on WLn+1 cells starts with a higher $Vte^0max$ shift and Vt widening induced by 1P and 2P programs of WLn+3 cells initially. The detail descriptions will be explained below.

FIG. 14A is a diagram with graphs and table showing preferred SLC-like Vt distributions, populations, Vt verify and widen voltages for dummy cell erase, SLC-like program, and read operations according to an embodiment of the present invention. As shown, three Vt distribution graphs and an illustrative table are used to show a preferred SLC-like Vt distributions, populations, Vt verify and widen voltages for erase, SLC-like program and read operations on dummy cells in a DMYWL under total 30% Yupin coupling effect. In dummy erase operation, dummy cell initial $P2^3$ state and wide $E^3$ state are turned to $E^0$ state with negative $Vte^0max$=−1.0V. In dummy cell program, it is SLC-like program to shift initial $E^0$ state first to $P2^1$ state while leaving a widened $E^1$ state. Eventually, $E^1$ state is further widened to $E^2$ state and more widened to final $E^3$ state, while $P2^1$ state is widened to $P2^2$ state and further to final dummy program state $P2^3$ (for example, Vt between 1.82V and 2.46V). In dummy read operation, VR2=1.5V is used to distinguish the dummy program state $P2^3$ and erase state $E^3$. More details on the exemplary Vt distributions, populations, Vt verify and widen voltages of the dummy cells can be found in the FIG. 14A. Note, the DMYWL program has to be finished before any subsequent program on the boundary WLn−1 cells.

FIG. 14B is a diagram with graphs and table showing preferred MLC Vt distributions, populations, shifting, verify and widened voltages for MLC operations on boundary WLn−1 cells according to an embodiment of the present invention. As shown, preferred MLC Vt distributions, populations, shifting, verify and widened voltages for respective MLC operations on the first boundary WLn−1 cells are illustrated in four graphs and a table, in which each interim 1P program or 2P program is implemented under the ABL, AnP, and Alt-WL scheme and sequences of the present invention with adjacent dummy WL and WLn being programmed.

In the first graph of FIG. 14B, the erase operation shifts MLC cells Vts from four initial widened program states $P0^4$, $P1^4$, $P2^4$, and $P3^4$ to one $E^0$ state. $Vte^0max$=−2V is used as erase-verify voltage.

Further in the second graph of FIG. 14B, the preferred ABL-1P program is shown that the boundary WLn−1 cell Vt is shifted from one initial $E^0$ state to two SLC-like program states $P0^1$ and $P2^1$ with narrow Vt distributions. Finally, a wider interim program $P0^2$ state and a $P2^2$ state are correspondingly formed. By using a program-verify voltage $Vtp0^1min$=−1.3V for $P0^1$ state and $Vtp2^1min$=0.7V for $P2^1$ state (and substantially same for $P0^2$ state and a $P2^2$ state), this 1P program is able to prevent earlier lockout for subsequent 4-state MLC program.

Additionally, in the third graph of FIG. 14B, the preferred ABL 2P program is performed to shift the boundary WLn−1 cell Vt from two initially widened interim SLC-like states $P0^2$ and $P2^2$ to four final narrowly-distributed MLC states $P0^3$, $P1^3$, $P2^3$, and $P3^3$ (and finally settled at fine program states $P0^4$, $P1^4$, $P2^4$, and $P3^4$) with adjacent dummy WL and WLn being programmed. The 2P is only checked if $P1^3$, $P2^3$, and $P3^3$ states are properly programmed using three new program-verify voltages $Vtp1^3$ min=0.8V, $Vtp2^3$ min=1.8V, and $Vtp3^3$ min=2.8V, but without checking the negative $Vtp0^3$ min to save 2P program-verify time.

Furthermore, in the fourth graph of FIG. 14B, a preferred Odd/Even-based MLC read operation is performed with three positive read check voltages VR1=0.5V, VR2=1.5V and VR3=2,5V to distinguish four final widened MLC states of $P0^4$, $P1^4$, $P2^4$, and $P3^4$. Note, all these three VRn values are lower than three counterparts shown in FIG. 6B with an assumption of total 40% Yupin coupling effect. Note, only $P0^1$ state needs to do program-verify operation once and the subsequent $P0^2$, $P0^3$, and $P0^4$ states are the Vt-widened P0 program states that do not need to do program-verify again to save the 2P program-verify time. But the P1, P2, and P3 states all need to do program-verify during both 1P and 2P MLC programs.

FIG. 14C is a diagram with graphs and table showing preferred MLC Vt distributions, populations, shifting, verify and widened voltages for respective MLC program operations of one non-boundary WLn cells and adjacent WLn+1 cells according to an embodiment of the present invention. As shown, preferred MLC Vt-distributions, populations, shifting, verify and widened voltages for respective MLC operations of non-boundary WLn NAND cells are illustrated. Again, each interim 1P program or 2P program follows the preferred ABL, AnP, and Alt-WL scheme and sequences of the present invention.

In the first graph of FIG. 14C, an erase operation is performed to shift MLC cells Vts from initial four widened program states $P0^5$, $P1^5$, $P2^5$, and $P3^5$ to one $E^0$ state by using $Vte^0max$=−2V as the erase-verify voltage.

In the second graph of FIG. 14C, a preferred ABL 1P program is performed to shift Vt of non-boundary cells (on WLn WLn+2) from one initial widen $E^0$ state to two narrowly-distributed SLC-like program states $P0^1$ and $P2^1$ with adjacent WL being programmed. Using two program-verify voltages $Vtp0^1$min=−1.3V and $Vtp2^1$min=0.7V, the two 1P program states can be verified to prevent earlier lockout for subsequent 4-state MLC program. The two programmed interim states further are widened to $P0^2$ and $P2^2$ states and further widened to $P0^3$ and $P2^3$ states.

In the third graph of FIG. 14C, a preferred ABL 2P program is performed to shift Vts of the non-boundary cells from two initial interim SLC-like $P0^3$ and $P2^3$ states with widened Vts to four final narrower MLC states $P0^4$, $P1^4$, $P2^4$, and $P3^4$ with programmed adjacent WLs. The four states are further widened to MLC states $P0^5$, $P1^5$, $P2^5$, and $P3^5$. Using three program-verify voltages of $Vtp1^3$ min=0.8V, $Vtp2^3$ min=1.8V, and $Vtp3^3$ min=2.8V, the three 2P programmed states $P1^4$, $P2^4$, and $P3^4$ can be verified. Note, no 2P program is performed on $P0^3$ state which has $Vtp0^3$ min=−0.74V as program-verify voltage, thereby cutting the 2P program latency.

In the fourth graph of FIG. 14C, a preferred Odd/Even-based MLC read operation with three read check voltages VR1=0.5V, VR2=1.5V, and VR3=2.5V to distinguish four widened MLC states $P0^5$, $P1^5$, $P2^5$, and $P3^5$. Note, these three VRn values are less than respective counterparts shown in FIG. 6C due to less Yupin coupling effect of 30%.

FIG. 14D is a diagram with graphs and table showing preferred MLC Vt distributions, populations, shifting, verify and widened voltages for respective MLC program operations of second boundary WLn+3 cells with WLn+4 cells being in P0-state according to an embodiment of the present invention. Again, each interim 1P or 2P program follows the preferred ABL, AnP, and Alt-WL scheme.

In the first graph of FIG. 14D, an erase operation is performed to shift MLC cells Vts from initial four narrow un-widened program states $P0^3$, $P1^3$, $P2^3$, and $P3^3$ to one $E^0$ state by using a same $Vte^0max$=−2V as the erase-verify voltage. In the second graph of FIG. 14D, a preferred ABL 1P program shifts Vt of the second boundary WLn+3 cells from one initial widened $E^0$ state to two narrower SLC-like program states $P0^1$ and $P2^1$ with adjacent WLn+4 cells at E-state. Using two program-verify voltages $Vtp0^1$min=−1.3V and $Vtp2^1$ min=0.7V, the two interim 1P program states $P0^1$ and $P2^1$ (later widened to $P0^2$ and $P2^2$) can be verified to prevent earlier lockout for subsequent 4-state MLC program.

In the third graph of FIG. 14D, a preferred ABL 2P program is performed to shift Vts of the second boundary cells from two initial widened interim SLC-like states $P0^2$ and $P2^2$ to four final same narrow MLC states of $P0^3$, $P1^3$, $P2^3$, and $P3^3$ with next first boundary cells at E-state. This process is substantially the same as to 2P program on the first boundary WLn−1 cell states $P0^4$, $P1^4$, $P2^4$, and $P3^4$. Again, by using three program-verify voltages such as $Vtp1^3$ min=0.8V, $Vtp2^3$ min=1.8V, and $Vtp3^3$ min=2.8V, $P1^3$, $P2^3$, and $P3^3$ program states can be verified. But the $P0^3$ state does not need to be verified as $Vtp0^3$ min is a genitive value of −1.3V to save 2P program-verify time.

Further in the fourth graph of FIG. 14D, a preferred Odd/Even-based MLC read operation is performed on the second boundary cells with three read check voltages such as VR1=0.5V, VR2=1.5V, and VR3=2.5V to distinguish four final narrow un-widened MLC states of $P0^3$, $P1^3$, $P2^3$, and $P3^3$ with a larger Vt margin as opposite to the read operation for the first boundary WLn−1 and non-boundary WLn cells. Note, this is the first read option of WLn+3 without employing any $V_{SL}$ individual compensation. In other words, here $V_{SL}$=0V when WLn+4 cells are in $E^0$ state.

FIG. 14E is a diagram with graphs and table showing preferred MLC Vt distributions, populations, shifting, verify and widened voltages for respective MLC program operations of boundary WLn+4 cells with respect to WLn+5 cells being programmed with MLC data according to an embodiment of the present invention. As shown, several MLC distributions, populations, shifting, verify and widened Vt voltages are provided for respective MLC operations of the boundary WLn+4 NAND cells with next non-boundary WLn+5 cells being programmed with MLC data. Again, each interim 1P or 2P program follows the preferred ABL, AnP, and Alt-WL scheme and sequences.

In the first graph of FIG. 14E, erase operation is performed on the boundary WLn+4 cells, that shifts MLC Vts from four initial widened program states of $P0^4$, $P1^4$, $P2^4$, and $P3^4$ to one $E^0$ state by using $Vte^0max$=−2V as the erase-verify voltage.

In the second graph of FIG. 14E, a preferred ABL 1P program is performed on the boundary WLn+4 cells, that shifts Vt from one initially widened $E^0$ state to two narrow SLC-like program states of $P0^1$ and $P2^1$ with adjacent WLn+5 cells being programmed. Using two program-verify voltages such as $Vtp0^1$min=−1.3V and $Vtp2^1$ min=0.7V, the 1P programmed states $P0^1$ and $P2^1$ can be properly verified (later two such states are widened to $P0^2$ and $P2^2$), to prevent earlier lockout for subsequent 4-state MLC program.

In the third graph of FIG. 14E, a preferred ABL 2P program is performed on the boundary WLn+4 cells to shift cells Vts from two initially widened interim SLC-like states of $P0^1$ and $P2^1$ to four final narrow MLC states of $P0^3$, $P1^3$, $P2^3$, and $P3^3$ with programmed adjacent cells. Later the 2P programmed states are widened to $P0^4$, $P1^4$, $P2^4$, and $P3^4$.

Using three new program-verify voltages such as $Vtp1^3$ min=0.8V, $Vtp2^3$ min=1.8V and $Vtp3^3$ min=2.8V, the 2P programmed states can be verified except that $P0^3$ does not need program-verify.

In the fourth graph of FIG. 14E, a preferred Odd/Even-based MLC read operation is performed on the boundary WLn+4 cells with three read check voltages such as VR1=0.5V, VR2=1.5V, and VR3=2.5V to distinguish four final widened MLC states of $P0^4$, $P1^4$, $P2^4$, and $P3^4$ of the boundary cells in WLn+4.

FIG. 14F is a diagram showing a 4-state MLC Vt shifting and widening for boundary WLn+3 cells with adjacent WLn+4 cells being programmed into P3 state from an initial P0 state according to an embodiment of the present invention. As shown, 4-state MLC Vt shifting and widening are illustrated for programming (0P, 1P, and 2P) the boundary WLn+3's cells when next adjacent WLn+4 cells, in a specific embodiment, are programmed into P3 state from the initial P0 state. In the embodiment, a widened $P0^3$ state and three narrow $P1^3$, $P2^3$, and $P3^3$ states with an initial ΔVt gap=0.8V in WLn+3 are being widened and shifted again to $P0^4$, $P1^4$, $P2^4$, and $P3^4$ with a reduced ΔVt gap=0.6V by the next cell of P3 state in WLn+4. A preferred $V_{SL}$-based individual Vt-compensation is not required when aligning VRn to P3 state cell in WLn+4, thus $V_{SL}$=0V.

FIG. 14G is a diagram showing 4-state MLC Vt shifting and widening for boundary WLn+3 cells with adjacent WLn+4 cells being programmed into P2 state from the initial P0 state according to an embodiment of the present invention. As shown, 4-state MLC Vt shifting and widening are illustrated for (0P, 1P, and 2P) programming the boundary WLn+3's cells when next adjacent WLn+4 cells, in another specific embodiment, are programmed into P2 state from the initial P0 state. The first graph of FIG. 14G shows one widened $P0^3$ state and three narrowly distributed $P1^3$, $P2^3$, and $P3^3$ states with an initial ΔVt gap=0.8V in WLn+3 cells are widened and shifted in positive direction to four final $P0^4$, $P1^4$, $P2^4$, and $P3^4$ states with a reduced ΔVt gap=0.6V by the opposite cells of P2 state in WLn+4. When a P2 state cell is aligned to the P3 state cell as explained in FIG. 14F, it is equivalent to lower all of the four Vt-distributions by 0.07V.

The second graph of FIG. 14G shows a preferred $V_{SL}$-based individual Vt-compensation of $V_{SL}$=0.07V which is equivalent to shift four Vtpnmin values higher by 0.07V on all WLn+3 nLC cells as to compensate for 0.07V drop by aligning the opposite P2 state cell to P3 state cell. As a result, all four Vt-distributions are shifted up in x-axis by 0.07V from $P0^4$, $P1^4$, $P2^4$, and $P3^4$ states respectively to $P0^5$, $P1^5$, $P2^5$, and $P3^5$ states for same VRn read voltage setting.

FIG. 14H is a diagram showing 4-state MLC Vt shifting and widening for boundary WLn+3 cells with adjacent WLn+4 cells are being programmed into P1 state from the initial P0 state according to an embodiment of the present invention. As shown, FIG. 14H, 4-state MLC Vt shifting and widening are illustrated for (0P, 1P, and 2P) programming the boundary WLn+3 cells when next adjacent WLn+4 cells, in yet another specific embodiment, are programmed into a P1 state from the initial P0 state.

In the embodiment, the first graph shows one widened $P0^3$ state and three narrow $P1^3$, $P2^3$ and $P3^3$ states with an initial ΔVt gap=0.8V in WLn+3 are respectively widened and shifted in positive direction to four final $P0^4$, $P1^4$, $P2^4$, and $P3^4$ states with a reduced ΔVt gap=0.6V by next cell of P2 state in WLn+4. When the P1 state cell is aligned to the P3 state cell as the P2 state cell is aligned to the P3 state cell explained in FIG. 14F and FIG. 14G, it is equivalent to lower all four Vt-distributions by 0.22V.

Additionally in the embodiment, the second graph shows a preferred $V_{SL}$-based individual Vt-compensation of $V_{SL}$=0.14V which is equivalent to shift four Vtpnmin distributions higher by 0.14V on all WLn+3 nLC cells as to compensate for 0.1V drop by aligning the P2 state cell to P3 state cell in WLn+4. As a result, all four Vt-distributions are shifted up by 0.14V from $P0^4$, $P1^4$, $P2^4$, and $P3^4$ to $P0^5$, $P1^5$, $P2^5$, and $P3^5$ for same VRn read operation.

FIG. 14I is a diagram showing 4-state MLC Vt shifting and widening for boundary WLn+3 cells with adjacent WLn+4 cells not being programmed but staying in initial P0 state according to an embodiment of the present invention. As shown, 4-state MLC Vt shifting and widening are illustrated for (1P and 2P) programming the boundary WLn+3 cells when next WLn+4 cells, in still another specific embodiment, are not programmed but staying in initial P0 state.

In the embodiment, the first graph shows one widened $P0^3$ state and three narrow $P1^3$, $P2^3$, and $P3^3$ states with an initial ΔVt gap=0.8V in the boundary WLn+3 cells which are widened and shifted in positive direction to $P0^4$, $P1^4$, $P2^4$, and $P3^4$ states by the next WLn+4 cell being programmed from E state in P0 state. Again, when the P0 state of the WLn+4 cell is aligned to the highest P3 state of WLn+3 cell, then it is equivalent to lower all four Vt-distributions of the WLn+3 cell by ~0.25V.

Additionally in the second graph of FIG. 14I, a preferred $V_{SL}$-based individual Vt-compensation of $V_{SL}$=0.25V is provided, which is equivalent to shift all four Vtpnmin distributions to higher positions by 0.25V on WLn+3 cells, as to compensate for 0.32V drop by aligning the P0 state cell in WLn+4 to a P3 state cell in WLn+3. As a result, all four Vt-distributions are shifted up by 0.25V from $P0^4$, $P1^4$, $P2^4$, and $P3^4$ respectively to $P0^5$, $P1^5$, $P2^5$, and $P3^5$ for same VRn read voltage setting.

FIG. 14J is a diagram showing 4-state MLC Vt shifting and widening for boundary WLn+3 cells with respect to WLn+4 MLC bit data with $V_{SL}$=0V according to an embodiment of the present invention. As shown, 4-state MLC Vt shifting and widening are illustrated for the boundary WLn+3 cells with WLn+4 being (1P and 2P) programmed to MLC bit data with $V_{SL}$ being set 0V (i.e., without Vt-compensation). The initial four dotted states of $P0^3$, $P1^3$, $P2^3$, and $P3^3$ with Vt-gap of 0.8V have been widened to four new states of $P0^5$, $P1^5$, $P2^5$, and $P3^5$ with less Vt-gap of 0.36V between any two adjacent states due to an induction by total four MLC bit data stored next cells in WLn+4. Thus a preferred $V_{SL}$-based Vt-compensation method is required for the boundary WLn+3 cells MLC read operation.

FIG. 14K is a diagram showing 4-state MLC Vt distribution and three preferred VRn for MLC reading of second boundary WLn+3 cells according to an embodiment of the present invention. As shown, 4-state MLC Vt-distribution and three preferred VRn values for MLC reading of the second boundary WLn+3 cells are provided by adopting certain $V_{SL}$-based individual Vt-offset scheme in accordance with four MLC cell program states on WLn+4.

The $V_{SL}$-offset values for each MLC cell in WLn+3 is preferably adjusted differently based on the four programmed states of MLC cells in WLn+4 by aligning to P3 cell. In addition to Vt-shift of 0.3V by raising up the WLn+3 voltage with 0.3V, four preferred individual $V_{SL}$-compensations of 0.25V, 0.14V, 0.07V, and 0V are used respectively for reading each WLn+3 cell in accordance with four respective programmed states P0, P1, P2, and P3 of the next MLC cells in WLn+4.

FIG. 15A is a table showing preferred sets of program-verify voltages $V_{FY}$ on selected WL with and without individual $V_{SL}$-based Vt-offset voltages for respective SLC-like 1P program and MLC 2P program cells according to an embodiment of the present invention. As shown, for 1P SLC-like program, only two sets of $V_{FY}$ voltages are provided: a) $V_{WL}$=0V and $V_{SL}$=1.3V for P0 interim state; and b) $V_{WL}$=0.7V and $V_{SL}$=0V for interim P2 state. Program-verify operation for interim P1 and P3 states is neglected during 1P program because no program operation for P1 and P3 states.

For 2P MLC program, three sets of $V_{FY}$ voltages are required for final P1, P2, and P3 program states. The program-verify operation of the final P0 program state is neglected without affecting the MLC read accuracy to save program-verify time because P0 state needs to be verified by a large negative voltage that would consume much power to precharge $V_{TPW}$ and $V_{DNW}$ for a proper negative verification. In general, No verification is needed for final P0 state. $V_{WL}$=0.8V and $V_{SL}$=0V are used as program-verify voltages for final P1 verification. $V_{WL}$=1.8V and $V_{SL}$=0V are used as program-verify voltages for final P2 verification. $V_{WL}$=2.8V and $V_{SL}$=0V are used as program-verify voltages for final P3 verification.

FIG. 15B is a table showing three sets of $V_{WL}$ and $V_{SL}$ voltages for a preferred MLC read operation in a first boundary and following non-boundary WLs (WLn−1 WLn+2) under the condition of adjacent WLs cells being fully programmed with 1st-pass and 2nd-pass program operations according to an embodiment of the present invention. As shown, a first set of read conditions include setting $V_{WL}$=VR1=0.5V and $V_{SL}$=0V to distinguish P0 state out from P1, P2, and P3 states for the first boundary WLn−1 cells and following non-boundary (WLn~WLn+2) cells assuming adjacent cells being fully programmed. Additionally, a second set of read conditions includes setting $V_{WL}$=VR2=1.5V and $V_{SL}$=0V to further distinguish P0 and P1 states out from P2 and P3 states. Further, a third set of read conditions includes setting $V_{WL}$=VR3=2.5V and $V_{SL}$=0V to further distinguish P3 state out from P1, P2, and P3 states. Note, using $V_{SL}$=0V with $V_{TPW}$=0V and $V_{DNW}$=Vdd for a MLC read operation is just one example of multiple read options, which should not unduly limit the scope of the claims herein.

FIG. 15C is a table showing preferred VRn voltages on WLn+3 cells along with $V_{SL}$=0V without Vt-offset for boundary WLn+3 MLC read operation with WLn+4 cells being only in P0 program state after 0P program according to an embodiment of the present invention. As shown, three preferred VRn on WLn+3 are provided along with $V_{SL}$=0V without Vt-offset for the boundary WLn+3 cell MLC read operation when next WLn+4 cells are only in P0 program state after 0P program. Specifically, $V_{WL}$=VR1=0.5V and $V_{SL}$=0V are set to distinguish P0 state out from P1, P2, and P3 states for the boundary WLn+3 cells with WLn+4 cells being only in P0 state. Additionally, $V_{WL}$=VR2=1.5V and $V_{SL}$=0V are set to further distinguish P0 and P1 states out from P2 and P3 states of these cells. Further, $V_{WL}$=VR3=2.5V and $V_{SL}$=0V are set to further distinguish P3 state out from P1, P2, and P3 states of the same cells. Note, WLn+4 MLC cells in P0 state means its MLC page data is not ready (referred to FIG. 6D).

FIG. 15D is a table showing preferred VRn values on boundary WLn+3 cells with individual $V_{SL}$ compensations in accordance with different MLC program states stored in the adjacent WLn+4 cells according to an embodiment of the present invention. As shown, three VRn values are provided for reading on boundary WLn+3 cells with three sets of four individual $V_{SL}$-compensations in accordance with four different MLC programmed states stored in the adjacent WLn+4 cells.

A first set of read conditions includes setting $V_{WLn+3}$=VR1=0.8V along with four individual $V_{SL}$ Vt-offset voltages to differentiate P0 state out of P1, P2, and P3 states of the boundary WLn+3 cells in accordance with four MLC programmed states stored in next WLn+4 cells. For example, the Vt-offset voltages are selected as: for P0, $V_{SL}$=0.25V; for P1, $V_{SL}$=0.14V; for P2, $V_{SL}$=0.07V; and for P3, $V_{SL}$=0V.

A second set of read conditions under the embodiment includes setting $V_{WLn+3}$=VR1=1.8V along with four individual $V_{SL}$ Vt-offset voltages to differentiate P0 state and P1 state out of P2 state and P3 state in accordance with four MLC programmed states stored in WLn+4 cells. For example, the Vt-offset voltages are selected as: for P0, $V_{SL}$=0.25V; for P1, $V_{SL}$=0.14V; for P2, $V_{SL}$=0.07V; and for P3, $V_{SL}$=0V.

Again, a third set of read conditions includes setting $V_{WLn+3}$=VR1=2.8V along with four individual $V_{SL}$ Vt-offset voltages to differentiate P3 state, out of P1, P2, and P3 states in accordance with four MLC programmed states stored in WLn+4 cells. For example, the Vt-offset voltages are selected as: for P0, $V_{SL}$=0.25V; for P1, $V_{SL}$=0.14V; for P2, $V_{SL}$=0.07V; and for P3, $V_{SL}$=0V.

FIG. 16 is a diagram showing preferred general MLC read flow for both boundary and non-boundary WL cells according to an embodiment of the present invention. In following description, when N-bit is referred, it means that total 16 KB physical NAND cells residing in one physical page without including the additional syndrome ECC bytes. As shown, a flow of MLC read operation starts from a first step of receiving a MLC Read Commend designed to have batch-based concurrent MLC operations. Next step of the flow moves to read the Mark bit on current WLn to determine if the WLn is a boundary WL or not. If the WLn is not a boundary WL, then the flow moves to sequentially read out MLC cells on the WLn by applying three predetermined VRn read voltages without applying individual Vt-compensation. If the WLn is a boundary WL, then the flow moves to sequentially read out four states of MLC cells on next WLn+1 without applying individual $V_{SL}$-based Vt-compensations.

Then next step of the flow is divided into two separate paths depending on MLC status of the next WLn+1 cells. If the WLn+1 cells are in $E^0$ state, then the flow moves to sequentially read MLC cells from the WLn with three VRn values without any individual $V_{SL}$-based Vt-compensation due to zero Yupin coupled effect. If the WLn+1 cells are in four programmed states, then four $V_{SL}$-based Vt-compensations are individually used for performing sequential MLC read operation from the WLn cells with three proper VRn values to perform MLC read operation.

FIGS. 17A, 17B, and 17C are diagrams respectively showing bias conditions for a preferred batch-based concurrent ABL and AnP MLC program and Odd/Even-LBL program-verify operations with one additional dummy cell being inserted right in the middle of NAND string according to an embodiment of the present invention. As shown, a set of bias conditions for a preferred batch-based concurrent ABL and AnP MLC program and Odd/Even-LBL program-verify operations are provided with a third dummy cell (in addition to typical two dummy cells in previous embodiments throughout the specification) being inserted right in the middle of NAND string of the present invention. The third dummy cell is added to isolate top and bottom sub-strings during all verify and read operations so that a Vinh program-inhibit voltage on the source node of unselected sub-string would have a safer drain-to-source voltage $V_{DS}$ punch-through margin when the opposing source node voltage of the selected sub-string with corresponding gates being coupled to Vss for acting as a long channel device to mitigate the sub-string punch-through.

Referring to FIG. 17A, total three dummy cells are inserted in each Even or Odd string. In a specific embodiment, these three dummy cells are placed in the middle of two mirrored sub-strings with the added third dummy cell is a true middle cell in each string. In another specific embodiment, this third dummy cell is preferably programmed with a small positive value of Vtp=2V without having a negative Vte for the purpose of read and verify isolation for the two sub-strings. The gate voltage (DWL) of the third dummy cell is set to 0V along with $DWL^1 1$ being biased to Vpa1 and $DWL^1 2$ being biased to 0V if the top sub-string is selected for the MLC program or with $DWL^1 1$ being set to 0V and $DWL^1 2$ being set to Vpa1 if the bottom sub-string is selected for the MLC program. Conversely, the first two dummy cells are programmed with SLC-like complementary Vte and Vtp as explained in previous embodiments.

In yet another specific embodiment, referring to FIG. 17C, the gate voltages of non-selected WLs are set 0V or gradually decreased to prevent GIDL effect from happening to the end cells in the string due to smooth channel electrical field by the smooth variation among 64 unselected WLs in the un-selected sub-string in the selected blocks. For the selected sub-string MLC program, the $V_{DS}$=0V is maintained for the string-select transistors MSe and MSo due to the precharged Vinh voltage being maintained in both drain and source nodes of inhibit string during whole course of 1P and 2P programs. Thus the Vts of inhibit string cells nearing the MSe and MSo would not be disturbed.

The Program-verify and charge-sharing techniques are applied in similar ways as many previous embodiments and can be referred to descriptions shown in earlier sections of the present specification.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A NAND memory array with BL-hierarchical structure for concurrent All-BL (ABL), All-Vtn-Program (AnP) and Alternative-WL (Alt-WL) program, Odd/Even read and verify operations, the NAND memory array comprising:
a plurality of transistors including NAND memory transistors and non-memory transistors arranged in multiple rows along wordline (WL) direction and N number of columns along bitline (BL) direction to form a NAND plane, the N number of columns of the NAND plane being divided to J number of high groups (HGs) along the BL-direction by respective J−1 rows of N number HG-divided devices, each HG comprising L number of middle groups (MGs) arranged along the BL-direction, each MG being further divided to J' number of low groups (LGs) by respective J'−1 rows of N number of LG-divided devices, each LG comprising H number of blocks connected in the BL-direction, each block comprising N number of NAND strings arranged with 2λ pitch size in the WL-direction, each string having K number of NAND memory transistors connected drain-to-source in series and capped by a first string-select transistor at a first end of the string and a second string-select transistor at a second end of the string, each row of NAND memory transistors in a block forming one page with a common WL, wherein N, J, L, J', H, and K are respectively selected from integers of 2 and greater based on memory chip design;
a two-level bit line hierarchical structure comprising a plurality of global bit lines (GBLs) respectively formed by metal lines laid at a top level along the BL-direction through the NAND plane and a plurality of local bit lines (LBLs) respectively formed by metal lines laid below the top level along the BL-direction through each MG, each GBL being divided into J number of broken-GBLs by J−1 number of the HG-divided devices, each LBL being divided into J' number of broken-LBLs by J'−1 number of the LG-divided devices, each broken-GBL being associated with a corresponding HG and configured to connect to at least one broken-LBL via a Y-pass device, each broken-LBL being associated with a corresponding LG to form a LBL capacitor independent from transistor channels of corresponding strings in the LG and configured to be a bit line connected to drain nodes of the strings in an column in one or more blocks among H number of blocks in the corresponding LG and alternatively to be source lines respectively connected to source nodes of other strings in an adjacent column in rest number of blocks among the H number of blocks in the corresponding LG without having any common source line laid in the WL-direction for strings in each block;
two rows of N number of dummy transistors per block being inserted to all strings of the block and being programmed with complementary threshold voltages Vts for Odd/Even string selection;
a row of N/2 number of Odd precharge transistors and a row of N/2 number of Even precharge transistors per each LG having corresponding N/2 Odd and N/2 Even drain nodes respectively coupled to Odd and Even LBLs within the LG and corresponding N source nodes respectively coupled to a common precharge power line;
wherein each row of N number of dummy transistors is commonly controlled by a DWL gate voltage, each row of N number of HG-divided devices is commonly controlled by a BHG gate voltage, each row of N number of LG-divided devices is commonly controlled by a BLG gate voltage, each row of N number of Y-pass devices is commonly controlled by a MGL gate voltage, each row of first string-select transistors is commonly controlled by a SSL gate voltage, each row of second string-select transistors is commonly controlled by a GSL gate voltage, each row of N/2 number of Odd/Even precharge transistors is commonly controlled by a PREo/e gate voltage, and each common precharge power line is a metal line laid in a lowest level along the WL-direction for precharging each LBL capacitor in a corresponding LG to a LBL voltage $V_{LBL}$ up to a program-inhibit voltage Vinh ~7V or alternately discharging individual local source line to a desired $V_{SL}$ voltage down to 0V;
wherein multiple pages in selected disperse blocks in one or more selected LGs are configured to perform batch-based concurrent nLC All-BL-program, All-threshold-states (All-Vtn)-program, and Alternate-wordline (Alt-WL) program, Odd/Even-BL read and verify operations in one or more cycles with an option of using the individual source line $V_{SL}$ voltage for providing individual transistor threshold voltage (Vt) compensation on either Odd or Even string NAND memory transistors of a selected page to offset WL-WL and LBL-LBL transistor floating-gate coupling effects.

2. The NAND memory array of claim 1 wherein the N is number of bits per page selected from 4 KB, 8 KB, 16 KB or other suitable integers; J is selected from 8, 16, or other suitable integer smaller than 16; L is selected from 4, 8, or other suitable integer smaller than 8; J' is selected from 4, 8, or other suitable integer smaller than 8; H is selected from 4, 8; and K is selected from 8, 16, 32, 64, 128, 256 or other suitable integer smaller than 256.

3. The NAND memory array of claim 1 wherein each of the plurality of NAND memory transistors is either a transistor selected from 1-poly charge-trapping SONOS type and 2-poly floating gate type, with non-volatile design selected from either PMOS or NMOS NAND, 2T Flotox-based EEPROM, NAND-based NOR, and NAND-based Flash, based on a manufacturing technology selected from 2D type and 3D type, PMOS or NMOS NAND cell and flash technology types.

4. The NAND memory array of claim 1 wherein each of the plurality of NAND memory transistors is a memory cell having a floating-gate threshold voltage configuration selected from two ranges of charges referred as a 1-bit SLC cell, four ranges of charges referred as a 2-bit MLC cell, eight ranges of charges referred as a 3-bit TLC cell, sixteen ranges of charges referred as a 4-bit XLC cell, and even 256 charge states referred as a 8-bit analog cell.

5. The NAND memory array of claim 1 wherein each of the first/second string-select transistor and the HG/LG-divided devices is a 1-poly NMOS transistor with preferred source-drain breakdown voltage (BVDS)≥7V.

6. The NAND memory array of claim 1 further comprising a M/1 column decoder configured to consolidate N number of GBLs to N/M number of GBLs that are associated with a page buffer having a size reduced by M-fold, wherein M is an integer equal to $2^m$ with m=1, 2, 3.

7. The NAND memory array of claim 1 wherein the plurality of LBLs includes the Odd and Even LBLs made by metal lines laid alternatively at a first middle level and a second middle level below the top level, the first middle level being lower than the second middle level, any selected Odd/Even LBL charged to a $V_{LBL}$ voltage is electrically shielded by two adjacent metal lines grounded at 0V parallelly laid in the same level of the selected Odd/Even LBL at a position below/above two adjacent Even/Odd LBLs.

8. The NAND memory array of claim 1 wherein the two rows of N number of dummy transistors per block are disposed together in the middle of all strings of the block to separate each string to a first sub-string with K/2 NAND memory transistors including the first string-select transistor and a second sub-string with K/2 NAND memory transistors including the second string-select transistor.

9. The NAND memory array of claim 1 wherein the two rows of N number of dummy transistors per block are respectively disposed next to the first string-select transistor in a first sub-string and second to last next to the second string-select transistor in a second sub-string.

10. The NAND memory array of claim 1 wherein the two dummy transistors in a same Odd/Even string are programmed with two SLC complementary Vts and any two dummy transistors in a same row but belonging to adjacent Even string and Odd string are programmed with two SLC complementary Vts so that an Odd/Even-BL select function in each block can be implemented for the Odd/Even-BL read and verify operations.

11. The NAND memory array of claim 10 wherein the two SLC complementary Vts includes an erase state Vte and a program state Vtp, wherein a gap between Vtp and Vte is preferred to be 2V either for 1) an option of Vte<0 and Vtp>0 and 2) another option of both Vtp and Vte being positive with Vtp-Vte>2V.

12. The NAND memory array of claim 11 wherein the Odd/Even-BL-select function relies on setting a first DWL gate voltage for a selected dummy WL to be between the Vtp and Vte states assigned to corresponding Odd/Even dummy transistors in a same row to turn off/on the Odd/Even dummy transistor in the selected dummy WL and setting a second DWL gate voltage for a un-selected dummy WL to above Vtp to turn on both dummy transistors in the unselected dummy WL.

13. The NAND memory array of claim 11 further comprising a third row of N number of dummy transistors placed in the middle of the string having each dummy transistor being assigned to erase state Vte, while other two rows of N number of dummy transistors are respectively disposed next to the first string-select transistor in a first sub-string and second to last next of the second string-select transistor in a second sub-string with any two dummy transistors in a same string being programmed to two SLC complementary Vts and any two dummy transistors in a same row of the two rows but belonging to adjacent Even string and Odd string being programmed to two SLC complementary Vts.

14. The NAND memory array of claim 1 wherein the Y-pass device is a 1-to-1 coupler configured to couple N number of GBLs to N number of LBLs in each MG so that each GBL has same 2λ pitch size as each LBL.

15. The NAND memory array of claim 1 wherein the Y-pass device is a 2-to-1 multiplexer configured to couple N/2 number of GBLs to N number of LBLs in each MG so that each GBL has 4λ pitch size.

16. The NAND memory array of claim 1 wherein each broken-LBL is configured to be isolated within a LG without taking extra die area to form an 1-bit unit pseudo CACHE (PCACHE) capacitor bearing a smallest capacitance $C_{LG}$ for at least temporarily storing charges corresponding to 1-bit cell data in terms of the charged $V_{LBL}$/Vinh program/program-inhibit voltages.

17. The NAND memory array of claim 16 wherein any adjacent two of the J' number of broken-LBLs in every column in a MG can be flexibly connected by a LG-divided device to form a LM capacitor with a larger capacitance of multiple folds of $C_{LG}$ up to $J' \times C_{LG} = C_{MG}$, for at least temporarily storing more charges corresponding to 1-bit sensed analog data from the array for read or erase-verify and program-verify or 1-bit data received from I/O with all broken-GBLs being connected to a page buffer for data conversion, all LG capacitors in a same row forming an 1-page $C_{LG}$ PCACHE registers and all MG capacitors in a same row forming an 1-page $C_{MG}$ PCACHE registers.

18. The NAND memory array of claim 17 wherein each 1-page PCACHE register is configured to at least temporarily store one SLC logic-page data loaded from I/O with all broken-GBLs being connected and is associated with an adjacent 1-page PCACHE register configured to at least temporarily store 1-bit of one logic page of an iterative MLC program-verify data read from one page of NAND memory transistors.

19. The NAND memory array of claim 17 wherein two pages of the PCACHE registers are configured to at least temporarily store two MLC logic-page data (MSB page and LSB page) loaded from I/O with all broken-GBLs connected and associated with another two pages of PCACHE registers configured to at least temporarily store two logic pages of a MLC iterative program-verify data read from one page of NAND memory transistors.

20. The NAND memory array of claim 17 wherein each broken-GBL is configured to be isolated within a HG without taking extra die area to form a $C_{HG}$ capacitor having a same length as L number of $C_{MG}$ capacitors and all CHG capacitors being flexibly connected by the HG-divided devices to form larger capacitor up to a whole GBL per column connected to a page buffer, wherein one or more $C_{LG}$ capacitors, and one or more $C_{MG}$ capacitors, and one or more $C_{HG}$ up to the whole GBL can be flexibly charge-shared with isolation for facilitating temporary storage charges required for performing concurrent all-BL, all-Vtn-states, alt-WL program, read, and verify operations.

21. The NAND memory array of claim 16 wherein at least two pages of adjacent PCACHE capacitors are configured to perform a charge-sharing operation and a voltage setting based on a low-voltage page buffer connected to the GBLs to generate multiple LBL voltages respectively assigned for performing batch-based all-BL all-Vtn-program operation on each of a selected page of NAND memory transistors depending on corresponding program states in a predefined sequential order and multiple cycles, the charge-sharing operation including at least one charge-sharing per cycle between two or more PCACHE registers respectively associate with two or more adjacent LGs per column with each page of PCACHE capacitors being independently precharged with a voltage above 2.5V up to the Vinh voltage of ~7V, the voltage setting being performed at least once per cycle to made a conversion of Vdd/Vss from corresponding GBL from the low voltage page buffer to Vinh/Vss at the precharged PCACHE register.

22. The NAND memory array of claim 21 wherein the multiple LBL voltages comprise $2^k$ number of program voltages and one program-inhibit voltage used to provide individual channel field offset as a WL voltage with stairwise increased value from 15V is applied to a common gate of the selected page for programming different NAND memory transistors in the page from initial erase state to $2^k$ number of different program states without causing earlier lockout due to BL-BL Vt coupling effect, where k=1 for programming SLC type data with two programmed states, k=2 for programming MLC type data with 4 programmed states, k=3 for programming TLC type data with 8 programmed states.

23. The NAND memory array of claim 21 wherein the multiple LBL voltages comprise $2^k-1$ number of program voltages and one program-inhibit voltage used to provide individual channel field offset as a WL voltage with stairwise increased value from 15V is applied to a common gate of the selected page for programming different NAND memory transistors in the page from initial erase state to $2^k-1$ number of different program states while keeping Vte erase state without causing earlier lockout due to BL-BL Vt coupling effect, where k=1 for programming SLC type data with 1 programmed state Vtp1 and 1 Vte, k=2 for programming MLC type data with 3 programmed states Vtp1~Vtp3 and 1 Vte, k=3 for programming TLC type data with 7 programmed states Vtp1~Vtp7 and 1 Vte.

24. The NAND memory array of claim 21 wherein the charge-sharing operation comprises, precharging the three adjacent PCACHE capacitors from the three corresponding common precharge power lines to three selected voltages above 2.5V up to source-drain breakdown voltage of ~7V, each of the three adjacent PCACHE capacitors being isolated by setting corresponding BLG gate voltages to 0V;

sending a different GBL voltage of $V_{GBL}$(<Vdd)/Vdd generated from program/program-inhibit data from a low-voltage page buffer for programming the selected NAND memory transistor at three different time cycles respectively to corresponding broken-GBLs that are coupled to three broken-LBLs associated with the three PCACHE capacitors by three Y-pass devices, wherein the Vdd is a typical low operation voltage down to 1.6V used by the low-voltage page buffer;

converting the precharged voltages in the three PCACHE capacitors, at the corresponding three different time cycles, to the corresponding GBL voltage if the latter is smaller than the Vdd or retaining the same precharged voltages if the corresponding GBL voltage is the Vdd, by setting the MGL gate voltages for the Y-pass devices to the Vdd;

charge-sharing among the three adjacent PCACHE capacitors by connecting corresponding LG-divided devices to obtain a final LBL voltage corresponding to a program state of the selected NAND memory transistor for either the first-pass MSB-based MLC program operation or the second-pass LSB-based MLC program operation, the final LBL voltage being fully passed to corresponding channel of the selected NAND memory transistor in the selected page.

25. The NAND memory array of claim 24 wherein the final LBL voltage is larger than Vss=0V or even larger than the Vdd but no greater than the precharged Vinh voltage of ~7V as a program-inhibit voltage.

26. The NAND memory array of claim 24 wherein the charge-sharing operation further is scalable to a j-capacitor charge-sharing technique in two or more sequential time cycles, wherein j is selected from 4 or larger integers, for generating seven LBL voltages and a Vinh program-inhibit voltage for program of a TLC NAND memory transistor, and alternatively generating 15 LBL voltage and a Vinh program-inhibit voltage for program of a XLC NAND memory transistor.

27. The NAND memory array of claim 21 wherein the batch-based concurrent All-BL-program, All-Vtn-program, and Alt-WL-program operation is configured to perform concurrently on M selected pages of NAND memory transistors in nLC data type, wherein n=1 for SLC, n=2 for MLC, n=3 for TLC, and n=4 for XLC, by using n×M dispersed pages of PCACHE registers selected randomly from one or more MGs within one or more HGs.

28. The NAND memory array of claim 27 wherein the n×M pages of $C_{LG}$-based PCACHE capacitors are configured to be precharged with desired voltages above 2.5V up to the Vinh ~7V from the corresponding common precharge power lines at the same time or individually precharged at different cycle times to cut precharge time and to be discharged at the same time by coupling the corresponding common precharge power lines to Vss=0V or other values required for setting desired common or individual source line voltages.

29. The NAND memory array of claim 27 wherein each selected page of NAND memory transistors comprises a local nLC program page data configured to be concurrently stored in n pages of N-bit $C_{LG}$-based PCACHE registers with Vinh/Vss and $V_{LBL}$/Vss voltage conversion, wherein n=1 for SLC data type, n=2 for MLC, n=3 for TLC, and n=4 for XLC for performing concurrent nLC All-BL-program, All-Vtn-program, and Alt-WL-program operation.

30. The NAND memory array of claim 27 wherein each selected page of NAND memory transistors comprises a local N-bit nLC program-verify Vinh-precharged data concurrently stored in a selected page of N-bit $C_{MG}$-based PCACHE registers with all J' $C_{LG}$ capacitors in each BL being connected for performing all-BL nLC program-verify operation.

31. The NAND memory array of claim 27 wherein each selected page of NAND memory transistors comprises a local N/2-bit Odd/Even-BL iterative nLC program-verify data concurrently stored in a selected page of N-bit $C_{MG}$-based PCACHE registers with preferred Vinh/Vdd and $V_{LBL}$/Vss voltage conversion for performing Odd/Even nLC program-verify operation.

32. The NAND memory array of claim 27 wherein each selected page of NAND memory transistors comprises a local N/2-bit Odd/Even-BL iterative nLC erase-verify data concurrently stored in a selected page of N-bit $C_{MG}$-based PCACHE registers with preferred Vinh/Vdd and $V_{LBL}$/Vss voltage conversion for performing Odd/Even nLC erase-verify operation.

33. The NAND memory array of claim 27 wherein each selected page of NAND memory transistors comprises a local N/2-bit Odd/Even-BL nLC read data concurrently stored in a selected page of N-bit $C_{MG}$-based PCACHE registers with the preferred Vinh/Vdd and $V_{LBL}$/Vss voltage conversion for Odd/Even nLC read operation.

34. The NAND memory array of claim 1 wherein the plurality of NAND memory transistors includes a portion of NAND memory transistors flexibly selected from one or more full blocks, or one or more pages per partial block, or mixture of both subjecting to a concurrent All-BL erase operation followed by two iterative Odd/Even-BL erase-verify operations.

35. The NAND memory array of claim 34 wherein the concurrent All-BL erase operation is performed on both NAND memory transistors and dummy transistors in each string of any selected block from multiple LGs or MGs or HGs using a same erase voltage of ~20V exerted by a bulk of the NAND plane to erase floating-gate based NAND memory transistors arranged in 2D string or 3D string or using gate-induced drain leakage (DIDL) effect for generating hot hole-electron pair to erase charge-trapping-based NAND memory transistors arranged in 3D string.

36. The NAND memory array of claim 34 wherein the two iterative Odd/Even-BL erase-verify operations include a two-cycle Odd/Even-BL erase-verify operation performed first on the dummy transistors in each block and a two-cycle Odd/Even-BL erase-verify operation performed next on the NAND memory transistors in the same block.

37. The NAND memory array of claim 35 wherein any NAND memory transistors and dummy transistors in at least two blocks in one LGs of one or more MGs and one or more HGs are configured to perform concurrent multi-block erase operation comprising:
charging the bulk to ~20V;
setting all WLs of the at least two blocks per LG to Vss=0V;
leaving all SSL, GSL, SSL, GSL, BLG, PREo, PREe gate voltages and precharge power line to floating;
erasing all NAND memory transistors in the at least two adjacent blocks per LG to obtain a maximum Vt value of −3.5V and erasing all dummy transistors to obtain a maximum Vt value of −1V;
resetting the bulk to 1V;
setting all SSL, GSL, SSL, GSL, BLG, PREo, PREe gate voltages and precharge power line from floating to Vss=0V; and
setting both PREo, PREe gate voltages to Vpass ~10V and precharge power line to 1V for further discharging residue charges in the bulk to 1V.

38. The NAND memory array of claim 37 wherein the dummy transistors in the at least two blocks in one LGs of one or more MGs and one or more HGs are configured to perform concurrent Odd/Even-BL erase-verify operation in two cycles comprising a first cycle for Even-BL erase-verify followed by a second cycle for Odd-BL erase-verify, the first cycle comprising:
precharging concurrently all Even LBLs in each of at least two adjacent blocks per LG to the Vinh ~7V while leaving unselected Odd LBLs to floating at 1V by setting PREe to Vpass ~10V, PREo to 0V, all WL voltages and GSL gate voltages to 0V, SSL gate voltages to 1.5V above transistor threshold Vt, and BLG gate voltages to Vpass ~10V for connecting all LGs in one MG;
discharging concurrently any Even LBL from ~7V to 1V if each and every of all NAND memory transistors and dummy transistors in the corresponding Even string passes an erase-verify voltage of −1V, otherwise retaining the corresponding Even LBL to ~7V, by switching PREo to Vpass, PREe to 0V, and precharge power line to 1V;
charge-sharing between a MG capacitor associated with each selected Even LBL in one MG and multiple HGs up to a whole column capacitor associated with multiple connected broken-GBL up to a whole GBL to have a diluted voltage either at fraction of the Vinh if transistor threshold Vt value of each of all NAND memory transistors and dummy transistors in the corresponding string corresponding to the selected Even LBL is no smaller than −1V or at fraction of 1V if transistor threshold Vt value of one of all NAND memory transistors and dummy transistors in the corresponding string corresponding to the selected Even LBL is smaller than −1V; and
sensing the diluted voltage in each corresponding GBL by a page buffer to complete the erase-verify operation; and
repeating the second cycle for the selected Odd-BL erase-verify.

39. The NAND memory array of claim 38 wherein the NAND memory transistors in one of the at least two blocks in one LGs of one or more MGs and one or more HGs are configured to perform concurrent Odd/Even-BL erase-verify operation in two cycles comprising a first cycle for Even-BL erase-verify with Odd-BL acting as a shielding-BL followed by a second cycle for Odd-BL erase-verify with Even-BL acting as a shielding-BL, the first cycle comprising:
resetting the bulk to −Vtemax, wherein Vtemax is a maximum Vt value of erase state of a NAND memory transistor;
setting four DWL gate voltages respectively to select each Even strings of one of the at least two adjacent blocks per LG;
precharging concurrently all Even LBLs associated with the selected Even strings to the Vinh ~7V while leaving unselected Odd LBLs to floating at −Vtemax as shielding LBL lines by setting PREe to Vpass ~10V, PREo to 0V, all WL voltage for NAND memory transistors to 0V, setting all GSL gate voltages to 0V, setting SSL gate voltage for the selected block to 4.0V above transistor threshold Vt but SSL gate voltage for unselected block to 0V, and setting BLG gate voltages to Vpass ~10V for connecting all LGs in one MG;

discharging concurrently any Even LBL from ~7V to −Vtemax if transistor threshold Vt value of each of all NAND memory transistors and dummy transistors in the corresponding Even string passes an erase-verify voltage of Vtemax, otherwise retaining the corresponding Even LBL to −7V, by switching PREo to Vpass, PREe to 0V, and precharge power line to −Vtemax;

charge-sharing between an Even-BL MG capacitor associated with each selected Even LBL capacitor in one MG and multiple HGs up to a whole column capacitor associated with multiple connected broken-GBL up to a whole GBL to have a diluted voltage either at fraction of the Vinh if transistor threshold Vt value of each of all NAND memory transistors and dummy transistors in the corresponding string is no smaller than Vtemax or at fraction of −Vtemax if transistor threshold Vt value of one of all NAND memory transistors and dummy transistors in the corresponding string is smaller than Vtemax; and sensing the diluted voltage in each corresponding GBL by a page buffer to complete the erase-verify operation; and repeating the second cycle for the selected Odd-BL erase-verify.

40. The NAND memory array of claim 1 wherein the two rows of N dummy transistors in any of all N strings in multiple selected blocks of one or more LGs within a selected MG are subjected to a $C_{LG}$-based iterative SLC-like program and program-verify operation before concurrent program of NAND memory transistors in the same string.

41. The NAND memory array of claim 40 wherein the $C_{LG}$-based iterative SLC-like program and program-verify operations on a selected Even-string dummy transistor in one of the two rows comprises:

precharging concurrently broken-LBLs for all selected Even strings in multiple selected blocks of one or more LGs with the Vinh voltage ~7V with while leaving all unselected Odd strings to be floating at 0V while closing drain node of each string;

passing the Vinh voltage and 0V respectively to unselected Odd string transistors and the selected Even string transistors, including dummy transistors in a first row of the two rows, in respective substrings from the corresponding source nodes of each string;

setting gradually reduced WL gate voltages for other transistors, including dummy transistors in a second row of the two rows, in all other substrings near corresponding drain nodes of each string;

discharging concurrently broken-LBLs of the unselected Odd strings in the multiple selected blocks of one or more LGs via corresponding common precharge power lines to 0V;

programming concurrently the dummy transistors in the first row in the selected Even strings in the multiple selected blocks of one or more LGs to a Vtp >0 state while leaving adjacent dummy transistors in the first row in unselected Odd strings unprogrammed at a complementary Vte (<Vtp) state.

42. The NAND memory array of claim 40 wherein the $C_{LG}$-based iterative SLC-like program and program-verify operation on a selected Odd-string dummy transistor in the same one of the two rows further comprises:

precharging concurrently broken-LBLs for all unselected Even strings in multiple selected blocks of one or more LGs with the Vinh voltage ~7V with while leaving all selected Odd strings to be floating at 0V while closing source node of each string;

passing the Vinh voltage and 0V respectively to selected Odd string transistors and unselected Even string transistors, including dummy transistors in a second row of the two rows, in respective sub strings from the corresponding drain nodes of each string;

setting gradually reduced WL gate voltages for other transistors, including dummy transistors in a first row of the two rows, in all other substrings near corresponding source nodes of each string;

discharging concurrently broken-LBLs of the selected Odd strings in the multiple selected blocks of one or more LGs via corresponding common precharge power lines to 0V;

programming concurrently the dummy transistors in the second row in the selected Odd strings in the multiple selected blocks of one or more LGs to a Vtp>0 state while leaving adjacent dummy transistors in the second row in unselected Even strings unprogrammed at a complementary Vte (<Vtp) state.

43. The NAND memory array of claim 1 wherein multiple pages of NAND memory transistors are selected on one-page-per-LG basis from one or more LGs of one or more MGs of one or more HGs to perform a batch-based concurrent All-BL, All-threshold-states, and Alternate-WL program operation, each LG includes one or more groups of pages of NAND memory transistors selected sequentially in time for program, wherein at least one or more pages are associated with a first boundary WL next to one or more non-boundary WLs followed by a second boundary WL of a first group of the one or more groups, wherein a second group having one or more pages associated with both boundary WLs and non-boundary WLs is selected later next to the first group for program.

44. The NAND memory array of claim 43 wherein the batch-based concurrent All-BL, All-threshold-states, and Alternate-WL program operation on each selected page of NAND memory transistors per LG of one or more MGs comprises:

select three adjacent LGs in one MG including the LG containing the selected page to sequentially perform three cycles of local-global charge conversion and sharing operation starting from one LG that is located farthest from a page of the Y-pass devices in the MG, each cycle on a selected one of the three adjacent LGs for all bit lines comprising:

precharging concurrently from the corresponding precharge power line to each broken-LBL associated with the selected LG with a precharge voltage substantially larger than the Vdd up to Vinh voltage of −7V, the precharge voltage being isolated from other LGs;

temporarily connecting the broken-LBL to a corresponding GBL by connecting one or more LG-divided devices and one corresponding Y-pass device while the corresponding GBL being supplied a GBL voltage from a low-voltage page buffer before shutting down connection again to have the broken-LBL storing either the same GBL voltage supplied from page buffer if the GBL voltage is smaller than the Vdd-Vt or the same precharge voltage if the GBL voltage is the Vdd, the broken-LBL being isolated from other broken-LBLs in other LGs;

performing a 3-cap charge-sharing operation per column for all bit lines among the three adjacent LGs along each column isolated from all other LGs to have an averaged value out of the three voltages stored temporarily in the three broken-LBLs obtained separately in the three cycles, the averaged value being adjustable by managing the GBL voltages supplied to the column from the page buffer in the three cycles to reach a final LBL voltage of a predefined value either for generating different threshold voltage responses to a program voltage or for inhibiting programming and is individually stored in one corresponding broken-LBL in the LG containing the select page;

passing each individually stored final LBL voltage to channel region of each corresponding NAND memory transistor in the selected page;

applying a program voltage increasing progressively in time up to 20V to a common gate of each NAND memory transistor in the selected page to form individual channel electric field due to individual voltage difference between the program voltage and the individual final LBL voltage to cause each NAND memory transistor to be individually programmed with corresponding threshold voltage Vt to reach a respective desired finish level substantially at a same time or be inhibited to program by staying at an initial erase state without any Vt level change.

45. The NAND memory array of claim 44 wherein the predefined value is either one two program voltage levels of 2V and 0V or a program-inhibit voltage level greater than the Vdd up to the Vinh of 7V, the two program voltage levels of 2V and 0V being set respectively for performing a first-pass (1P) SLC-like program operation to change an initial erase state with a negative Vt level to a first interim state P0' with a smaller negative Vt level and to a second interim state P2' with a positive Vt level, the Vt difference between P2' and P0' states being just 2V, alternatively the predefined value is either one of three program voltage levels of 2V, 1V, and 0V or a program-inhibit voltage level greater than the Vdd up to the Vinh of 7V, the three program voltage levels of 2V, 1V, and 0V being respectively stored at three LBL capacitors and set to channel regions of corresponding NAND memory transistors for performing a second-pass (2P) MLC program operation to form a final P1 state with a first positive Vt1 from the interim P0' state, to form a final P2 state with a second positive Vt2 from the interim P2' state, and to form a final P3 state with a third positive Vt3, Vt3>Vt2>Vt1, the Vt differences between the P3 and P2 and between P2 and P1 being respectively just 1V.

46. The NAND memory array of claim 45 wherein the Alt-WL program is configured to perform on all pages of NAND memory transistors corresponding to non-boundary WLs in the first group sequentially in time yet alternatively in adjacent pages with a 1P program being performed on any current page followed by the 2P program on previous adjacent page and is continued with another 1P program on a next adjacent page followed by the 2P program on the current page.

47. The NAND memory array of claim 46 wherein the Alt-WL program for the page with the second boundary WL of the first group is configured to perform in an order of performing a zero-pass program on a next adjacent page corresponding to a first boundary WL of the second group if no MLC page data is available to the page with the first boundary WL of the second group, performing the 1P program on the current page with the second boundary WL of the first group, performing the 2P program on a previous adjacent page with non-boundary WL of the first group, and finally performing the 2P program on the current page, the zero-pass program being configured to keep a subject transistor threshold voltage Vt from an initial erase state with Vt<0 to a non-programmed state P0' with a Vt still <0.

48. The NAND memory array of claim 47 wherein the page of NAND memory transistors corresponding to the first boundary WL of the second group with the corresponding MLC page data ready is selected to perform the Alternate-WL program as a starting WL extended to subsequent one or more WLs after the completion of the zero-pass program operation and the 2P program on the second boundary WL of the first group.

49. The NAND memory array of claim 43 wherein each page of NAND memory transistors in multiple blocks selected on one-block-per-MG basis are configured to perform concurrent Even/Odd-BL program-verify operation in two cycles, the first cycle comprising:

setting DWL gate voltages respectively to select each Even strings in a selected block in a MG;

precharging concurrently all Even LBLs associated with the MG to the Vinh of ~7V from a precharge power line while leaving unselected Odd LBLs to floating at 0V by setting PREe to Vpass ~10V, PREo to 0V and setting BLG gate voltages to Vpass ~10V for connecting all LGs in the MG, setting WL voltage for all unselected pages to Vread ~6V and the selected page to a predetermined program-verify voltage;

discharging any Even LBL from ~7V to 0V if transistor threshold Vt value of correspond NAND memory transistor in the selected page is smaller than the program-verify voltage, otherwise retaining the Even LBL to ~7V, by switching PREo to Vpass, PREe to 0V, and precharge power line to 0V;

charge-sharing between each selected Even LBL in the MG and multiple HGs up to a whole column capacitor associated with multiple connected broken-GBL up to a whole GBL to have a diluted voltage either at multi-fraction of the Vinh if transistor threshold Vt value of each of all NAND memory transistors and dummy transistors in the corresponding string is no smaller than the program-verify voltage or at 0V if transistor threshold Vt value of one of all NAND memory transistors and dummy transistors in the corresponding string is smaller than the program-verify voltage; and sensing the diluted voltage in each corresponding GBL by a page buffer to complete the program-verify operation; and repeating the second cycle for the selected Odd-BL program-verify.

50. The NAND memory array of claim 43 wherein each page of NAND memory transistors in the first group programmed with MLC data is selected to perform an Odd/Even-BL read operation in two cycles, the read operation comprising:

receiving read command for a selected page;

determining the selected page at a non-boundary WL upon reading out "1" from a mark bit prestored in spare area of the selected page; and sequentially applying three read voltages from corresponding WL in accordance with a coupling effect from an adjacent Odd/Even-BL NAND memory transistor in the second page in fully programmed states to each Odd/Even-BL NAND memory transistor of the selected page to distinguish four distinct states of the MLC data.

51. The NAND memory array of claim 50 wherein the three read voltages are selected based on three Vt-differences of four final program states P0, P1, P2, and P3 of each Odd/Even-BL NAND memory transistor in the select page of a non-boundary WL affected by the coupling effect, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data.

52. The NAND memory array of claim 43 wherein each page of NAND memory transistors in the first group programmed with MLC data is selected to perform an Odd/Even-BL read operation in two cycles, the read operation comprising:
   receiving read command for a selected page;
   determining the selected page at a boundary WL upon reading out "0" from the mark bit prestored in spare area of the selected page;
   checking programmed states of Odd/Even-BL NAND memory transistors in a second page next adjacent to the selected page;
   determining the Odd/Even-BL NAND memory transistors of the second page only in an interim P0 state generated by a zero-pass program operation upon reading out "0" from another mark bit prestored in spare area of the second page;
   sequentially applying three read voltages from corresponding WL in accordance with a factor for measuring a coupling effect from the adjacent NAND memory transistor in the second page to each Odd/Even-BL NAND memory transistor of the selected page to distinguish four distinct states of the MLC data.

53. The NAND memory array of claim 52 wherein the three read voltages are selected based on three Vt-differences of four final program states P0, P1, P2, and P3 of each Odd/Even-BL NAND memory transistor in the select page with a boundary WL and the coupling effect from an adjacent NAND memory transistor in the second page only at P0 state after the zero-pass program without including individual Vt-compensations, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.2V/2.2V/3.2V in accordance with a 10% factor for measuring the coupling effect from the adjacent NAND memory transistor in the second page.

54. The NAND memory array of claim 43 wherein each page of NAND memory transistors in the first group programmed with MLC data is selected to perform an Odd/Even-BL read operation in two cycles, the read operation comprising:
   receiving read command for a selected page;
   determining the selected page at a boundary WL upon reading out "0" from the mark bit prestored in spare area of the selected page, checking programmed states of Odd/Even-BL NAND memory transistors in a second page next adjacent to the selected page;
   determining the Odd/Even-BL NAND memory transistors of the second page in one of four fully programmed states generated by both 1P and 2P program operations upon reading out "1" from the another mark bit prestored in spare area of the second page;
   applying a factor for measuring a coupling effect from individual programmed state of the adjacent NAND memory transistor in the second page;
   applying an individual $V_{SL}$ voltage from column-decoder of a page buffer corresponding to each individual program state of the Odd/Even-BL NAND memory transistor in the selected page in accordance with the factor of the coupling effect to provide individual Vt-compensations; and
   sequentially applying three read voltages from corresponding WL in accordance with the factor for measuring the coupling effect to each Odd/Even-BL NAND memory transistor of the selected page to distinguish four distinct states of the MLC data.

55. The NAND memory array of claim 54 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.22V/0.38V in accordance with the factor of 10% for measuring the coupling effect from the adjacent NAND memory transistor in the second page.

56. The NAND memory array of claim 55 wherein the three read voltages are based on Vt-differences of four final program states P0, P1, P2, and P3 of each Odd/Even-BL NAND memory transistor in the select page with a boundary WL being affected by the coupling effect including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.7V/2.7V/3.7V in accordance with the factor of 10% for measuring the coupling effect.

57. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:
   receiving read command for a selected page;
   checking programmed states of Odd/Even-BL NAND memory transistors in a second page next adjacent to the selected page;
   determining the selected page at a non-boundary WL upon reading out "1" from a mark bit prestored in spare area of the second page and the Odd/Even-BL NAND memory transistors in a second page in one of four programmed states after fully 1P and 2P program operations;

applying a factor for measuring a coupling effect from individual programmed state of the adjacent NAND memory transistor in the second page;

applying an individual $V_{SL}$ voltage from column-decoder of a page buffer corresponding to each individual program state of the Odd/Even-BL NAND memory transistor in the selected page in accordance with the factor of the coupling effect to provide individual Vt-compensations; and sequentially applying three read voltages from corresponding WL in accordance with the factor of the coupling effect to each Odd/Even-BL NAND memory transistor of the selected page to distinguish four distinct states of the MLC data.

58. The NAND memory array of claim 57 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.0V/0.15V in accordance with the factor of 10% for measuring the coupling effect.

59. The NAND memory array of claim 58 wherein the three read voltages are based on Vt-differences of four final program states P0, P1, P2, and P3 of each Odd/Even-BL NAND memory transistor in the select page with a non-boundary WL being affected by the coupling effect including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.4V/2.4V/3.4V in accordance with the factor of 10% for measuring the coupling effect.

60. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:

receiving read command for a selected page;
checking programmed states of Odd/Even-BL NAND memory transistors in a second page next adjacent to the selected page;
determining the selected page at a boundary WL upon reading out "0" from a mark bit prestored in spare area of the second page;
determining the Odd/Even-BL NAND memory transistors of the second page only in an interim P0 state generated by a zero-pass program operation upon reading out "0" from another mark bit prestored in spare area of the second page;
sequentially applying three read voltages from corresponding WL in accordance with a factor for measuring a coupling effect from the adjacent NAND memory transistor in the second page to each Odd/Even-BL NAND memory transistor of the selected page to distinguish four distinct states of the MLC data.

61. The NAND memory array of claim 60 wherein the three read voltages are based on three Vt-differences of four final program states P0, P1, P2, and P3 of each Odd/Even-BL NAND memory transistor in the select page with a boundary WL being affected by the coupling effect from an adjacent NAND memory transistors in the second page only at P0 state without including individual Vt-compensations, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.2V/2.2V/3.2V in accordance with the factor of 10% for measuring the coupling effect.

62. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:

receiving read command for a selected page;
checking programmed states of Odd/Even-BL NAND memory transistors in a second page next adjacent to the selected page;
determining the selected page at a boundary WL upon reading out "0" from a mark bit prestored in spare area of the second page;
determining the Odd/Even-BL NAND memory transistors of the second page in one of four fully programmed states generated by both 1P and 2P program operations upon reading out "1" from the another mark bit prestored in spare area of the second page;
applying a factor for measuring a coupling effect from individual programmed state of the adjacent NAND memory transistor in the second page;
applying an individual $V_{SL}$ voltage from column-decoder of a page buffer corresponding to each individual program state of the Odd/Even-BL NAND memory transistor in the selected page to provide individual Vt-compensations; and
sequentially applying three read voltages from corresponding WL in accordance with the factor of the coupling effect to each Odd/Even-BL NAND memory transistor of the selected page to distinguish four distinct states of the MLC data.

63. The NAND memory array of claim 62 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.22V/0.38V in accordance with the factor of 10% for measuring the coupling effect.

64. The NAND memory array of claim 63 wherein the three read voltages are based on three Vt-differences of four final program states P0, P1, P2, and P3 of each Odd/Even-BL NAND memory transistor in the select page with a boundary WL being affected by the coupling effect including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.7V/2.7V/3.7V in accordance with a 10% factor for measuring the coupling effect.

65. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
determining the selected page at a non-boundary WL upon reading out "1" from a mark bit prestored in spare area of the selected page, sequentially applying three read voltages from corresponding WL in accordance with a coupling effect from the adjacent Odd/Even-BL NAND memory transistors in the second page to each Odd/Even-BL NAND memory transistor of the selected page to distinguish four distinct states of the MLC data;
wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.5V/1.5V/2.5V in accordance with a 7.5% factor for measuring the coupling effect without including individual Vt-compensations.

66. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
determining the selected page at a boundary WL upon reading out "0" from the mark bit prestored in spare area of the selected page, checking programmed states of Odd/Even-BL NAND memory transistors in a second page next adjacent to the selected page;
determining the Odd/Even-BL NAND memory transistors of the second page only in an erase E0 state without program upon reading out "0" from another mark bit prestored in spare area of the second page;
sequentially applying three read voltages from corresponding WL in accordance with a coupling effect from the adjacent Odd/Even-BL NAND memory transistors in the second page to each Odd/Even-BL NAND memory transistor of the selected page to distinguish four distinct states of the MLC data;
wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.5V/1.5V/2.5V in accordance with a 7.5% factor for measuring the coupling effect without including individual Vt-compensations.

67. The NAND memory array of claim 43 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
determining the selected page at a boundary WL upon reading out "0" from the mark bit prestored in spare area of the selected page, checking programmed states of Odd/Even-BL NAND memory transistors in a second page next adjacent to the selected page;
determining the Odd/Even-BL NAND memory transistors of the second page in one of four fully programmed states generated by both 1P and 2P program operations upon reading out "1" from the another mark bit prestored in spare area of the second page;
applying a factor for measuring a coupling effect from individual programmed state of the adjacent NAND memory transistor in the second page;
applying an individual $V_{SL}$ voltage from column-decoder of a page buffer corresponding to each individual program state of the Odd/Even-BL NAND memory transistor in the selected page to provide individual Vt-compensations; and
sequentially applying three read voltages from corresponding WL in accordance with the coupling effect to each Odd/Even-BL NAND memory transistor of the selected page to distinguish four distinct states of the MLC data;
wherein the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.07V/0.14V/0.25V in accordance with a 7.5% factor for measuring the coupling effect from the adjacent NAND memory transistor in the second page;

wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.8V/1.8V/2.8V in accordance with a 7.5% factor for measuring the coupling effect and the individual Vt-compensations.

68. The NAND memory array of claim 1 wherein each Odd/Even NAND memory transistors in a selected page of NAND memory transistors is selected to perform an Odd/Even-BL program-verify operation in two cycles per page to verify an interim P0' state with smaller negative threshold Vt and an interim P2' state with positive threshold Vt generated after a first-pass SLC program, the Odd/Even-BL program-verify operation including setting the wordline of the selected page to 0V and source line compensation voltage to 1V for verifying the P0' state and setting the wordline voltage to 1V and source line compensation voltage to 0V for verifying the P2' state.

69. The NAND memory array of claim 67 wherein the Odd/Even-BL program-verify operation further is performed on each Odd/Even NAND memory transistors in two cycles per page to verify three final programmed states P1, P2, and P3 with positive Vts of increasing values by setting the wordline voltage to 1.6V, 2.6V, and 3.6V and source line voltage to 0V for respectively verifying the P1, P2, and P3 states.

70. A NAND memory chip enabled with BL-hierarchical structure for concurrent All-BL (ABL), All-Vtn-Program (AnP) and Alternative-WL (Alt-WL) program, Odd/Even read and verify operations, the NAND memory chip comprising:
a hierarchical NAND array comprising N columns and a plurality of rows of NAND memory transistors linked with N global bit lines (GBLs) made by top-level metal lines laid through a whole column of the array and a M-to-1 column decoder to reduce the N GBLs to N/M relaxed GBLs, the array being divided flexibly to J number of HG groups, each HG group being divided to L number of smaller MG groups lined with N local bit lines (LBLs) made by lower-level metal lines and isolated within the corresponding MG group and respectively coupled to the N GBLs via a row of Y-pass devices, each MG group comprising J' number of LG groups, each LG group comprising multiple pre-defined blocks and a precharge power line coupled to all LBLs of the corresponding MG group, each block comprising N strings of transistors connected in series in the column-direction and arranged one-by-one across the row-direction with a drain node of each string being connected to a LBL as its bit line and a source node of the string being connected to an adjacent LBL as its source line without any common source line for every string in the block so that each string has an individually controllable source line voltage, wherein N, M, J, L, J' are integers selected for a predetermined chip design;
a plurality of row-decoders including wordline decodes, HG group decoders, MG group decoders, LG group decoders, and power-line decoders for respectively controlling gates of each row of NAND memory transistors, HG-divided devices, Y-pass devices, LG-divided devices, LG precharge devices;
an ISO circuit coupled to the N/M (=N') relaxed-GBLs with N'-bit data bit lines;
a sense amplifier circuit coupled to the ISO circuit via the N'-bit data bit lines and configured to sense nLC data from the GBLs and to provide read/write and transistor threshold voltage Vt compensation control; and
a peripheral system comprising a data communication group including a data register circuit, a real cache register circuit, a block decoder circuit, and a pointer circuit coupled between the sense amplifier circuit and a data I/O buffer circuit to form a page buffer for handling data communication between the NAND array and external I/O, and a second command control group including a command interface, a state-machine circuit, an address register circuit, and a voltage generator for receiving/transmitting external control signals and communication with the data I/O buffer circuit to operate the page buffer under a low Vdd operating voltage and to generate various high, medium, and analog low voltages and address information for the plurality of row decoders to set desired bias conditions for performing concurrent nLC All-BL (ABL), All-Vtn-Program (AnP) and Alternative-WL (Alt-WL) program, Odd/Even-string read and verify operations in one or more cycles with an option of providing individual source line voltage based Vt-compensation and LBL voltage compensations on either Odd or Even numbered string of NAND memory transistors in one or more blocks selected from one or more LG groups in one or more MG groups to reduce WL-WL and BL-BL floating-gate coupling effects.

71. The NAND memory chip of claim 70 wherein the hierarchical NAND array comprises J−1 rows of HG-divided devices, each row having a common BHG gate voltage, being inserted between any two adjacent HG groups to divide each of N GBLs to J broken-GBLs, each broken-GBL comprising an isolated metal line capacitor $C_{HG}$, each of the HG-divided devices is a 1-poly NMOS transistor with preferred source-drain breakdown voltage (BVDS)≥7V.

72. The NAND memory chip of claim 70 wherein each MG group comprises J'−1 rows of LG-divided devices, each row having a common BLG gate voltage, being inserted between any two adjacent LG groups to divide each of N LBLs to J' broken-LBLs, each broken-LBL comprising an isolated metal line capacitor $C_{LG}$ within a LG group and one row of broken-LBLs forming a page of $C_{LG}$-based pseudo CACHE (PCACHE) registers, each of the LG-divided devices is a 1-poly NMOS transistor with preferred source-drain breakdown voltage (BVDS)≥7V.

73. The NAND memory chip of claim 72 wherein each metal line capacitor $C_{LG}$ can be charged to a LBL voltage $V_{LBL}$ up to a program-inhibit voltage Vinh ~7V from the precharge power line independent from the associated string of NAND memory transistors to allow the corresponding $C_{LG}$-based PCACHE register to at least temporarily store charges corresponding to 1-bit cell data in terms of the $V_{LBL}$/Vinh program/program-inhibit voltages for performing All-BL program operation.

74. The NAND memory chip of claim 72 wherein each any adjacent two of the J' number of broken-LBLs in every column in a MG group can be flexibly connected by the LG-divided device to become a LM capacitor with a larger capacitance of multiple folds of $C_{LG}$ up to J'×$C_{LG}$=$C_{MG}$, forming a $C_{MG}$-based PCACHE register for at least temporarily storing charges corresponding to 1-bit sensed analog data from the array for read or erase-verify and program-verify operation or 1-bit data received from I/O with GBLs being connected to the page buffer for data conversion.

75. The NAND memory chip of claim 72 wherein two pages of the PCACHE registers are configured to at least temporarily store two MLC logic-page data (MSB page and LSB page) loaded from I/O with all broken-GBLs being connected and associated with another two pages of PCACHE registers configured to at least temporarily store two logic pages of a MLC iterative program-verify data read from one page of NAND memory transistors.

76. The NAND memory chip of claim 72 wherein each broken-GBL is configured to be isolated within a HG group without taking extra die area to form a $C_{HG}$ capacitor having a same length as L number of $C_{MG}$ capacitors and all CHG capacitors being flexibly connected by the HG-divided devices to form larger capacitor up to a whole GBL per column connected to a page buffer, wherein one or more $C_{LG}$ capacitors, and one or more $C_{MG}$ capacitors, and one or more $C_{HG}$ up to the whole GBL can be flexibly charge-shared with isolation for facilitating temporary storage charges required for performing concurrent all-BL, all-Vtn-states, alt-WL program, read, and verify operations.

77. The NAND memory chip of claim 72 wherein at least two pages of adjacent PCACHE capacitors are configured to perform a charge-sharing operation and a voltage setting based on a low-voltage page buffer connected to the GBLs to generate multiple LBL voltages respectively assigned for performing batch-based all-BL all-Vtn-states program operation on each of a selected page of NAND memory transistors depending on corresponding program states in a predefined sequential order and multiple cycles, the charge-sharing operation including at least one charge-sharing per cycle between two or more PCACHE registers respectively associate with two or more adjacent LGs per column with each page of PCACHE capacitors being independently precharged with a voltage above 2.5V up to the Vinh voltage of ~7V, the voltage setting being performed at least once per cycle to made a conversion of Vdd/Vss from corresponding GBL from the low voltage page buffer to Vinh/Vss at the precharged PCACHE register.

78. The NAND memory chip of claim 77 wherein the multiple LBL voltages comprise $2^k$ number of program voltages and one program-inhibit voltage used to provide individual channel field offset as a WL voltage with stair-wise increased value from 15V is applied to a common gate of the selected page for programming different NAND memory transistors in the page from initial erase state to $2^k$ number of different program states without causing earlier lockout due to BL-BL Vt coupling effect, wherein k=1 for programming SLC type data with two programmed states, k=2 for programming MLC type data with 4 programmed states, k=3 for programming TLC type data with 8 programmed states.

79. The NAND memory chip of claim 77 wherein the multiple LBL voltages comprise $2^k-1$ number of program voltages and one program-inhibit voltage used to provide individual channel field offset as a WL voltage with stair-wise increased value from 15V is applied to a common gate of the selected page for programming different NAND memory transistors in the page from initial erase state to $2^k-1$ number of different program states while keeping Vte erase state without causing earlier lockout due to BL-BL Vt coupling effect, wherein k=1 for programming SLC type data with 1 programmed state Vtp1 and 1 Vte, k=2 for programming MLC type data with 3 programmed states Vtp1~Vtp3 and 1 Vte, k=3 for programming TLC type data with 7 programmed states Vtp1~Vtp7 and 1 Vte.

80. The NAND memory chip of claim 77 wherein the charge-sharing operation comprises,
precharging the three adjacent PCACHE capacitors from the three corresponding common precharge power lines to three selected voltages above 2.5V up to source-drain breakdown voltage ~7V, each of the three adjacent PCACHE capacitors being isolated by setting corresponding BLG gate voltages to 0V;
sending a different GBL voltage of $V_{GBL}$(~Vdd)/Vdd generated from program/program-inhibit data from a low-voltage page buffer for programming the selected NAND memory transistor at three different time cycles respectively to corresponding broken-GBLs that are coupled to three broken-LBLs associated with the three PCACHE capacitors by three Y-pass devices, wherein the Vdd is a typical low operation voltage down to 1.6V used by the low-voltage page buffer;
converting the precharged voltages in the three PCACHE capacitors, at the corresponding three different time cycles, to the corresponding GBL voltage if the latter is smaller than the Vdd or retaining the same precharged voltages if the corresponding GBL voltage is the Vdd, by setting the MGL gate voltages for the Y-pass devices to the Vdd;
charge-sharing among the three adjacent PCACHE capacitors by connecting corresponding LG-divided devices to obtain a final LBL voltage corresponding to a program state of the selected NAND memory transistor for either the first-pass MSB-based MLC program operation or the second-pass LSB-based MLC program operation, the final LBL voltage being fully passed to corresponding channel of the selected NAND memory transistor in the selected page.

81. The NAND memory chip of claim 80 wherein the final LBL voltage is larger than Vss=0V and even larger than the Vdd but no greater than the precharged Vinh voltage of ~7V as a program-inhibit voltage.

82. The NAND memory chip of claim 80 wherein the charge-sharing operation further is scalable to a j-capacitor charge-sharing technique in two or more sequential time cycles, wherein j is selected from 4 or larger integers, for generating seven LBL voltages and a Vinh program-inhibit voltage for program of a TLC NAND memory transistor, and alternatively generating 15 LBL voltage and a Vinh program-inhibit voltage for program of a XLC NAND memory transistor.

83. The NAND memory chip of claim 77 wherein the batch-based concurrent All-BL-program, All-Vtn-states program operation is configured to perform concurrently on M selected pages of NAND memory transistors in nLC data type, wherein n=1 for SLC, n=2 for MLC, n=3 for TLC, and n=4 for XLC, by using n×M dispersed pages of PCACHE registers selected randomly from one or more MGs within one or more HGs.

84. The NAND memory chip of claim 83 wherein the n×M pages of $C_{LG}$-based PCACHE capacitors are configured to be precharged with desired voltages above 2.5V up to the Vinh ~7V from the corresponding common precharge power lines at the same time or individually precharged at different cycle times to cut precharge time and to be discharged at the same time by coupling the corresponding common precharge power lines to Vss=0V or other values required for setting desired common or individual source line voltages.

85. The NAND memory chip of claim 83 wherein each selected page of NAND memory transistors comprises a local nLC program page data configured to be concurrently stored in n pages of N-bit $C_{LG}$-based PCACHE registers with Vinh/Vss and $V_{LBL}$/Vss voltage conversion, wherein n=1 for SLC data type, n=2 for MLC, n=3 for TLC, and n=4 for XLC for performing concurrent nLC All-BL-program, All-Vtn-program, and Alt-WL-program operation.

86. The NAND memory chip of claim 83 wherein each selected page of NAND memory transistors comprises a local N-bit nLC program-verify Vinh-precharged data concurrently stored in a selected page of N-bit $C_{MG}$-based PCACHE registers with all J' $C_{LG}$ capacitors in each BL being connected for performing all-BL nLC program-verify operation.

87. The NAND memory chip of claim 83 wherein each selected page of NAND memory transistors comprises a local N/2-bit Odd/Even-BL iterative nLC program-verify data concurrently stored in a selected page of N-bit $C_{MG}$-based PCACHE registers with preferred Vinh/Vdd and $V_{LBL}$/Vss voltage conversion for performing Odd/Even nLC program-verify operation.

88. The NAND memory chip of claim 83 wherein each selected page of NAND memory transistors comprises a local N/2-bit Odd/Even-BL iterative nLC erase-verify data concurrently stored in a selected page of N-bit $C_{MG}$-based PCACHE registers with preferred Vinh/Vdd and $V_{LBL}$/Vss voltage conversion for performing Odd/Even nLC erase-verify operation.

89. The NAND memory chip of claim 83 wherein each selected page of NAND memory transistors comprises a local N/2-bit Odd/Even-BL nLC read data concurrently stored in a selected page of N-bit $C_{MG}$-based PCACHE registers with the preferred Vinh/Vdd and $V_{LBL}$/Vss voltage conversion for Odd/Even nLC read operation.

90. The NAND memory chip of claim 72 wherein the plurality of NAND memory transistors includes a portion of NAND memory transistors flexibly selected from one or more full blocks, or one or more pages per partial block, or mixture of both subjecting to a concurrent All-BL erase operation followed by two iterative Odd/Even-BL erase-verify operations.

91. The NAND memory chip of claim 90 wherein each block comprises a row of first string-select transistors located respectively at drain nodes of the strings of the block and a row of second string-select transistors located respectively at source nodes of the strings of the block, each of the first/second string-select transistor is a 1-poly NMOS transistor with preferred source-drain breakdown voltage (BVDS)≥7V.

92. The NAND memory chip of claim 91 wherein each block further comprises at least two rows of dummy transistors commonly gated by two DWL gate signals with at least one row being inserted preferably in the middle of the strings of the block.

93. The NAND memory chip of claim 92 wherein the two dummy transistors in a same Odd/Even string are programmed with two SLC complementary Vts and any two dummy transistors in a same row but belonging to adjacent Even string and Odd string are programmed with two SLC complementary Vts so that an Odd/Even-BL select function in each block can be implemented for the Odd/Even-BL read and verify operations.

94. The NAND memory chip of claim 93 wherein the two SLC complementary Vts includes an erase state Vte and a program state Vtp, wherein a gap between Vtp and Vte is preferred to be 2V either for 1) an option of Vte<0 and Vtp>0 and 2) another option of both Vtp and Vte being positive.

95. The NAND memory chip of claim 94 wherein the Odd/Even-BL-select function for read and verify operations relies on setting a first DWL gate signal for a selected row of dummy transistors to be between the corresponding Vtp and Vte states assigned to Odd/Even dummy transistors in the selected row to turn off/on the Odd/Even dummy transistor in the selected dummy WL and setting a second DWL gate signal for a un-selected row to above the Vtp to turn on both dummy transistors in the unselected row.

96. The NAND memory chip of claim 95 wherein the concurrent erase operation is performed on both NAND memory transistors and dummy transistors in all strings of multiple selected blocks in one or more selected MGs using a same erase voltage of ~20V exerted by a bulk of the NAND plane made by floating-gate based NAND memory transistors arranged in 2D string or 3D string or using gate-induced drain leakage (DIDL) effect for generating hot hole-electron pair on charge-trapping-based NAND memory transistors arranged in 3D string.

97. The NAND memory chip of claim 96 wherein any NAND memory transistors and dummy transistors in at least two blocks in one LGs of one or more MGs and one or more HGs are configured to perform concurrent multi-block erase operation comprising:
  charging the bulk to ~20V;
  setting all WLs of the at least two blocks per LG group to Vss=0V;
  leaving the precharge power line to floating;
  erasing all NAND memory transistors in the at least two adjacent blocks per LG group to obtain a maximum threshold value of −3.5V and erasing all dummy transistors to obtain a maximum threshold value of −1V;
  resetting the bulk to 1V;
  setting the precharge power line from floating to Vss=0V; and
  discharging residue charges in the bulk to 1V.

98. The NAND memory chip of claim 97 wherein the dummy transistors in the at least two blocks in one LG groups of one or more MG groups and one or more HG groups are configured to perform concurrent Odd/Even-BL erase-verify operation in two cycles comprising a first cycle for Even-BL erase-verify followed by a second cycle for Odd-BL erase-verify, the first cycle comprising:
  precharging concurrently all Even LBLs in each of at least two adjacent blocks per LG group to the Vinh of 7V while leaving unselected Odd LBLs to floating at 1V;
  discharging concurrently any Even LBL from ~7V to 1V if each and every of all NAND memory transistors and dummy transistors in the corresponding Even string passes an erase-verify voltage of −1V, otherwise retaining the corresponding Even LBL to ~7V;
  charge-sharing between a LBL capacitor in one MG group and multiple HG groups up to a whole column capacitor associated with multiple connected broken-GBL up to a whole GBL to have a diluted voltage either at fraction of the Vinh if transistor threshold Vt value of each of all NAND memory transistors and dummy transistors in the corresponding string corresponding to the selected Even LBL is no smaller than −1V or at fraction of 1V if transistor threshold Vt value of one of all NAND memory transistors and dummy transistors in the corresponding string corresponding to the selected Even LBL is smaller than −1V; and
  sensing the diluted voltage in each corresponding GBL by the page buffer to complete the erase-verify operation; and repeating the second cycle for the selected Odd-BL erase-verify.

99. The NAND memory chip of claim 98 wherein the NAND memory transistors in the same block are configured to perform, following the dummy transistor erase-verify operation, a concurrent Odd/Even-BL erase-verify operation in two cycles comprising a first cycle for Even-BL erase-verify with Odd-BL acting as a shielding-BL followed by a second cycle for Odd-BL erase-verify with Even-BL acting as a shielding-BL, the first cycle comprising:
resetting the bulk to −Vtemax, wherein Vtemax is maximum Vt value of erase state of a NAND memory transistor;
setting four DWL gate signals respectively to select each Even strings of one of the at least two adjacent blocks per LG group;
precharging concurrently all Even LBLs associated with the selected Even strings to the Vinh ~7V while leaving unselected Odd LBLs to floating at −Vtemax;
discharging concurrently any Even LBL from ~7V to −Vtemax if transistor threshold Vt value of each of all NAND memory transistors and dummy transistors in the corresponding Even string passes an erase-verify voltage of Vtemax, otherwise retaining the corresponding Even LBL to ~7V;
charge-sharing between a LBL capacitor in one MG group and multiple HG groups up to a whole column capacitor associated with multiple connected broken-GBL up to a whole GBL to have a diluted voltage either at fraction of the Vinh if transistor threshold Vt value of each of all NAND memory transistors and dummy transistors in the corresponding string is no smaller than Vtemax or at fraction of −Vtemax if transistor threshold Vt value of one of all NAND memory transistors and dummy transistors in the corresponding string is smaller than Vtemax; and
sensing the diluted voltage in each corresponding GBL by the page buffer to complete the erase-verify operation; and
repeating the second cycle for the selected Odd-BL erase-verify.

100. The NAND memory chip of claim 72 wherein the two rows of N dummy transistors in any of all N strings in multiple selected blocks of one or more LG groups within a selected MG group are subjected to a $C_{LG}$-based iterative SLC-like program and program-verify operation before concurrent program of NAND memory transistors in the same string.

101. The NAND memory chip of claim 100 wherein the $C_{LG}$-based iterative SLC-like program and program-verify operation on a selected Even-string dummy transistor in one of the two rows comprises:
precharging concurrently broken-LBLs for all selected Even strings in multiple selected blocks of one or more LG groups with the Vinh voltage ~7V with while leaving all unselected Odd strings to be floating at 0V while closing drain node of each string;
passing the Vinh voltage and 0V respectively to unselected Odd string transistors and the selected Even string transistors, including dummy transistors in a first row of the two rows, in respective sub strings from the corresponding source nodes of each string;
setting gradually reduced WL gate voltages for other transistors, including dummy transistors in a second row of the two rows, in all other substrings near corresponding drain nodes of each string;
discharging concurrently broken-LBLs of the unselected Odd strings in the multiple selected blocks of one or more LG groups via corresponding common precharge power lines to 0V;
programming concurrently the dummy transistors in the first row in the selected Even strings in the multiple selected blocks of one or more LG groups to a Vtp>0 state while leaving adjacent dummy transistors in the first row in unselected Odd strings unprogrammed at a complementary Vte (<Vtp) state.

102. The NAND memory chip of claim 100 wherein the $C_{LG}$-based iterative SLC-like program and program-verify operation on a selected Odd-string dummy transistor in the same one of the two rows further comprises:
precharging concurrently broken-LBLs for all unselected Even strings in multiple selected blocks of one or more LG groups with the Vinh voltage ~7V with while leaving all selected Odd strings to be floating at 0V while closing source node of each string;
passing the Vinh voltage and 0V respectively to selected Odd string transistors and unselected Even string transistors, including dummy transistors in a second row of the two rows, in respective substrings from the corresponding drain nodes of each string;
setting gradually reduced WL gate voltages for other transistors, including dummy transistors in a first row of the two rows, in all other substrings near corresponding source nodes of each string;
discharging concurrently broken-LBLs of the selected Odd strings in the multiple selected blocks of one or more LG groups via corresponding common precharge power lines to 0V;
programming concurrently the dummy transistors in the second row in the selected Odd strings in the multiple selected blocks of one or more LG groups to a Vtp>0 state while leaving adjacent dummy transistors in the second row in unselected Even strings unprogrammed at a complementary Vte (<Vtp) state.

103. The NAND memory chip of claim 72 wherein multiple pages of NAND memory transistors are selected on one-page-per-LG basis from one or more LG groups of one or more MG groups of one or more HG groups to perform a batch-based concurrent All-BL, All-threshold-states, and Alternate-WL program operation, each LG group includes one or more groups of pages of NAND memory transistors selected sequentially in time for program, wherein at least one or more pages are associated with a first boundary WL next to one or more non-boundary WLs followed by a second boundary WL of a first group of the one or more groups, wherein a second group having one or more pages associated with both boundary WLs and non-boundary WLs is selected later next to the first group for program.

104. The NAND memory chip of claim 103 wherein the batch-based concurrent All-BL, All-threshold-states, and Alternate-WL program operation on each selected page of NAND memory transistors per LG group of one or more MG groups comprises:
select three adjacent LG groups in one MG group including the LG group containing the selected page to sequentially perform three cycles of local-global charge conversion and sharing operation starting from one LG group that is located farthest from a page of the Y-pass devices in the MG group, each cycle on a selected one of the three adjacent LG groups for all bit lines comprising:
precharging concurrently from the corresponding precharge power line to each broken-LBL associated with the selected LG group with a precharge voltage substantially larger than the Vdd up to Vinh voltage of ~7V, the precharge voltage being isolated from other LG groups;

temporarily connecting the broken-LBL to a corresponding GBL by connecting one or more LG-divided devices and one corresponding Y-pass device while the corresponding GBL being supplied a GBL voltage from page buffer before shutting down connection again to have the broken-LBL storing either the same GBL voltage supplied from page buffer if the GBL voltage is smaller than the Vdd-Vt or the same precharge voltage if the GBL voltage is the Vdd, the broken-LBL being isolated from other broken-LBLs in other LG groups;

performing a 3-cap charge-sharing operation per column for all bit lines among the three adjacent LG groups along each column isolated from all other LG groups to have an averaged value out of the three voltages stored temporarily in the three broken-LBLs obtained separately in the three cycles, the averaged value being adjustable by managing the GBL voltages supplied to the column from the page buffer in the three cycles to reach a final LBL voltage of a predefined value either for generating different threshold voltage responses to a program voltage or for inhibiting programming and is individually stored in one corresponding broken-LBL in the LG group containing the select page;

passing each individually stored final LBL voltage to each corresponding NAND memory transistor in the selected page;

applying a program voltage increasing progressively in time up to 20V to a common gate of each NAND memory transistor in the selected page to form individual channel electric field due to individual voltage difference between the program voltage and the individual final LBL voltage to cause each NAND memory transistor to be individually programmed with corresponding threshold voltage Vt to reach a respective desired finish level substantially at a same time or be inhibited to program by staying at an initial erase state without any Vt level change.

105. The NAND memory chip of claim 104 wherein the predefined value is either one two program voltage levels of 2V and 0V or a program-inhibit voltage level greater than 2.5V up to the Vinh of 7V, the two program voltage levels of 2V and 0V being set respectively for performing a first-pass (1P) SLC-like program operation to change an initial erase state with a negative Vt level to a first interim state P0' with a smaller negative Vt level and to a second interim state P2' with a positive Vt level, the Vt difference between P2' and P0' states being just 2V, alternatively the predefined value is either one of three program voltage levels of 2V, 1V, and 0V or a program-inhibit voltage level greater than 2.5V up to the Vinh of 7V, the three program voltage levels of 2V, 1V, and 0V being set respectively for performing a second-pass (2P) MLC program operation to form a final P1 state with a first positive Vt1 from the interim P0' state, to form a final P2 state with a second positive Vt2 from the interim P2$^1$ state, and to form a final P3 state with a third positive Vt3, Vt3>Vt2>Vt1, the Vt differences between the P3 and P2 and between P2 and P1 being respectively just 1V.

106. The NAND memory chip of claim 105 wherein the Alt-WL program is configured to perform on all pages of NAND memory transistors corresponding to non-boundary WLs in the first group sequentially in time yet alternatively in adjacent pages with a 1P program being performed on any current page followed by the 2P program on previous adjacent page and is continued with another 1P program on a next adjacent page followed by the 2P program on the current page.

107. The NAND memory chip of claim 106 wherein the Alt-WL program for the page with the second boundary WL of the first group is configured to perform in an order of performing a zero-pass program on a next adjacent page corresponding to a first boundary WL of the second group if no MLC page data is available to the page with the first boundary WL of the second group, performing the 1P program on the current page with the second boundary WL of the first group, performing the 2P program on a previous adjacent page with non-boundary WL of the first group, and finally performing the 2P program on the current page, the zero-pass program being configured to keep a subject transistor threshold voltage Vt from an initial erase state with Vt<0 to a non-programmed state P0' with a Vt still <0.

108. The NAND memory chip of claim 107 wherein the page of NAND memory transistors corresponding to the first boundary WL of the second group with the corresponding MLC page data ready is selected to perform the Alternate-WL program as a starting WL extended to subsequent one or more WLs after the completion of the zero-pass program operation and the 2P program on the second boundary WL of the first group.

109. The NAND memory chip of claim 103 wherein each page of NAND memory transistors in multiple blocks selected on one-block-per-MG basis are configured to perform concurrent Even/Odd-BL program-verify operation in two cycles, the first cycle comprising:

setting DWL gate voltages respectively to select each Even strings in a selected block in a MG group;

precharging concurrently all Even LBLs associated with the MG group to the Vinh ~7V from a precharge power line while leaving unselected Odd LBLs to floating at 0V, at least by setting WL voltage for all unselected pages to Vread ~6V and the selected page to a predetermined program-verify voltage;

discharging any Even LBL from ~7V to 0V if transistor threshold Vt value of correspond NAND memory transistor in the selected page is smaller than the program-verify voltage, otherwise retaining the Even LBL to ~7V;

charge-sharing between each selected Even LBL in the MG group and multiple HG groups up to a whole column capacitor associated with multiple connected broken-GBL up to a whole GBL to have a diluted voltage either at multi-fraction of the Vinh if transistor threshold Vt value of each of all NAND memory transistors and dummy transistors in the corresponding string is no smaller than the program-verify voltage or at 0V if transistor threshold Vt value of one of all NAND memory transistors and dummy transistors in the corresponding string is smaller than the program-verify voltage; and sensing the diluted voltage in each corresponding GBL by a page buffer to complete the program-verify operation; and repeating the second cycle for the selected Odd-BL program-verify.

110. The NAND memory chip of claim 103 wherein each page of NAND memory transistors in the first group programmed with MLC data is selected to perform an Odd/

Even-BL read operation in two cycles with Even/Odd-BL being biased as a shielding BL, the read operation comprising:
  receiving read command for a selected page;
  determining the selected page at a non-boundary WL upon reading out "1" from a mark bit prestored in spare area of the selected page; and
  sequentially applying three read voltages from corresponding WL in accordance with a coupling effect from an adjacent Odd/Even-BL NAND memory transistor in the second page in fully programmed states to each Odd/Even-BL NAND memory transistor of the selected page to distinguish four distinct states of the MLC data.

111. The NAND memory chip of claim 110 wherein the three read voltages are selected based on three Vt-differences of four final program states P0, P1, P2, and P3 of each Odd/Even-BL NAND memory transistor in the select page of a non-boundary WL being affected at least by the coupling effect without including individual Vt-compensations, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.4V/2.4V/3.4V in accordance with a 10% factor for measuring the coupling effect from the adjacent Odd/Even-BL NAND memory transistor in the second page.

112. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:
  receiving read command for a selected page;
  determining the selected page at a boundary WL upon reading out "0" from the mark bit prestored in spare area of the selected page;
  checking programmed states of Odd/Even-BL NAND memory transistors in a second page next adjacent to the selected page;
  determining the Odd/Even-BL NAND memory transistors of the second page only in an interim P0 state generated by a zero-pass program operation upon reading out "0" from another mark bit prestored in spare area of the second page; and
  sequentially applying three read voltages from corresponding WL in accordance with a factor for measuring a coupling effect from the adjacent NAND memory transistor in the second page to each Odd/Even-BL NAND memory transistor of the selected page to distinguish four distinct states of the MLC data.

113. The NAND memory chip of claim 112 wherein the three read voltages are selected based on three Vt-differences of four final program states P0, P1, P2, and P3 of each Odd/Even-BL NAND memory transistor in the select page with a boundary WL and the coupling effect from an adjacent NAND memory transistor in the second page only at P0 state after the zero-pass program without including individual Vt-compensations, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.2V/2.2V/3.2V in accordance with a 10% factor for measuring the coupling effect from the adjacent NAND memory transistor in the second page.

114. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:
  receiving read command for a selected page;
  determining the selected page at a boundary WL upon reading out "0" from the mark bit prestored in spare area of the selected page, checking programmed states of Odd/Even-BL NAND memory transistors in a second page next adjacent to the selected page;
  determining the Odd/Even-BL NAND memory transistors of the second page in one of four fully programmed states generated by both 1P and 2P program operations upon reading out "1" from the another mark bit prestored in spare area of the second page;
  applying a factor for measuring a coupling effect from individual programmed state of the adjacent NAND memory transistor in the second page;
  applying an individual $V_{SL}$ voltage from column-decoder of a page buffer corresponding to each individual program state of the Odd/Even-BL NAND memory transistor in the selected page to provide individual Vt-compensations; and
  sequentially applying three read voltages from corresponding WL in accordance with the factor for measuring the coupling effect to each Odd/Even-BL NAND memory transistor of the selected page to distinguish four distinct states of the MLC data.

115. The NAND memory chip of claim 114 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.22V/0.38V in accordance with the factor of 10% for measuring the coupling effect from the adjacent NAND memory transistor in the second page.

116. The NAND memory chip of claim 115 wherein the three read voltages are based on Vt-differences of four final program states P0, P1, P2, and P3 of each Odd/Even-BL NAND memory transistor in the select page with a boundary WL being affected by the coupling effect including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.7V/2.7V/3.7V in accordance with the factor of 10% for measuring the coupling effect from the adjacent NAND memory transistor in the second page.

117. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
checking programmed states of Odd/Even-BL NAND memory transistors in a second page next adjacent to the selected page;
determining the selected page at a non-boundary WL upon reading out "1" from a mark bit prestored in spare area of the second page and the Odd/Even-BL NAND memory transistors in a second page in one of four programmed states after fully 1P and 2P program operations;
applying a factor for measuring a coupling effect from individual programmed state of the adjacent NAND memory transistor in the second page;
applying an individual $V_{SL}$ voltage from column-decoder of a page buffer corresponding to each individual program state of the Odd/Even-BL NAND memory transistor in the selected page in accordance with the factor of the coupling effect to provide individual Vt-compensations; and
sequentially applying three read voltages from corresponding WL in accordance with the factor of the coupling effect to each Odd/Even-BL NAND memory transistor of the selected page to distinguish four distinct states of the MLC data.

118. The NAND memory chip of claim 117 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.0V/0.15V in accordance with the factor of 10% for measuring the coupling effect.

119. The NAND memory chip of claim 118 wherein the three read voltages are based on Vt-differences of four final program states P0, P1, P2, and P3 of each Odd/Even-BL NAND memory transistor in the select page with a non-boundary WL being affected by the coupling effect including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.4V/2.4V/3.4V in accordance with the factor of 10% for measuring the coupling effect.

120. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
checking programmed states of Odd/Even-BL NAND memory transistors in a second page next adjacent to the selected page;
determining the selected page at a boundary WL upon reading out "0" from a mark bit prestored in spare area of the second page;
determining the Odd/Even-BL NAND memory transistors of the second page only in an interim P0 state generated by a zero-pass program operation upon reading out "0" from another mark bit prestored in spare area of the second page;
sequentially applying three read voltages from corresponding WL in accordance with a factor for measuring a coupling effect from the adjacent NAND memory transistor in the second page to each Odd/Even-BL NAND memory transistor of the selected page to distinguish four distinct states of the MLC data.

121. The NAND memory chip of claim 120 wherein the three read voltages are based on three Vt-differences of four final program states P0, P1, P2, and P3 of each Odd/Even-BL NAND memory transistor in the select page with a boundary WL being affected by the coupling effect from an adjacent NAND memory transistors in the second page only at P0 state without including individual Vt-compensations, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.2V/2.2V/3.2V in accordance with the factor of 10% for measuring the coupling effect.

122. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:
receiving read command for a selected page;
checking programmed states of Odd/Even-BL NAND memory transistors in a second page next adjacent to the selected page;
determining the selected page at a boundary WL upon reading out "0" from a mark bit prestored in spare area of the second page;
determining the Odd/Even-BL NAND memory transistors of the second page in one of four fully programmed states generated by both 1P and 2P program operations upon reading out "1" from the another mark bit prestored in spare area of the second page;

applying a factor for measuring a coupling effect from individual programmed state of the adjacent NAND memory transistor in the second page;

applying an individual $V_{SL}$ voltage from column-decoder of a page buffer corresponding to each individual program state of the Odd/Even-BL NAND memory transistor in the selected page to provide individual Vt-compensations; and sequentially applying three read voltages from corresponding WL in accordance with the factor of the coupling effect to each Odd/Even-BL NAND memory transistor of the selected page to distinguish four distinct states of the MLC data.

123. The NAND memory chip of claim 122 wherein four individual $V_{SL}$ voltages are respectively selected based on Vt-distributions of four final program states P0, P1, P2, and P3 of each Odd/Even-BL NAND memory transistor in the select page with a boundary WL which are respectively affected by the coupling effect from four programmed states of an adjacent NAND memory transistor in the second page after full 1P and 2P program operations and determined by a Vt-compensation operation to align every program state of corresponding Odd/Even-BL NAND memory transistor in the second page adjacent to the P3 state of each Odd/Even-BL NAND memory transistor in the select page, the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.1V/0.22V/0.38V in accordance with the factor of 10% for measuring the coupling effect.

124. The NAND memory chip of claim 123 wherein the three read voltages are based on three Vt-differences of four final program states P0, P1, P2, and P3 of each Odd/Even-BL NAND memory transistor in the select page with a boundary WL being affected by the coupling effect from an adjacent NAND memory transistor in the second page at one of four programmed states after full 1P and 2P program operations and including the individual Vt-compensations provided by the four individual $V_{SL}$ voltages, the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 1.7V/2.7V/3.7V in accordance with the factor of 10% for measuring the coupling effect.

125. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:

receiving read command for a selected page;
determining the selected page at a non-boundary WL upon reading out "1" from a mark bit prestored in spare area of the selected page;
sequentially applying three read voltages from corresponding WL in accordance with a factor of a coupling effect from the adjacent Odd/Even-BL NAND memory transistor in the second page to each Odd/Even-BL NAND memory transistor of the selected page to distinguish four distinct states of the MLC data;
wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.5V/1.5V/2.5V in accordance with the factor of 7.5% for measuring the coupling effect without including individual Vt-compensations.

126. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:

receiving read command for a selected page;
determining the selected page at a boundary WL upon reading out "0" from the mark bit prestored in spare area of the selected page, checking programmed states of Odd/Even-BL NAND memory transistors in a second page next adjacent to the selected page;
determining the Odd/Even-BL NAND memory transistors of the second page only in an erase E0 state without program upon reading out "0" from another mark bit prestored in spare area of the second page;
sequentially applying three read voltages from corresponding WL in accordance with a factor of a coupling effect from the adjacent Odd/Even-BL NAND memory transistors in the second page to each Odd/Even-BL NAND memory transistor of the selected page to distinguish four distinct states of the MLC data;
wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.5V/1.5V/2.5V in accordance with the factor of 7.5% for measuring the coupling effect without including individual Vt-compensations.

127. The NAND memory chip of claim 103 wherein each page of NAND memory transistors in the first group programmed with MLC data is selected to perform an Odd/Even-BL read operation in two cycles with Even/Odd-BL being biased as a shielding BL, the read operation comprising:

receiving read command for a selected page;
determining the selected page at a boundary WL upon reading out "0" from the mark bit prestored in spare area of the selected page, checking programmed states of Odd/Even-BL NAND memory transistors in a second page next adjacent to the selected page;
determining the Odd/Even-BL NAND memory transistors of the second page in one of four fully programmed states generated by both 1P and 2P program operations upon reading out "1" from the another mark bit prestored in spare area of the second page;
applying a factor for measuring a coupling effect from individual programmed state of the adjacent NAND memory transistor in the second page;
applying an individual $V_{SL}$ voltage from column-decoder of a page buffer corresponding to each individual program state of the Odd/Even-BL NAND memory transistor in the selected page in accordance with the factor of the coupling effect to provide individual Vt-compensations; and sequentially applying three read voltages from corresponding WL in accordance with the factor of the coupling effect to each Odd/Even-BL NAND memory transistor of the selected page to distinguish four distinct states of the MLC data;

wherein the four individual $V_{SL}$ voltages including a first $V_{SL}$ voltage corresponding to a P3 state of the corresponding NAND memory transistor in the second page, a second $V_{SL}$ voltage corresponding to a P2 state of the corresponding NAND memory transistor in the second page, a third $V_{SL}$ voltage corresponding to a P1 state of the corresponding NAND memory transistor in the second page, and a fourth $V_{SL}$ voltage corresponding to a P0 state of the corresponding NAND memory transistor in the second page, the first/second/third/fourth $V_{SL}$ voltages being 0.0V/0.07V/0.14V/0.25V in accordance with the factor of 7.5% for measuring the coupling effect;

wherein the three read voltages including a first read voltage for distinguishing a P0 state out of P1, P2, and P3 states of a MLC data, a second read voltage for distinguishing the P0 and P1 states out of the P2 and P3 states of the MLC data, and a third read voltage for distinguishing the P3 state out of P0, P1, and P2 states of the MLC data, the first/second/third read voltage being 0.8V/1.8V/2.8V in accordance with the factor of 7.5% for measuring the coupling effect and the individual Vt-compensations.

128. The NAND memory chip of claim 70 wherein each Odd/Even NAND memory transistors in a selected page of NAND memory transistors is selected to perform an Odd/Even-BL program-verify operation in two cycles per page to verify an interim P0' state with smaller negative threshold Vt and an interim P2$^1$ state with positive threshold Vt generated after a first-pass SLC program, the Odd/Even-BL program-verify operation including setting the wordline of the selected page to 0V and source line compensation voltage to 1V for verifying the P0' state and setting the wordline voltage to 1V and source line compensation voltage to 0V for verifying the P2$^1$ state.

129. The NAND memory chip of claim 128 wherein the Odd/Even-BL program-verify operation further is performed on each Odd/Even NAND memory transistors in two cycles per page to verify three final programmed states P1, P2, and P3 with positive Vts of increasing values by setting the wordline voltage to 1.6V, 2.6V, and 3.6V and source line voltage to 0V for respectively verifying the P1, P2, and P3 states.

130. The NAND memory chip of claim 70 wherein the N is number of bits per page selected from 4 KB, 8 KB, 16 KB or other suitable integers; J is selected from 8, 16, or other suitable integer smaller than 16; L is selected from 4, 8, or other suitable integer smaller than 8; J' is selected from 4, 8, or other suitable integer smaller than 8.

131. The NAND memory chip of claim 70 wherein each LG group comprises H number of blocks, where H is selected from 4, 8; each string comprises K number of NAND memory transistors, where K is selected from 8, 16, 32, 64, 128, 256 or other suitable integer smaller than 256.

132. The NAND memory chip of claim 70 wherein each of the plurality of NAND memory transistors is either a transistor selected from 1-poly charge-trapping SONOS type and 2-poly floating gate type, with non-volatile design selected from either PMOS or NMOS NAND, 2T Flotox-based EEPROM, NAND-based NOR, and NAND-based Flash, based on a manufacturing technology selected from 2D type and 3D type, PMOS or NMOS NAND cell and flash technology types.

133. The NAND memory chip of claim 70 wherein each of the plurality of NAND memory transistors is a memory cell having a floating-gate threshold voltage configuration selected from two ranges of charges referred as a 1-bit SLC cell, four ranges of charges referred as a 2-bit MLC cell, eight ranges of charges referred as a 3-bit TLC cell, sixteen ranges of charges referred as a 4-bit XLC cell, and even 256 charge states referred as a 8-bit analog cell.

134. The NAND memory chip of claim 70 wherein the M-to-1 column decoder is configured to consolidate N number of GBLs to N/M=N' number of GBLs that are associated with a page buffer having a size reduced by M-fold, wherein M is an integer equal to $2^m$ with m=1, 2, 3.

* * * * *